United States Patent
Sity et al.

(10) Patent No.: US 11,514,996 B2
(45) Date of Patent: Nov. 29, 2022

(54) MEMORY-BASED PROCESSORS

(71) Applicant: NeuroBlade Ltd., Hod-Hashron (IL)

(72) Inventors: Elad Sity, Kfar Saba (IL); Eliad Hillel, Kfar Saba (IL)

(73) Assignee: NeuroBlade Ltd., Tel-Aviv (IL)

( * ) Notice: Subject to any disclaimer, the term of this patent is extended or adjusted under 35 U.S.C. 154(b) by 0 days.

(21) Appl. No.: 16/783,767

(22) Filed: Feb. 6, 2020

(65) Prior Publication Data

US 2020/0243154 A1    Jul. 30, 2020

Related U.S. Application Data

(63) Continuation of application No. PCT/IB2019/001005, filed on Sep. 6, 2019, and a continuation-in-part of application No. 16/512,546, filed on Jul. 16, 2019, now Pat. No. 11,269,743, which is a continuation of application No. PCT/IB2018/000995, filed on Jul. 30, 2018.

(60) Provisional application No. 62/727,653, filed on Sep. 6, 2018, provisional application No. 62/548,990, filed on Aug. 23, 2017, provisional application No. 62/538,724, filed on Jul. 30, 2017, provisional application No. 62/538,722, filed on Jul. 30, 2017.

(51) Int. Cl.
| | | |
|---|---|---|
| G06F 13/12 | (2006.01) | |
| G11C 29/38 | (2006.01) | |
| G11C 11/406 | (2006.01) | |
| G11C 29/36 | (2006.01) | |
| G06F 11/10 | (2006.01) | |
| G11C 11/408 | (2006.01) | |

(52) U.S. Cl.
CPC .......... *G11C 29/38* (2013.01); *G06F 11/1068* (2013.01); *G11C 11/4087* (2013.01); *G11C 11/40618* (2013.01); *G11C 29/36* (2013.01); *G11C 2029/3602* (2013.01)

(58) Field of Classification Search
None
See application file for complete search history.

(56) References Cited

U.S. PATENT DOCUMENTS

| | | |
|---|---|---|
| 5,345,552 A | 9/1994 | Brown |
| 5,822,608 A | 10/1998 | Dieffenderfer et al. |

(Continued)

FOREIGN PATENT DOCUMENTS

WO    WO 2019/025864 A2    2/2014

OTHER PUBLICATIONS

International Search Report and Written Opinion issued in counterpart International Application No. PCT/IB2018/000995 dated Feb. 8, 2019 (12 pages).

(Continued)

*Primary Examiner* — Henry Tsai
*Assistant Examiner* — Dean Phan
(74) *Attorney, Agent, or Firm* — Finnegan, Henderson, Farabow, Garrett & Dunner LLP

(57) ABSTRACT

A memory chip may include: a plurality of memory banks; a data storage configured to store access information indicative of access operations for one or more segments of the plurality of memory banks; and a refresh controller configured to perform a refresh operation of the one or more segments based, at least in part, on the stored access information.

24 Claims, 89 Drawing Sheets

(56) References Cited

U.S. PATENT DOCUMENTS

| | | | |
|---|---|---|---|
| 6,380,730 B1* | 4/2002 | Arkin | G01R 31/319 |
| | | | 324/750.01 |
| 6,711,660 B1* | 3/2004 | Milne | G06F 9/4406 |
| | | | 711/173 |
| 6,785,780 B1 | 8/2004 | Klein et al. | |
| 7,197,677 B1* | 3/2007 | Wendorf | G11C 29/16 |
| | | | 714/30 |
| 2003/0056160 A1* | 3/2003 | Kohnen | G11C 29/42 |
| | | | 714/718 |
| 2007/0169551 A1* | 7/2007 | Kelly | G01P 21/00 |
| | | | 73/514.01 |
| 2007/0276977 A1 | 11/2007 | Coteus et al. | |
| 2009/0248972 A1 | 10/2009 | Ware et al. | |
| 2011/0128787 A1* | 6/2011 | Shelton | G11C 29/12 |
| | | | 365/185.08 |
| 2012/0054452 A1 | 3/2012 | Kumar et al. | |
| 2012/0102576 A1 | 4/2012 | Chew | |
| 2012/0204069 A1* | 8/2012 | Hughes | G11C 29/16 |
| | | | 714/718 |
| 2012/0255018 A1 | 10/2012 | Sallam | |
| 2012/0291133 A1 | 11/2012 | Nagpal et al. | |
| 2014/0040622 A1 | 2/2014 | Kendall et al. | |
| 2014/0136915 A1 | 5/2014 | Hyde et al. | |
| 2014/0143470 A1 | 5/2014 | Dobbs et al. | |
| 2014/0293725 A1 | 10/2014 | Best et al. | |
| 2017/0365324 A1 | 12/2017 | Bains et al. | |
| 2019/0102325 A1 | 4/2019 | Natu et al. | |

OTHER PUBLICATIONS

International Search Report and Written Opinion issued in counterpart international Application No. PCT/IB19/01005 dated Apr. 2, 2020 (14 pages).

International Searching Authority, Notification of Transmittal of the International Search Report and the Written Opinion of the International Search Authority, International Application No. PCT/IB2020/00665, dated May 27, 2021 (15 pages).

* cited by examiner

3506

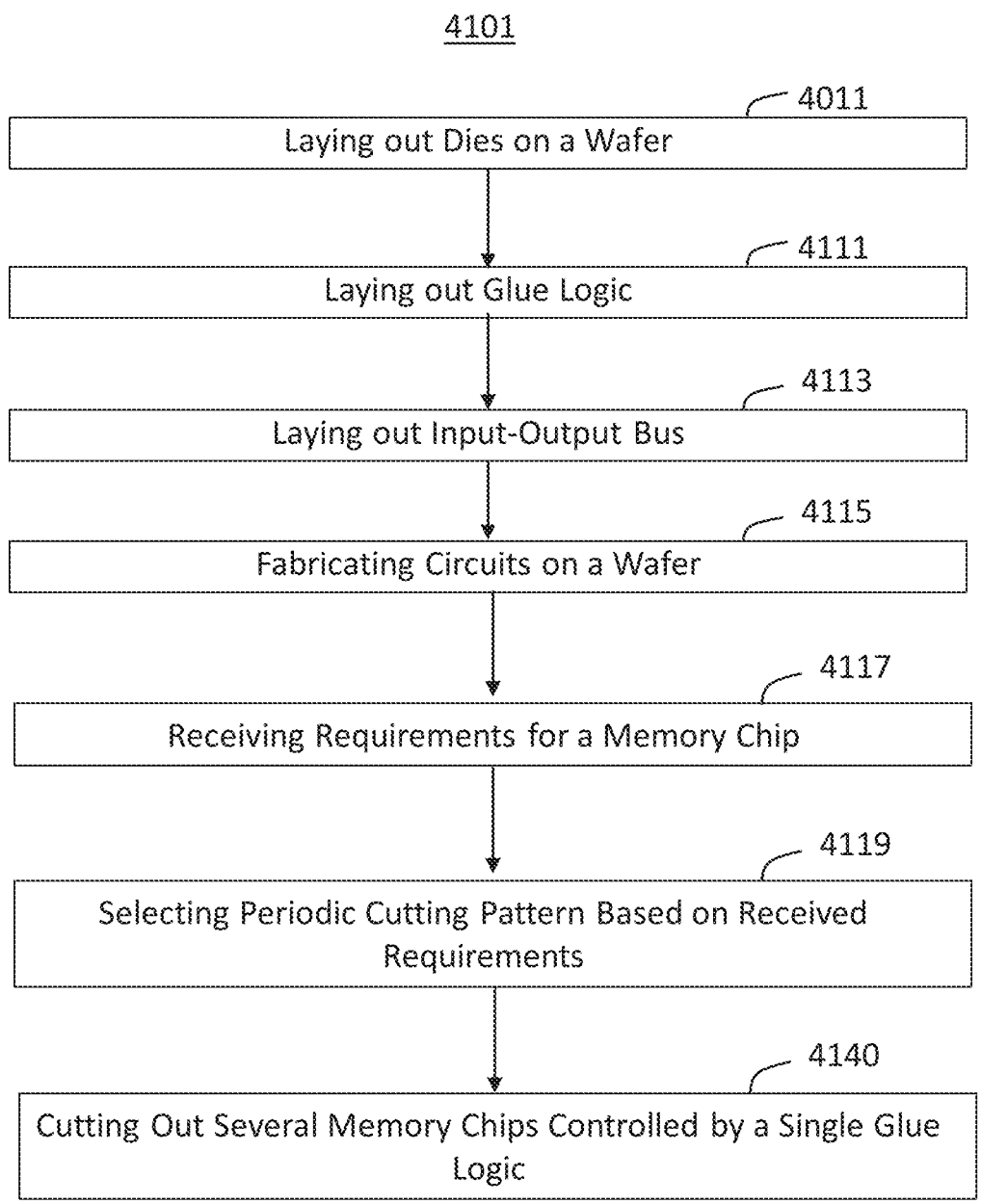

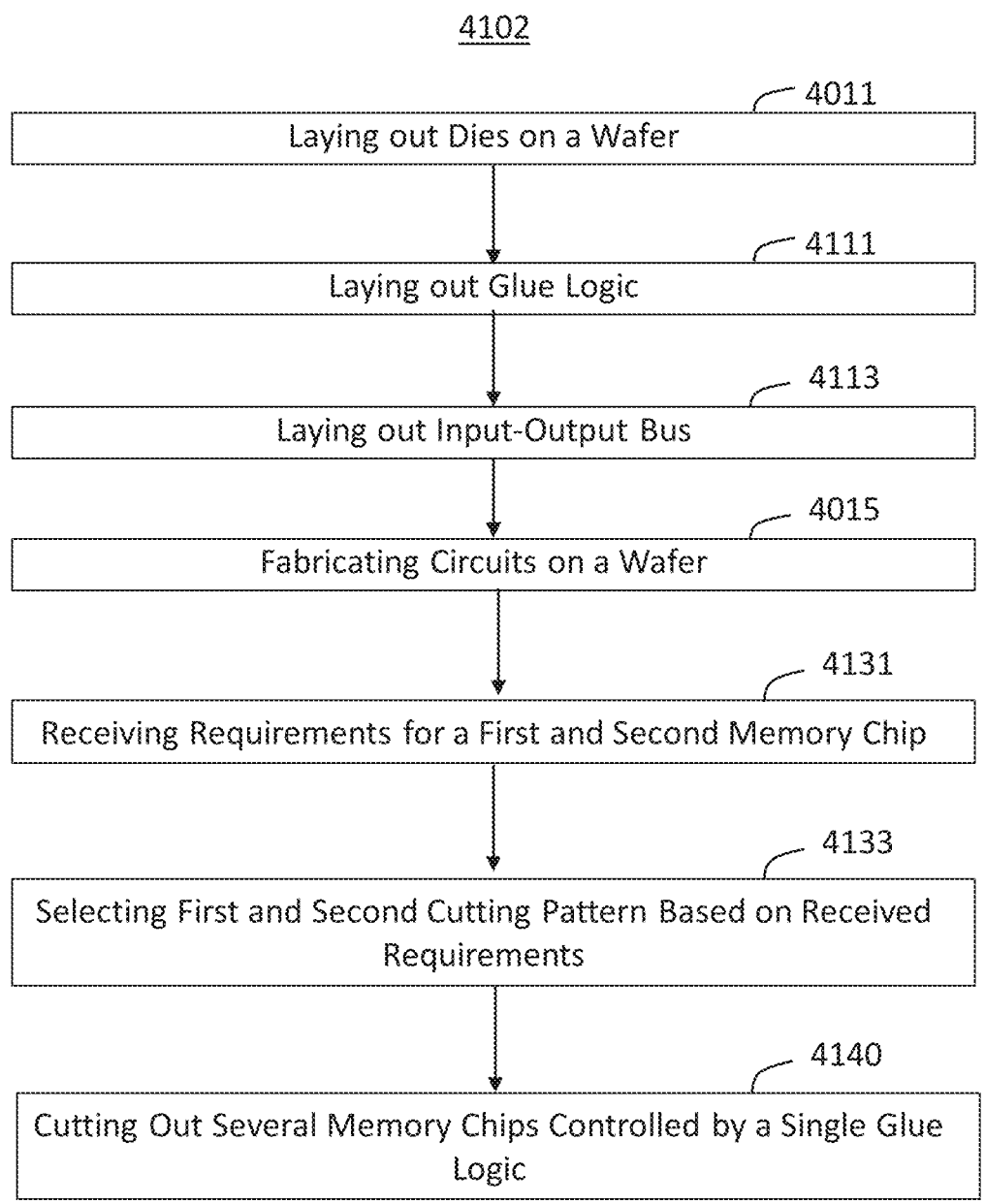

MEMORY-BASED PROCESSORS

CROSS REFERENCES TO RELATED APPLICATIONS

This application is a continuation of International Patent Application No. PCT/IB2019/001005, filed Sep. 6, 2019, and a continuation-in-part of U.S. application Ser. No. 16/512,546, filed Jul. 16, 2019, which is a continuation of International Patent Application No. PCT/IB2018/000995, filed Jul. 30, 2018. International Patent Application No. PCT/IB2019/001005 claims the benefit of priority of U.S. Provisional Patent Application No. 62/727,653, filed on Sep. 6, 2018. International Patent Application No. PCT/IB2018/000995 claims the benefit of priority of U.S. Provisional Patent Application No. 62/538,722, filed Jul. 30, 2017, U.S. Provisional Patent Application No. 62/538,724, filed Jul. 30, 2017, and U.S. Provisional Patent Application No. 62/548,990, filed Aug. 23, 2017. Each of the above-referenced applications is incorporated herein by reference to their entirety.

BACKGROUND

Technical Field

The present disclosure relates generally to apparatuses for facilitating memory-intensive operations. In particular, the present disclosure relates to hardware chips that include processing elements coupled to dedicated memory banks. The present disclosure also relates to apparatuses for improving power efficiency and speed of memory chips. In particular, the present disclosure relates system and methods for implementing partial refreshes, or even no refreshes, on a memory chip. The present disclosure also relates to selectable-sized memory chips and dual-port capabilities on a memory chip.

Background Information

As processor speeds and memory sizes both continue to increase, a significant limitation on effective processing speeds is the von Neumann bottleneck. The von Neumann bottleneck results from throughput limitations resulting from conventional computer architecture. In particular, data transfer from memory to the processor is often bottlenecked compared to actual computations undertaken by the processor. Accordingly, the number of clock cycles to read and write from memory increases significantly with memory-intensive processes. These clock cycles result in lower effective processing speeds because reading and writing from memory consumes clock cycles that cannot be used for performing operations on data. Moreover, the computational bandwidth of the processor is generally larger than the bandwidth of the buses that the processor uses to access the memory.

These bottlenecks are particularly pronounced for memory-intensive processes, such as neural network and other machine learning algorithms; database construction, indexing searching, and querying; and other tasks that include more reading and writing operation than data processing operations.

Additionally, the rapid growth in volume and granularity of available digital data has created opportunities to develop machine learning algorithms and has enabled new technologies. However, it has also brought cumbersome challenges to the world of data bases and parallel computing. For example, the rise of social media and the Internet of Things (IoT) creates digital data at a record rate. This new data can be used to create algorithms for a variety of purposes, ranging from new advertising techniques to more precise control methods of industrial processes. However, the new data has been difficult to store, process, analyze and handle.

New data resources can be massive, sometimes in the order of peta- to zettabytes. Moreover, the growth rate of these data resources may exceed data processing capabilities. Therefore, data scientists have turned to parallel data processing techniques, to tackle these challenges. In an effort to increase computation power and handle the massive amount of data, scientists have attempted to create systems and methods capable of parallel intensive computing. But these existing systems and methods have not kept up with the data processing requirements, often because the techniques employed are limited by their demand of additional resources for data management, integration of segregated data, and analysis of the sectioned data.

To facilitate the manipulation of large data sets, engineers and scientists now seek to improve the hardware used to analyze data. For example, new semiconductor processors or chips (such as those described herein) may be designed specifically for data intensive tasks by incorporating memory and processing functions in a single substrate fabricated in technologies more fitting for memory operations rather than arithmetic computation. With integrated circuits specifically designed for data-intensive tasks, it is possible to meet the new data processing requirements. Nonetheless, this new approach to tackle data processing of large data sets requires solving new issues in chip design and fabrication. For instance, if the new chips designed for data intensive tasks are manufactured with fabrication techniques and architectures used for common chips, they would have a poor performance and/or unacceptable yields. In addition, if the new chips are designed to operate with current data handling methods, they will have poor performance because current methods can limit the chip's ability to handle parallel operations.

The present disclosure describes solutions for mitigating or overcoming one or more of the problems set forth above, among other problems in the prior art.

SUMMARY

In some embodiments, a memory chip may include: a plurality of memory banks; a data storage configured to store access information indicative of access operations for one or more segments of the plurality of memory banks; and a refresh controller configured to perform a refresh operation of the one or more segments based, at least in part, on the stored access information.

Some embodiments may include a non-transitory computer-readable medium storing instructions that, when executed by at least one processor, cause the at least one processor to: receive higher-level computer code; identify a plurality of memory segments distributed over a plurality of memory banks associated with a memory chip to be accessed by the higher-level computer code; assess the higher-level computer code to identify a plurality of memory read commands to occur over a plurality of memory access cycles; cause a distribution of data, associated with the plurality of memory read commands, across each of the plurality of memory segments such that each of the plurality of memory segments is accessed during each of the plurality of memory access cycles.

Some embodiments may include a non-transitory computer-readable medium storing instructions that, when executed by at least one processor, cause the at least one processor to: receive higher-level computer code; identify a plurality of memory segments distributed over a plurality of memory banks associated with a memory chip to be accessed by the higher-level computer code; assess the higher-level computer code to identify a plurality of memory access commands each implicating one or more of the plurality of memory segments; based on analysis of the memory access commands and for each memory segment among the plurality of memory segments, track an amount of time that would accrue from a last access to the memory segment; and in response to a determination that an amount of time since a last access for any particular memory segment would exceed a predetermined threshold, introduce into the higher-level computer code at least one of a memory refresh command or a memory access command configured to cause an access to the particular memory segment.

In some embodiments, a memory chip having a software-configurable memory refresh control may include: a plurality of memory banks and a plurality of memory segments included in each of the plurality of memory banks; and a refresh controller including a data storage element storing at least one memory refresh pattern to be implemented in refreshing the plurality of memory segments included in each of the plurality of memory banks, and wherein the memory refresh pattern is configurable using software to identify which of the plurality of memory segments in a particular memory bank are to be refreshed during a refresh cycle and which of the plurality of memory segments in the particular memory bank are not to be refreshed during the refresh cycle.

Consistent with one embodiment of the present disclosure, the method for producing selectable sized memory chips from a wafer is provided. The method includes forming a wafer comprising a group of dies and a coupling circuit, where the dies of the group comprise memory units, and where the coupling circuit is coupled to the dies of the group. The method further includes forming the selectable sized memory chips by at least one of cutting a region of the wafer that comprises the group of dies and the coupling circuit, to provide a single memory chip that comprises the group of dies, and configuring at least one controller associated with the group of dies, to control the group of dies together as a single memory chip, and cutting regions of the wafer, each region of the wafer including a die of the group to provide a plurality of separate memory chips.

Consistent with another embodiment of the present disclosure, a method for producing selectable sized memory chips from a wafer is provided. The method includes, forming a plurality of memory chips on the wafer, the plurality of memory chips arranged along one or more rows, and forming at least one shared input-output bus corresponding to the one or more rows, wherein the at least one shared input-output bus electrically connects at least two of the plurality of memory chips to function together as a single chip. The method may further include cutting at least two of the plurality of memory chips off the wafer with at least one corresponding portion of the shared input-output bus such that at least one memory controller is configurable to control the at least two of the plurality of memory chips to function together as a single chip.

Consistent with another embodiment of the present disclosure, a wafer including memory chips with selectable sizes, is provided. The wafer may include a plurality of memory chips arranged along one or more rows of the wafer and at least one shared input-output bus corresponding to the one or more rows. The wafer may further include a plurality of cutting shapes including the plurality of memory chips and excluding at least a portion of the shared input-output bus.

Some embodiments may include a memory instance providing dual-port functionality. The memory instance may include a plurality of memory banks arranged along at least one row and at least one column; at least one column multiplexer configured to receive, during a single clock cycle, two addresses for reading or writing; and a row decoder configured to cooperate with the at least one column multiplexer to: activate a word line based on the two addresses, wherein the two address share a word line address; retrieve, during a memory access cycle, a first of the two addresses from the at least one column multiplexer by decoding a bitline corresponding to the first address, and retrieve, during the memory access cycle, a second of the two addresses from the at least one column multiplexer by decoding a bitline corresponding to the second address In other embodiments, a memory instance providing dual-port functionality may include: a plurality of memory banks arranged along at least one row and at least one column; at least one row multiplexer or at least one column multiplexer configured to receive, during a single clock cycle, two addresses for reading or writing; and a row decoder and a column decoder configured to cooperate to: retrieve, during a first cycle, a first of the two addresses from the at least one row multiplexer or the at least one column multiplexer, and decode a word line and a bitline corresponding to the first address, and retrieve, during a second cycle that follows the first cycle, a second of the two addresses from the at least one row multiplexer or the at least one column multiplexer, and decode a word line and a bitline corresponding to the second address.

In some embodiments, a memory instance may include: a plurality of memory banks arranged along at least one row and at least one column; at least one row circuit and at least one column circuit configured to function as switches; and a row decoder and a column decoder configured to cooperate to: during a memory clock cycle, retrieve a first of two addresses by: activating ones of the at least one row circuit and the at least one column circuit corresponding to the first address by transmitting one or more control signals to close ones of the switching elements corresponding to the first address, and using at least one row multiplexer and at least one column multiplexer of the memory chip to decode a word line and a bitline corresponding to the first address, and during the memory clock cycle, retrieve a second of the two addresses by: activating ones of the at least one row circuit and the at least one column circuit corresponding to the second address by transmitting one or more control signals to close ones of the switching elements corresponding to the second address, and using the at least one row multiplexer and the at least one column multiplexer to decode a word line and a bitline corresponding to the second address.

In other embodiments, a memory mat for dual-port access may include: a plurality of memory cells arranged along at least one row and at least one column and comprising a plurality of capacitive elements; at least two row decoders for activating the at least one row; at least two column multiplexers for activating the at least one column; and a first plurality of conductive lines connecting the memory cells to a first of the at least two row decoders and a first of the at least two column multiplexers; and a second plurality of conductive lines connecting the memory cells to a second of the at least two row decoders and a second of the at least two column multiplexers.

In some embodiments, an integrated circuit may comprise a memory unit comprising memory cells, an output port, and read circuitry; and a processing unit. The read circuitry may comprise a reduction unit and a first group of in-memory read paths for outputting up to a first number of bits through the output port. The processing unit may be configured to send to the memory unit a read request for reading a second number of bits from the memory unit. The reduction unit may be configured to control the in-memory read paths, during a read operation triggered by the read request, based on the first number of bits and the second number of bits.

Another embodiment may include integrated circuit that comprises a memory unit comprising memory cells, an output port, and write circuitry; and a processing unit. The write circuitry may comprise a reduction unit and a first group of in-memory write paths for outputting up to a first number of bits through the output port. The processing unit may be configured to send to the memory unit a write request for writing a second number of bits from the memory unit. The reduction unit may be configured to control the in-memory write paths, during a write operation triggered by the write request, based on the first number of bits and the second number of bits.

Some embodiments may include a method for energy reduction of an integrated circuit. The method may include sending, by a processing unit of the integrated circuit and to a memory unit of the integrated circuit, a read request for reading a second number of bits from the memory unit; wherein the memory unit comprises memory cells, an output port, and read circuitry that comprises a reduction unit and a first group of in-memory read paths for outputting up to a first number of bits through the output port; and controlling, by the reduction unit, the in-memory read paths, during a read operation triggered by the read request, based on the first number of bits and the second number of bits.

In some embodiments, a memory unit may include a first memory mat; a second memory mat; and an activation unit that is configured to activate a first group of memory cells included in the first memory mat without activating a second group of memory cells included in the second memory mat, wherein the first group of memory cells and the second group of memory cells both belong to a single row of the memory unit.

Another embodiment may include a memory unit that comprises a first memory mat, a second memory mat; and an activation unit that is configured to supply an activation signal to a first group of memory cells of the first memory mat and delay a supply of the activation signal to a second group of memory cells of the second memory mat at least until activation of the first group of memory cells has been completed. The first group of memory cells and the second group of memory cells may belong to a single row of the memory unit.

In some embodiments, a memory unit may comprise a first memory mat, a second memory mat, and an isolation unit. The isolation unit may be configured to isolate first memory cells of the first memory mat from second memory cells of the second memory mat during an initial activation period in which the first memory cells are activated; and couple the first memory cells to the second memory cells following the initial activation period; wherein the first and second memory cells belong to a single row of the memory unit.

Some embodiments may include a method for operating a memory unit. The method may include activating, by an activation unit, a first group of memory cells included in a first memory mat of the memory unit without activating a second group of memory cells included in a second memory mat of the memory unit. The first group of memory cells and the second group of memory cells may both belong to a single row of the memory unit.

In some embodiments, an integrated circuit may comprise a substrate; a memory array disposed on the substrate; a processing array disposed on the substrate; and an interface disposed on the substrate. The memory array may comprise multiple memory banks, the processing array may comprise a plurality of testing units, the plurality of testing units may be configured to test the multiple memory banks to provide test results, and the interface may be configured to output, outside the integrated circuit, information indicative of the test results.

Another embodiment may include an integrated circuit comprising a substrate; a memory array disposed on the substrate; a processing array disposed on the substrate; and an interface disposed on the substrate. The memory array may comprise multiple memory banks, the interface may be configured to receive configuration information that comprises instructions, the processing array may be configured to execute the instructions to access the memory array, perform computational operations and provide results, and the interface may be configured to output, outside the integrated circuit, information indicative of the results.

Some embodiments may include a method for testing memory banks of an integrated circuit. The method may include receiving a request to test memory banks of an integrated circuit, the integrated circuit comprising a substrate, a memory array that is disposed on the substrate and comprises the memory banks, a processing array disposed on the substrate, and an interface disposed on the substrate; wherein the processing array comprises a plurality of testing units; testing, by the plurality of testing units and in response to the request, the multiple memory banks to provide test results; and outputting, by the interface and outside the integrated circuit, information indicative of the test results.

In some embodiments, a method for testing memory banks of an integrated circuit may comprise receiving by an interface of an integrated circuit, configuration information that comprises instructions, the integrated circuit comprising a substrate, a memory array that comprises memory bank and is disposed on the substrate, a processing array disposed on the substrate; and an interface disposed on the substrate; executing, by the processing array, the instructions by accessing the memory array, performing computational operations and provide result; and outputting, by the interface and outside the integrated circuit, information indicative of the results.

Consistent with other disclosed embodiments, non-transitory computer-readable storage media may store program instructions, which are executed by at least one processing device and perform any of the methods described herein.

The foregoing general description and the following detailed description are exemplary and explanatory only and are not restrictive of the claims.

BRIEF DESCRIPTION OF THE DRAWINGS

The accompanying drawings, which are incorporated in and constitute a part of this disclosure, illustrate various disclosed embodiments. In the drawings:

FIGS. 41B-41C are example flowcharts of processes of determining cutting patterns for cutting one or more groups of memory chips from a wafer consistent with the present disclosure.

DETAILED DESCRIPTION

Figure 1:
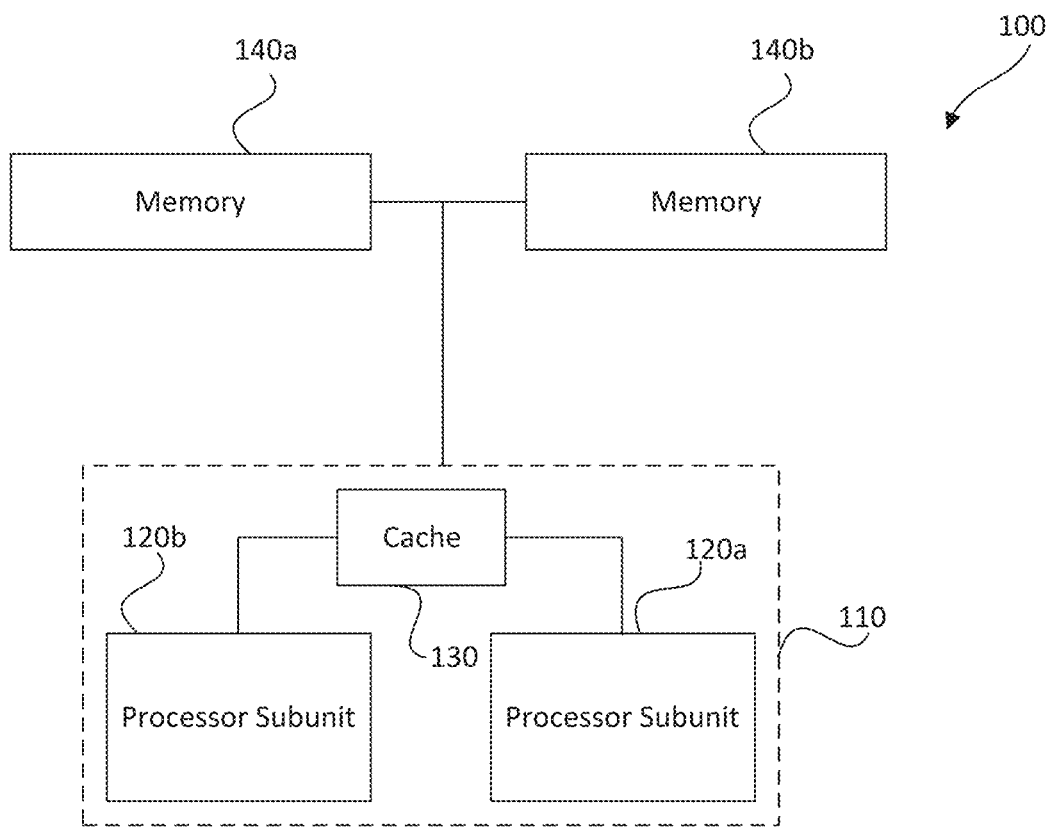
FIG. 1 is a diagrammatic representation of a central processing unit (CPU).

The following detailed description refers to the accompanying drawings. Wherever convenient, the same reference numbers are used in the drawings and the following description to refer to the same or similar parts. While several illustrative embodiments are described herein, modifications, adaptations and other implementations are possible. For example, substitutions, additions or modifications may be made to the components illustrated in the drawings, and the illustrative methods described herein may be modified by substituting, reordering, removing, or adding steps to the disclosed methods. Accordingly, the following detailed description is not limited to the disclosed embodiments and examples. Instead, the proper scope is defined by the appended claims.

Processor Architecture

As used throughout this disclosure, the term "hardware chip" refers to a semiconductor wafer (such as silicon or the like) on which one or more circuit elements (such as transistors, capacitors, resistors, and/or the like) are formed. The circuit elements may form processing elements or memory elements. A "processing element" refers to one or more circuit elements that, together, perform at least one logic function (such as an arithmetic function, a logic gate, other Boolean operations, or the like). A processing element may be a general-purpose processing element (such as a configurable plurality of transistors) or a special-purpose processing element (such as a particular logic gate or a plurality of circuit elements designed to perform a particular logic function). A "memory element" refers to one or more circuit elements that can be used to store data. A "memory element" may also be referred to as a "memory cell." A memory element may be dynamic (such that electrical refreshes are required to maintain the data store), static (such that data persists for at least some time after power loss), or non-volatile memories.

Processing elements may be joined to form processor subunits. A "processor subunit" may thus comprise a smallest grouping of processing elements that may execute at least one task or instructions (e.g., of a processor instruction set). For example, a subunit may comprise one or more general-purpose processing elements configured to execute instructions together, one or more general-purpose processing elements paired with one or more special-purpose processing elements configured to execute instructions in a complementary fashion, or the like. The processor subunits may be arranged on a substrate (e.g., a wafer) in an array. Although the "array" may comprise a rectangular shape, any arrangement of the subunits in the array may be formed on the substrate.

Memory elements may be joined to form memory banks. For example, a memory bank may comprise one or more lines of memory elements linked along at least one wire (or other conductive connection). Furthermore, the memory elements may be linked along at least one addition wire in another direction. For example, the memory elements may be arranged along wordlines and bitlines, as explained below. Although the memory bank may comprise lines, any arrangement of the elements in the bank may be used to form the bank on the substrate. Moreover, one or more banks may be electrically joined to at least one memory controller to form a memory array. Although the memory array may comprise a rectangular arrangement of the banks, any arrangement of the banks in the array may be formed on the substrate.

As further used throughout this disclose, a "bus" refers to any communicative connection between elements of a substrate. For example, a wire or a line (forming an electrical connection), an optical fiber (forming an optical connection), or any other connection conducting communications between components may be referred to as a "bus."

Conventional processors pair general-purpose logic circuits with shared memories. The shared memories may store both instruction sets for execution by the logic circuits as well as data used for and resulting from execution of the instruction sets. As described below, some conventional processors use a caching system to reduce delays in performing pulls from the shared memory; however, conventional caching systems remain shared. Conventional processors include central processing units (CPUs), graphics processing units (GPUs), various application-specific integrated circuits (ASICs), or the like. FIG. 1 shows an example of a CPU, and FIG. 2 shows an example of a GPU.

As shown in FIG. 1, a CPU 100 may comprise a processing unit 110 that includes one or more processor subunits, such as processor subunit 120a and processor subunit 120b. Although not depicted in FIG. 1, each processor subunit may comprise a plurality of processing elements. Moreover, the processing unit 110 may include one or more levels of on-chip cache. Such cache elements are generally formed on the same semiconductor die as processing unit 110 rather than being connected to processor subunits 120a and 120b via one or more buses formed in the substrate containing processor subunits 120a and 120b and the cache elements. An arrangement directly on the same die, rather than being connected via buses, is common for both first-level (L1) and second-level (L2) caches in conventional processors. Alternatively, in older processors, L2 caches were shared amongst processor subunits using back-side buses between the subunits and the L2 caches. Back-side buses are generally larger than front-side buses, described below. Accordingly, because cache is to be shared with all processor subunits on the die, cache 130 may be formed on the same die as processor subunits 120a and 120b or communicatively coupled to processor subunits 120a and 120b via one or more back-side buses. In both embodiments without buses (e.g., cache is formed directly on-die) as well as embodiments using back-side buses, the caches are shared between processor subunits of the CPU.

Moreover, processing unit 110 communicates with shared memory 140a and memory 140b. For example, memories 140a and 140b may represent memory banks of shared dynamic random access memory (DRAM). Although depicted with two banks, most conventional memory chips include between eight and sixteen memory banks. Accordingly, processor subunits 120a and 120b may use shared memories 140a and 140b to store data that is then operated upon by processor subunits 120a and 120b. This arrangement, however, results in the buses between memories 140a and 140b and processing unit 110 acting as a bottleneck when the clock speeds of processing unit 110 exceed data transfer speeds of the buses. This is generally true for conventional processors, resulting in lower effective processing speeds than the stated processing speeds based on clock rate and number of transistors.

Figure 2:
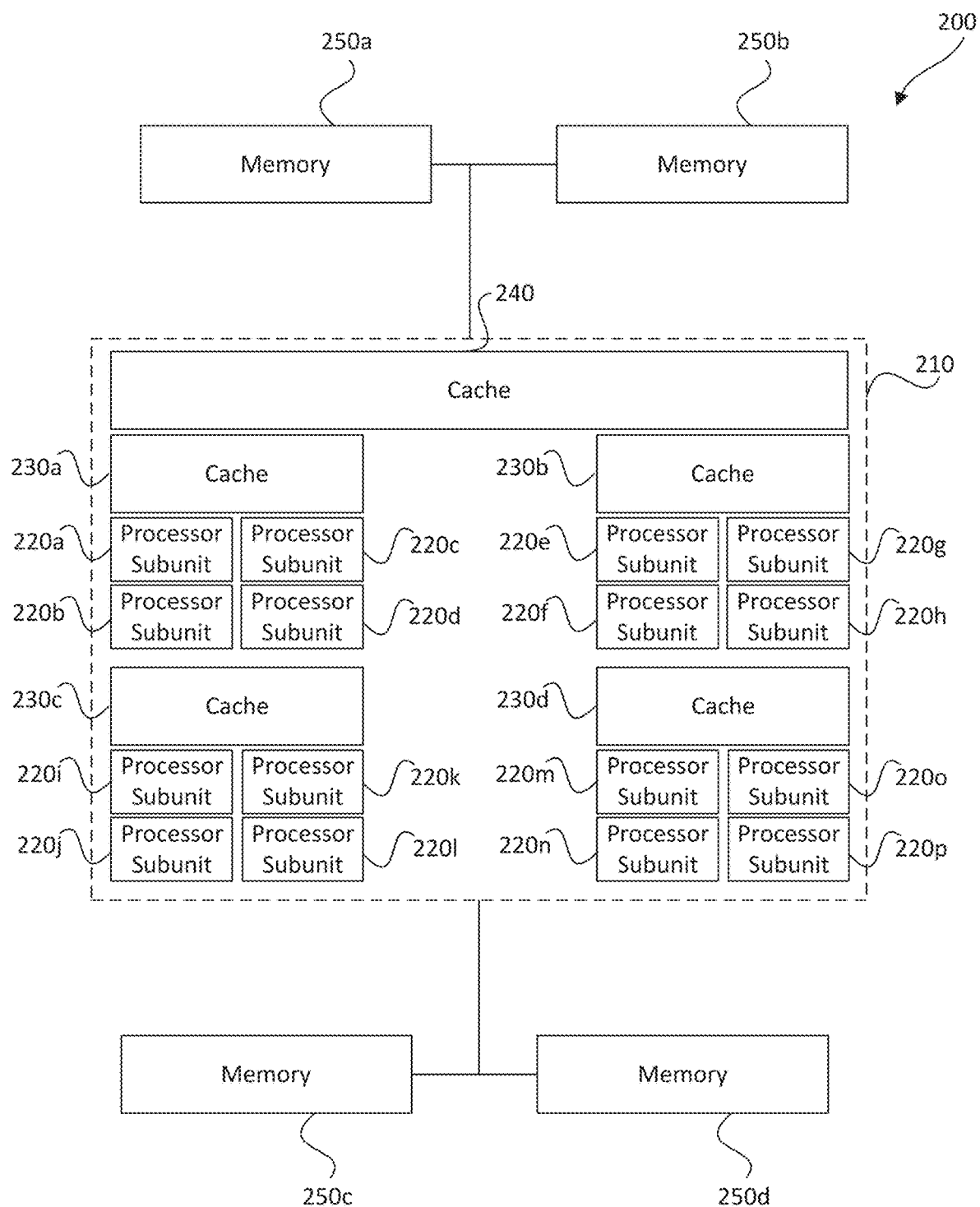
FIG. 2 is a diagrammatic representation of a graphics processing unit (GPU).

As shown in FIG. 2, similar deficiencies persist in GPUs. A GPU 200 may comprise a processing unit 210 that includes one or more processor subunits (e.g., subunits 220a, 220b, 220c, 220d, 220e, 220f, 220g, 220h, 220i, 220j, 220k, 220l, 220m, 220n, 220o, and 220p). Moreover, the processing unit 210 may include one or more levels of on-chip cache and/or register files. Such cache elements are generally formed on the same semiconductor die as processing unit 210. Indeed, in the example of FIG. 2, cache 210 is formed on the same die as processing unit 210 and shared amongst all of the processor subunits, while caches 230a, 230b, 230c, and 230d are formed on a subset of the processor subunits, respectively, and dedicated thereto.

Moreover, processing unit 210 communicates with shared memories 250a, 250b, 250c, and 250d. For example, memories 250a, 250b, 250c, and 250d may represent memory banks of shared DRAM. Accordingly, the processor subunits of processing unit 210 may use shared memories 250a, 250b, 250c, and 250d to store data that is then operated upon by the processor subunits. This arrangement, however, results in the buses between memories 250a, 250b, 250c, and 250d and processing unit 210 acting as a bottleneck, similar to the bottleneck described above for CPUs.

Overview of Disclosed Hardware Chips

Figure 3A:
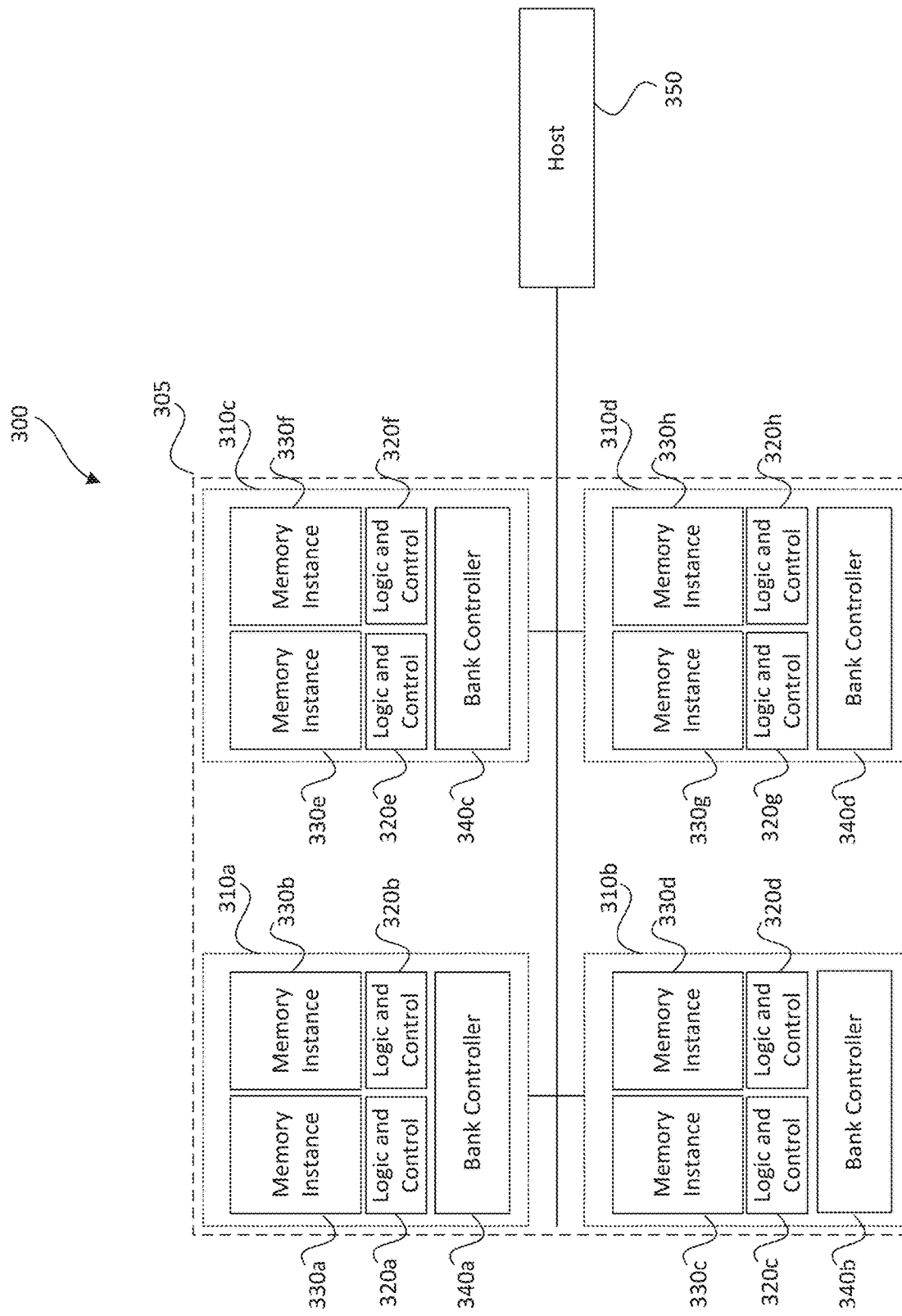
FIG. 3A is a diagrammatic representation of an embodiment of an exemplary hardware chip consistent with the disclosed embodiments.

FIG. 3A is a diagrammatic representation of an embodiment depicting an exemplary hardware chip 300. Hardware chip 300 may comprise a distributed processor designed to mitigate the bottlenecks described above for CPUs, GPUs, and other conventional processors. A distributed processor may include a plurality of processor subunits distributed spatially on a single substrate. Moreover, as explained above, in distributed processors of the present disclosure, corresponding memory banks are also spatially distributed on the substrate. In some embodiments, a distributed processor may be associated with a set of instructions, and each one of the processor subunits of the distributed processor may be responsible for performing one or more tasks included in the set of instructions.

As depicted in FIG. 3A, hardware chip 300 may comprise a plurality of processor subunits, e.g., logic and control subunits 320a, 320b, 320c, 320d, 320e, 320f, 320g, and 320h. As further depicted in FIG. 3A, each processor subunit may have a dedicated memory instance. For example, logic and control subunit 320a is operably connected to dedicated memory instance 330a, logic and control subunit 320b is operably connected to dedicated memory instance 330b, logic and control subunit 320c is operably connected to dedicated memory instance 330c, logic and control subunit 320d is operably connected to dedicated memory instance 330*d*, logic and control subunit 320*e* is operably connected to dedicated memory instance 330*e*, logic and control subunit 320*f* is operably connected to dedicated memory instance 330*f*, logic and control subunit 320*g* is operably connected to dedicated memory instance 330*g*, and logic and control subunit 320*h* is operably connected to dedicated memory instance 330*h*.

Although FIG. 3A depicts each memory instance as a single memory bank, hardware chip 300 may include two or more memory banks as a dedicated memory instance for a processor subunit on hardware chip 300. Furthermore, although FIG. 3A depicts each processor subunit as comprising both a logic component and a control for the dedicated memory bank(s), hardware chip 300 may use controls for the memory banks that are separate, at least in part, from the logic components. Moreover, as depicted in FIG. 3A, two or more processor subunits and their corresponding memory banks may be grouped, e.g., into processing groups 310*a*, 310*b*, 310*c*, and 310*d*. A "processing group" may represent a spatial distinction on a substrate on which hardware chip 300 is formed. Accordingly, a processing group may include further controls for the memory banks in the group, e.g., controls 340*a*, 340*b*, 340*c*, and 340*d*. Additionally or alternatively, a "processing group" may represent a logical grouping for the purposes of compiling code for execution on hardware chip 300. Accordingly, a compiler for hardware chip 300 (further described below) may divide an overall set of instructions between the processing groups on hardware chip 300.

Furthermore, host 350 may provide instructions, data, and other input to hardware chip 300 and read output from the same. Accordingly, a set of instructions may be executed entirely on a single die, e.g., the die hosting hardware chip 300. Indeed, the only communications off-die may include the loading of instructions to hardware chip 300, any input sent to hardware chip 300, and any output read from hardware chip 300. Accordingly, all calculations and memory operations may be performed on-die (on hardware chip 300) because the processor subunits of hardware chip 300 communicate with dedicated memory banks of hardware chip 300.

Figure 3B:
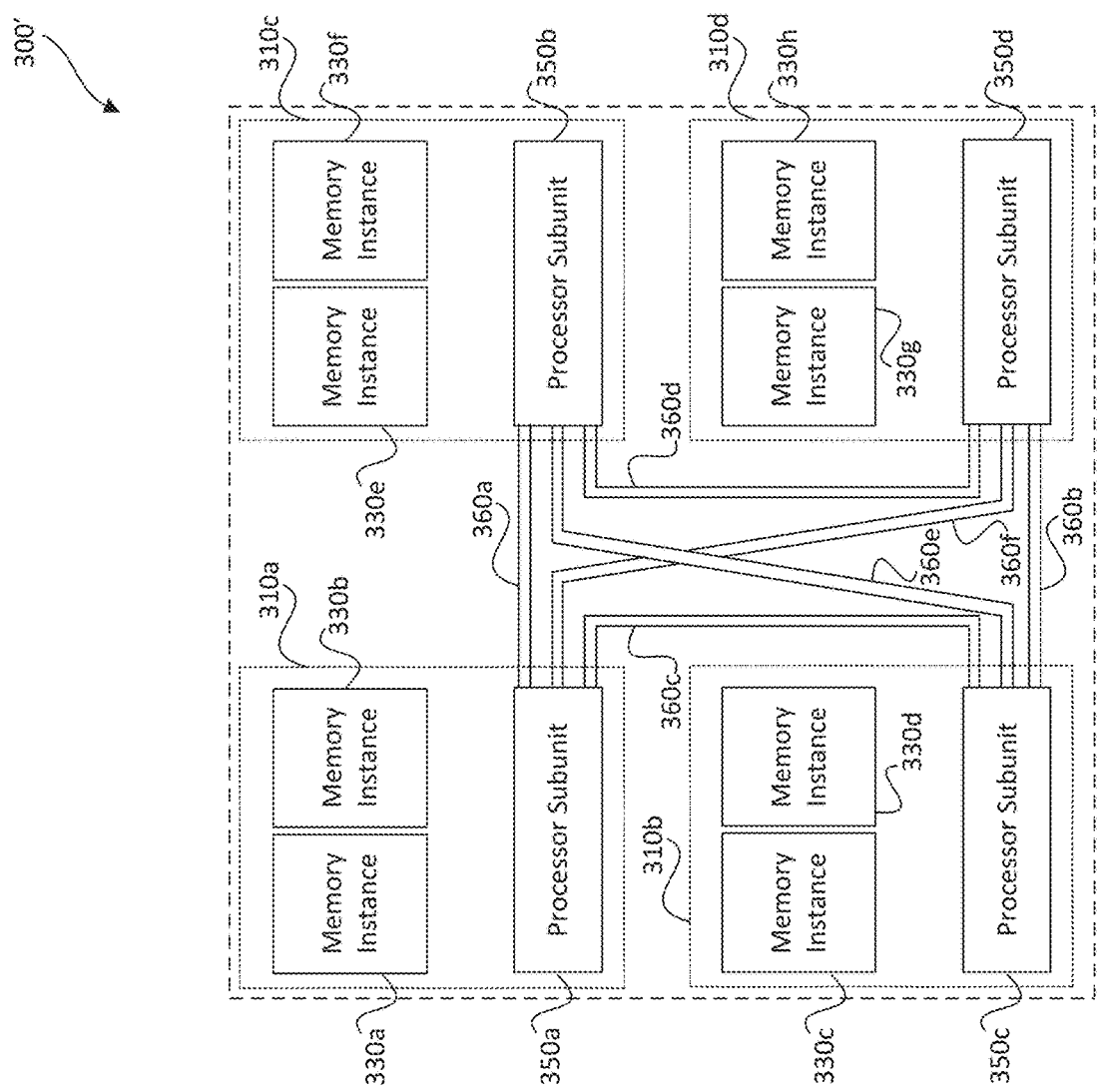
FIG. 3B is a diagrammatic representation of another embodiment of an exemplary hardware chip consistent with the disclosed embodiments.

FIG. 3B is a diagrammatic representation of an embodiment depicting another exemplary hardware chip 300'. Although depicted as an alternative to hardware chip 300, the architecture depicted in FIG. 3B may be combined, at least in part, with the architecture depicted in FIG. 3A.

As depicted in FIG. 3B, hardware chip 300' may comprise a plurality of processor subunits, e.g., processor subunits 350*a*, 350*b*, 350*c*, and 350*d*. As further depicted in FIG. 3B, each processor subunit may have a plurality of dedicated memory instances. For example, processor subunit 350*a* is operably connected to dedicated memory instances 330*a* and 330*b*, processor subunit 350*b* is operably connected to dedicated memory instances 330*c* and 330*d*, processor subunit 350*c* is operably connected to dedicated memory instances 330*e* and 330*f*, and processor subunit 350*d* is operably connected to dedicated memory instances 330*g* and 330*h*. Moreover, as depicted in FIG. 3B, the processor subunits and their corresponding memory banks may be grouped, e.g., into processing groups 310*a*, 310*b*, 310*c*, and 310*d*. As explained above, a "processing group" may represent a spatial distinction on a substrate on which hardware chip 300' is formed and/or a logical grouping for the purposes of compiling code for execution on hardware chip 300'.

As further depicted in FIG. 3B, the processor subunits may communicate with each other via buses. For example, as shown in FIG. 3B, processor subunit 350*a* may communicate with processor subunit 350*b* via bus 360*a*, with processor subunit 350*c* via bus 360*c*, and with processor subunit 350*d* via bus 360*f*. Similarly, processor subunit 350*b* may communicate with processor subunit 350*a* via bus 360*a* (as described above), with processor subunit 350*c* via bus 360*e*, and with processor subunit 350*d* via bus 360*d*. In addition, processor subunit 350*c* may communicate with processor subunit 350*a* via bus 360*c* (as described above), with processor subunit 350*b* via bus 360*e* (as described above), and with processor subunit 350*d* via bus 360*b*. Accordingly, processor subunit 350*d* may communicate with processor subunit 350*a* via bus 360*f* (as described above), with processor subunit 350*b* via bus 360*d* (as described above), and with processor subunit 350*c* via bus 360*b* (as described above). One of ordinary skill will understand that fewer buses than depicted in FIG. 3B may be used. For example, bus 360*e* may be eliminated such that communications between processor subunit 350*b* and 350*c* pass through processor subunit 350*a* and/or 350*d*. Similarly, bus 360*f* may be eliminated such that communications between processor subunit 350*a* and processor subunit 350*d* pass through processor subunit 350*b* or 350*c*.

Moreover, one of ordinary skill will understand that architectures other than those depicted in FIGS. 3A and 3B may be used. For example, an array of processing groups, each with a single processor subunit and memory instance, may be arranged on a substrate. Processor subunits may additionally or alternatively form part of controllers for corresponding dedicated memory banks, part of controllers for memory mats of corresponding dedicated memory, or the like.

In view of the architecture described above, hardware chips 300 and 300' may provide significant increases in efficiency for memory-intensive tasks as compared with traditional architectures. For example, database operations and artificial intelligence algorithms (such as neural networks) are examples of memory-intensive tasks for which traditional architectures are less efficient than hardware chips 300 and 300'. Accordingly, hardware chips 300 and 300' may be referred to as database accelerator processors and/or artificial intelligence accelerator processors.

Configuring the Disclosed Hardware Chips

The hardware chip architecture described above may be configured for execution of code. For example, each processor subunit may individually execute code (defining a set of instructions) apart from other processor subunits in the hardware chip. Accordingly, rather than relying on an operating system to manage multithreading or using multitasking (which is concurrency rather than parallelism), hardware chips of the present disclosure may allow for processor subunits to operate fully in parallel.

In addition to a fully parallel implementation described above, at least some of the instructions assigned to each processor subunit may be overlapping. For example, a plurality of processor subunits on a distributed processor may execute overlapping instructions as, for example, an implementation of an operating system or other management software, while executing non-overlapping instructions in order to perform parallel tasks within the context of the operating system or other management software.

Figure 4:
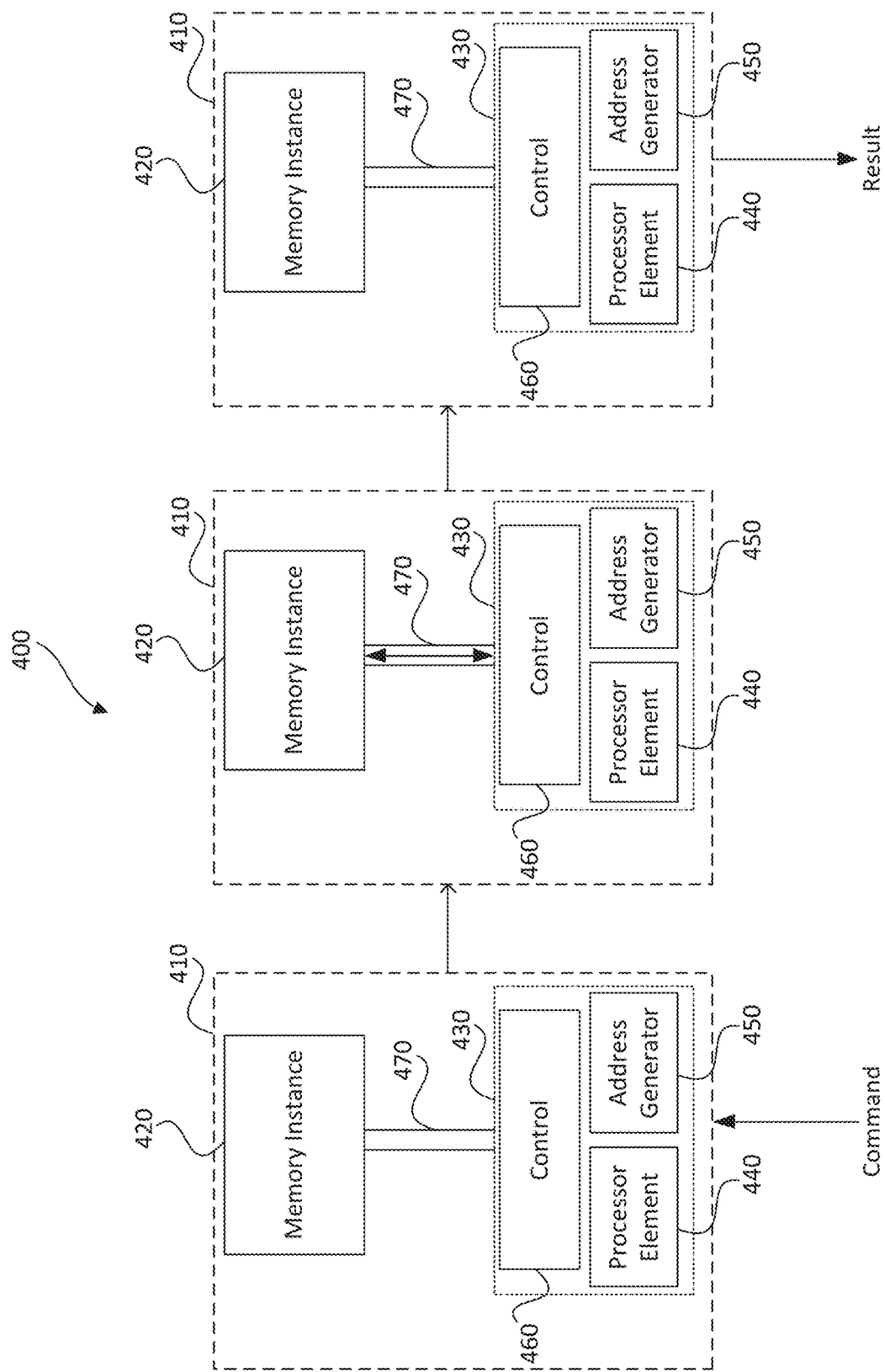
FIG. 4 is a diagrammatic representation of a generic command executed by an exemplary hardware chip consistent with the disclosed embodiments.

FIG. 4 depicts an exemplary process 400 for executing a generic command with processing group 410. For example, processing group 410 may comprise a portion of a hardware chip of the present disclosure, e.g., hardware chip 300, hardware chip 300', or the like.

As depicted in FIG. 4, a command may be sent to processor subunit 430, which is paired with dedicated memory instance 420. An external host (e.g., host 350) may send the command to processing group 410 for execution. Alternatively, host 350 may have sent an instruction set including the command for storage in memory instance 420 such that processor subunit 430 may retrieve the command from memory instance 420 and execute the retrieved command. Accordingly, the command may be executed by processing element 440, which is a generic processing element configurable to execute the received command. Moreover, processing group 410 may include a control 460 for memory instance 420. As depicted in FIG. 4, control 460 may perform any reads and/or writes to memory instance 420 required by processing element 440 when executing the received command. After execution of the command, processing group 410 may output the result of the command, e.g., to the external host or to a different processing group on the same hardware chip.

In some embodiments, as depicted in FIG. 4, processor subunit 430 may further include an address generator 450. An "address generator" may comprise a plurality of processing elements that are configured to determine addresses in one or more memory banks for performing reads and writes and may also perform operations on the data located at the determined addresses (e.g., addition, subtraction, multiplication, or the like). For example, address generator 450 may determine addresses for any reads or writes to memory. In one example, address generator 450 may increase efficiency by overwriting a read value with a new value determined based on the command when the read value is no longer needed. Additionally or alternatively, address generator 450 may select available addresses for storage of results from execution of the command. This may allow for scheduling of result read-off for a later clock cycle, when it is more convenient for the external host. In another example, address generator 450 may determine addresses to read from and write to during a multi-cycle calculation, such as a vector or matrix multiply-accumulate calculation. Accordingly, address generator 450 may maintain or calculate memory addresses for reading data and writing intermediate results of the multi-cycle calculation such that processor subunit 430 may continue processing without having to store these memory addresses.

Figure 5:
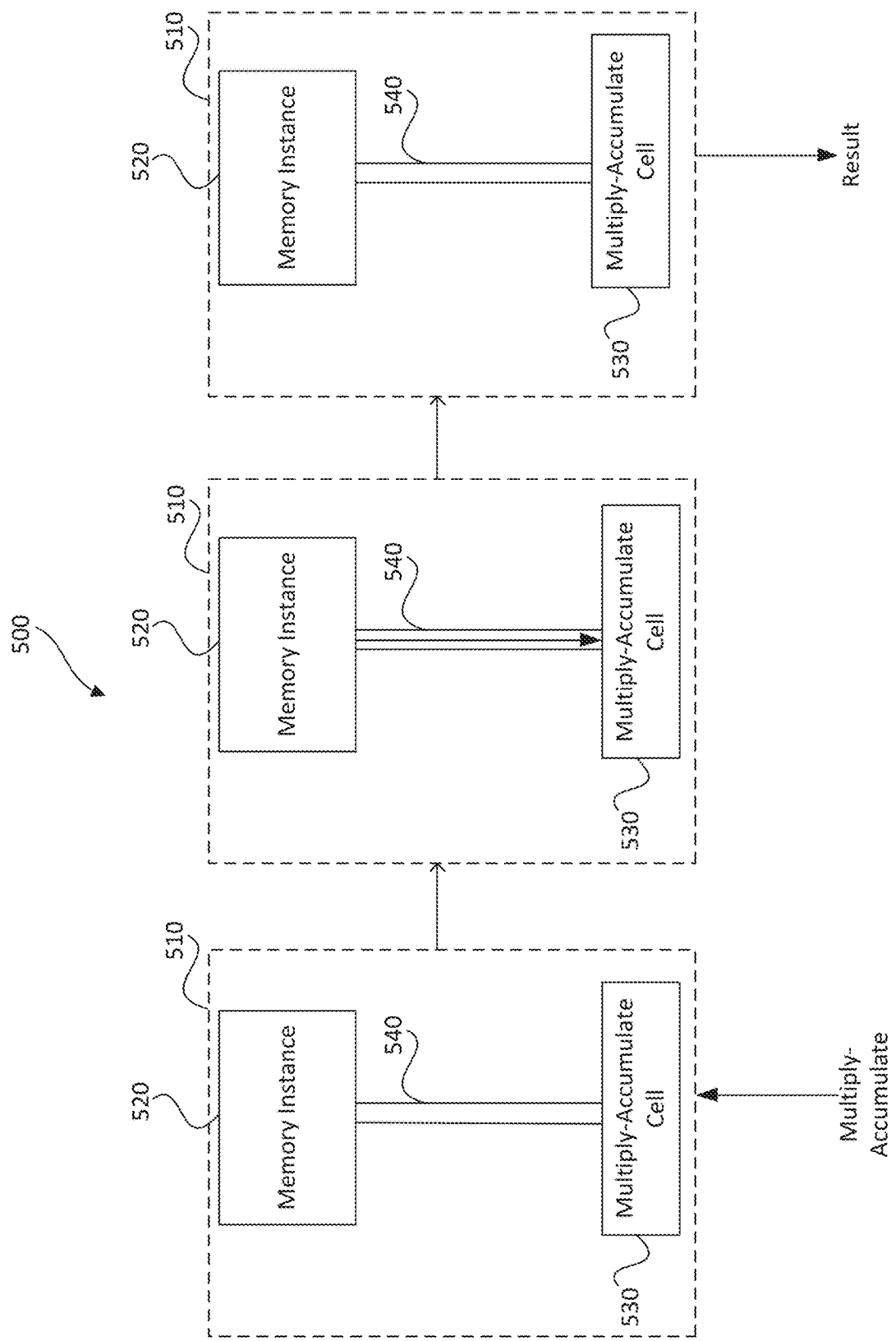
FIG. 5 is a diagrammatic representation of a specialized command executed by an exemplary hardware chip consistent with the disclosed embodiments.

FIG. 5 depicts an exemplary process 500 for executing a specialized command with processing group 510. For example, processing group 510 may comprise a portion of a hardware chip of the present disclosure, e.g., hardware chip 300, hardware chip 300', or the like.

As depicted in FIG. 5, a specialized command (e.g., a multiply-accumulate command) may be sent to processing element 530, which is paired with dedicated memory instance 520. An external host (e.g., host 350) may send the command to processing element 530 for execution. Accordingly, the command may be executed at a given signal from the host by processing element 530, a specialized processing element configurable to execute particular commands (including the received command). Alternatively, processing element 530 may retrieve the command from memory instance 520 for execution. Thus, in the example of FIG. 5, processing element 530 is a multiply-accumulate (MAC) circuit configured to execute MAC commands received from the external host or retrieved from memory instance 520. After execution of the command, processing group 410 may output the result of the command, e.g., to the external host or to a different processing group on the same hardware chip. Although depicted with a single command and a single result, a plurality of commands may be received or retrieved and executed, and a plurality of results may be combined on processing group 510 before output.

Although depicted as a MAC circuit in FIG. 5, additional or alternative specialized circuits may be included in processing group 510. For example, a MAX-read command (which returns the max value of a vector) a MAX0-read command (a common function also termed a rectifier, which returns the entire vector but also does MAX with 0), or the like may be implemented.

Although depicted separately, the generalized processing group 410 of FIG. 4 and the specialized processing group 510 of FIG. 5 may be combined. For example, a generic processor subunit may be coupled to one or more specialized processor subunits to form a processor subunit. Accordingly, the generic processor subunit may be used for all instructions not executable by the one or more specialized processor subunits.

One of ordinary skill will understand that neural network implementation and other memory-intensive tasks may be handled with specialized logic circuits. For example, database queries, packet inspection, string comparison, and other functions may increase in efficiency if executed by the hardware chips described herein.

A Memory-Based Architecture for Distributed Processing

On hardware chips consistent with the present disclosure, dedicated buses may transfer data between processor subunits on the chip and/or between the processor subunits and their corresponding dedicated memory banks. The use of dedicated buses may reduce arbitration costs because competing requests are either not possible or easily avoided using software rather than hardware.

Figure 6:
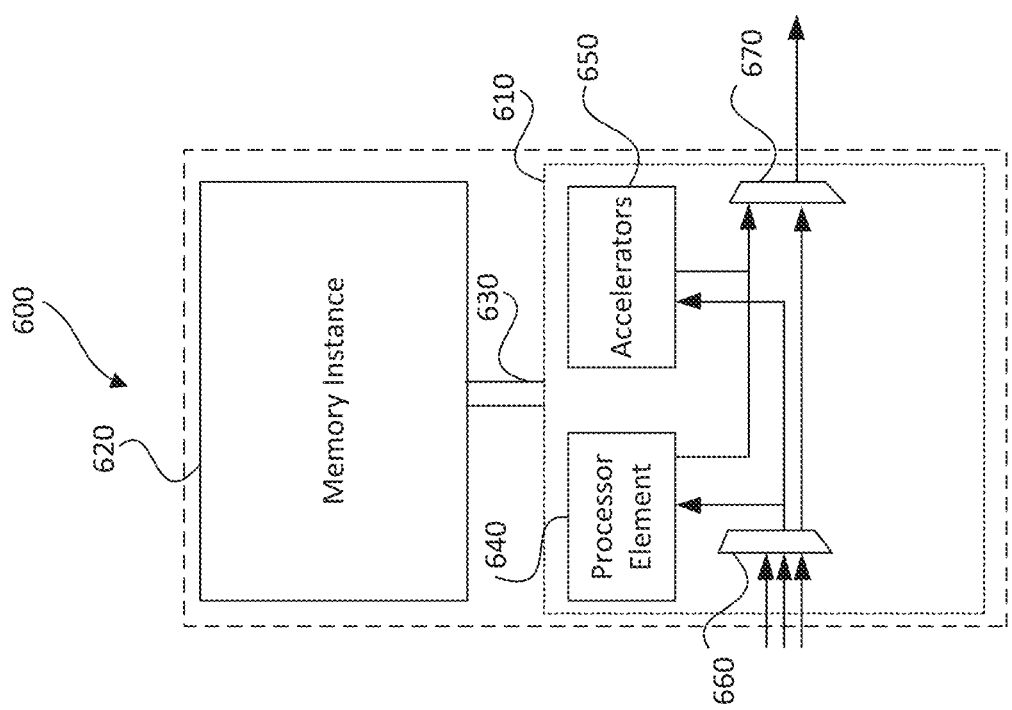
FIG. 6 is a diagrammatic representation of a processing group for use in an exemplary hardware chip consistent with the disclosed embodiments.

FIG. 6 schematically depicts a diagrammatic representation of a processing group 600. Processing group 600 may be for use in a hardware chip, e.g., hardware chip 300, hardware chip 300', or the like. Processor subunit 610 may be connected via buses 630 to memory 620. Memory 620 may comprise a Randomly Accessible Memory (RAM) element that stores data and code for execution by processor subunit 610. In some embodiments, memory 620 may be an N-Way memory (wherein N is a number equal to or larger than 1 that implies the number of segments in an interleaved memory 620). Because processor subunit 610 is coupled to memory 620 dedicated to processor subunit 610 via bus 630, N may be kept relatively small without compromising the execution performance. This represents an improvement over conventional multiway register files or caches where a lower N generally results in lower execution performance, and a higher N generally results in large area and power loss.

The size of memory 620, the number of ways, and the width of bus 630 may be adjusted to meet the requirements of tasks and application implementations of a system using processing group 600 according to, for instance, the size of data involved in the task or tasks. Memory element 620 may comprise one or more types of memory known in the art, e.g., volatile memory (such as RAM, DRAM, SRAM, phase-change RAM (PRAM), magnetoresistive RAM (MRAM), resistive RAM (ReRAM), or the like) or non-volatile memory (such as flash or ROM). According to some embodiments, a portion of memory element 620 may comprise a first memory type, while another portion may comprise another memory type. For instance, the code region of a memory element 620 may comprise a ROM element, while a data region of the memory element 620 may comprise a DRAM element. Another example for such partitioning is storing the weights of a neural network in flash while storing the data for calculation in DRAM.

Processor subunit 610 comprises a processing element 640 that may comprise a processor. The processor can be pipelined or not pipelined, a customized Reduced Instruction Set Computing (RISC) element or other processing scheme, implemented on any commercial Integrated Circuit (IC) known in the art (such as ARM, ARC, RISC-V, etc.), as appreciated by one of ordinary skill. Processing element 640 may comprise a controller that, in some embodiments, includes an Arithmetic Logic Unit (ALU) or other controller.

According to some embodiments, processing element 640, which executes received or stored code, may comprise a generic processing element and, therefore, be flexible and capable of performing a wide variety of processing operations. Non-dedicated circuitry typically consumes more power than specific-operation-dedicated circuitry when comparing the power consumed during performance for a specific operation. Therefore, when performing specific complex arithmetic calculations, processing element 640 may consume more power and perform less efficiently than dedicated hardware. Therefore, according to some embodiments, a controller of processing element 640 may be designed to perform specific operations (e.g., addition or "move" operations).

In one example, the specific operations may be performed by one or more accelerators 650. Each accelerator may be dedicated and programmed to perform a specific calculation (such as multiplication, floating point vector operations, or the like). By using accelerator(s), the average power consumed per calculation per processor subunit may be lowered, and the calculation throughput henceforth increases. Accelerator(s) 650 may be chosen according to an application that the system is designed to implement (e.g., execution of neural networks, execution of database queries, or the like). Accelerator(s) 650 may be configured by processing element 640 and may operate in tandem therewith for lowering power consumption and accelerating calculations and computations. The accelerators may additionally or alternatively be used to transfer data between memory and MUXs/DEMUXs/input/output ports (e.g., MUX 650 and DEMUX 660) of processing group 600, such as a smart DMA (direct memory access) peripheral.

Accelerator(s) 650 may be configured to perform a variety of functions. For instance, one accelerator may be configured to perform 16-bit floating point calculation or 8-bit integer calculations, which are often used in neural networks. Another example of an accelerator function is a 32-bit floating point calculation, which is often used during a training stage of a neural network. Yet another example of an accelerator function is query processing, such as that used in databases. In some embodiments, accelerator(s) 650 may comprise specialized processing elements to perform these functions and/or may be configured according to configuration data, stored on the memory element 620, such that it may be modified.

Accelerator(s) 650 may additionally or alternatively implement a configurable scripted list of memory movements to time movements of data to/from memory 620 or to/from other accelerators and/or inputs/outputs. Accordingly, as explained further below, all the data movement inside the hardware chip using processing group 600 may use software synchronization rather than hardware synchronization. For example, an accelerator in one processing group (e.g., group 600) may transfer data from its input to its accelerator every tenth cycle and then output data at the next cycle, thereby letting the information flow from the memory of the processing group to another one.

As further depicted in FIG. 6, in some embodiments, processing group 600 may further comprise at least one input multiplexer (MUX) 660 connected to its input port and at least one output DEMUX 670 connected to its output port. These MUXs/DEMUXs may be controlled by control signals (not shown) from processing element 640 and/or from one of accelerator(s) 650, determined according to a current instruction being carried out by processing element 640 and/or the operation executed by an accelerator of accelerator(s) 650. In some scenarios, processing group 600 may be required (according to a predefined instruction from its code memory) to transfer data from its input port to its output port. Accordingly, one or more of the input MUXs (e.g., MUX 660) may be directly connected via one or more buses to an output DEMUX (e.g., DEMUX 670), in addition to each of the DEMUXs/MUXs being connected to processing element 640 and accelerator(s) 650.

Figure 7A:
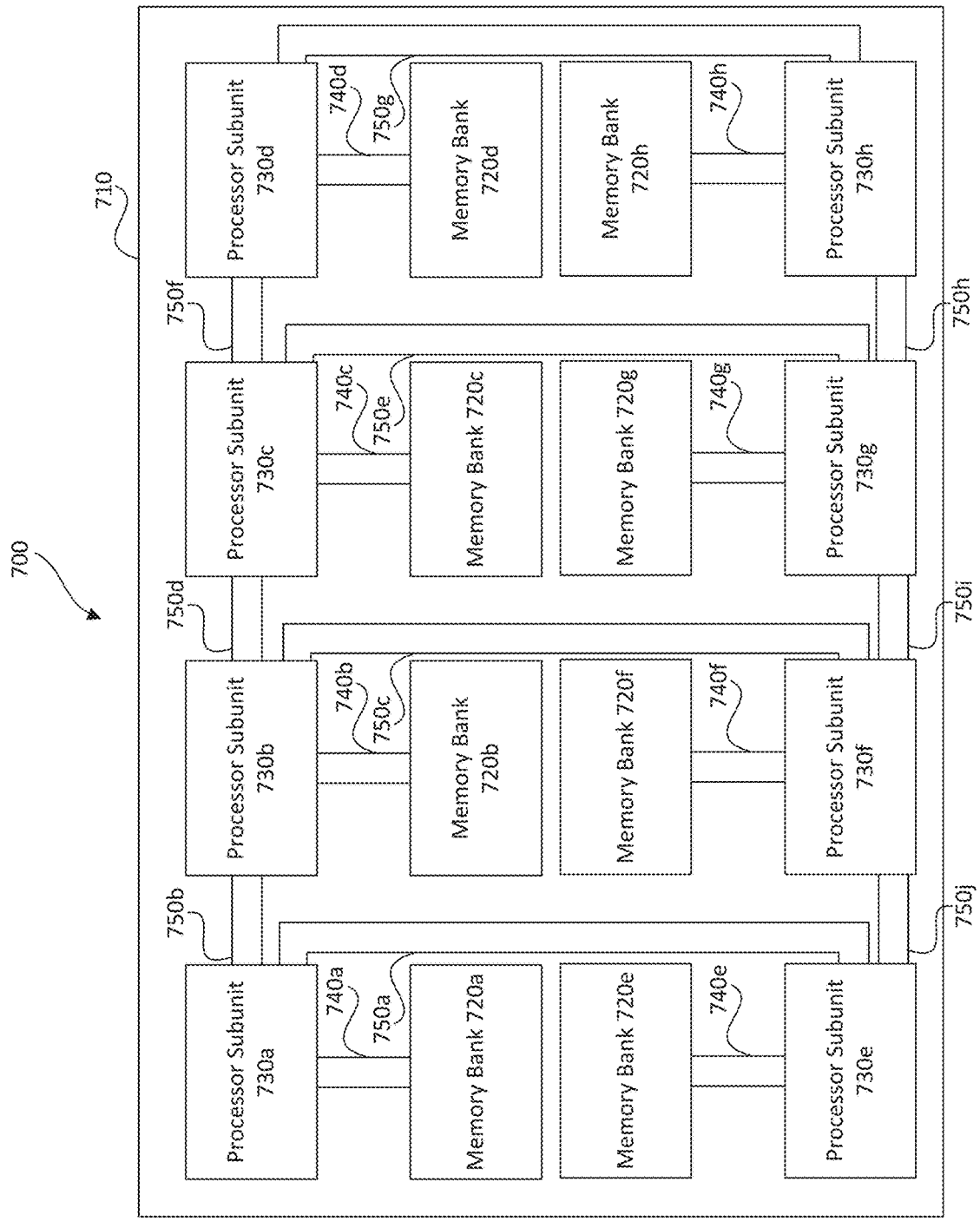
FIG. 7A is a diagrammatic representation of a rectangular array of processing groups consistent with the disclosed embodiments.

The processing group 600 of FIG. 6 may be arrayed to form a distributed processor, for example, as depicted in FIG. 7A. The processing groups may be disposed on substrate 710 to form an array. In some embodiments, substrate 710 may comprise a semiconductor substrate, such as silicon. Additionally or alternatively, substrate 710 may comprise a circuit board, such as a flexible circuit board.

As depicted in FIG. 7A, substrate 710 may include, disposed thereon, a plurality of processing groups, such as processing group 600. Accordingly, substrate 710 includes a memory array that includes a plurality of banks, such as banks 720a, 720b, 720c, 720d, 720e, 720f, 720g, and 720h. Furthermore, substrate 710 includes a processing array that may include a plurality of processor subunits, such as subunits 730a, 730b, 730c, 730d, 730e, 730f, 730g, and 730h.

Furthermore, as explained above, each processing group may include a processor subunit and one or more corresponding memory banks dedicated to the processor subunit. Accordingly, as depicted in FIG. 7A, each subunit is associated with a corresponding, dedicated memory bank, e.g.: Processor subunit 730a is associated with memory bank 720a, processor subunit 730b is associated with memory bank 720b, processor subunit 730c is associated with memory bank 720c, processor subunit 730d is associated with memory bank 720d, processor subunit 730e is associated with memory bank 720e, processor subunit 730f is associated with memory bank 720f, processor subunit 730g is associated with memory bank 720g, processor subunit 730h is associated with memory bank 720h.

To allow each processor subunit to communicate with its corresponding, dedicated memory bank(s), substrate 710 may include a first plurality of buses connecting one of the processor subunits to its corresponding, dedicated memory bank(s). Accordingly, bus 740a connects processor subunit 730a to memory bank 720a, bus 740b connects processor subunit 730b to memory bank 720b, bus 740c connects processor subunit 730c to memory bank 720c, bus 740d connects processor subunit 730d to memory bank 720d, bus 740e connects processor subunit 730e to memory bank 720e, bus 740f connects processor subunit 730f to memory bank 720f, bus 740g connects processor subunit 730g to memory bank 720g, and bus 740h connects processor subunit 730h to memory bank 720h. Moreover, to allow each processor subunit to communicate with other processor subunits, substrate 710 may include a second plurality of buses connecting one of the processor subunits to another of the processor subunits. In the example of FIG. 7A, bus 750a connects processor subunit 730a to processor subunit 750e, bus 750b connects processor subunit 730a to processor subunit 750b, bus 750c connects processor subunit 730b to processor subunit 750f, bus 750d connects processor subunit 730b to processor subunit 750c, bus 750e connects processor subunit 730c to processor subunit 750g, bus 750f connects processor subunit 730c to processor subunit 750d, bus 750g connects processor subunit 730d to processor subunit 750h, bus 750h connects processor subunit 730h to processor subunit 750g, bus 750i connects processor subunit 730g to processor subunit 750g, and bus 750j connects processor subunit 730f to processor subunit 750e.

Accordingly, in the example arrangement shown in FIG. 7A, the plurality of logic processor subunits is arranged in at least one row and at least one column. The second plurality of buses connect each processor subunit to at least one adjacent processor subunit in the same row and to at least one adjacent processor subunit in the same column. FIG. 7A may be referred to as a "partial tile connection."

The arrangement shown in FIG. 7A may be modified to form a "full tile connection." A full tile connection includes additional buses connecting diagonal processor subunits. For example, the second plurality of buses may include additional buses between processor subunit 730a and processor subunit 730f, between processor subunit 730b and processor subunit 730e, between processor subunit 730b and processor subunit 730g, between processor subunit 730c and processor subunit 730f, between processor subunit 730c and processor subunit 730h, and between processor subunit 730d and processor subunit 730g.

A full tile connection may be used for convolution calculations, in which data and results stored in a near processor subunit are used. For example, during convolutional image processing, each processor subunit may receive a tile of the image (such as a pixel or a group of pixels). In order to calculate the convolution results, each processor subunit may acquire data from all eight adjacent processor subunits, each of which have received a corresponding tile. In a partial tile connection, the data from the diagonal adjacents may be passed through other adjacent processor subunits connected to the processor subunit. Accordingly, the distributed processor on a chip may be an artificial intelligence accelerator processor.

In a specific example of a convolutional calculation, an N×M image may be divided across a plurality of processor subunits. Each processor subunit may perform a convolution with an A×B filter on its corresponding tile. To perform the filtering on one or more pixels on a boundary between tiles, each processor subunit may require data from neighboring processor subunits having tiles including pixels on the same boundary. Accordingly, the code generated for each processor subunit configures the subunit to calculate the convolutions and pull from one of the second plurality of buses whenever data is needed from an adjacent subunit. Corresponding commands to output data to the second plurality of buses are provided to the subunits to ensure proper timing of needed data transfers.

The partial tile connection of FIG. 7A may be modified to be an N-partial tile connection. In this modification, the second plurality of buses may further connect each processor subunit to processor subunits within a threshold distance of the processor subunit (e.g., within n processor subunits) in the four directions along which the buses of FIG. 7A run (i.e., up, down, left, and right). A similar modification may be made to the full-tile connection (to result in an N-full tile connection) such that the second plurality of buses further connects each processor subunit to processor subunits within a threshold distance of the processor subunit (e.g., within n processor subunits) in the four directions along which the buses of FIG. 7A run in additional to the two diagonal directions.

Other arrangements are possible. For example, in the arrangement shown in FIG. 7B, bus 750a connects processor subunit 730a to processor subunit 730d, bus 750b connects processor subunit 730a to processor subunit 730b, bus 750c connects processor subunit 730b to processor subunit 730c, and bus 750d connects processor subunit 730c to processor subunit 730d. Accordingly, in the example arrangement shown in FIG. 7B, the plurality of processor subunits is arranged in a star pattern. The second plurality of buses connect each processor subunit to at least one adjacent processor subunit within the star pattern.

Further arrangements (not shown) are possible. For example, a neighbor connection arrangement may be used such that the plurality of processor subunits is arranged in one or more lines (e.g., similar to that depicted in FIG. 7A). In a neighbor connection arrangement, the second plurality of buses connect each processor subunit to a processor subunit to the left in the same line, to a processor subunit to the right in the same line, to the processor subunits both to the left and to the right in the same line, etc.

In another example, an N-linear connection arrangement may be used. In an N-linear connection arrangement, the second plurality of buses connect each processor subunit to processor subunits within a threshold distance of the processor subunit (e.g., within n processor subunits). The N-linear connection arrangement may be used with the line array (described above), the rectangular array (depicted in FIG. 7A), the elliptical array (depicted in FIG. 7B), or any other geometrical array.

In yet another example, an N-log connection arrangement may be used. In an N-log connection arrangement, the second plurality of buses connect each processor subunit to processor subunits within a threshold power of two distance of the processor subunit (e.g., within $2^n$ processor subunits). The N-log connection arrangement may be used with the line array (described above), the rectangular array (depicted in FIG. 7A), the elliptical array (depicted in FIG. 7B), or any other geometrical array.

Any of the connection schemes described above may be combined for use in the same hardware chip. For example, a full tile connection may be used in one region while a partial tile connection is used in another region. In another example, an N-linear connection arrangement may be used in one region while an N-full tile connection is used in another region.

Alternatively to or in addition with dedicated buses between processor subunits of the memory chip, one or more shared buses may be used to interconnect all (or a subset of) the processor subunits of a distributed processor. Collisions on the shared buses may still be avoided by timing data transfers on the shared buses using code executed by the processor subunits, as explained further below. Additionally with or alternatively to shared buses, configurable buses may be used to dynamically connect processor subunits to form groups of processors units connected to separated buses. For example, the configurable buses may include transistors or other mechanisms that may be controlled by processor subunit to direct data transfers to a selected processor subunit.

Figure 7B:
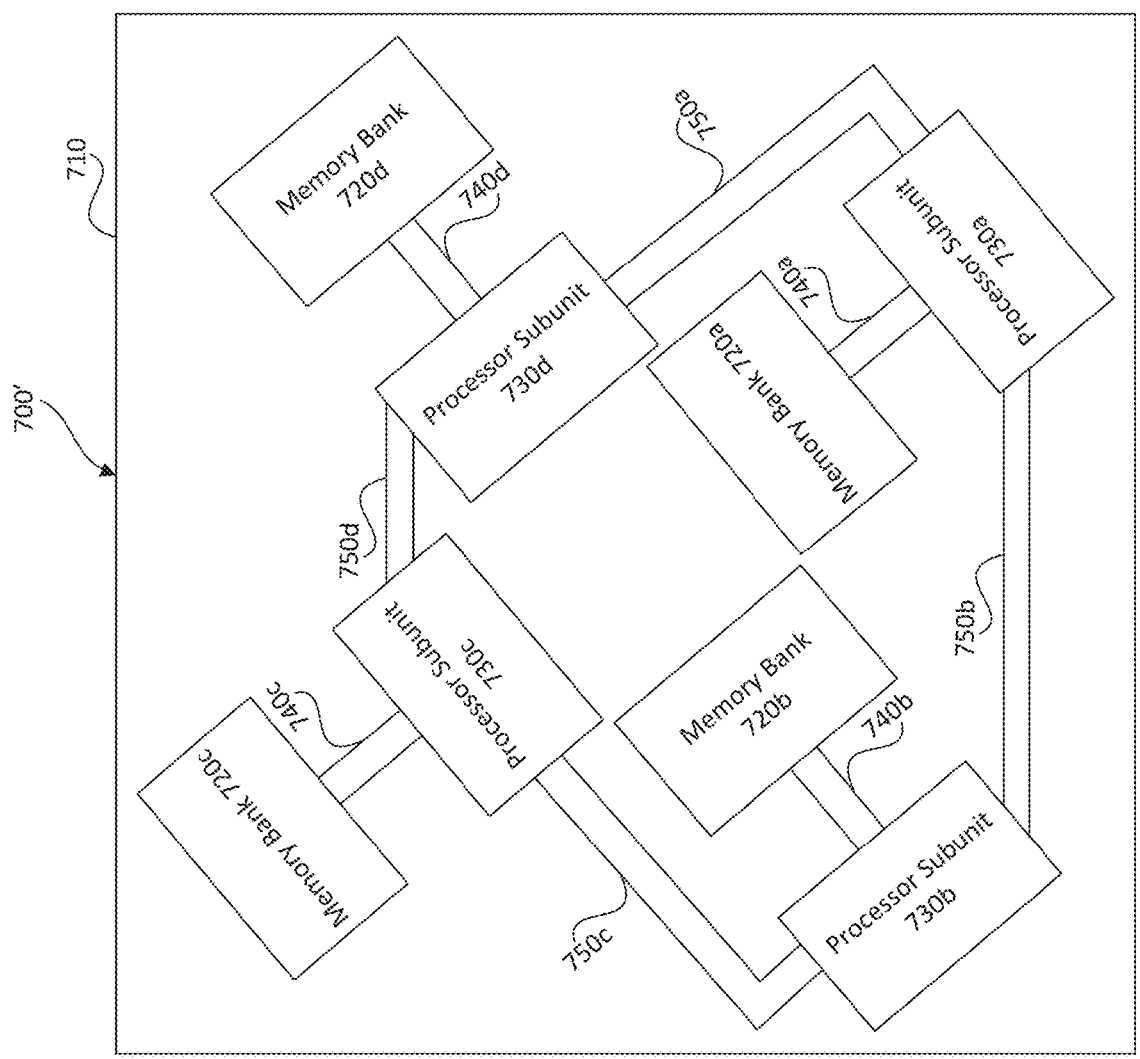
FIG. 7B is a diagrammatic representation of an elliptical array of processing groups consistent with the disclosed embodiments.

In both FIGS. 7A and 7B, the plurality of processor subunits of the processing array is spatially distributed among the plurality of discrete memory banks of the memory array. In other alternative embodiments (not shown), the plurality of processor subunits may be clustered in one or more regions of the substrate, and the plurality of memory banks may be clustered in one or more other regions of the substrate. In some embodiments, a combination of spatial distribution and clustering may be used (not shown). For example, one region of the substrate may include a cluster of processor subunits, another region of the substrate may include a cluster of memory banks, and yet another region of the substrate may include processing arrays distributed amongst memory banks.

One of ordinary skill will recognize that arraying processor groups 600 on a substrate is not an exclusive embodiment. For example, each processor subunit may be associated with at least two dedicated memory banks. Accordingly, processing groups 310*a*, 310*b*, 310*c*, and 310*d* of FIG. 3B may be used in lieu of or in combination with processing group 600 to form the processing array and the memory array. Other processing groups including, for example, three, four, or more dedicated memory banks (not shown) may be used.

Each of the plurality of processor subunits may be configured to execute software code associated with a particular application independently, relative to other processor subunits included in the plurality of processor subunits. For example, as explained below, a plurality of sub-series of instructions may be grouped as machine code and provided to each processor subunit for execution.

In some embodiments, each dedicated memory bank comprises at least one dynamic random access memory (DRAM). Alternatively, the memory banks may comprise a mix of memory types, such as static random access memory (SRAM), DRAM, Flash or the like.

In conventional processors, data sharing between processor subunits is usually performed with shared memory. Shared memory typically requires a large portion of chip area and/or performed a bus that is managed by additional hardware (such as arbiters). The bus results in bottlenecks, as described above. In addition, the shared memory, which may be external to the chip, typically includes cache coherency mechanisms and more complex caches (e.g., L1 cache, L2 cache, and shared DRAM) in order to provide accurate and up-to-date data to the processor subunits. As explained further below, the dedicated buses depicted in FIGS. 7A and 7B allow for hardware chips that are free of hardware management (such as arbiters). Moreover, the use of dedicated memories as depicted in FIGS. 7A and 7B allow for the elimination of complex caching layers and coherency mechanism.

Instead, in order to allow each processor subunit to access data calculated by other processor subunits and/or stored in memory banks dedicated to the other processor subunits, buses are provided whose timing is performed dynamically using code individually executed by each processor subunit. This allows for elimination of most, if not all, bus management hardware as conventionally used. Moreover, complex caching mechanisms are replaced with direct transfers over these buses, resulting in lower latency times during memory reads and writes.

Memory-Based Processing Arrays

As depicted in FIGS. 7A and 7B, a memory chip of the present disclosure may operate independently. Alternatively, memory chips of the present disclosure may be operably connected with one or more additional integrated circuits, such as a memory device (e.g., one or more DRAM banks), a system-on-a-chip, a field-programmable gate array (FPGA), or other processing and/or memory chip. In such embodiments, tasks in a series of instructions executed by the architecture may be divided (e.g., by a compiler, as described below) between processor subunits of the memory chip and any processor subunits of the additional integrated circuit(s). For example, the other integrated circuits may comprise a host (e.g., host 350 of FIG. 3A) that inputs instructions and/or data to the memory chip and receives output therefrom.

In order to interconnect memory chips of the present disclosure with one or more additional integrated circuits, the memory chip may include a memory interface, such as a memory interface complying with a Joint Electron Device Engineering Council (JEDEC) standard or any of its variants. The one or more additional integrated circuits may then connect to the memory interface. Accordingly, if the one or more additional integrated circuits are connected to a plurality of memory chips of the present disclosure, data may be shared between the memory chips through the one or more additional integrated circuits. Additionally or alternatively, the one or more additional integrated circuits may include buses to connect to buses on the memory chips of the present disclosure such that the one or more additional integrated circuits may execute code in tandem with the memory chips of the present disclosure. In such embodiments, the one or more additional integrated circuits further assist with distributed processing even though they may be on different substrates than the memory chips of the present disclosure.

Figure 7C:
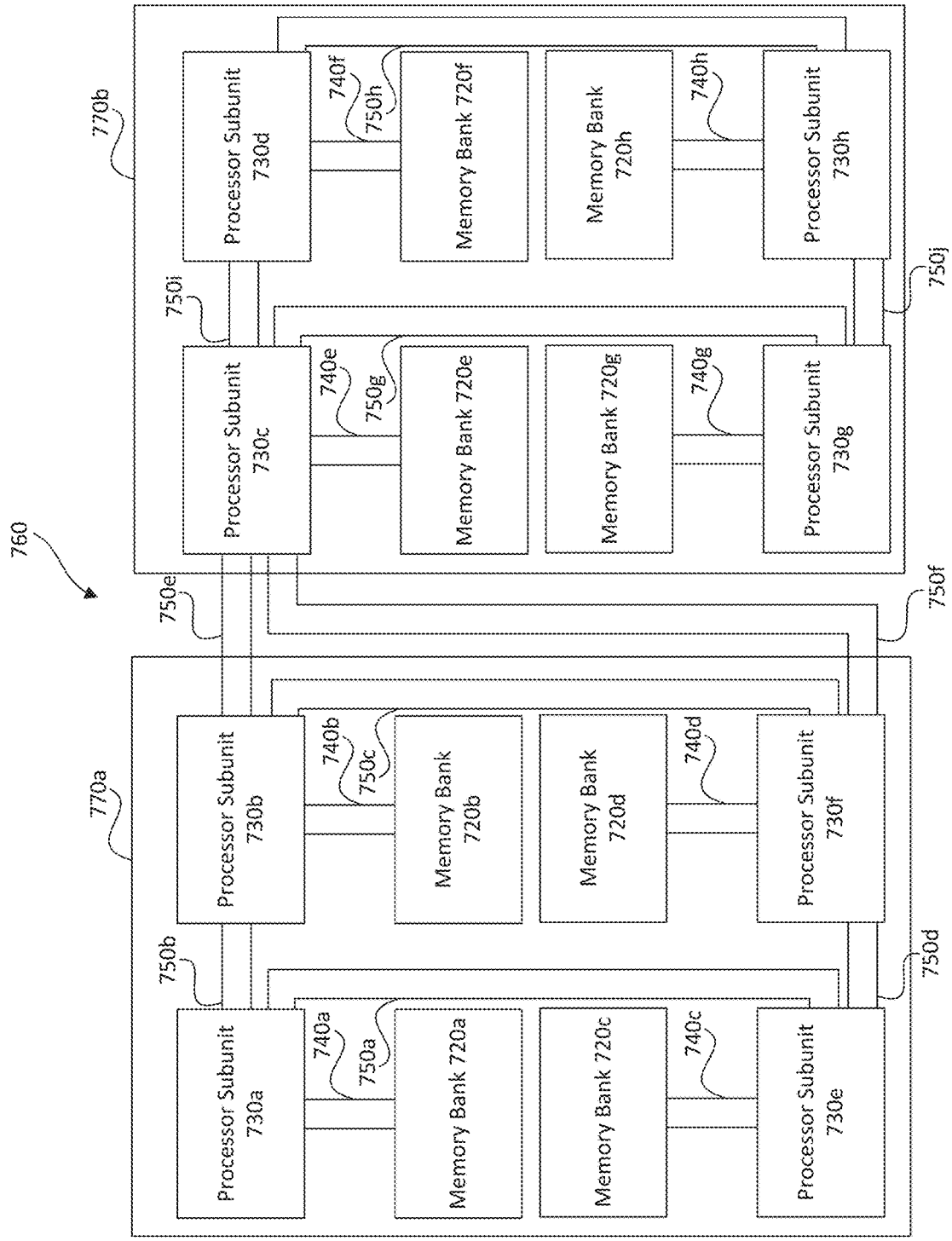
FIG. 7C is a diagrammatic representation an array of hardware chips consistent with the disclosed embodiments.
Figure 7D:
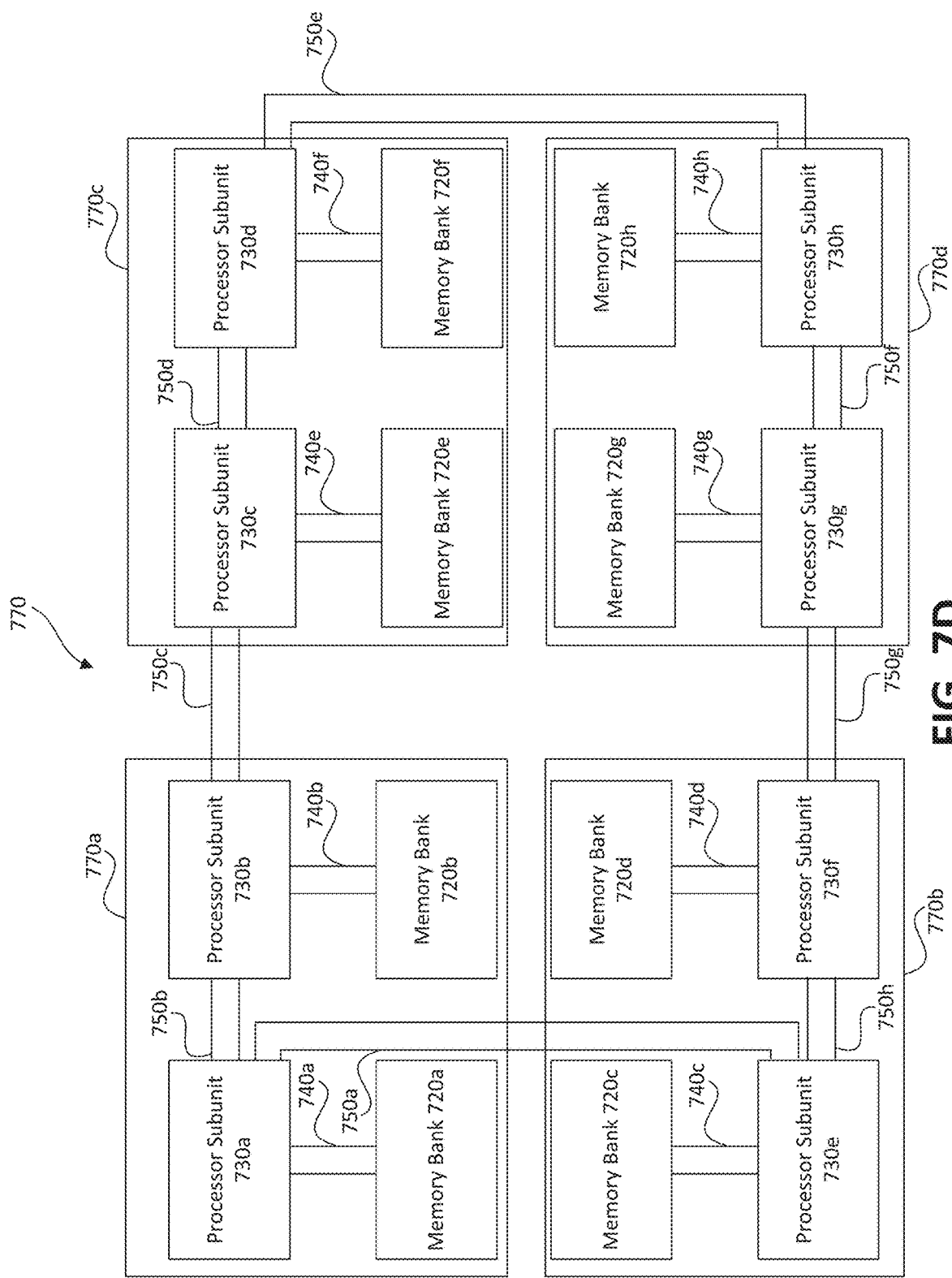
FIG. 7D is a diagrammatic representation another array of hardware chips consistent with the disclosed embodiments.

Furthermore, memory chips of the present disclosure may be arrayed in order to form an array of distributed processors. For example, one or more buses may connect a memory chip 770*a* to an additional memory chip 770*b*, as depicted in FIG. 7C. In the example of FIG. 7C, memory chip 770*a* includes processor subunits with one or more corresponding memory banks dedicated to each processor subunit, e.g.: Processor subunit 730*a* is associated with memory bank 720*a*, processor subunit 730*b* is associated with memory bank 720*b*, processor subunit 730*e* is associated with memory bank 720*c*, and processor subunit 730*f* is associated with memory bank 720*d*. Buses connect each processor subunit to its corresponding memory bank. Accordingly, bus 740*a* connects processor subunit 730*a* to memory bank 720*a*, bus 740*b* connects processor subunit 730*b* to memory bank 720*b*, bus 740*c* connects processor subunit 730*e* to memory bank 720*c*, and bus 740*d* connects processor subunit 730*f* to memory bank 720*d*. Moreover, bus 750*a* connects processor subunit 730*a* to processor subunit 750*e*, bus 750*b* connects processor subunit 730*a* to processor subunit 750*b*, bus 750*c* connects processor subunit 730*b* to processor subunit 750*f*, and bus 750*d* connects processor subunit 730*e* to processor subunit 750*f*. Other arrangements of memory chip 770*a* may be used, for example, as described above.

Similarly, memory chip 770*b* includes processor subunits with one or more corresponding memory banks dedicated to each processor subunit, e.g.: Processor subunit 730*c* is associated with memory bank 720*e*, processor subunit 730*d* is associated with memory bank 720*f*, processor subunit 730*g* is associated with memory bank 720*g*, and processor subunit 730*h* is associated with memory bank 720*h*. Buses connect each processor subunit to its corresponding memory bank. Accordingly, bus 740*e* connects processor subunit 730*c* to memory bank 720*e*, bus 740*f* connects processor subunit 730*d* to memory bank 720*f*, bus 740*g* connects processor subunit 730*g* to memory bank 720*g*, and bus 740*h* connects processor subunit 730*h* to memory bank 720*h*. Moreover, bus 750*g* connects processor subunit 730*c* to processor subunit 750*g*, bus 750*h* connects processor subunit 730*d* to processor subunit 750*h*, bus 750*i* connects processor subunit 730c to processor subunit 750d, and bus 750j connects processor subunit 730g to processor subunit 750h. Other arrangements of memory chip 770b may be used, for example, as described above.

The processor subunits of memory chip 770a and 770b may be connected using one or more buses. Accordingly, in the example of FIG. 7C, bus 750e may connect processor subunit 730b of memory chip 770a and processor subunit 730c of memory chip 770b, and bus 750f may connect processor subunit 730f of memory chip 770a and processor subunit 730c of memory 770b. For example, bus 750e may serve as an input bus to memory chip 770b (and thus an output bus for memory chip 770a) while bus 750f may serve as an input bus to memory chip 770a (and thus an output bus for memory chip 770b) or vice versa. Alternatively, buses 750e and 750f may both server as two-way buses between memory chips 770a and 770b.

Buses 750e and 750f may include direct wires or may be interleaved on a high-speed connection in order to reduce the pins used for the inter-chip interface between memory chip 770a and integrated circuit 770b. Moreover, any of the connection arrangements described above used in the memory chip itself may be used to connect the memory chip to one or more additional integrated circuits. For example, memory chip 770a and 770b may be connected using a full-tile or partial-tile connection rather than only two buses as shown in FIG. 7C.

Accordingly, although depicted using buses 750e and 750f, architecture 760 may include fewer buses or additional buses. For example, a single bus between processor subunits 730b and 730c or between processor subunits 730f and 730c may be used. Alternatively, additional buses, e.g., between processor subunits 730b and 730d, between processor subunits 730f and 730d, or the like, may be used.

Furthermore, although depicted as using a single memory chip and an additional integrated circuit, a plurality of memory chips may be connected using buses as explained above. For example, as depicted in the example of FIG. 7C, memory chips 770a, 770b, 770c, and 770d are connected in an array. Each memory chip includes processor subunits and dedicated memory banks similar to the memory chips described above. Accordingly, a description of these components is not repeated here.

In the example of FIG. 7C, memory chips 770a, 770b, 770c, and 770d are connected in a loop. Accordingly, bus 750a connects memory chips 770a and 770d, bus 750c connects memory chips 770a and 770b, bus 750e connects memory chips 770b and 770c, and bus 750g connects memory chips 770c and 770d. Although memory chips 770a, 770b, 770c, and 770d may be connected with full-tile connections, partial-tile connections, or other connection arrangements, the example of FIG. 7C allows for fewer pin connections between memory chips 770a, 770b, 770c, and 770d.

Relatively Large Memories

Embodiments of the present disclosure may use dedicated memories of relatively large size as compared with shared memories of conventional processors. The use of dedicated memories rather than shared memories allows for gains in efficiency to continue without tapering off with memory increases. This allows for memory-intensive tasks such as neural network processing and database queries to be performed more efficiently than in conventional processors, where the efficiency gains of increasing shared memory taper off due to the von Neumann bottleneck.

For example, in distributed processors of the present disclosure, a memory array disposed on the substrate of the distributed processor may include a plurality of discrete memory banks. Each of the discrete memory banks may have a capacity greater than one megabyte, as well as a processing array disposed on the substrate, including a plurality of processor subunits. As explained above, each one of the processor subunits may be associated with a corresponding, dedicated one of the plurality of discrete memory banks. In some embodiments, the plurality of processor subunits may be spatially distributed among the plurality of discrete memory banks within the memory array. By using dedicated memories of at least one megabyte, rather than shared caches of a few megabytes for a large CPU or GPU, the distributed processors of the present disclosure gain efficiencies that are not possible in conventional systems due to the von Neumann bottleneck in CPUs and GPUs.

Different memories may be used as the dedicated memories. For example, each dedicated memory bank may comprise at least one DRAM bank. Alternatively, each dedicated memory bank may comprise at least one static random access memory bank. In other embodiments, different types of memories may be combined on a single hardware chip.

As explained above, each dedicated memory may be at least one megabyte. Accordingly, each dedicated memory bank may be the same size or at least two of the plurality of memory banks may have different sizes.

Moreover, as described above, the distributed processor may include a first plurality of buses, each connecting one of the plurality of processor subunits to a corresponding, dedicated memory bank and a second plurality of buses, each connecting one of the plurality of processor subunits to another one of the plurality of processor subunits.

Synchronization Using Software

As explained above, hardware chips of the present disclosure may manage data transfers using software rather than hardware. In particular, because the timings of transfers on the buses, reads and writes to the memories, and calculations of the processor subunits are set by the sub-series of instructions executed by the processor subunits, hardware chips of the present disclosure may execute code to prevent collisions on the buses. Accordingly, hardware chips of the present disclosure may avoid hardware mechanisms conventionally used to manage data transfers (such as network controllers within in a chip, packet parsers and packets transferors between processor subunits, bus arbitrators, a plurality of buses to avoid arbitration, or the like).

If hardware chips of the present disclosure transferred data conventionally, connecting N processor subunits with buses would require bus arbitration or wide MUXs controlled by an arbiter. Instead, as described above, embodiments of the present disclosure may use a bus that is only a wire, an optical cable, or the like between processor subunits, where the processor subunits individually execute code to avoid collision on the buses. Accordingly, embodiments of the present disclosure may preserve space on the substrate as well as materials cost and efficiency losses (e.g., due to power and time consumption by arbitration). The efficiency and space gains are even greater when compared to other architectures using first-in-first-out (FIFO) controllers and/or mailboxes.

Furthermore, as explained above, each processor subunit may include one or more accelerators in addition to one or more processing elements. In some embodiments, the accelerator(s) may read and write from the buses rather than the processing element(s). In such embodiments, additional efficiency may be obtained by allowing the accelerator(s) to transmit data during the same cycle in which the processing element(s) perform one or more calculations. Such embodiments, however, require additional materials for the accelerator(s). For example, additional transistors may be required for fabrication of the accelerator(s).

The code also may account for the internal behavior, including timing and latencies, of the processor subunits (e.g., including the processing elements and/or accelerators forming part of the processor subunit). For example, a compiler (as described below) may perform pre-processing that accounts for the timing and latencies when generating the sub-series of instructions that control the data transfers.

In one example, a plurality of processor subunits may be assigned a task of calculating a neural network layer containing a plurality of neurons fully-connected to a previous layer of a larger plurality of neurons. Assuming data of the previous layer is evenly spread between the plurality of processor subunits, one way to perform the calculation may be to configure each processor subunit to transmit the data of the previous layer to the main bus in turn and then each processor subunit will multiply this data by the weight of the corresponding neuron that the subunit implements. Because each processor subunit calculates more than one neuron, each processor subunit will transmit the data of the previous layer a number of times equal to the number of neurons. Thus, the code of each processor subunit is not the same as the code for other processor subunits because the subunits will transmit at different times.

In some embodiments, a distributed processor may comprise a substrate (e.g., a semiconductor substrate, such as silicon and/or a circuit board, such as a flexible circuit board) with a memory array disposed on the substrate, the memory array including a plurality of discrete memory banks, and a processing array disposed on the substrate, the processing array including a plurality of processor subunits, as depicted, e.g., in FIGS. 7A and 7B. As explained above, each one of the processor subunits may be associated with a corresponding, dedicated one of the plurality of discrete memory banks. Moreover, as depicted, e.g., in FIGS. 7A and 7B, the distributed processor may further comprise a plurality of buses, each one of the plurality of buses connecting one of the plurality of processor subunits to at least another one of the plurality of processor subunits.

As explained above, the plurality of buses may be controlled in software. Accordingly, the plurality of buses may be free of timing hardware logic components such that data transfers between processor subunits and across corresponding ones of the plurality of buses are uncontrolled by timing hardware logic components. In one example, the plurality of buses may be free of bus arbiters such that data transfers between processor subunits and across corresponding ones of the plurality of buses are uncontrolled by bus arbiters.

In some embodiments, as depicted, e.g., in FIGS. 7A and 7B, the distributed processor may further comprise a second plurality of buses connecting one of the plurality of processor subunits to a corresponding, dedicated memory bank. Similar to the plurality of buses described above, the second plurality of buses may be free of timing hardware logic components such that data transfers between processor subunits and corresponding, dedicated memory banks are uncontrolled by timing hardware logic components. In one example, the second plurality of buses may be free of bus arbiters such that data transfers between processor subunits and corresponding, dedicated memory banks are uncontrolled by bus arbiters.

As used herein, the phrase "free of" does not necessarily imply the absolute absence of components, such as timing hardware logic components (e.g., bus arbiters, arbitration trees, FIFO controllers, mailboxes, or the like). Such components may still be included in a hardware chip described as "free of" those components. Instead, the phrase "free of" refers to the function of the hardware chip; that is, a hardware chip "free of" timing hardware logic components controls the timing of its data transfers without use of the timing hardware logic components, if any, included therein. For example, a hardware chip that executes code including sub-series of instructions that control data transfers between processor subunits of the hardware chip, even if the hardware chip includes timing hardware logic components as a secondary precaution to protect against collisions due to errors in the executed code.

As explained above, the plurality of buses may comprise at least one of wires or optical fibers between corresponding ones of the plurality of processor subunits. Accordingly, in one example, a distributed processor free of timing hardware logic components may include only wires or optical fibers without bus arbiters, arbitration trees, FIFO controllers, mailboxes, or the like.

In some embodiments, the plurality of processor subunits is configured to transfer data across at least one of the plurality of buses in accordance with code executed by the plurality of processor subunits. Accordingly, as explained below, a compiler may organize sub-series of instructions, each sub-series comprising code executed by a single processor subunit. The sub-series instructions may instruct the processor subunit when to transfer data onto one of the buses and when to retrieve data from the buses. When the sub-series are executed in tandem across the distributed processor, the timing of transfers between the processor subunits may be governed by the instructions to transfer and retrieve included in the sub-series. Thus, the code dictates timing of data transfers across at least one of the plurality of buses. The compiler may generate code to be executed by a single processor subunit. Additionally, the compiler may generate code to be executed by groups of processor subunits. In some cases, the compiler may treat all the processor subunits together as if they were one super-processor (e.g., a distributed processor), and the compiler may generate code for execution by that defined super-processor/distributed processor.

As explained above and depicted in FIGS. 7A and 7B, the plurality of processor subunits may be spatially distributed among the plurality of discrete memory banks within the memory array. Alternatively, the plurality of processor subunits may be clustered in one or more regions of the substrate, and the plurality of memory banks may be clustered in one or more other regions of the substrate. In some embodiments, a combination of spatial distribution and clustering may be used, as explained above.

In some embodiments, a distributed processor may comprise a substrate (e.g., a semiconductor substrate, including silicon and/or a circuit board, such as a flexible circuit board) with a memory array disposed on the substrate, the memory array including a plurality of discrete memory banks. A processing array may also be disposed on the substrate, the processing array including a plurality of processor subunits, as depicted, e.g., in FIGS. 7A and 7B. As explained above, each one of the processor subunits may be associated with a corresponding, dedicated one of the plurality of discrete memory banks. Moreover, as depicted, e.g., in FIGS. 7A and 7B, the distributed processor may further comprise a plurality of buses, each one of the plurality of buses connecting one of the plurality of processor subunits to a corresponding, dedicated one of the plurality of discrete memory banks.

As explained above, the plurality of buses may be controlled in software. Accordingly, the plurality of buses may be free of timing hardware logic components such that data transfers between a processor subunit and a corresponding, dedicated one of the plurality of discrete memory banks and across a corresponding one of the plurality of buses are not controlled by timing hardware logic components. In one example, the plurality of buses may be free of bus arbiters such that data transfers between processor subunits and across corresponding ones of the plurality of buses are uncontrolled by bus arbiters.

In some embodiments, as depicted, e.g., in FIGS. 7A and 7B, the distributed processor may further comprise a second plurality of buses connecting one of the plurality of processor subunits to at least another one of the plurality of processor subunits. Similar to the plurality of buses described above, the second plurality of buses may be free of timing hardware logic components such that data transfers between processor subunits and corresponding, dedicated memory banks are uncontrolled by timing hardware logic components. In one example, the second plurality of buses may be free of bus arbiters such that data transfers between processor subunits and corresponding, dedicated memory banks are uncontrolled by bus arbiters.

In some embodiments, the distributed processor may use a combination of software timing with hardware timing components. For example, a distributed processor may comprise a substrate (e.g., a semiconductor substrate, including silicon and/or a circuit board, such as a flexible circuit board) with a memory array disposed on the substrate, the memory array including a plurality of discrete memory banks. A processing array may also be disposed on the substrate, the processing array including a plurality of processor subunits, as depicted, e.g., in FIGS. 7A and 7B. As explained above, each one of the processor subunits may be associated with a corresponding, dedicated one of the plurality of discrete memory banks. Moreover, as depicted, e.g., in FIGS. 7A and 7B, the distributed processor may further comprise a plurality of buses, each one of the plurality of buses connecting one of the plurality of processor subunits to at least another one of the plurality of processor subunits. Moreover, as explained above, the plurality of processor subunits may be configured to execute software that controls timing of data transfers across the plurality of buses to avoid colliding data transfers on at least one of the plurality of buses. In such an example, the software may control the timing of the data transfers, but the transfers themselves may be controlled, at least in part, by one or more hardware components.

In such embodiments, the distributed processor may further comprise a second plurality of buses connecting one of the plurality of processor subunits to a corresponding, dedicated memory bank. Similar to the plurality of buses described above, the plurality of processor subunits may be configured to execute software that controls timing of data transfers across the second plurality of buses to avoid colliding data transfers on at least one of the second plurality of buses. In such an example, as explained above, the software may control the timing of the data transfers, but the transfers themselves may be controlled, at least in part, by one or more hardware components.

Division of Code

As explained above, hardware chips of the present disclosure may execute code in parallel across processor subunits included on a substrate forming the hardware chip. Additionally, hardware chips of the present disclosure may perform multitasking. For example, hardware chips of the present disclosure may perform area multitasking, in which one group of processor subunits of the hardware chip execute one task (e.g., audio processing) while another group of processor subunits of the hardware chip execute another task (e.g., image processing). In another example, hardware chips of the present disclosure may perform timing multitasking, in which one or more processor subunits of the hardware chip execute one task during a first period of time and another task during a second period of time. A combination of area and timing multitasking may also be used such that one task may be assigned to a first group of processor subunits during a first period of time while another task may be assigned to a second group of processor subunits during the first period of time, after which a third task may be assigned to processor subunits included in the first group and the second group during a second period of time.

In order to organize machine code for execution on memory chips of the present disclosure, machine code may be divided between processor subunits of the memory chip. For example, a processor on a memory chip may comprise a substrate and a plurality of processor subunits disposed on the substrate. The memory chip may further comprise a corresponding plurality of memory banks disposed on the substrate, each one of the plurality processor subunits being connected to at least one dedicated memory bank not shared by any other processor subunit of the plurality of processor subunits. Each processor subunit on the memory chip may be configured to execute a series of instructions independent from other processor subunits. Each series of instructions may be executed by configuring one or more general processing elements of the processor subunit in accordance with code defining the series of instructions and/or by activating one or more special processing elements (e.g., one or more accelerators) of the processor subunit in accordance with a sequence provided in the code defining the series of instructions.

Accordingly, each series of instructions may define a series of tasks to be performed by a single processor subunit. A single task may comprise an instruction within an instruction set defined by the architecture of one or more processing elements in the processor subunit. For example, the processor subunit may include particular registers, and a single task may push data onto a register, pull data from a register, perform an arithmetic function on data within a register, perform a logic operation on data within a register, or the like. Moreover, the processor subunit may be configured for any number of operands, such as a 0-operand processor subunit (also called a "stack machine"), a 1-operand processor subunit (also called an accumulator machine), a 2-operand processor subunit (such as a RISC), a 3-operand processor subunit (such as a complex instruction set computer (CISC)), or the like. In another example, the processor subunit may include one or more accelerators, and a single task may activate an accelerator to perform a specific function, such as a MAC function, a MAX function, a MAX-0 function, or the like.

The series of instructions may further include tasks for reading and writing from the dedicated memory banks of the memory chip. For example, a task may include writing a piece of data to a memory bank dedicated to the processor subunit executing the task, reading a piece of data from a memory bank dedicated to the processor subunit executing the task, or the like. In some embodiments, the reading and writing may be performed by the processor subunit in tandem with a controller of the memory bank. For example, the processor subunit may execute a read or write task by sending a control signal to the controller to perform the read or write. In some embodiments, the control signal may include a particular address to use for reads and writes. Alternatively, the processor subunit may defer to the memory controller to select an available address for the reads and writes.

Additionally or alternatively, the reading and writing may be performed by one or more accelerators in tandem with a controller of the memory bank. For example, the accelerators may generate the control signals for the memory controller, similar to how the processor subunit generates control signals, as described above.

In any of the embodiments described above, an address generator may also be used to direct the reads and writes to specific addresses of a memory bank. For example, the address generator may comprise a processing element configured to generate memory addresses for reads and writes. The address generator may be configured to generate addresses in order to increase efficiency, e.g., by writing results of a later calculation to the same address as the results of a former calculation that are no longer needed. Accordingly, the address generator may generate the controls signals for the memory controller, either in response to a command from the processor subunit (e.g., from a processing element included therein or from one or more accelerator(s) therein) or in tandem with the processor subunit. Additionally or alternatively, the address generator may generate the addresses based on some configuration or registers for example generating a nested loop structure to iterate on certain addresses in the memory at a certain pattern.

In some embodiments, each series of instructions may comprise a set of machine code defining a corresponding series of tasks. Accordingly, the series of tasks described above may be encapsulated within machine code comprising the series of instructions. In some embodiments, as explained below with respect to FIG. 8, the series of tasks may be defined by a compiler configured to distribute a higher-level series of tasks amongst the plurality of logic circuits as a plurality of series of tasks. For example, the compiler may generate the plurality of series of tasks based on the higher-level series of tasks such that the processor subunits, executing each corresponding series of tasks in tandem, perform the same function as outlined by the higher-level series of tasks.

As explained further below, the higher-level series of tasks may comprise a set of instructions in a human-readable programming language. Correspondingly, the series of tasks for each processor subunit may comprise lower-level series of tasks, each of which comprises a set of instructions in a machine code.

As explained above with respect to FIGS. 7A and 7B, the memory chip may further comprise a plurality of buses, each bus connecting one of the plurality of processor subunits to at least one other of the plurality of processor subunits. Moreover, as explained above, data transfers on the plurality of buses may be controlled using software. Accordingly, data transfers across at least one of the plurality of buses may be predefined by the series of instructions included in a processor subunit connected to the at least one of the plurality of buses. Therefore, one of the tasks included in the series of instructions may include outputting data to one of the buses or pulling data from one of the buses. Such tasks may be executed by a processing element of the processor subunit or by one or more accelerators included in the processor subunit. In the latter embodiment, the processor subunit may perform a calculation or send a control signal to a corresponding memory bank in the same cycle during which accelerator(s) pull data from or place data on one of the buses.

In one example, the series of instructions included in the processor subunit connected to the at least one of the plurality of buses may include a sending task that comprises a command for the processor subunit connected to the at least one of the plurality of buses to write data to the at least one of the plurality of buses. Additionally or alternatively, the series of instructions included in the processor subunit connected to the at least one of the plurality of buses may include a receiving task that comprises a command for the processor subunit connected to the at least one of the plurality of buses to read data from the at least one of the plurality of buses.

Additionally or alternatively to distribution of code amongst processor subunits, data may be divided between memory banks of the memory chip. For example, as explained above, a distributed processor on a memory chip may comprise a plurality of processor subunits disposed on the memory chip and a plurality of memory banks disposed on the memory chip. Each one of the plurality of memory banks may be configured to store data independent from data stored in other ones of the plurality of memory banks, and each one of the plurality of processor subunits may be connected to at least one dedicated memory bank from among the plurality of memory banks. For example, each processor subunit may have access to one or more memory controllers of one or more corresponding memory banks dedicated to the processor subunit, and no other processor subunit may have access to these corresponding one or more memory controllers. Accordingly, the data stored in each memory bank may be unique to the dedicated processor subunit. Moreover, the data stored in each memory bank may be independent of the memory stored in other memory banks because no memory controllers may be shared between memory banks.

In some embodiments, as described below with respect to FIG. 8, the data stored in each of the plurality of memory banks may be defined by a compiler configured to distribute data amongst the plurality of memory banks. Moreover, the compiler may be configured to distribute data defined in a higher-level series of tasks amongst the plurality of memory banks using a plurality of lower-level tasks distributed amongst corresponding processor subunits.

As explained further below, the higher-level series of tasks may comprise a set of instructions in a human-readable programming language. Correspondingly, the series of tasks for each processor subunit may comprise lower-level series of tasks, each of which comprises a set of instructions in a machine code.

As explained above with respect to FIGS. 7A and 7B, the memory chip may further comprise a plurality of buses, each bus connecting one of the plurality of processor subunits to one or more corresponding, dedicated memory banks from among the plurality of memory banks. Moreover, as explained above, data transfers on the plurality of buses may be controlled using software. Accordingly, data transfers across a particular one of the plurality of buses may be controlled by a corresponding processor subunit connected to the particular one of the plurality of buses. Therefore, one of the tasks included in the series of instructions may include outputting data to one of the buses or pulling data from one of the buses. As explained above, such tasks may be executed by (i) a processing element of the processor subunit or (ii) one or more accelerators included in the processor subunit. In the latter embodiment, the processor subunit may perform a calculation or use buses connecting the processor subunit to other processor subunits in the same cycle during which accelerator(s) pull data from or place data on one of the buses connected to the one or more corresponding, dedicated memory banks.

Therefore, in one example, the series of instructions included in the processor subunit connected to the at least one of the plurality of buses may include a sending task. The sending task may comprise a command for the processor subunit connected to the at least one of the plurality of buses to write data to the at least one of the plurality of buses for storage in the one or more corresponding, dedicated memory banks. Additionally or alternatively, the series of instructions included in the processor subunit connected to the at least one of the plurality of buses may include a receiving task. The receiving task may comprise a command for the processor subunit connected to the at least one of the plurality of buses to read data from the at least one of the plurality of buses for storage in the one or more corresponding, dedicated memory banks. Accordingly, the sending and receiving tasks in such embodiments may comprise control signals that are sent, along the at least one of the plurality of buses, to one or more memory controllers of the one or more corresponding, dedicated memory banks. Moreover, the sending and receiving tasks may be executed by one portion of the processing subunit (e.g., by one or more accelerators thereof) concurrently with a calculation or other task executed by another portion of the processing subunit (e.g., by one or more different accelerators thereof). An example of such a concurrent execution may include a MAC-relay command, in which receiving, multiplying, and sending are executed in tandem.

In addition to distributing data amongst the memory banks, particular portions of data may be duplicated across different memory banks. For example, as explained above, a distributed processor on a memory chip may comprise a plurality of processor subunits disposed on the memory chip and a plurality of memory banks disposed on the memory chip. Each one of the plurality of processor subunits may be connected to at least one dedicated memory bank from among the plurality of memory banks, and each memory bank of the plurality of memory banks may be configured to store data independent from data stored in other ones of the plurality of memory banks. Moreover, at least some of the data stored in one particular memory bank from among the plurality of memory banks may comprise a duplicate of data stored in at least another one of the plurality of memory banks. For example, a number, string, or other type of data used in the series of instructions may be stored in a plurality of memory banks dedicated to different processor subunits rather than being transferred from one memory bank to other processor subunits in the memory chip.

In one example, parallel string matching may use data duplication described above. For example, a plurality of strings may be compared to the same string. A conventional processor would compare each string in the plurality to the same string in sequence. On a hardware chip of the present disclosure, the same string may be duplicated across the memory banks such that the processor subunits may compare a separate string in the plurality to the duplicated string in parallel.

In some embodiments, as described below with respect to FIG. 8, the at least some data duplicated across the one particular memory bank from among the plurality of memory banks and the at least another one of the plurality of memory banks is defined by a compiler configured to duplicate data across memory banks. Moreover, the compiler may be configured to duplicate the at least some data using a plurality of lower-level tasks distributed amongst corresponding processor subunits.

Duplication of data may be useful for certain tasks that re-use the same portions of data across different calculations. By duplicating these portions of data, the different calculations may be distributed amongst processor subunits of the memory chip for parallel execution while each processor subunit may store the portions of data in, and access the stored portions from, a dedicated memory bank (rather than pushing and pulling the portions of data across buses connecting the processor subunits). In one example, the at least some data duplicated across the one particular memory bank from among the plurality of memory banks and the at least another one of the plurality of memory banks may comprise weights of a neural network. In this example, each node in the neural network may be defined by at least one processor subunit from among the plurality of processor subunits. For example, each node may comprise machine code executed by the at least one processor subunit defining the node. In this example, duplication of the weights may allow each processor subunit to execute machine code to effect, at least in part, a corresponding node while only accessing one or more dedicated memory banks (rather than performing data transfers with other processor subunits). Because the timing of reads and writes to the dedicated memory bank(s) are independent of other processor subunits while the timing of data transfers between processor subunits requires timing synchronization (e.g., using software, as explained above), duplication of memory to avoid data transfers between processor subunits may produce further efficiencies in overall execution.

As explained above with respect to FIGS. 7A and 7B, the memory chip may further comprise a plurality of buses, each bus connecting one of the plurality of processor subunits to one or more corresponding, dedicated memory banks from among the plurality of memory banks. Moreover, as explained above, data transfers on the plurality of buses may be controlled using software. Accordingly, data transfers across a particular one of the plurality of buses may be controlled by a corresponding processor subunit connected to the particular one of the plurality of buses. Therefore, one of the tasks included in the series of instructions may include outputting data to one of the buses or pulling data from one of the buses. As explained above, such tasks may be executed by (i) a processing element of the processor subunit or (ii) one or more accelerators included in the processor subunit. As further explained above, such tasks may include a sending task and/or a receiving tasks that comprise control signals that are sent, along the at least one of the plurality of buses, to one or more memory controllers of the one or more corresponding, dedicated memory banks.

Figure 8:
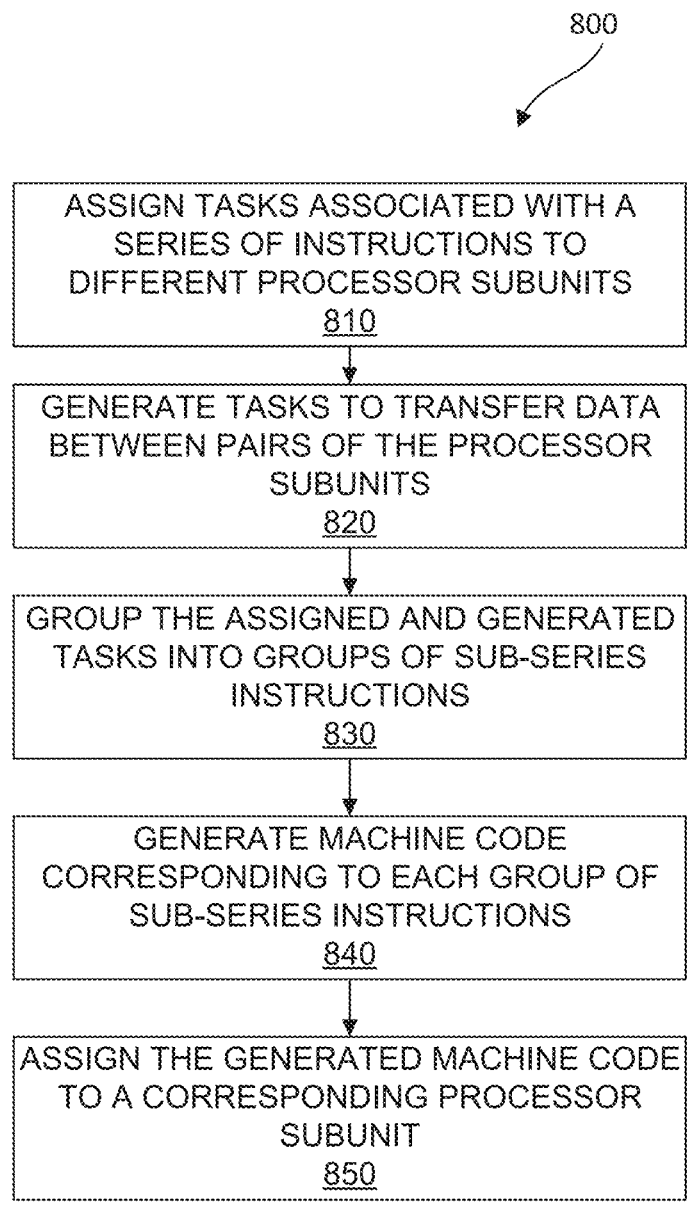
FIG. 8 is a flowchart depicting an exemplary method for compiling a series of instructions for execution on an exemplary hardware chip consistent with the disclosed embodiments.

FIG. 8 depicts a flowchart of a method 800 for compiling a series of instructions for execution on an exemplary memory chip of the present disclosure, e.g., as depicted in FIGS. 7A and 7B. Method 800 may be implemented by any conventional processor, whether generic or special-purpose.

Method 800 may be executed as a portion of a computer program forming a compiler. As used herein, a "compiler" refers to any computer program that converts a higher-level language (e.g., a procedural language, such as C, FORTRAN, BASIC, or the like; an object-oriented language, such as Java, C++, Pascal, Python, or the like; etc.) to a lower-level language (e.g., assembly code, object code, machine code, or the like). The compiler may allow a human to program a series of instructions in a human-readable language, which is then converted to a machine-executable language.

At step 810, the processor may assign tasks associated with the series of instructions to different ones of the processor subunits. For example, the series of instructions may be divided into subgroups, the subgroups to be executed in parallel across the processor subunits. In one example, a neural network may be divided into its nodes, and one or more nodes may be assigned to separate processor subunits. In this example, each subgroup may comprise a plurality of nodes connected across different layers. Thus, a processor subunit may implement a node from a first layer of the neural network, a node from a second layer connected to the node from the first layer implemented by the same processor subunit, and the like. By assigning nodes based on their connections, data transfers between the processor subunits may be lessened, which may result in greater efficiency, as explained above.

As explained above depicted in FIGS. 7A and 7B, the processor subunits may be spatially distributed among the plurality of memory banks disposed on the memory chip. Accordingly, the assignment of tasks may be, at least in part, a spatial divisional as well as a logical division.

At step 820, the processor may generate tasks to transfer data between pairs of the processor subunits of the memory chip, each pair of processor subunits being connected by a bus. For example, as explained above, the data transfers may be controlled using software. Accordingly, processor subunits may be configured to push and pull data on buses at synchronized times. The generated tasks may thus include tasks for performing this synchronized pushing and pulling of data.

As explained above, step 820 may include pre-processing to account for the internal behavior, including timing and latencies, of the processor subunits. For example, the processor may use known times and latencies of the processor subunits (e.g., the time to push data to a bus, the time to pull data from a bus, the latency between a calculation and a push or pull, or the like) to ensure that the generated tasks synchronize. Therefore, the data transfers comprising at least one push by one or more processor subunits and at least one pull by one or more processor subunits may occur simultaneously rather than incurring a delay due to timing differences between the processor subunits, latencies of the processor subunits, or the like.

At step 830, the processor may group the assigned and generated tasks into the plurality of groups of sub-series instructions. For example, the sub-series instructions may each comprise a series of tasks for execution by a single processor subunit. Therefore, each of the plurality of groups of sub-series instructions may correspond to a different one of the plurality of processor sub-units. Accordingly, steps 810, 820, and 830 may result in dividing the series of instructions into a plurality of groups of sub-series instructions. As explained above, step 820 may ensure that any data transfers between the different groups are synchronized.

At step 840, the processor may generate machine code corresponding to each of the plurality of groups of subs-series instructions. For example, the higher-level code representing sub-series instructions may be converted to lower-level code, such as machine code, executable by corresponding processor subunits.

At step 850, the processor may assign the generated machine code corresponding to each of the plurality of groups of subs-series instructions to a corresponding one of the plurality of processor subunits in accordance with the division. For example, the processor may label each sub-series instructions with an identifier of the corresponding processor subunit. Thus, when the sub-series instructions are uploaded to a memory chip for execution (e.g., by host 350 of FIG. 3A), each sub-series may configure a correct processor subunit.

In some embodiments, assigning tasks associated with the series of instructions to the different ones of the processor subunits may depend, at least in part, on a spatial proximity between two or more of the processor subunits on the memory chip. For example, as explained above, efficiency may be increased by lessening the number of data transfers between processor subunits. Accordingly, the processor may minimize data transfers that move data across more than two of processor subunits. Therefore, the processor may use a known layout of the memory chip in combination with one or more optimization algorithms (such as a greedy algorithm) in order to assign sub-series to processor subunits in a way that maximizes (at least locally) adjacent transfers and minimizes (at least locally) transfers to non-neighboring processor subunits.

Method 800 may include further optimizations for the memory chips of the present disclosure. For example, the processor may group data associated with the series of instructions based on the division and assign the data to the memory banks in accordance with the grouping. Accordingly, the memory banks may hold data used for the sub-series instructions assigned to each processor subunit to which each memory bank is dedicated.

In some embodiments, grouping the data may include determining at least a portion of the data to duplicate in two or more of the memory banks. For example, as explained above, some data may be used across more than one sub-series instructions. Such data may be duplicated across the memory banks dedicated to the plurality of processor subunits to which the different sub-series instructions are assigned. This optimization may further reduce data transfers across processor subunits.

The output of method 800 may be input to a memory chip of the present disclosure for execution. For example, a memory chip may comprise a plurality of processor subunits and a corresponding plurality of memory banks, each processor subunit being connected to at least one memory bank dedicated to the processor subunit, and the processor sub-units of the memory chip may be configured to execute the machine code generated by method 800. As explained above with respect to FIG. 3A, host 350 may input the machine code generated by method 800 to the processor subunits for execution.

Sub-Banks and Sub-Controllers

In conventional memory banks, controllers are provided at the bank level. Each bank includes a plurality of mats, which are typically arranged in a rectangular manner but may be arranged in any geometrical shape. Each mat includes a plurality of memory cells, which are also typically arranged in a rectangular manner but may be arranged in any geometrical shape. Each cell may store a single bit of data (e.g., depending on whether the cell is retained at a high voltage or a low voltage).

Figure 9:
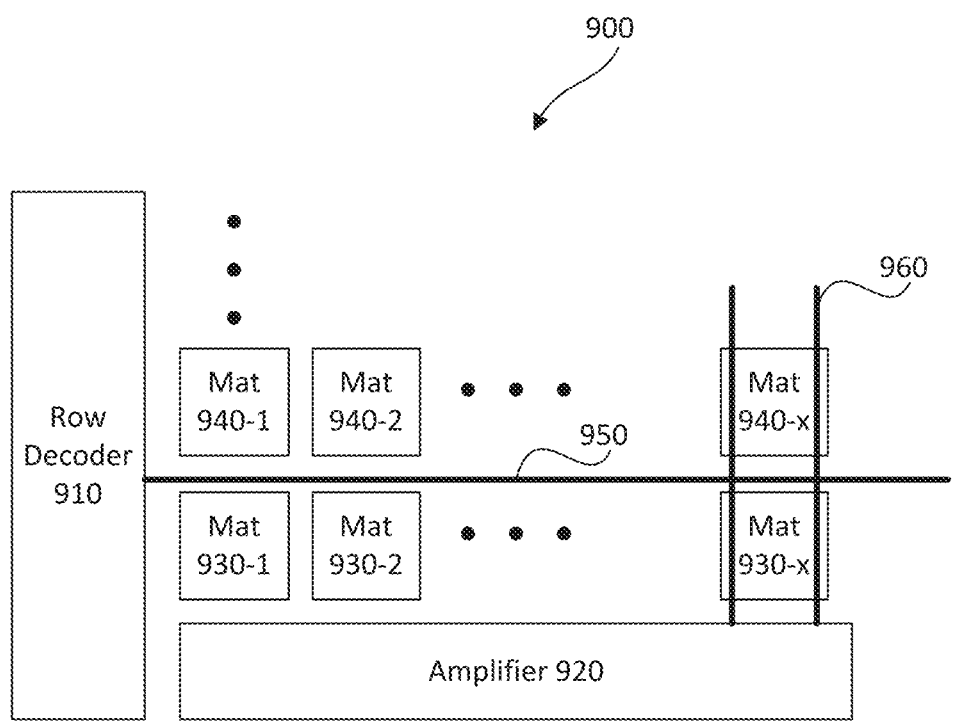
FIG. 9 is a diagrammatic representation of a memory bank.
Figure 10:
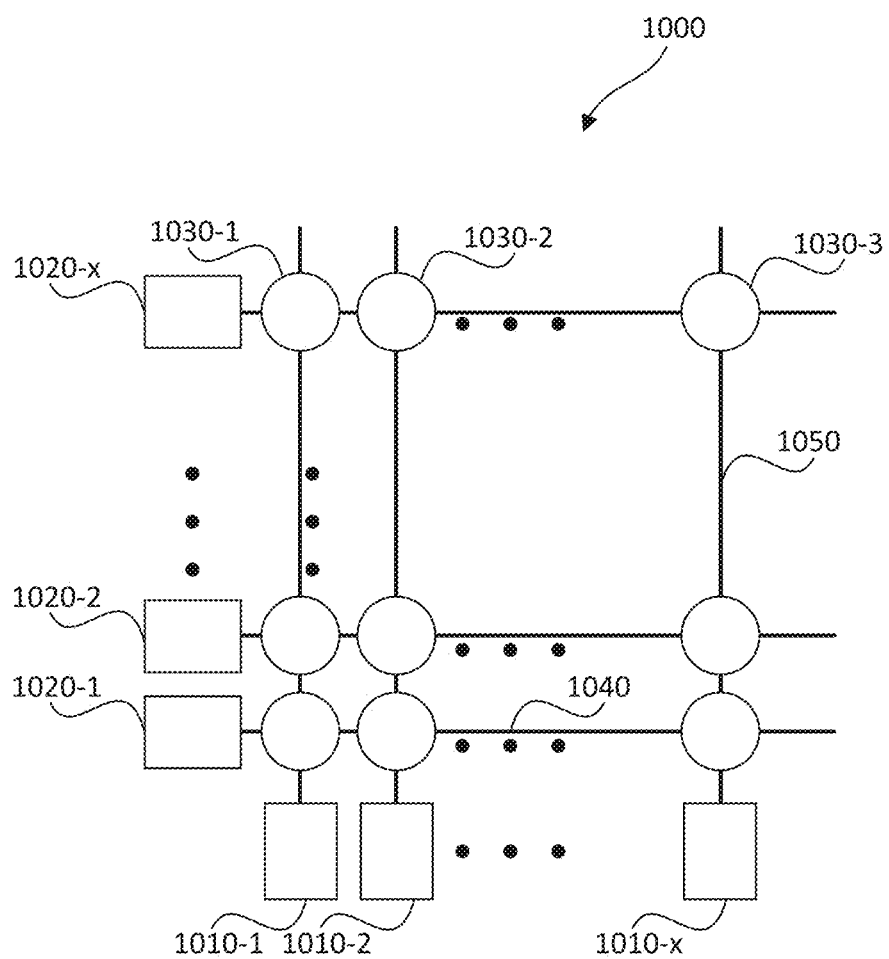
FIG. 10 is a diagrammatic representation of a memory bank.

An example of this conventional architecture is depicted in FIGS. 9 and 10. As shown in FIG. 9, at the bank level, a plurality of mats (e.g., mats 930-1, 930-2, 940-1, and 940-2) may form bank 900. In a conventional rectangular organization, bank 900 may be controlled across global wordlines (e.g., wordline 950) and global bitlines (e.g., bitline 960). Accordingly, row decoder 910 may select the correct wordline based on an incoming control signal (e.g., a request for a read from an address, a request for a write to an address, or the like) and global sense amplifier 920 (and/or a global column decoder, not shown in FIG. 9) may select the correct bitline based on the control signal. Amplifier 920 may also amplify any voltage levels from a selected bank during a read operation. Although depicted as using a row decoder for initial selecting and performing amplification along columns, a bank may additionally or alternatively use a column decoder for initial selecting and perform amplification along rows.

FIG. 10 depicts an example of a mat 1000. For example, mat 1000 may form a portion of a memory bank, such as bank 900 of FIG. 9. As depicted in FIG. 10, a plurality of cells (e.g., cells 1030-1, 1030-2, and 1030-3) may form mat 1000. Each cell may comprise a capacitor, a transistor, or other circuitry that stores at least one bit of data. For example, a cell may comprise a capacitor that is charged to represent a '1' and discharged to represent a '0' or may comprise a flip-flop having a first state representing a '1' and a second state representing a '0.' A conventional mat may comprise, for example, 512 bits by 512 bits. In embodiments where mat 1000 forms a portion of MRAM, ReRAM, or the like, a cell may comprise a transistor, resistor, capacitor or other mechanism for isolating an ion or portion of a material that stores at least one bit of data. For example, a cell may comprise a electrolyte ion, a portion of chalcogenide glass, or the like, having a first state representing a '1' and a second state representing a '0.'

As further depicted in FIG. 10, in a conventional rectangular organization, mat 1000 may be controlled across local wordlines (e.g., wordline 1040) and local bitlines (e.g., bitline 1050). Accordingly, wordline drivers (e.g., wordline driver 1020-1, 1020-2, . . . , 1020-*x*) may control the selected wordline to perform a read, write, or refresh based on a control signal from a controller associated with the memory bank of which mat 1000 forms a part (e.g., a request for a read from an address, a request for a write to an address, a refresh signal). Moreover, local sense amplifiers (e.g., local amplifiers 1010-1, 1010-2, . . . , 1010-*x*) and/or local column decoders (not shown in FIG. 10) may control the selected bitline to perform a read, write, or refresh. The local sense amplifiers may also amplify any voltage levels from a selected cell during a read operation. Although depicted as using a wordline driver for initial selecting and performing amplification along columns, a mat may instead use a bitline driver for initial selecting and perform amplification along rows.

As explained above, a large number of mats are duplicated to form a memory bank. Memory banks may be grouped to form a memory chip. For example, a memory chip may comprise eight to thirty-two memory banks. Accordingly, pairing processor subunits with memory banks on a conventional memory chip may result in only eight to thirty two processor subunits. Accordingly, embodiments of the present disclosure may include memory chips with additional sub-bank hierarchy. These memory chips of the present disclosure may then include processor subunits with memory sub-banks used as the dedicated memory banks paired with the processor subunits allowing for a larger number of sub processors, which may then achieve higher parallelism and performance of in-memory computing.

In some embodiments of the present disclosure, the global row decoder and global sense amplifier of bank 900 may be replaced with sub-bank controllers. Accordingly, rather than sending control signals to a global row decoder and a global sense amplifier of the memory bank, a controller of the memory bank may direct the control signal to the appropriate sub-bank controller. The direction may be controlled dynamically or may be hard-wired (e.g., via one or more logic gates). In some embodiments, fuses may be used to indicate the controller of each sub bank or mat whether to block or pass the control signal to the appropriate sub-bank or mat. In such embodiments, faulty sub-banks may thus be deactivated using the fuses.

In one example of such embodiments, a memory chip may include a plurality of memory banks, each memory bank having a bank controller and a plurality of memory sub-banks, each memory sub-bank having a sub-bank row decoder and a sub-bank column decoder for allowing reads and writes to locations on the memory sub-bank. Each sub-bank may comprise a plurality of memory mats, each memory mat having a plurality of memory cells and may have internally local row decoders, column decoders, and/or local sense amplifiers. The sub-bank row decoders and the sub-bank column decoders may process read and write requests from the bank controller or from a sub-bank processor subunit used for in memory computations on the sub-bank memory, as described below. Additionally, each memory sub-bank may further have a controller configured to determine whether to process read requests and write requests from the bank controller and/or to forward them to the next level (e.g., of row and column decoders on a mat) or to block the requests, e.g., to allow an internal processing element or processor subunit to access the memory. In some embodiments, the bank controller may be synchronized to a system clock. However, the sub-bank controllers may be not synchronized to the system clock.

As explained above, the use of sub-banks may allow for the inclusion of a larger number processor subunits in the memory chip than if processor subunits were paired with memory banks of conventional chips. Accordingly, each sub-bank may further have a processor subunit using the sub-bank as a dedicated memory. As explained above, the processor subunit may comprise a RISC, a CISC, or other general-purpose processing subunit and/or may comprise one or more accelerators. Additionally, the processor subunit may include an address generator, as explained above. In any of the embodiments described above, each processor subunit may be configured to access a sub-bank dedicated to the processor subunit using the row decoder and the column decoder of the sub-bank without using the bank controller. The processor sub-unit associated with the sub-bank may also handle the memory mats (including the decoder and memory redundancy mechanisms, described below) and/or determine whether a read or write request from an upper level (e.g., the bank level or the memory level) is forwarded and handled accordingly.

In some embodiments, the sub-bank controller may further include a register that stores a state of the sub-bank. Accordingly, the sub-bank controller may return an error if the sub-bank controller receives a control signal from the memory controller while the register indicates that the sub-bank is in use. In embodiments where each sub-bank further includes a processor subunit, the register may indicate an error if the processor subunit in the sub-bank is accessing the memory in conflict with an external request from the memory controller.

Figure 11:
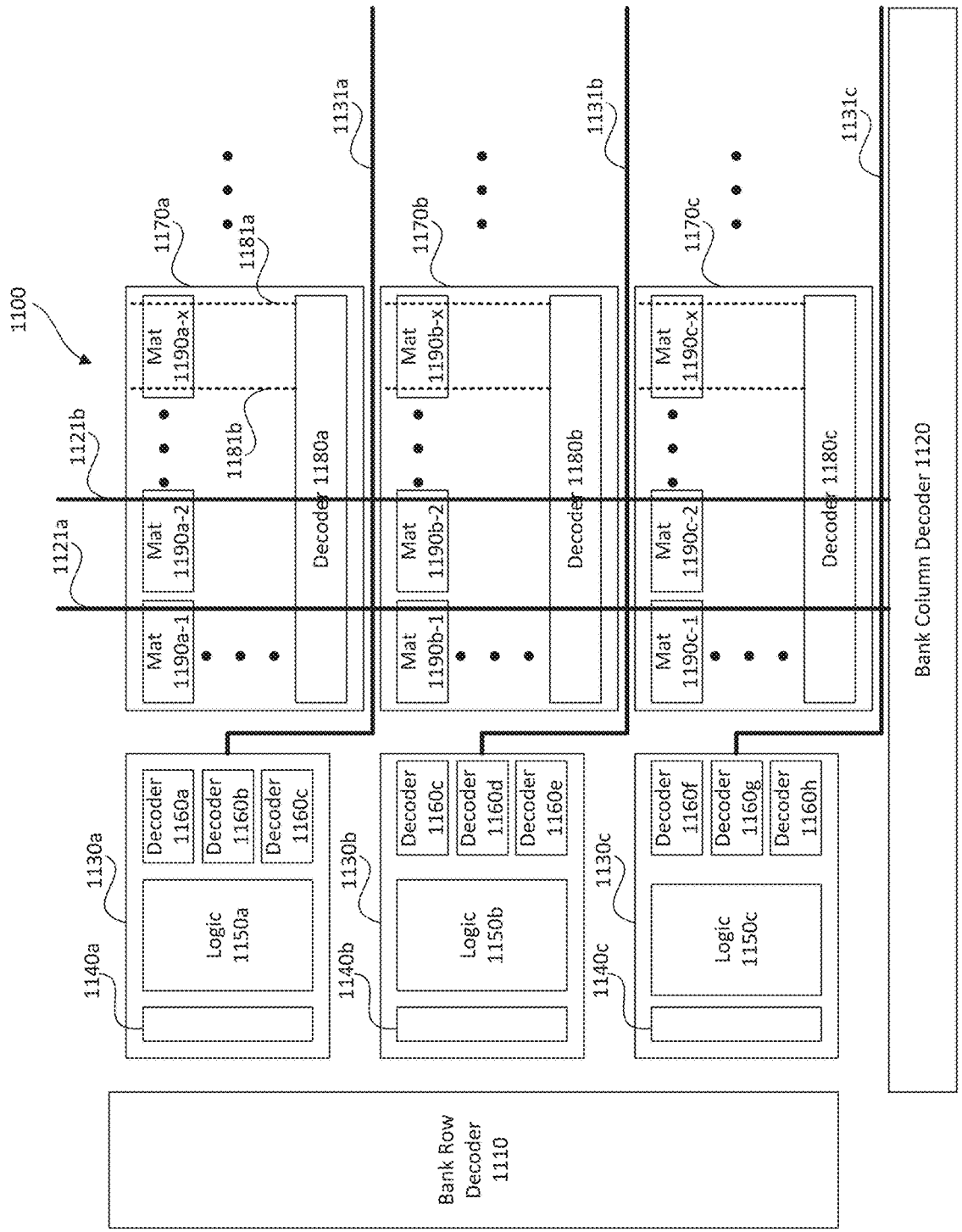
FIG. 11 is a diagrammatic representation of an embodiment of an exemplary memory bank with sub-bank controls consistent with the disclosed embodiments.

FIG. 11 shows an example of another embodiment of a memory bank using sub-bank controllers. In the example of FIG. 11, bank 1100 has a row decoder 1110, a column decoder 1120, and a plurality of memory sub-banks (e.g., sub-banks 1170*a*, 1170*b*, and 1170*c*) with sub-bank controllers (e.g., controllers 1130*a*, 1130*b*, and 1130*c*). The sub-bank controllers may include address resolvers (e.g., resolvers 1140a, 1140b, and 1140c), which may determine whether to pass a request to one or more sub-banks controlled by the sub-bank controller.

The sub-bank controllers may further include one or more logic circuits (e.g., logic 1150a, 1150b, and 1150c). For example, a logic circuit comprising one or more processing elements may allow for one or more operations, such as refreshing of cells in the sub-bank, clearing of cells in the sub-bank, or the like, to be performed without processing requests externally from bank 1100. Alternatively, the logic circuit may comprise a processor subunit, as explained above, such that the processor sub-unit has any sub-banks controlled by the sub-bank controller as corresponding, dedicated memory. In the example of FIG. 11, logic 1150a may have sub-bank 1170a as a corresponding, dedicated memory, logic 1150b may have sub-bank 1170b as a corresponding, dedicated memory, and logic 1150c may have sub-bank 1170c as a corresponding, dedicated memory. In any of the embodiments described above, the logic circuits may have buses to the sub-banks, e.g., buses 1131a, 1131b, or 1131c. As further depicted in FIG. 11, the sub-bank controllers may each include a plurality of decoders, such as a sub-bank row decoder and a sub-bank column decoder for allowing reads and writes, either by a processing element or processor subunit or by a higher-level memory controller issuing commands, to locations on the memory sub-bank(s). For example, sub-bank controller 1130a includes decoders 1160a, 1160b, and 1160c, sub-bank controller 1130b includes decoders 1160d, 1160e, and 1160f, and sub-bank controller 1130c includes decoders 1160g, 1160h, and 1160i. The sub-bank controllers may, based on a request from bank row decoder 1110, select a wordline using the decoders included in the sub-bank controllers. The described system may allow a processing element or processor subunit of the sub-bank to access the memory without interrupting other banks and even other sub-banks, thereby allowing each sub-bank processor subunit to perform memory computations in parallel with the other sub-bank processor subunits.

Furthermore, each sub-bank may comprise a plurality of memory mats, each memory mat having a plurality of memory cells. For example, sub-bank 1170a includes mats 1190a-1, 1190a-2, . . . , 1190a-x; sub-bank 1170b includes mats 1190b-1, 1190b-2, . . . , 1190b-x; and sub-bank 1170c includes mats 1190c-1, 1190c-2, . . . , 1190c-3. As further depicted in FIG. 11, each sub-bank may include at least one decoder. For example, sub-bank 1170a includes decoder 1180a, sub-bank 1170b includes decoder 1180b, and sub-bank 1170c includes decoder 1180c. Accordingly, bank column decoder 1120 may select a global bitline (e.g., bitline 1121a or 1121b) based on external requests while the sub-bank selected by bank row decoder 1110 may use its column decoder to select a local bitline (e.g., bitline 1181a or 1181b) based on local requests from the logic circuit to which the sub-bank is dedicated. Accordingly, each processor subunit may be configured to access a sub-bank dedicated to the processor subunit using the row decoder and the column decoder of the sub-bank without using the bank row decoder and the bank column decoder. Thus, each processor subunit may access a corresponding sub-bank without interrupting other sub-banks. Moreover, sub-bank decoders may reflect accessed data to the bank decoders when the request to the sub-bank is external to the processor subunit. Alternatively, in embodiments where each sub-bank has only one row of memory mats, the local bitlines may be the bitlines of the mat rather than bitlines of the sub-bank.

A combination of embodiments using sub-bank row decoders and sub-bank column decoders with the embodiment depicted in FIG. 11 may be used. For example, the bank row decoder may be eliminated but the bank column decoder retained and local bitlines used.

Figure 12:
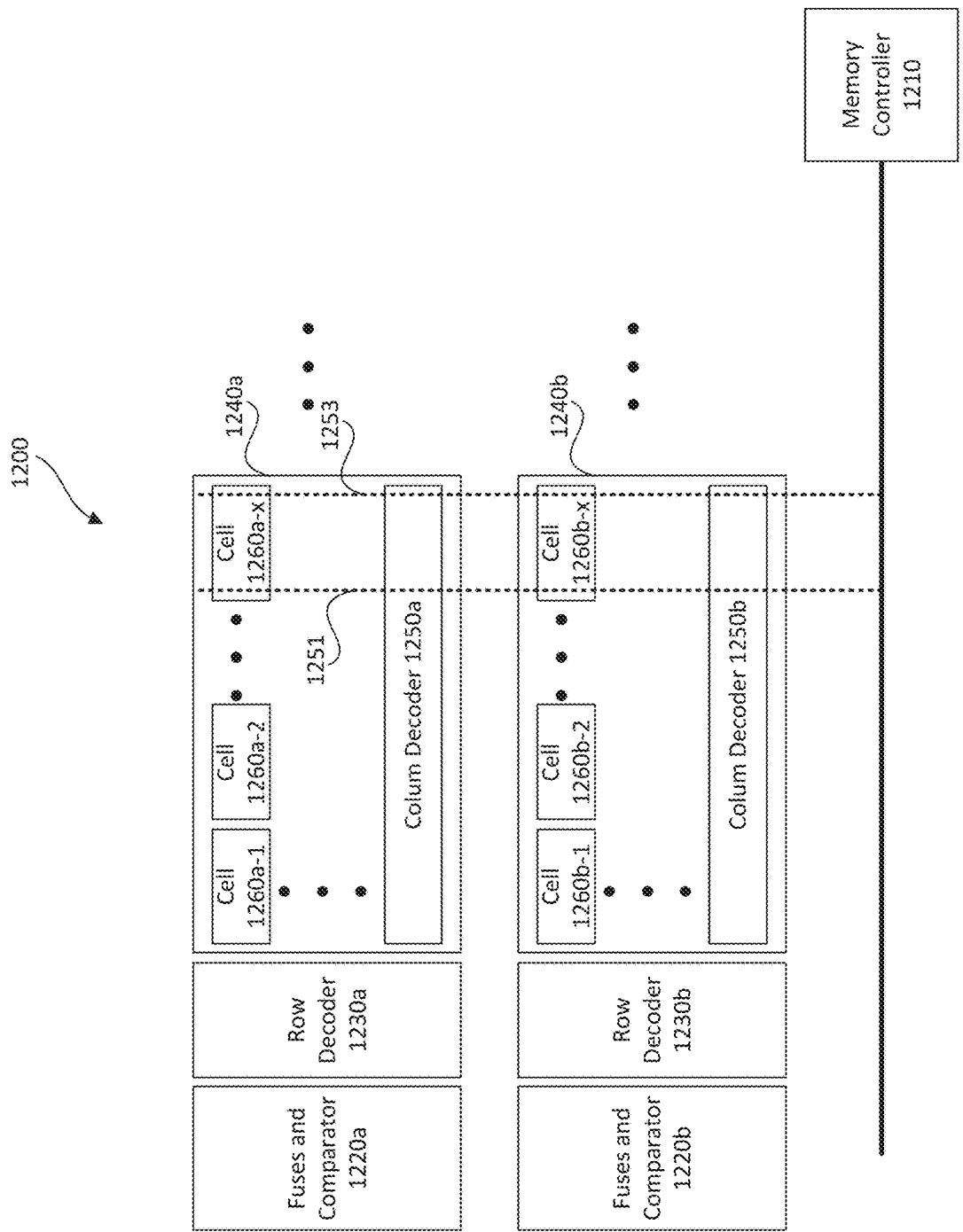
FIG. 12 is a diagrammatic representation of another embodiment of an exemplary memory bank with sub-bank controls consistent with the disclosed embodiments.

FIG. 12 shows an example of an embodiment of a memory sub-bank 1200 having a plurality of mats. For example, sub-bank 1200 may represent a portion of sub-bank 1100 of FIG. 11 or may represent an alternative implementation of a memory bank. In the example of FIG. 12, sub-bank 1200 includes a plurality of mats (e.g., mats 1240a and 1240b). Moreover, each mat may include a plurality of cells. For example, mat 1240a includes cells 1260a-1, 1260a-2, . . . , 1260a-x, and mat 1240b includes cells 1260b-1, 1260b-2, . . . , 1260b-x.

Each mat may be assigned a range of addresses that will be assigned to the memory cells of the mat. These addresses may be configured at production such that mats may be shuffled around and such that faulted mats may be deactivated and left unused (e.g., using one or more fuses, as explained further below).

Sub-bank 1200 receives read and write requests from memory controller 1210. Although not depicted in FIG. 12, requests from memory controller 1210 may be filtered through a controller of sub-bank 1200 and directed to an appropriate mat of sub-bank 1200 for address resolution. Alternatively, at least a portion (e.g., higher bits) of an address of a request from memory controller 1210 may be transmitted to all mats of sub-bank 1200 (e.g., mats 1240a and 1240b) such that each mat may process the full address and the request associated with the address only if the mat's assigned address range includes the address specified in the command. Similar to the sub-bank direction described above, the mat determination may be dynamically controlled or may be hardwired. In some embodiments, fuses may be used to determine the address range for each mat, also allowing for disabling of faulty mats by assigning an illegal address range. Mats may additionally or alternatively be disabled by other common methods or connection of fuses.

In any of the embodiments described above, each mat of the sub-bank may include a row decoder (e.g., row decoder 1230a or 1230b) for selection of a wordline in the mat. In some embodiments, each mat may further include fuses and comparators (e.g., 1220a and 1220b). As described above, the comparators may allow each mat to determine whether to process an incoming request, and the fuses may allow each mat to deactivate if faulty. Alternatively, row decoders for the bank and/or sub-bank may be used rather than a row decoder in each mat.

Furthermore, in any of the embodiments described above, a column decoder included in the appropriate mat (e.g., column decoder 1250a or 1250b) may select a local bitline (e.g., bitline 1251 or 1253). The local bitline may be connected to a global bitline of the memory bank. In embodiments where the sub-bank has local bitlines of its own, the local bitline of the cell may be further connected to the local bitline of the sub-bank. Accordingly, data in the selected cell may be read through the column decoder (and/or sense amplifier) of the cell, then through the column decoder (and/or sense amplifier) of the sub-bank (in embodiments including a sub-bank column decoder and/or sense amplifier), and then through the column decoder (and/or sense amplifier) of the bank.

Mat 1200 may be duplicated and arrayed to form a memory bank (or a memory sub-bank). For example, a memory chip of the present disclosure may comprise a plurality of memory banks, each memory bank having a plurality of memory sub-banks, and each memory sub-bank having a sub-bank controller for processing reads and writes to locations on the memory sub-bank. Furthermore, each memory sub-bank may comprise a plurality of memory mats, each memory mat having a plurality of memory cells and having a mat row decoder and a mat column decoder (e.g., as depicted in FIG. 12). The mat row decoders and the mat column decoders may process read and write requests from the sub-bank controller. For example, the mat decoders may receive all requests and determine (e.g., using a comparator) whether to process the request based on a known address range of each mat, or the mat decoders may only receive requests within the known address range based on selection of a mat by the sub-bank (or bank) controller.

Controller Data Transfers

Any of the memory chips of the present disclosure may also share data using memory controllers (or sub-bank controllers or mat controllers) in addition to sharing data using processing subunits. For example, a memory chip of the present disclosure may comprise a plurality of memory banks (e.g., an SRAM bank, a DRAM bank, or the like), each memory bank having a bank controller, a row decoder, and a column decoder for allowing reads and writes to locations on the memory bank, as well as a plurality of buses connecting each controller of the plurality of bank controllers to at least one other controller of the plurality of bank controllers. The plurality of buses may be similar to the buses connecting the processing subunits, as described above, but connecting the bank controllers directly rather than through the processing subunits. Furthermore, although described as connecting the bank controllers, buses may additionally or alternatively connect sub-bank controllers and/or mat controllers.

In some embodiments, the plurality of buses may be accessed without interruption of data transfers on main buses of the memory banks connected to one or more processor subunits. Accordingly, a memory bank (or sub-bank) may transmit data to or from a corresponding processor subunit in the same clock cycle as transmitting data to or from a different memory bank (or sub-bank). In embodiments where each controller is connected to a plurality of other controllers, the controllers may be configurable for selection of one other of the other controllers for sending or receiving of data. In some embodiments, each controller may be connected to at least one neighboring controller (e.g., pairs of spatially adjacent controllers may be connected to one another).

Redundant Logic in Memory Circuits

The disclosure is generally directed to a memory chip with primary logic portions for on-chip data processing. The memory chip may include redundant logic portions, which may replace defective primary logic portions to increase the fabrication yield of the chip. Thus, the chip may include on-chip components that allow a configuration of logic blocks in the memory chip based on individual testing of the logic portions. This feature of the chip may increase yields because a memory chip with larger areas dedicated to logic portions is more susceptible to fabrication failures. For example, DRAM memory chips with large redundant logic portions may be susceptible to fabrication issues that reduce yield. However, implementing redundant logic portions may result in increased yield and reliability because it provides a manufacturer or user of DRAM memory chips to turn on or off full logic portions while maintaining the ability of high parallelism. It should be noted that here and throughout the disclosure, example of certain memory types (such as DRAM) may be identified in order to facilitate the explanation of disclosed embodiments. It is to be understood, however, that in such instances the identified memory types are not intended to be limiting. Rather, memory types such as DRAM, Flash, SRAM, ReRAM, PRAM, MRAM, ROM, or any other memory may be used together with the disclosed embodiments even if fewer examples are specifically identified in a certain section of the disclosure.

Figure 13:
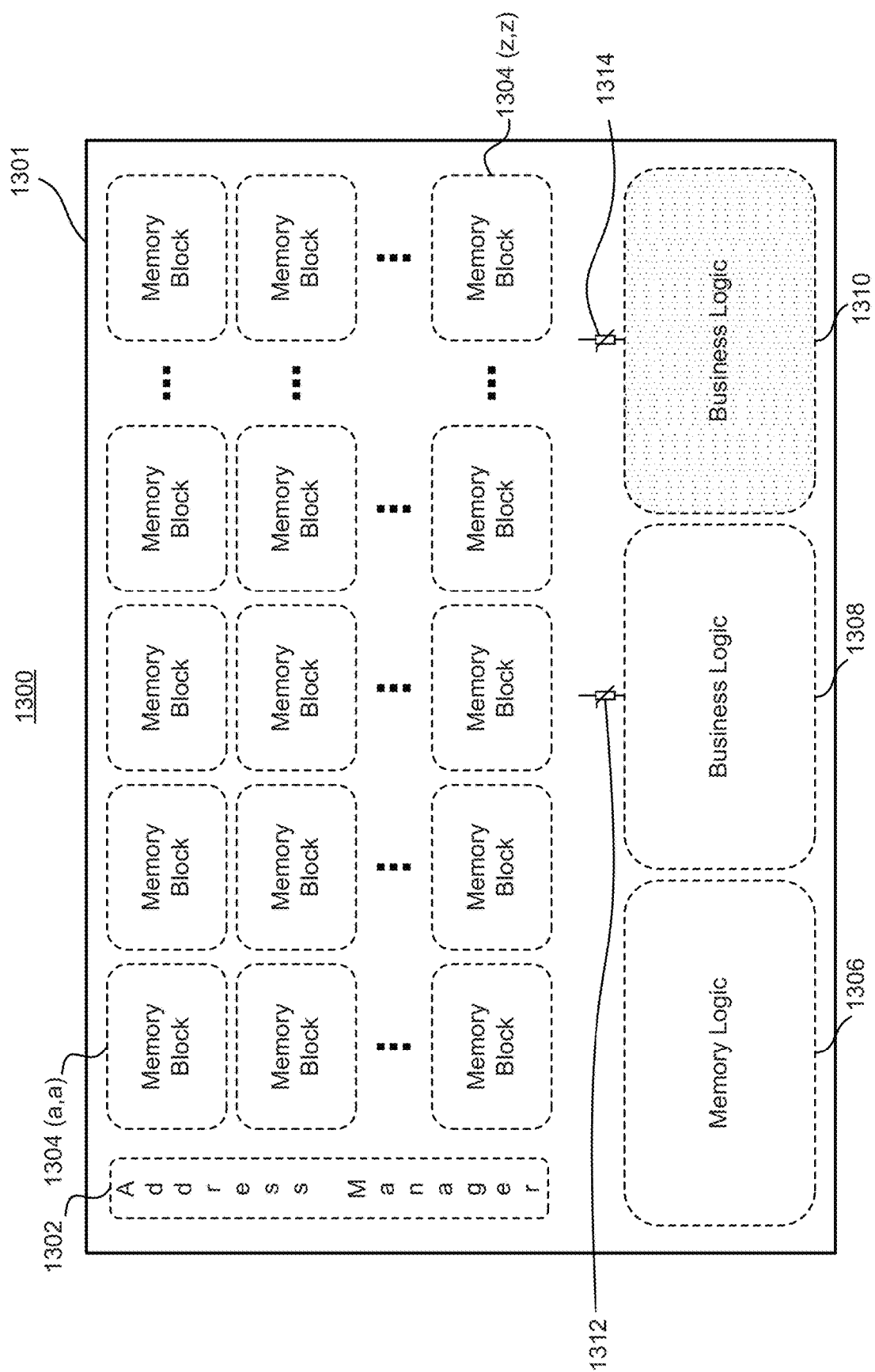
FIG. 13 is a block diagram of an exemplary memory chip, consistent with disclosed embodiments.

FIG. 13 is a block diagram of an exemplary memory chip 1300, consistent with disclosed embodiments. Memory chip 1300 may be implemented as a DRAM memory chip. Memory chip 1300 may also be implemented as any type of memory volatile or non-volatile, such as Flash, SRAM, ReRAM, PRAM, and/or MRAM, etc. Memory chip 1300 may include a substrate 1301 in which an address manager 1302, a memory array 1304 including a plurality of memory banks, 1304(*a,a*) to 1304(*z,z*), a memory logic 1306, a business logic 1308, and a redundant business logic 1310 are disposed. Memory logic 1306 and business logic 1308 may constitute primary logic blocks, while redundant business logic 1310 may constitute redundant blocks. In addition, memory chip 1300 may include configuration switches, which may include deactivation switches 1312, and an activation switches 1314. Deactivation switches 1312 and activation switches 1314 may also be disposed in the substrate 1301. In this Application, memory logic 1306, business logic 1308, and redundant business logic 1310 may also be collectively referred to as the "logic blocks."

Address manager 1302 may include row and column decoders or other type of memory auxiliaries. Alternatively, or additionally, address manager 1302 may include a microcontroller or processing unit.

In some embodiments, as shown in FIG. 13, memory chip 1300 may include a single memory array 1304 that may arrange the plurality of memory blocks in a two-dimensional array on substrate 1301. In other embodiments, however, memory chip 1300 may include multiple memory arrays 1304 and each of the memory arrays 1304 may arrange memory blocks in different configurations. For example, memory blocks in at least one of the memory arrays (also known as memory banks) may be arranged in a radial distribution to facilitate routing between address manager 1302 or memory logic 1306 to the memory blocks.

Business logic 1308 may be used to do the in-memory computation of an application that is not related to the logic used to manage the memory itself. For example, business logic 1308 may implement functions related to AI such as floating, integer, or MAC operations used as activation functions. In addition, business logic 1308 may implement data base related functions like min, max, sort, count, among others. Memory logic 1306 may perform tasks related to memory management, including (but not limited to) read, write, and refresh operations. Therefore, business logic may be added in one or more of the bank level, mats level, or a group of mats level. Business logic 1308 may have one or more address outputs and one or more data inputs/outputs. For instance, business logic 1308 can address by row\column lines to address manager 1302. In certain embodiments, however, the logic blocks may be additionally or alternatively addressed via data inputs\outputs.

Redundant business logic 1310 may be a replicate of business logic 1308. In addition, redundant business logic 1310 may be connected to deactivation switches 1312 and/or activation switches 1314, which may include small fuse\anti-fuse, and used for logic disabling or enabling one of the instances (e.g., an instance which is connected by default) and enable one of the other logic blocks (e.g., an instance which is disconnected by default). In some embodiments, as further described in connection to FIG. 15, the redundancy of blocks may be local within a logic block, such as business logic 1308.

In some embodiments, the logic blocks in memory chip 1300 may be connected to subsets of memory array 1304 with dedicated buses. For example, a set of memory logic 1306, business logic 1308, and redundant business logic 1310 may be connected to the first row of memory blocks in memory array 1304 (i.e., memory blocks 1304 (*a,a*) to 1304 (*a,z*)). The dedicated buses may allow associated logic blocks to quickly access data from the memory blocks without requirements of opening communication lines through, for example, address manager 1302.

Each of the plurality of primary logic blocks may be connected to at least one of the plurality of memory banks 1304. Also, redundant blocks, such as redundant business block 1310, may be connected to at least one of the memory instances 1304(*a,a*)-(*z,z*). Redundant blocks may replicate at least one of the plurality of primary logic blocks, such as memory logic 1306 or business logic 1308. Deactivation switches 1312 may be connected to at least one of the plurality of primary logic blocks and activation switches 1314 may be connected to at least one of the plurality of redundant blocks.

In these embodiments, upon detecting of a fault associated with one of the plurality of primary logic blocks (memory logic 1306 and/or business logic 1308), deactivation switches 1312 may be configured to disable the one of the plurality of primary logic blocks. Simultaneously, activation switches 1314 may be configured to enable one of the plurality of redundant blocks, such as redundant logic block 1310, that replicates the one of the plurality of primary logic blocks.

In addition, activation switches 1314 and deactivation switches 1312, which may collectively be referred to as "configuration switches," may include an external input to configure the status of the switch. For instance, activation switches 1314 may be configured so an activation signal in the external input causes a closed switch condition, while deactivation switches 1312 may be configured so a deactivation signal in the external input causes an open switch condition. In some embodiments, all configuration switches in 1300 may be deactivated by default and become activated or enabled after a test indicates an associated logic block is functional and a signal is applied in the external input. Alternatively, in some cases, all configuration switches in 1300 may be enabled by default and may be deactivated or disabled after a test indicates an associated logic block is not functional and a deactivation signal is applied in the external input.

Regardless of whether a configuration switch is initially enabled or disabled, upon detection of a fault associated with an associated logic block, the configuration switch may disable the associated logic block. In cases where the configuration switch is initially enabled, the state of the configuration switch may be changed to disabled in order to disable the associated logic block. In cases where the configuration switch is initially disabled, the state of the configuration switch may be left in its disabled state in order to disable the associated logic block. For example, the result of an operability test may indicate that a certain logic block is nonoperational or that it fails to operate within certain specifications. In such cases, the logic block may be disabled my not enabling its corresponding configuration switch.

In some embodiments, configuration switches may be connected to two or more logic blocks and may be configured to choose between different logic blocks. For example, a configuration switch may be connected to both business logic 1308 and redundant logic block 1310. Configuration switch may enable redundant logic block 1310 while disabling business logic 1308.

Alternatively, or additionally, at least one of the plurality of primary logic blocks (memory logic 1306 and/or business logic 1308) may be connected to a subset of the plurality of memory banks or memory instances 1304 with a first dedicated connection. Then, at least one of the plurality of redundant blocks (such as redundant business logic 1310), which replicates the at least one of the plurality of primary logic blocks, may be connected to the subset of the same plurality of memory banks or instances 1304 with a second dedicated connection.

Moreover, memory logic 1306 may have different functions and capabilities than business logic 1308. For example, while memory logic 1306 may be designed to enable read and write operations in the memory bank 1304, business logic 1308 may be designed to perform in-memory computations. Therefore, if the business logic 1308 includes a first business logic block, and the business logic 1308 includes a second business logic block (like redundant business logic 1310), it is possible to disconnect defective business logic 1308 and reconnect redundant business logic 1310 without missing any capability.

In some embodiments, configuration switches (including deactivation switches 1312 and activation switches 1314) may be implemented with a fuse, an anti-fuse, or a programmable device (including a one-time programmable device), or other form of non-volatile memory.

Figure 14:
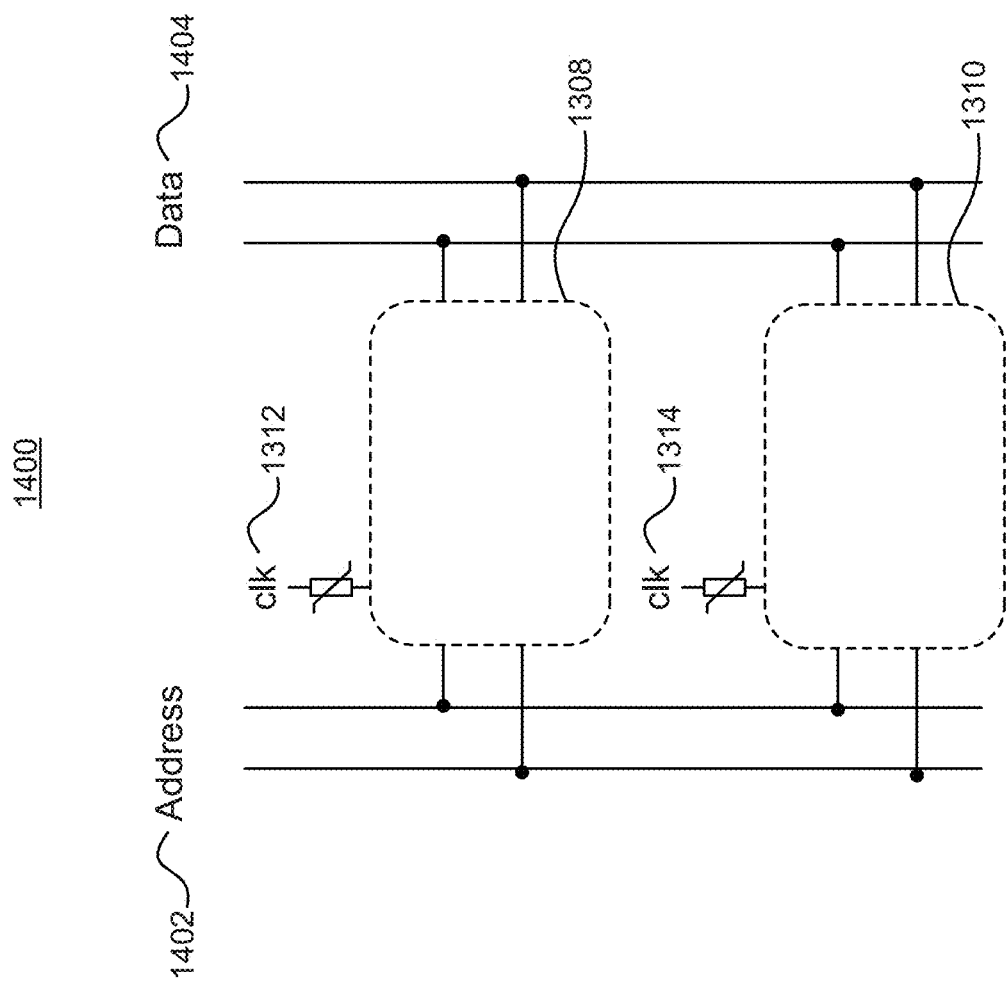
FIG. 14 is a block diagram of an exemplary redundant logic block set, consistent with disclosed embodiments.

FIG. 14 is a block diagram of an exemplary redundant logic block set 1400, consistent with disclosed embodiments. In some embodiments, redundant logic block set 1400 may be disposed in substrate 1301. Redundant logic block set 1400 may include at least one of business logic 1308, and redundant business logic 1310, connected to switches 1312 and 1314, respectively. In addition, business logic 1308 and redundant business logic 1310 may be connected to an address bus 1402 and a data bus 1404.

In some embodiments, as shown in FIG. 14, the switches 1312 and 1314 may connect logic blocks to a clock node. In this way, the configuration switches may engage or disengage the logic blocks from the clock signal, effectively activating or deactivating the logic blocks. In other embodiments, however, switches 1312 and 1314 may connect logic blocks to other nodes for activation or deactivation. For instance, configuration switches may connect logic blocks to a voltage supply node (e.g., VCC) or to the ground node (e.g., GND) or clock signal. In this way, the logic blocks may be enable of disable by the configuration switches because they would create an open circuit or cut-off the logic block power supply.

In some embodiments, as shown in FIG. 14, address bus 1402 and data bus 1404 may be in opposite sides of the logic blocks, which are connected in parallel to each one of the buses. In this way, routing of the different on-chip components may be facilitated by the logic block set 1400.

In some embodiments, each one of the plurality of deactivation switches 1312 couple at least one of the plurality of primary logic blocks with a clock node, and each one of the plurality of activation switches 1314 may be couple at least one of the plurality of redundant blocks with the clock node allowing to connect\disconnect the clock as a simple activation\deactivation mechanism.

Redundant business logic 1310 of redundant logic block set 1400 allows the designer to choose, based on area and routing, the blocks that are worth duplication. For example, a chip designer may select larger blocks for duplication because larger blocks may be more error prone. Thus, a chip designer may decide to duplicate large logic blocks. On the other hand, a designer may prefer to duplicate smaller logic blocks because they are easily duplicated without a significant loss of space. Moreover, using the configuration in FIG. 14, a designer may easily choose to duplicate logic blocks depending on the statistics of errors per area.

Figure 15:
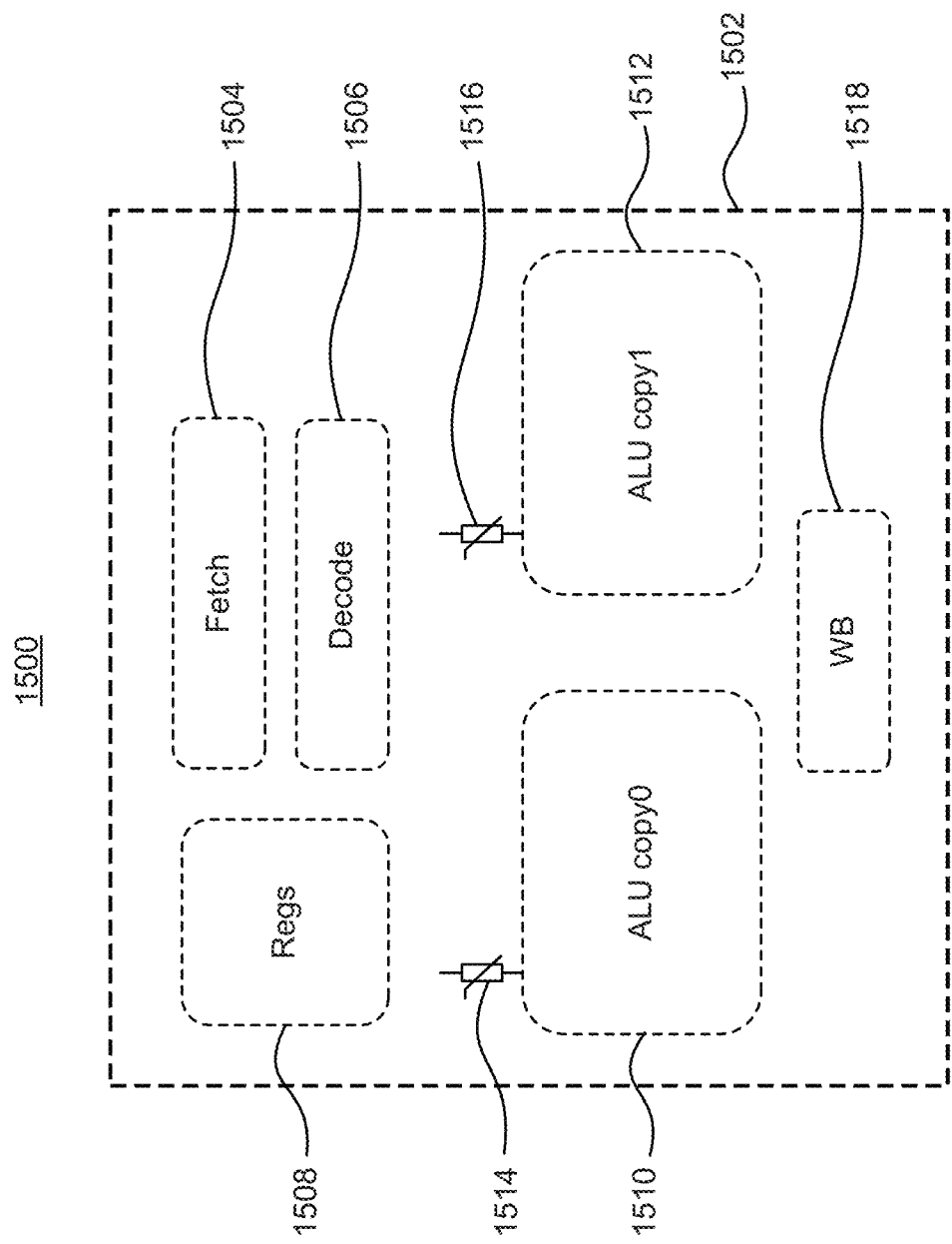
FIG. 15 is a block diagram for an exemplary logic block, consistent with disclosed embodiments.

FIG. 15 is a block diagram for an exemplary logic block 1500, consistent with disclosed embodiments. The logic block may be business logic 1308 and/or redundant business logic 1310. In other embodiments, however, the exemplary logic block may describe memory logic 1306 or other component of memory chip 1300.

Logic block 1500 presents yet another embodiment where the logic redundancy is used within a small processor pipeline. The logic block 1500 may include a register 1508, a fetch circuit 1504, decoder 1506, and a write-back circuit 1518. In addition, logic block 1500 may include a computation unit 1510 and a duplicated computing unit 1512. However, in other embodiments, logic block 1500 may include other units that do not comprise a controller pipeline but include sporadic processing elements that comprise a required business logic.

Computation unit 1510 and duplicated computation unit 1512 may include a digital circuit capable of performing digital calculations. For example, computation unit 1510 and duplicated computation unit 1512 may include an arithmetic logic unit (ALU) to perform arithmetic and bitwise operations on binary numbers. Alternatively, computation unit 1510 and duplicated computation unit 1512 may include a floating-point unit (FPU), which operates on floating point numbers. In addition, in some embodiments computation unit 1510 and duplicated computation unit 1512 may implement data base related functions like min, max, count, and compare operations, among others.

In some embodiments, as shown in FIG. 15, computation unit 1510 and duplicated computation unit 1512 may be connected to switching circuits 1514 and 1516. When activated the switching circuits may enable or disable the computing units.

In logic block 1500, the duplicated computation unit 1512 may replicate the computation unit 1510. Moreover, in some embodiments, register 1508, fetch circuit 1504, decoder 1506, and write-back circuit 1518 (collectively referred to as the local logic units) may be smaller in size than the computation unit 1510. Because larger elements are more prone to issues during fabrication, a designer may decide to replicate larger units (such as computation unit 1510) instead of smaller units (such as the local logic units). Depending on historic yields and error rates, however, a designed may elect to duplicate local logic units additionally or alternatively to large units (or the entire block). For example, computation unit 1510 may be larger, and thus more error prone, than register 1508, fetch circuit 1504, decoder 1506, and write-back circuit 1518. A designer may choose to duplicate computation unit 1510 instead of the other elements in logic block 1500 or the whole block.

Logic block 1500 may include a plurality of local configuration switches, each one of the plurality of local configuration switches being connected to at least one of the at least one of computation unit 1510 or duplicated computation unit 1512. Local configuration switches may be configured to disable computation unit 1510 and enable duplicated computation unit 1512 when a fault is detected in the computation unit 1510.

Figure 16:
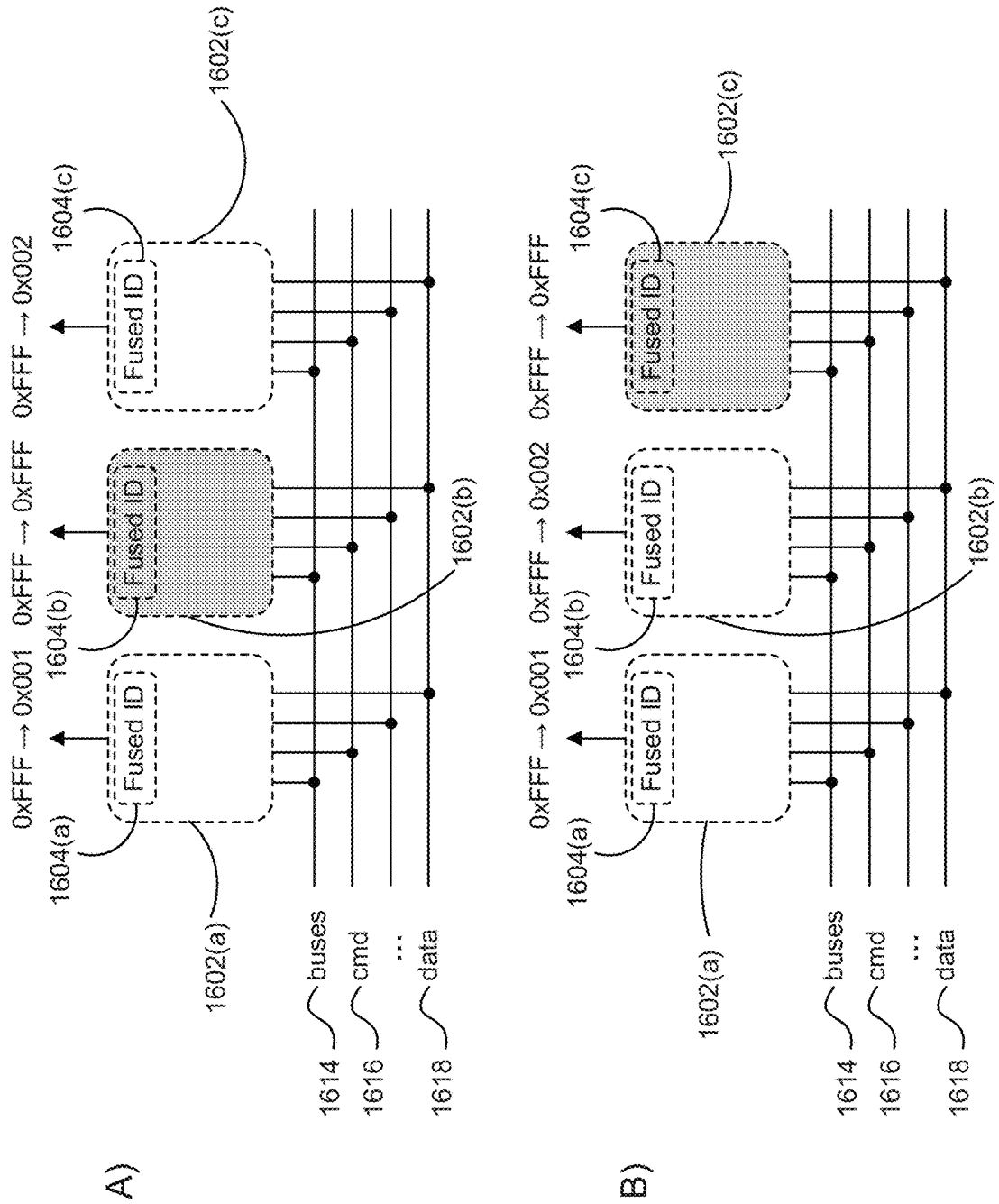
FIG. 16 are block diagrams of exemplary logic blocks connected with a bus, consistent with disclosed embodiments.

FIG. 16 shows block diagrams of exemplary logic blocks connected with a bus, consistent with disclosed embodiments. In some embodiments, logic blocks 1602 (which may represent memory logic 1306, business logic 1308, or redundant business logic 1310) may be independent of each other, may be connected via a bus, and may be activated externally by addressing them specifically. For example, memory chip 1300 may include many logic blocks, each logic block having an ID number. In other embodiments, however, logic blocks 1602 may represent larger units comprised of a plurality one or more of memory logic 1306, business logic 1308, or redundant business logic 1310.

In some embodiments, each one of logic blocks 1602 may be redundant with the other logic blocks 1602. This complete redundancy, in which all blocks may operate as primary or redundant blocks, may improve fabrication yields because a designer may disconnect faulty units while maintaining functionality of the overall chip. For example, a designer may have the ability to disable logic areas that are prone to errors but maintain similar computation capabilities because the all duplicate blocks may be connected to the same address and data buses. For example, the initial number of logic blocks 1602 may greater than a target capability. Then, disabling some logic blocks 1602 would not affect the target capability.

A bus connected to the logic blocks may include address bus 1614, command lines 1616, and data lines 1618. As shown in FIG. 16, each one of the logic blocks may be connected independently from each line in the bus. In certain embodiments, however, logic blocks 1602 may be connected in a hierarchical structure to facilitate routing. For instance, each line in the bus may be connected to a multiplexer that routes the line to different logic blocks 1602.

In some embodiments, to allow external access without knowing the internal chip structure, which may change due to enable and disabled units, each one of the logic blocks may include Fused IDs such as fused identification 1604. Fused identification 1604 may include an array of switches (like fuses) that determine an ID and may be connected to a managing circuit. For example, fused identification 1604 may be connected to address manager 1302. Alternatively, fused identification 1604 may be connected to higher memory address units. In these embodiments, fused identification 1604 may be configurable to for a specific address. For example, fused identification 1604 may include a programmable, non-volatile device that determines a final ID based on instructions received form a managing circuit.

A distributed processor on a memory chip may be designed with the configuration depicted in FIG. 16. A testing procedure executed as BIST at chip wakeup or at factory testing may assign running ID numbers to blocks in the plurality of primary logic blocks (memory logic 1306 and business logic 1308) that pass a testing protocol. A testing procedure may also assign illegal ID numbers to blocks in the plurality of primary logic blocks that do not pass the testing protocol. The test procedure may also assign running ID numbers to blocks in the plurality of redundant blocks (redundant logic block 1310) that pass the testing protocol. Because redundant blocks replace failing primary logic blocks, the blocks in the plurality of redundant blocks assigned running ID numbers may be equal to, or greater than, the blocks in the plurality of primary logic blocks assigned illegal ID numbers, thereby disabling the block. In addition, each one of the plurality of primary logic blocks and each one of the plurality of redundant blocks may include at least one fused identification 1604. Also, as shown in FIG. 16, the bus connecting logic blocks 1602 may include a command line, a data line, and an address line.

In other embodiments, however, all logic blocks 1602 that are connected to the bus will start disabled and with no ID number. Tested one by one, each good logic block will get a running ID number, and those logic blocks not working will remain with illegal ID, which would disable these blocks. In this manner, redundant logic blocks may improve the fabrication yields by replacing blocks that are known to be defective during the testing process.

Address bus 1614 may couple a managing circuit to each one of the plurality of memory banks, each one of the plurality of primary logic blocks, and each one of the plurality of redundant blocks. These connections allow the managing circuit to, upon detection of the fault associated with a primary logic blocks (such as business logic 1308), assign an invalid address to the one of the plurality of primary logic blocks and assign a valid address to the one of the plurality of redundant blocks.

For example, as shown in FIG. 16A, illegal IDs are configured to all logic blocks 1602(a)-(c) (e.g., address 0xFFF). After testing logic blocks 1602(a) and 1602(c) are verified to be functional while logic block 1602(b) is not functional. In FIG. 16A unshaded logic blocks may represent logic blocks that passed the functionality test successfully, while shaded logic blocks may represent logic blocks that failed the test for functionality. Then, the test procedure changes the illegal IDs to legal IDs for logic blocks that are functional while leaving the illegal IDs for logic blocks that are not functional. As an example, in FIG. 16A, the address for logic blocks 1602(a) and 1602(c) is changed from 0xFFF to 0x001 and 0x002, respectively. In contrast, the address for logic block 1602(b) remains the illegal address 0xFFF. In some embodiments, the ID is changed by programming a corresponding fused identification 1604.

Different results from the testing of logic blocks 1602 may result in a different configuration. For example, as shown in FIG. 16B, address manager 1302 may initially assign illegal IDs to all logic blocks 1602 (i.e., 0xFFF). The testing results, however, may indicate that both logic blocks 1602(a) and 1602(b) are functional. In these cases, testing of logic block 1602(c) may not be necessary because memory chip 1300 may require only two logic blocks. Therefore, to minimize testing resources, logic blocks may be tested only according to the minimum number of functional logic blocks needed by the product definition of 1300, leaving other logic blocks untested. FIG. 16B also shows unshaded logic blocks, which represent tested logic blocks that passed the test for functionality, and shaded logic blocks, which represent untested logic blocks.

In these embodiments, a production tester (external or internal, automatic or manual) or a controller executing a BIST at startup, may change illegal IDs to running IDs for tested logic blocks that are functional while leaving the illegal IDs to untested logic blocks. As an example, in FIG. 16B, the address for logic blocks 1602(a) and 1602(b) is changed from 0xFFF to 0x001 and 0x002, respectively. In contrast, the address for untested logic block 1602(c) remains with the illegal address 0xFFF.

Figure 17:
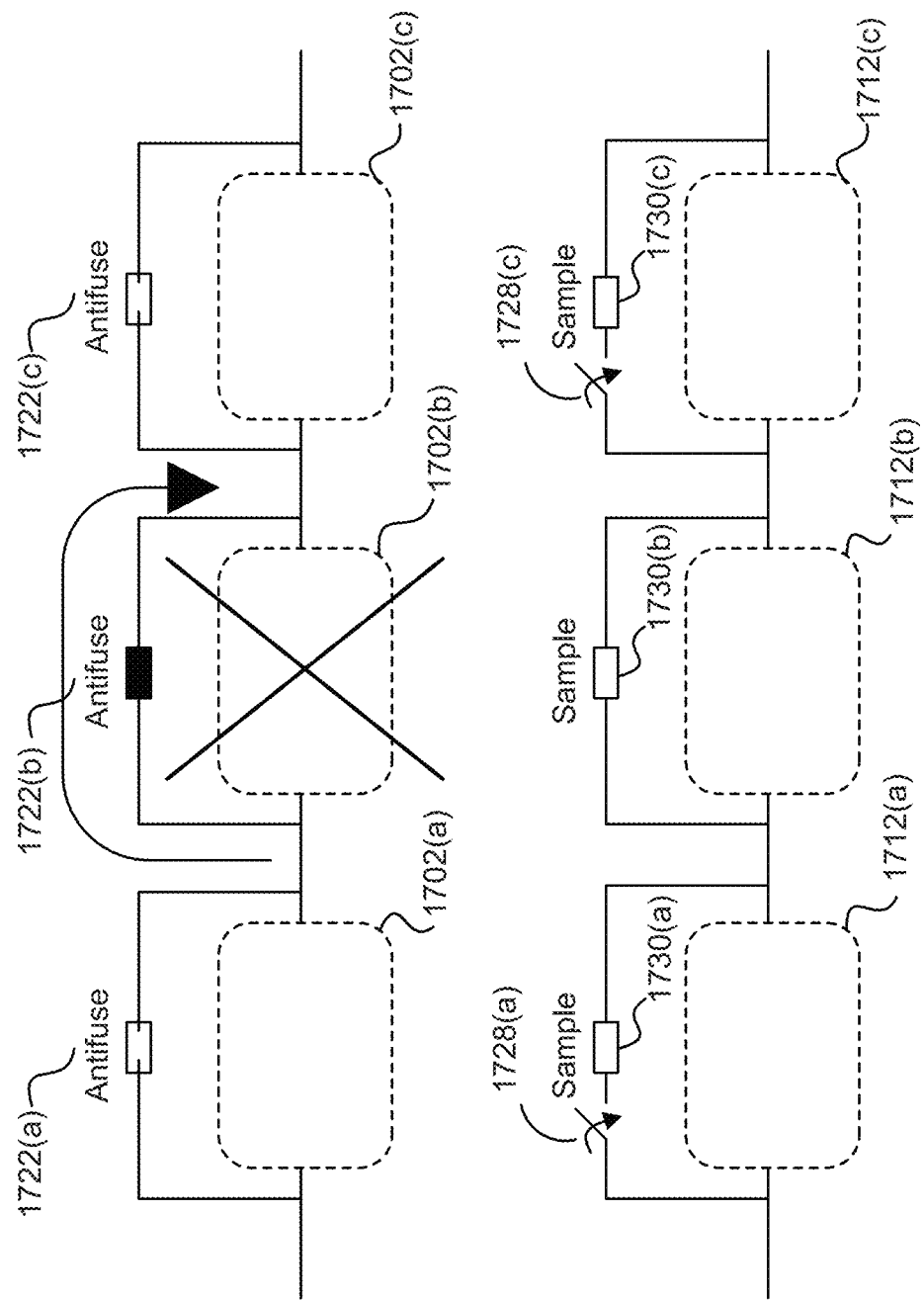
FIG. 17 is a block diagram for exemplary logic blocks connected in series, consistent with disclosed embodiments.

FIG. 17 is a block diagram for exemplary units 1702 and 1712 connected in series, consistent with disclosed embodiments. FIG. 17 may represent an entire system or chip. Alternatively, FIG. 17 may represent a block in a chip containing other functional blocks.

Units 1702 and 1712 may represent complete units that include a plurality of logic blocks such as memory logic 1306 and/or business logic 1308. In these embodiments units 1702 and 1712 may also include elements required to perform operations such as address manager 1302. In other embodiments, however, units 1702 and 1712 may represent logic units such as business logic 1308 or redundant business logic 1310.

FIG. 17 presents embodiments in which units 1702 and 1712 may need to communicate between themselves. In such cases, units 1702 and 1712 may be connected in series. However, a non-working unit may break the continuity between the logic blocks. Therefore, the connection between units may include a bypass option when a unit needs to be disabled due to a defect. The bypass option can also be a part of the bypassed unit itself.

In FIG. 17 units may be connected in series (e.g., 1702(a)-(c)), and a failing unit (e.g., 1702(b)) may be bypassed when it is defective. The units may further be connected in parallel with switching circuits. For example, in some embodiments units 1702 and 1712 may be connected with switching circuits 1722 and 1728, as depicted in FIG. 17. In the example depicted in FIG. 17, unit 1702(b) is defective. For example, unit 1702(b) does not pass a test for a circuit functionality. Therefore, unit 1702(b) may be disabled using, for example, activation switches 1314 (not shown in FIG. 17) and/or switching circuit 1722(b) may be activated to bypass unit 1702(b) and sustain the connectivity between logic blocks.

Accordingly, when a plurality of primary units are connected in series, each one of the plurality of units may be connected in parallel with a parallel switch. Upon detection of a fault associated with the one of the plurality of units, the parallel switch connected to the one of the plurality of units may be activated to connect two of the plurality of units.

In other embodiments, as shown in FIG. 17, switching circuits 1728 may include a sampling point or more that would cause a cycle or cycles delay maintaining synchronization between different lines of units. When a unit is disabled, shorting the connection between adjacent logic blocks may generate synchronization errors with other calculations. For example, if a task requires data from both A and B lines, and each of A and B is carried by an independent series of units, disabling a unit would cause a desynchronization between the lines that would require further data management. To prevent desynchronizations, sample circuits 1730 may simulate the delay caused by the disabled unit 1712(b). Nonetheless, in some embodiments, the parallel switch may include an anti-fuse instead of a sampling circuit 1730.

Figure 18:
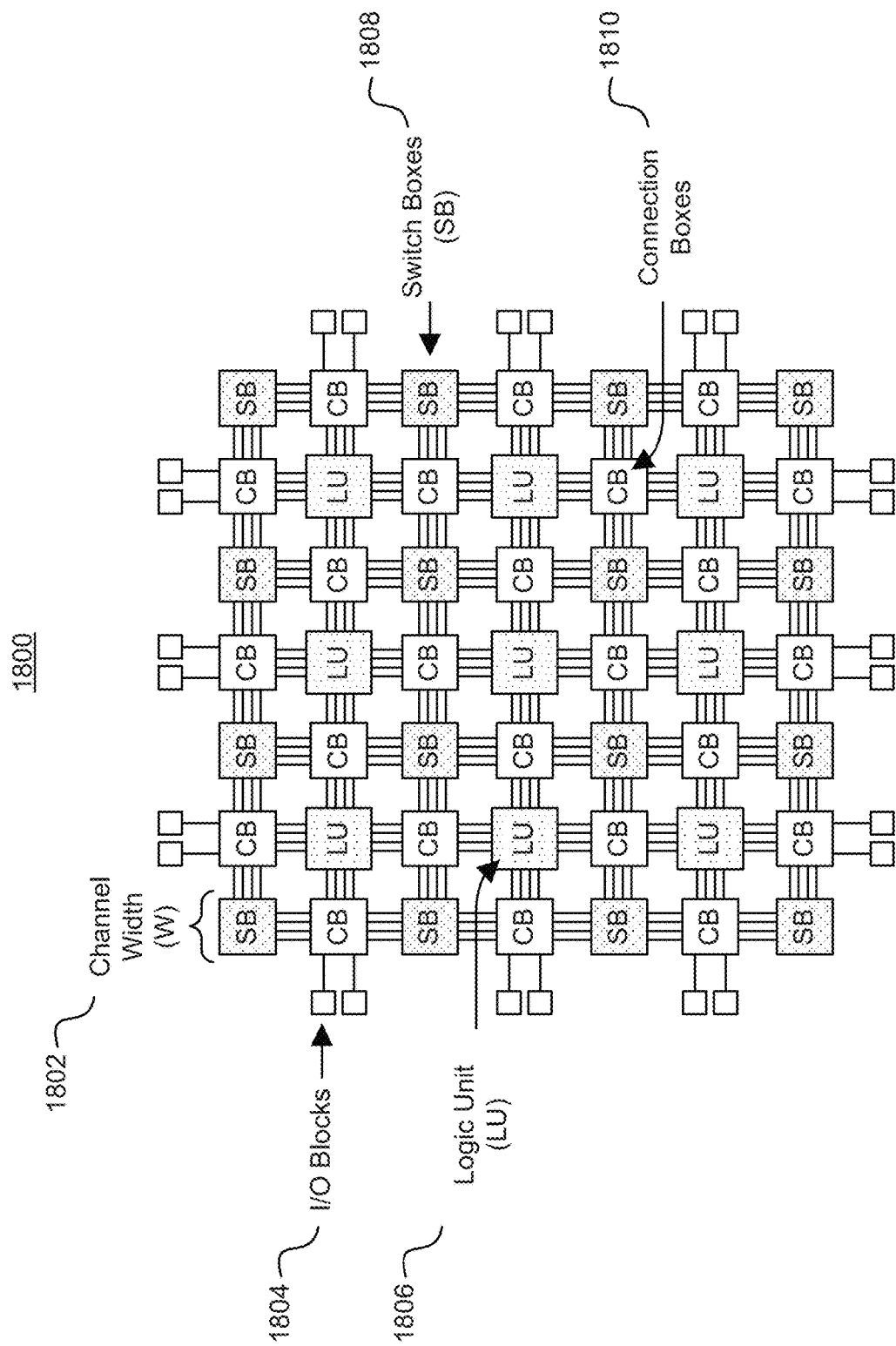
FIG. 18 is a block diagram of exemplary logic blocks connected in a two-dimension array, consistent with disclosed embodiments.

FIG. 18 is a block diagram of exemplary units connected in a two-dimension array, consistent with disclosed embodiments. FIG. 18 may represent an entire system or chip. Alternatively, FIG. 18 may represent a block in a chip containing other functional blocks.

Units 1806 may represent autonomous units that include a plurality of logic blocks such as memory logic 1306 and/or business logic 1308. However, in other embodiments units 1806 may represent logic units such as business logic 1308. Where convenient, discussion of FIG. 18 may refer to elements identified in FIG. 13 (e.g., memory chip 1300) and discussed above.

As shown in FIG. 18, units may be arranged in a two-dimensional array in which units 1806 (which may include or represent one or more of memory logic 1306, business logic 1308, or redundant business logic 1310) are interconnected via switching boxes 1808 and connection boxes 1810. In addition, in order to control the configuration of the two-dimensional array, the two-dimensional array may include I/O blocks 1804 in the periphery of the two-dimensional array.

Connection boxes 1810 may be programmable and reconfigurable devices that may respond to signals inputted from the I/O blocks 1804. For example, connection boxes may include a plurality of input pins from units 1806 and may also be connected to switching boxes 1808. Alternatively, connection boxes 1810 may include a group of switches connecting pins of programmable logic cells with routing tracks, while switching boxes 1808 may include a group of switches connecting different tracks.

In certain embodiments, connection boxes 1810 and switching boxes 1808 may be implemented with configuration switches such as switches 1312 and 1314. In such embodiments, connection boxes 1810 and switching boxes 1808 may be configured by a production tester or a BIST executed at chip startup.

In some embodiments, connection boxes 1810 and switching boxes 1808 may be configured after units 1806 are tested for a circuit functionality. In such embodiments, I/O blocks 1804 may be used to send testing signals to units 1806. Depending on the test results, I/O blocks 1804 may send programming signals that configure connection boxes 1810 and switching boxes 1808 in a manner disabling the units 1806 that fail the testing protocol and enabling units 1806 that pass the testing protocol.

In such embodiments, the plurality of primary logic blocks and the plurality of redundant blocks may be disposed on the substrate in a two-dimensional grid. Therefore, each one of the plurality of primary units 1806 and each one of the plurality of redundant blocks, such as redundant business logic 1310, may be interconnected with switching boxes 1808, and an input block may be disposed in the periphery of each line and each column of the two-dimensional grid.

Figure 19:
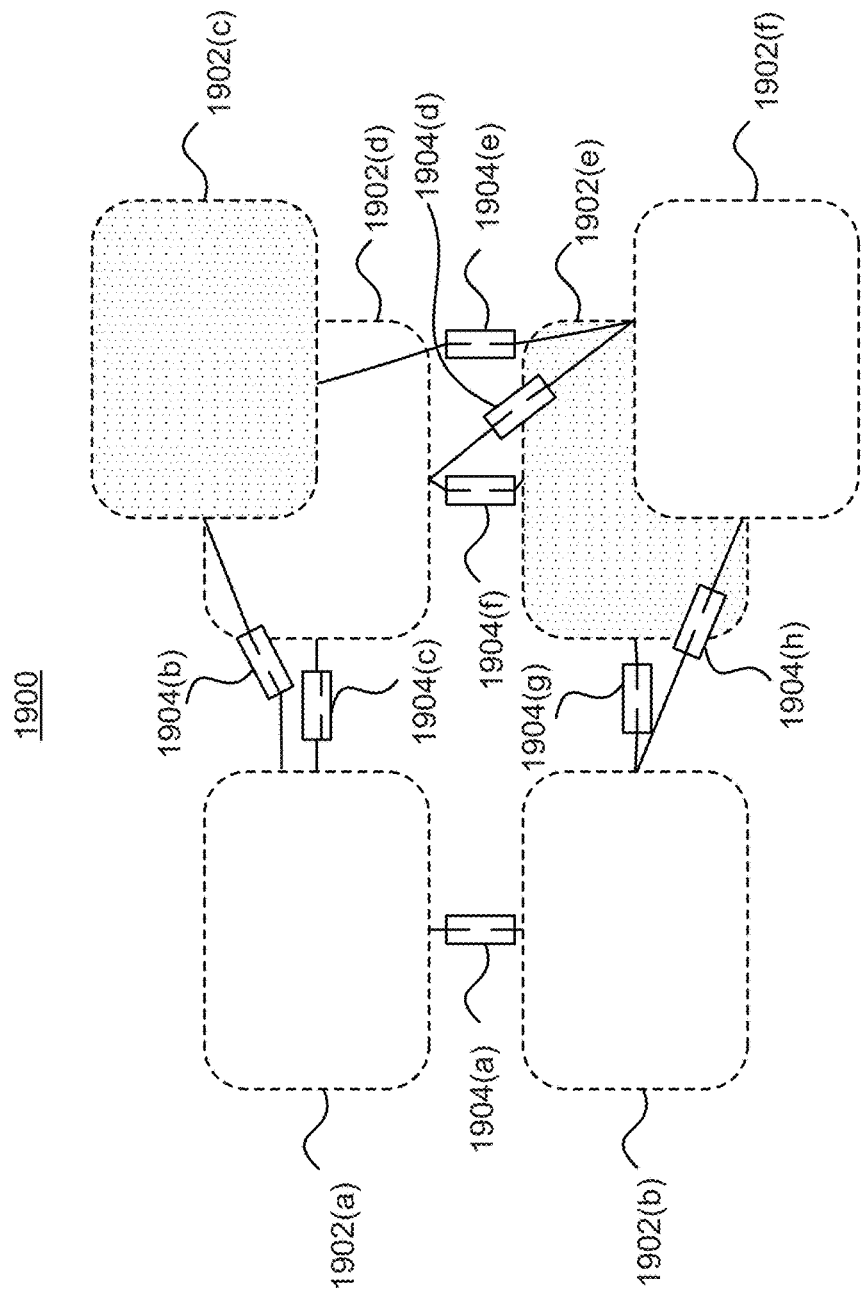
FIG. 19 is a block diagram for exemplary logic blocks in a complex connection, consistent with disclosed embodiments.

FIG. 19 is a block diagram for exemplary units in a complex connection, consistent with disclosed embodiments. FIG. 19 may represent an entire system. Alternatively, FIG. 19 may represent a block in a chip containing other functional blocks.

The complex connection of FIG. 19 includes units 1902(*a*)-(*f*) and configuration switches 1904(*a*)-(*h*). Units 1902 may represent autonomous units that include a plurality of logic blocks such as memory logic 1306 and/or business logic 1308. However, in other embodiments units 1902 may represent logic units such as memory logic 1306, business logic 1308, or redundant business logic 1310. Configuration switches 1904 may include any of deactivation switches 1312 and activation switches 1314.

As shown in FIG. 19, the complex connection may include units 1902 in two planes. For example, the complex connection may include two independent substrates separated in the z-axis. Alternatively, or additionally, units 1902 may be arranged in two surfaces of a substrate. For example, with the objective to reduce the area of memory chip 1300, substrate 1301 may be arranged in two overlapping surfaces and connected with configuration switches 1904 arranged in three dimensions. Configuration switches may include deactivation switches 1312 and/or activation switches 1314.

A first plane of the substrate may include "main" unit 1902. These blocks may be enabled by default. In such embodiments, a second plain may include "redundant" unit 1902. These units may be disabled by default.

In some embodiments, configuration switches 1904 may include anti-fuses. Thus, after testing of units 1902, the blocks may be connected in a tile of functional units by switching certain anti-fuses to "always-on" and disable selected units 1902, even if they are in a different plane. In the example presented in FIG. 19, one of the 'main' units (unit 1902(*e*)) is not working. FIG. 19 may represent non-functional or untested blocks as shaded blocks while tested or functional blocks may be unshaded. Therefore, configuration switches 1904 are configured so one of the logic blocks in a different plane (e.g., unit 1902(*f*)) becomes active. In this way even though one of the main logic blocks was defective, the memory chip is still working by replacing a spare logic unit.

FIG. 19 additionally shows that one of the units 1902 (i.e., 1902(*c*)) in the second plane is not tested or enabled because the main logic blocks are functional. For example, in FIG. 19, both main units 1902(*a*) and 1902(*d*) passed a test for functionality. Thus, units 1902(*c*) was not tested or enabled. Therefore, FIG. 19 shows the ability to specifically select the logic blocks that become active depending on testing results.

In some embodiments, as shown in FIG. 19, not all units 1902 in a first plain may have a corresponding spare or redundant blocks. However, in other embodiments, all units may be redundant with each other for complete redundancy where all units are both primary or redundant. In addition, while some implementations may follow the star network topology depicted in FIG. 19, other implementation may use parallel connections, serial connections, and/or couple the different elements with configuration switches in parallel or in series.

Figure 20:
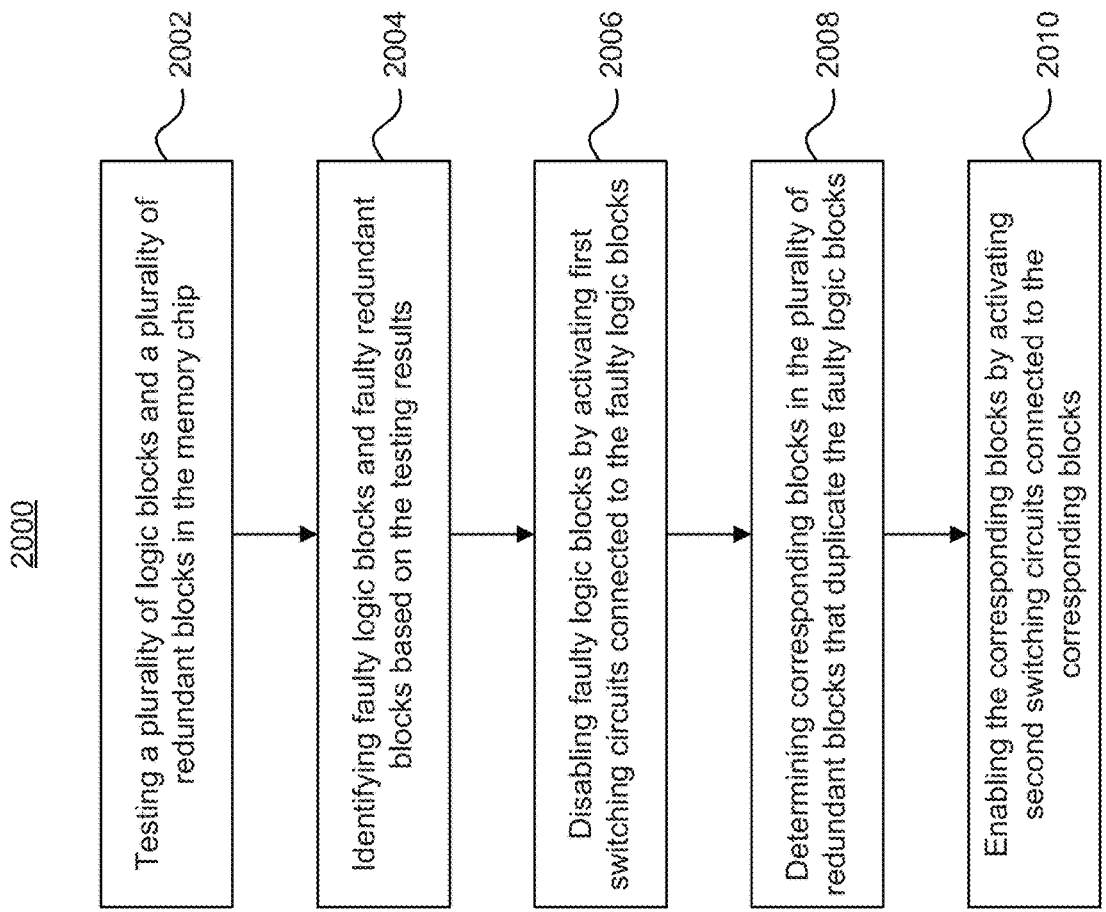
FIG. 20 is an exemplary flow chart illustrating a redundant block enabling process, consistent with disclosed embodiments.

FIG. 20 is an exemplary flowchart illustrating a redundant block enabling process 2000, consistent with disclosed embodiments. The enabling process 2000 may be implemented for memory chip 1300 and specially for DRAM memory chips. In some embodiments, process 2000 may include steps of testing each one of a plurality of logic blocks on the substrate of the memory chip for at least one circuit functionality, identifying faulty logic blocks in the plurality of primary logic blocks based on the testing results, testing at least one redundant or additional logic block on the substrate of the memory chip for the at least one circuit functionality, disabling the at least one faulty logic block by applying an external signal to a deactivation switch, and enabling the at least one redundant block by applying the external signal to an activation switch, the activation switch being connected with the at least one redundant block and being disposed on the substrate of the memory chip. The description of FIG. 20 below further elaborates on each step of process 2000.

Process 2000 may include testing a plurality of logic blocks (step 2002), such as business block 1308 and a plurality of redundant blocks (e.g., redundant business block 1310). The testing may be before packaging using, for example, probing stations for on-wafer testing. Step 2000, however, may also be performed after packaging.

The testing in step 2002 may include applying a finite sequence of testing signals to every logic block in memory chip 1300 or a subset of logic blocks in memory chip 1300. The testing signals may include requesting a computation that is expected to yield a 0 or a 1. In other embodiments, the testing signal may request reading a specific address in a memory bank or writing in a specific memory bank.

Testing techniques may be implemented to test the response of the logic blocks under iterative processes in step 2002. For example, the test may involve testing logic blocks by transmitting instructions to write data in a memory bank and then verifying the integrity of the written data. In some embodiments, the testing may include repeating the algorithm with data inversed.

In alternative embodiments, the testing of step 2002 may include running a model of the logic blocks to generate a target memory image based on a set of testing instructions. Then, the same sequence of instructions may be executed to the logic blocks in the memory chip, and the results may be recorded. The residual memory image of the simulation may also be compared to the image taken from the test, and any mismatch may be flagged as a failure.

Alternatively, in step 2002, testing may include shadow modeling, where a diagnostic is generated but the results are not necessarily predicted. Instead, the test using shadow modeling may be run in parallel on both the memory chip and a simulation. For example, when the logic blocks in the memory chip complete an instruction or task, the simulation may be signaled to execute the same instruction. Once the logic blocks in the memory chip finalize the instructions, the two models' architectural states may be compared. If there is a mismatch, then a failure is flagged.

In some embodiments, all logic blocks (including, e.g., each one of memory logic 1306, business logic 1308, or redundant business logic 1310) may be tested in step 2002. In other embodiments, however, only subsets of the logic blocks may be tested in different testing rounds. For example, in a first round of testing only memory logic 1306 and associated blocks may be tested. In a second round, only business logic 1308 and associated blocks may be tested. In a third round, depending on the results of the first two rounds, logic blocks associated with redundant business logic 1310 may be tested.

Process 2000 may continue to step 2004. In step 2004, faulty logic blocks may be identified, and faulty redundant blocks may also be identified. For example, logic blocks that do not pass the testing of step 2002 may be identified as faulty blocks in step 2004. In other embodiments, however, only certain faulty logic blocks may be initially identified. For example, in some embodiments, only logic blocks associated with business logic 1308 may be identified, and faulty redundant blocks are only identified if they are required for substituting a faulty logic block. In addition, identifying faulty blocks may include writing on a memory bank or a nonvolatile memory the identification information of the identified faulty blocks.

In step 2006, faulty logic blocks may be disabled. For example, using a configuration circuit, the faulty logic blocks may be disabled by disconnecting them from clock, ground, and/or power nodes. Alternatively, faulty logic blocks may be disabled by configuring connection boxes in an arrangement that avoids the logic blocks. Yet, in other embodiments, faulty logic blocks may be disabled by receiving an illegal address from address manager 1302.

In step 2008, redundant blocks that duplicate the faulty logic blocks may be identified. To support the same capabilities of the memory chips even though some logic blocks have failed, in step 2008, redundant blocks that are available and can duplicate faulty logic blocks may be identified. For example, if a logic block that performs multiplications of vectors is determined to be faulty, in step 2008, an address manager 1302 or an on-chip controller may identify an available redundant logic block that also performs multiplication of vectors.

In step 2010, the redundant blocks identified in step 2008 may be enabled. In contrast to the disable operation of step 2006, in step 2010, the identified redundant blocks may be enabled by connecting them to clock, ground, and/or power nodes. Alternatively, identified redundant blocks may be enabled by configuring connection boxes in an arrangement that connects the identified redundant blocks. Yet, in other embodiments, identified redundant blocks may be enabled by receiving a running address at the test procedure execution time.

Figure 21:
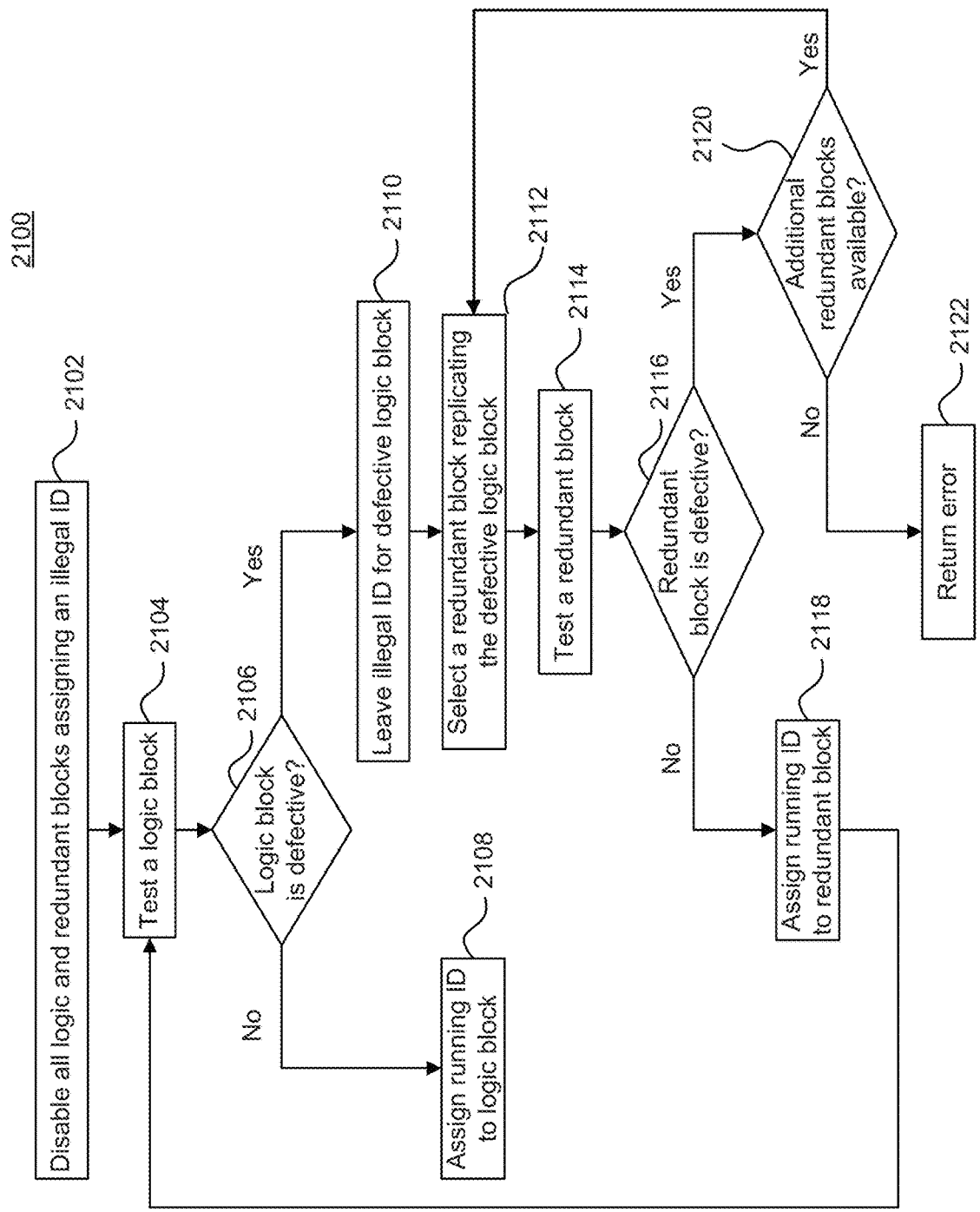
FIG. 21 is an exemplary flow chart illustrating an address assignment process, consistent with disclosed embodiments.

FIG. 21 is an exemplary flow chart illustrating an address assignment process 2100, consistent with disclosed embodiments. The address assignment process 2100 may be implemented for memory chip 1300 and specially for a DRAM memory chips. As described in relation to FIG. 16, in some embodiments, logic blocks in memory chip 1300 may be connected to a data bus and have an address identification. Process 2100 describes an address assignment method that disables faulty logic blocks and enables logic blocks that pass a test. The steps described in process 2100 will be described as being performed by a production tester or a BIST executed at chip startup; however, other components of memory chip 1300 and/or external devices may also perform one or more steps of process 2100.

In step 2102, the tester may disable all logic and redundant blocks by assigning an illegal identification to each logic block at a chip level.

In step 2104, the tester may execute a testing protocol of a logic block. For example, the tester may run testing methods described in step 2002 for one or more of the logic blocks in memory chip 1300.

In step 2106, depending on the results of the test in step 2104, the tester may determine whether the logic block is defective. If the logic block is not defective (step 2106: no), address manager may assign a running ID to the tested logic block in step 2108. If the logic block is defective (step 2106: yes), address manager 1302 may leave the illegal ID for the defective logic block in step 2110.

In step 2112, address manager 1302 may select a redundant logic block that replicates the defective logic block. In some embodiments, the redundant logic block that replicates the defective logic block may have the same components and connections to the defective logic blocks. In other embodiments, however, the redundant logic block may have different components and/or connections to the defective logic blocks but be able to perform an equivalent operation. For example, if the defective logic block is designed to perform multiplication of vectors, the selected redundant logic block would also be capable of performing multiplication of vectors, even if it does not have the same architecture as the defective unit.

In step 2114, address manager 1302 may test the redundant block. For instance, the tester may apply the testing techniques applied in step 2104 to the identified redundant block.

In step 2116, based on the results of testing in step 2114, the tester may determine whether the redundant block is defective. In step 2118, if the redundant block is not defective (step 2116: no), the tester may assign a running ID to the identified redundant block. In some embodiments, process 2100 may return to step 2104 after step 2118, creating an iteration loop to test all logic blocks in the memory chip.

If the tester determines the redundant block is defective (step 2116: yes), in step 2120, the tester may determine if additional redundant blocks are available. For example, the tester may query a memory bank with information regarding available redundant logic blocks. If redundant logic blocks are available (step 2120: yes), the tester may return to step 2112 and identify a new redundant logic block replicating the defective logic block. If redundant logic blocks are not available (step 2120: no), in step 2122, the tester may generate an error signal. The error signal may include information of the defective logic block and the defective redundant block.

Coupled Memory Banks

The presently disclosed embodiments also include a distributed high-performance processor. The processor may include a memory controller that interfaces memory banks and processing units. The processor may be configurable to expedite delivery of data to the processing units for calculations. For example, if a processing unit requires two data instances to perform a task, the memory controller may be configured so communication lines independently provide access to the information from two data instances. The disclosed memory architecture seeks to minimize hardware requirements that are associated with complex cache memory and complex register files schemes. Normally, processor chips include cache hierarchies that allow cores to work directly with registers. However, the cache operations require significant die area and consume additional power. The disclosed memory architecture avoids the use of a cache hierarchy by adding logic components in the memory.

The disclosed architecture also enables strategic (or even optimized) placement of data in memory banks. Even if the memory banks have a single port and high latency, the disclosed memory architecture may enable high performance and avoid memory accessing bottlenecks by strategically positioning data in different blocks of memory banks. With the goal of providing a continuous stream of data to the processing units, a compilation optimization step may determine how data should be stored in memory banks for specific or generic tasks. Then, the memory controller, which interfaces processing units and memory banks, may be configured to grant access to specific processing units when they require data to perform operations.

The configuration of the memory chip may be performed by a processing unit (e.g., a configuration manager) or an external interface. The configuration may be also written by a compiler or other SW tool. In addition, the configuration of the memory controller may be based on the available ports in the memory banks and the organization of data in the memory banks. Accordingly, the disclosed architecture may provide processing units with a constant flow of data or simultaneous information from different memory blocks. In this way, computation tasks within the memory may be quickly processed by avoiding latency bottlenecks or cache memory requirements.

Moreover, data stored in the memory chip may be arranged based on compilation optimization steps. The compilation may allow for building of processing routines in which the processor efficiently assigns tasks to processing units without memory latency associated delays. The compilation may be performed by a compiler and transmitted to a host connected to an external interface in the substrate. Normally, high latency for certain access patterns and/or low numbers of ports would result in data bottlenecks for processing units requiring the data. The disclosed compilation, however, may position data in memory banks in a way that enables processing units to continuously receive data even with disadvantageous memory types.

Furthermore, in some embodiments, a configuration manager may signal required processing units based on computations that are required by a task. Different processing units or logic blocks in the chip may have specialized hardware or architectures for different tasks. Therefore, depending on the task that will be performed, a processing unit, or a group of processing units, may be selected to perform the task. The memory controller on the substrate may be configurable to route data, or grant access, according to the selection of processing subunits to improve data transfer rates. For example, based on the compilation optimization and the memory architecture, processing units may be granted access to memory banks when they are required to perform a task.

Moreover, the chip architecture may include on-chip components that facilitate transfer of data by reducing the time required to access data in the memory banks. Therefore, the present disclosure describes chip architecture(s), along with a compilation optimization step, for a high-performance processor capable of performing specific or generic tasks using simple memory instances. The memory instances may have high latency in random access and/or low number of ports, such as those used in a DRAM device or other memory-oriented technologies, but the disclosed architecture may overcome these shortcomings by enabling a continuous (or nearly continuous) flow of data from memory banks to processing units.

In this application, simultaneous communication may refer to communication within a clock cycle. Alternatively, simultaneous communication may refer to sending information within a predetermine amount of time. For example, simultaneous communication may refer to communication within a few nanoseconds.

Figure 22:
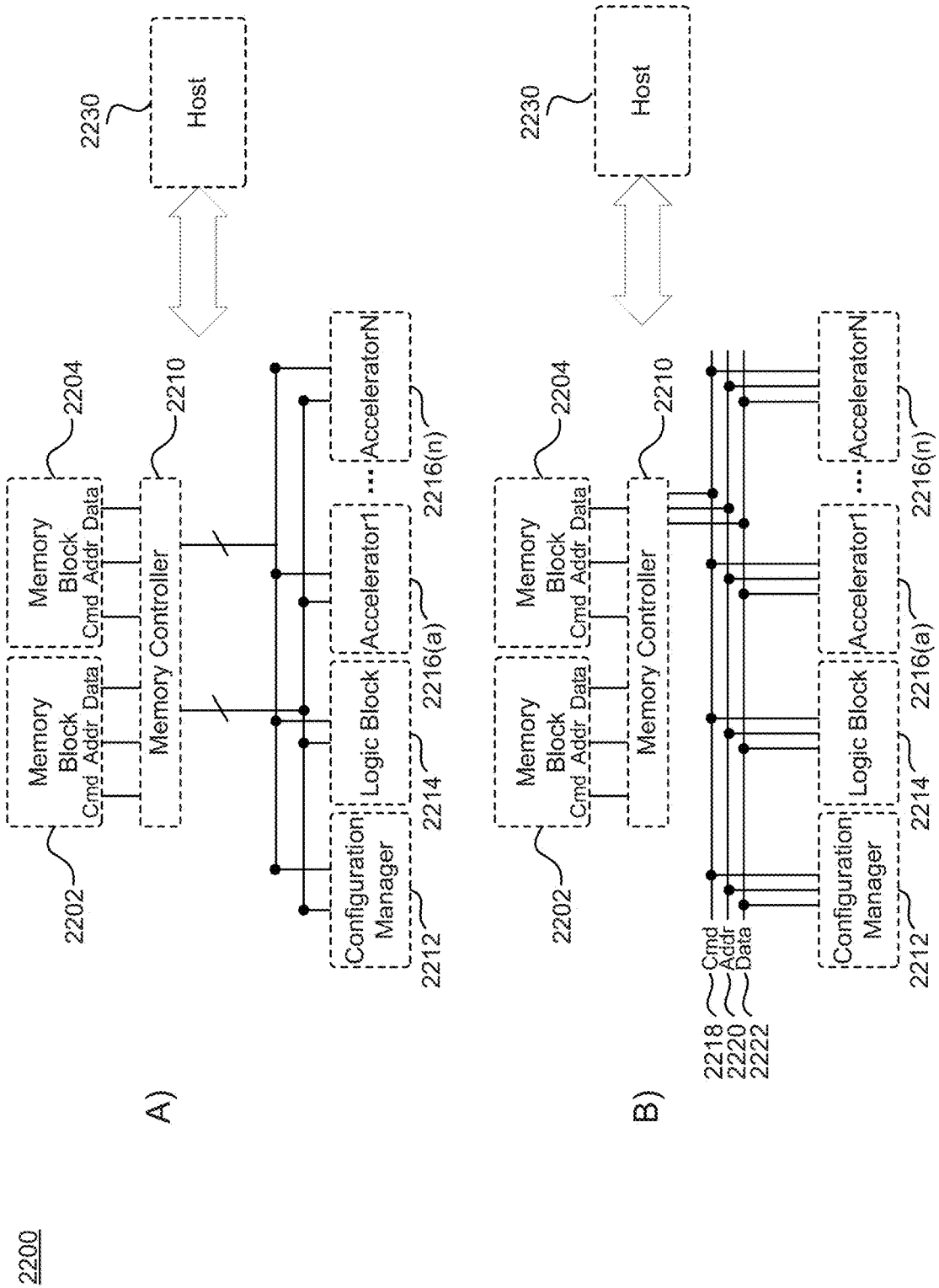
FIG. 22 provides block diagrams for exemplary processing devices, consistent with disclosed embodiments.

FIG. 22 provides block diagrams for exemplary processing devices, consistent with disclosed embodiments. FIG. 22A shows a first embodiment of a processing device 2200 in which a memory controller 2210 connects a first memory block 2202 and a second memory block 2204 using multiplexers. Memory controller 2210 may also connect at least a configuration manager 2212, a logic block 2214, and multiple accelerators 2216(a)-(n). FIG. 22B shows a second embodiment of processing device 2200 in which memory controller 2210 connects memory blocks 2202 and 2204 using a bus that connects memory controller 2210 with at least a configuration manager 2212, a logic block 2214, and multiple accelerators 2216(a)-(n). In addition, host 2230 may be external and connected to processing device 2200 through, for example, an external interface.

Memory blocks 2202 and 2204 may include a DRAM mats or group of mats, DRAM banks, MRAM\ PRAM\ RERAM\ SRAM units, Flash mats, or other memory technologies. Memory blocks 2202 and 2204 may alternatively include non-volatile memories, a flash memory device, a Resistive Random Access Memory (ReRAM) device, or a Magnetoresistive Random Access Memory (MRAM) device.

Memory blocks 2202 and 2204 may additionally include a plurality of memory cells arranged in rows and columns between a plurality of word lines (not shown) and a plurality of bit lines (not shown). The gates of each row of memory cells may be connected to a respective one of the plurality of word lines. Each column of memory cells may be connected to a respective one of the plurality of bit lines.

In other embodiments, a memory area (including memory blocks 2202 and 2204) is built from simple memory instances. In this application, the term "memory instance" may be used interchangeably with the term "memory block." The memory instances (or blocks) may have poor characteristics. For example, the memories may be only one port memories and may have high random-access latency. Alternatively, or additionally, the memories may be inaccessible during column and line changes and face data access problems related to, for example, capacity charging and/or circuitry setups. Nonetheless, the architecture presented in FIG. 22 still facilitates parallel processing in the memory device by allowing dedicated connections between memory instances and processing units and arranging the data in a certain manner that takes the characteristics of the blocks into account.

In some device architectures, memory instances may include several ports, facilitating the parallel operations. Nonetheless, in such embodiments, the chip may still achieve an improved performance when data is compiled and organized based on the chip architecture. For example, a compiler may improve the efficiency of access in the memory area by providing instructions and organizing data placement, so it can be readily access even using one-port memories.

Furthermore, memory blocks 2202 and 2204 may be multiple types for memory in a single chip. For example, memory blocks 2202 and 2204 may be eFlash and eDRAM. Also, memory blocks may include DRAM with instances of ROM.

Memory controller 2210 may include a logic circuit to handle the memory access and return the results to the rest of the modules. For example, memory controller 2210 may include an address manager and selection devices, such as multiplexers, to route data between the memory blocks and processing units or grant access to the memory blocks. Alternatively, Memory controller 2210 may include double data rate (DDR) memory controllers used to drive DDR SDRAM, where data is transferred on both rising and falling edges of the system's memory clock.

In addition, memory controller 2210 may constitute Dual Channel memory controllers. The incorporation of dual channel memory may facilitate control of parallel access lines by memory controller 2210. The parallel access lines may be configured to have identical lengths to facilitate synchronization of data when multiple lines are used in conjunction. Alternatively, or additionally, the parallel access lines may allow access of multiple memory ports of the memory banks.

In some embodiments processing device 2200 may include one or more muxes that may be connected to processing units. The processing units may include configuration manager 2212, logic block 2214, and accelerators 2216, which may be connected directly to the mux. Also, memory controller 2210 may include at least one data input from a plurality of memory banks or blocks 2202 and 2204 and at least one data output connected to each one of the plurality of processing units. With this configuration, memory controller 2210 may simultaneously receive data from memory banks or memory blocks 2202 and 2204 via the two data inputs, and simultaneously transmits data received via to the at least one selected processing unit via the two data outputs. In some embodiments, however, the at least one data input and at least one data output may be implemented in a single port allowing only read or write operations. In such embodiments, the single port may be implemented as a data bus including data, address, and command lines.

Memory controller 2210 may be connected to each one of the plurality of memory blocks 2202 and 2204, and may also connect to processing units via, for example, a selection switch. Also processing units on the substrate, including configuration manager 2212, logic block 2214, and accelerators 2216, may be independently connected to memory controller 2210. In some embodiments, configuration manager 2212 may receive an indication of a task to be performed and, in response, configure memory controller 2210, accelerators 2216, and/or logic blocks 2214 according to a configuration stored in memory or supplied externally. Alternatively, memory controller 2210 may be configured by an external interface. The task may require at least one computation that may be used to select at least one selected processing unit from the plurality of processing units. Alternatively, or additionally, the selection may be based at least in part upon a capability of the selected processing unit for performing the at least one computation. In response, memory controller 2210 may grant access to the memory banks, or route data between the at least one selected processing unit and at least two memory banks, using dedicated buses and/or in a pipelined memory access.

In some embodiments, first memory block 2202 of at least two memory blocks may be arranged on a first side of the plurality of processing units; and second memory bank 2204 of the at least two memory banks may be arranged on a second side of the plurality of processing units opposite to the first side. Further, a selected processing unit to perform the task, for instance accelerator 2216(n), may be configured to access second memory bank 2204 during a clock cycle in which a communication line is opened to the first memory bank or first memory block 2202. Alternatively, the selected processing unit may be configured to transfer data to second memory block 2204 during a clock cycle in which a communication line is opened to first memory block 2202.

In some embodiments, memory controller 2210 may be implemented as an independent element, as shown in FIG. 22. In other embodiments, however, memory controller 2210 may be embedded in the memory area or may be disposed along accelerators 2216(a)-(n).

A processing area in processing device 2200 may include configuration manager 2212, logic block 2214, and accelerators 2216(a)-(n). Accelerators 2216 may include multiple processing circuits with pre-defined functions and may be defined by a specific application. For example, an accelerator may be a vector multiply accumulate (MAC) unit or a Direct Memory Access (DMA) unit handling memory moving between modules. Accelerators 2216 may also be able to calculate their own address and request the data from memory controller 2210 or write data to it. For example, configuration manager 2212 may signal at least one of accelerators 2216 that he can access the memory bank. Then accelerators 2216 may configure memory controller 2210 to route data or grant access to themselves. In addition, accelerators 2216 may include at least one arithmetic logic unit, at least one vector handling logic unit, at least one string compare logic unit, at least one register, and at least one direct memory access.

Configuration manager 2212 may include digital processing circuits to configure accelerators 2216 and instructs execution of tasks. For example, configuration manager 2212 may be connected to memory controller 2210 and each one of the plurality of accelerators 2216. Configuration manager 2212 may have its own dedicated memory to hold the configurations of accelerators 2216. Configuration manager 2212 may use the memory banks to fetch commands and configurations via memory controller 2210. Alternatively, configuration manager 2212 may be programmed through an external interface. In certain embodiments, configuration manager 2212 may be implemented with an on-chip reduced instruction set computer (RISC) or an on-chip complex CPU with its own cache hierarchy. In some embodiments, configuration manager 2212 may also be omitted and the accelerators can be configured through an external interface.

Processing device 2200 may also include an external interface (not shown). The external interface allows access to the memory from an upper level, such a memory bank controller which receives the command from external host 2230 or on-chip main processor or access to the memory from external host 2230 or on-chip main processor. The external interface may allow programming of the configuration manager 2212 and the accelerators 2216 by writing configurations or code to the memory via memory controller 2210 to be used later by configuration manager 2212 or the units 2214 and 2216 themselves. The external interface, however, may also directly program processing units without being routed through memory controller 2210. In case configuration manager 2212 is a microcontroller, configuration manager 2212 may allow loading of code from a main memory to the controller local memory via the external interface. Memory controller 2210 may be configured to interrupt the task in response to receiving a request from the external interface.

The external interface may include multiple connectors associated with logic circuits that provide a glue-less interface to a variety of elements on the processing device. The external interface may include: Data I/O Inputs for data reads and output for data writes; External address outputs; External CEO chip select pins; Active-low chip selectors; Byte enable pins; a pin for wait states on the memory cycle; a Write enable pin; an Output enable-active pin; and read-write enable pin. Therefore, the external interface has the required inputs and outputs to control processes and obtain information from the processing device. For example, the external interface may conform to JEDEC DDR standards. Alternatively, or additionally, external interface may conform to other standards such as SPI\OSPI or UART.

In some embodiments, the external interface may be disposed on the chip substrate and may be connected external host 2230. The external host may gain access to memory blocks 2202 and 2204, memory controller 2210, and processing units via the external interface. Alternatively, or additionally, external host 2230 may read and write to the memory or may signal configuration manager 2212, through read and write commands, to perform operations such as starting a process and/or stopping a process. In addition, external host 2230 may configure the accelerators 2216 directly. In some embodiments, external host 2230 be able to perform read/write operations directly on memory blocks 2202 and 2204.

In some embodiments, configuration manager 2212 and accelerators 2216 may be configured to connect the device area with the memory area using direct buses depending on the target task. For example, a subset of accelerators 2216 may connect with memory instances 2204 when the subset of accelerators has the capability to perform computations required to execute the task. By doing such a separation, it is possible to assure that dedicated accelerators get the bandwidth (BW) needed to memory blocks 2202 and 2204. Moreover, this configuration with dedicated buses may allow splitting a large memory to smaller instances or blocks because connecting memory instances to memory controller 2210 allows quick access to data in different memories even with high row latency time. To achieve the parallelization of connection, memory controller 2210 may be connected to each of the memory instances with data, address, and/or control buses.

The above-discussed inclusion of memory controller 2210 may eliminate the requirement of a cache hierarchy or complex register file in the processing device. Although the cache hierarchy can be added to give added capabilities, the architecture in processing device processing device 2200 may allow a designer to add enough memory blocks or instances based on the processing operations and manage the instances accordingly without a cache hierarchy. For example, the architecture in processing device processing device 2200 may eliminate requirements of a cache hierarchy by implementing a pipelined memory access. In the pipelined memory access, processing units may receive a sustaining flow of data in every cycle certain data lines may be opened (or activated) while other data lines receive or transmit data. The sustained flow of data using independent communication lines may allow an improved execution speed and minimum latency due to line changes.

Moreover, the disclosed architecture in FIG. 22 enables a pipelined memory access it may be possible to organize data in a low number of memory blocks and save power losses caused by line switching. For example, a In some embodiments, a compiler may communicate host 2230 the organization of, or a method to organize, data in memory banks to facilitate access to data during a given task. Then, configuration manager 2212 may define which memory banks, and in some cases which ports of the memory banks, may be accessed by the accelerators. This synchronization between the location of data in memory banks and the access method to data, improves computing tasks by feeding data to the accelerators with minimum latency. For example, in embodiments in which configuration manager 2212 includes a RISC\CPU, the method may be implemented in offline software (SW) and then the configuration manager 2212 may be programmed to execute the method. The method may be developed in any language executable by RISC/CPU computers and may be executed on any platform. The inputs of the method may include configuration of the memories behind memory controller and the data itself along with the pattern of memory accesses. In addition, the method may be implemented in a language or machine language specific to the embodiment and may also be just a series of configuration values in binary or text.

As discussed above, in some embodiments, a compiler may provide instructions to host 2230 for organizing data in memory blocks 2202 and 2204 in preparation of a pipelined memory access. The pipelined memory access may generally include steps of: receiving a plurality of addresses of a plurality of memory banks or memory blocks 2202 and 2204; accessing the plurality of memory banks according to the received addresses using independent data lines; supplying data from a first address through a first communication line to at least one of the plurality of processing units and opening a second communication line to a second address, the first address being in a first memory bank of the plurality of memory banks, the second address being in second memory bank 2204 of the plurality of memory banks; and supplying data from the second address through the second communication line to the at least one of the plurality of processing units and opening a third communication line to a third address in the first memory bank in the first line within a second clock cycle. In some embodiments, the pipelined memory access may be executed with two memory blocks being connected to a single port. In such embodiments, memory controller 2210 may hide the two memory blocks behind a single port but transmit data to the processing units with the pipelined memory access approach.

In some embodiments, a compiler can run on host 2230 before executing a task. In such embodiments, the compiler may be able to determine a configuration of data flow based on the architecture of the memory device since the configuration would be known to the compiler.

In other embodiments, if the configuration of memory blocks 2204 and 2202 is unknown at offline time, the pipelined method can run on host 2230 which may arrange data in memory blocks before starting calculations. For example, host 2230 may directly write data in memory blocks 2204 and 2202. In such embodiments, processing units, such as configuration manager 2212 and memory controller 2210 may not have information regarding required hardware until run time. Then, it may be necessary to delay the selection of an accelerator 2216 until a task starts running In these situations, the processing units or memory controller 2210 may randomly select an accelerator 2216 and create a test data access pattern, which may be modified as the task is executed.

Nonetheless, when the task is known in advance, a compiler may organize data and instructions in memory banks for host 2230 to provide to a processing unit, such as configuration manager 2212, to set signal connections that minimize access latency. For example, in some cases n words may be needed at the same time by accelerators 2216. However, each memory instance supports retrieving only m words at a time, where "m" and "n" are integers and m<n. Thus, the compiler may place the needed data across different memory instances or blocks facilitating data access. Also, to avoid line miss latencies, a host may split data in different lines of different memory instances if processing device 2200 includes multiple memory instances. The division of data may allow accessing the next line of data in the next instance while still using data from the current instance.

For example, accelerator 2216(*a*) may be configured to multiply two vectors. Each one of the vectors may be stored in independent memory blocks, such as memory blocks 2202 and 2204, and each vector may include multiple words. Therefore, to complete a task requiring a multiplication by accelerator 2216(*a*), it may be necessary to access the two memory blocks and retrieve multiple words. However, in some embodiments, memory blocks only allow access of one word per clock cycle. For instance, memory blocks may have a single port. In these cases, to expedite data transmittal during an operation, a compiler may organize the words composing vectors in different memory blocks allowing parallel and/or simultaneous reading of the words. In these situations, a compiler may store words in memory blocks that have a dedicated line. For instance, if each vector includes two words and memory controller has direct access to four memory blocks, a compiler may arrange data in four memory blocks, each one transmitting a word and expediting data delivery. Moreover, in embodiments when memory controller 2210 may have more than a single connection to each memory block, the compiler may instruct configuration manager 2212 (or other processing unit) to access ports specific ports. In this way, processing device 2200 may perform a pipelined memory access, continuously providing data to processing units by simultaneously loading words in some lines and transmitting data in other lines. Thus, this pipelined memory access avoid may avoid latency issues.

Figure 23:
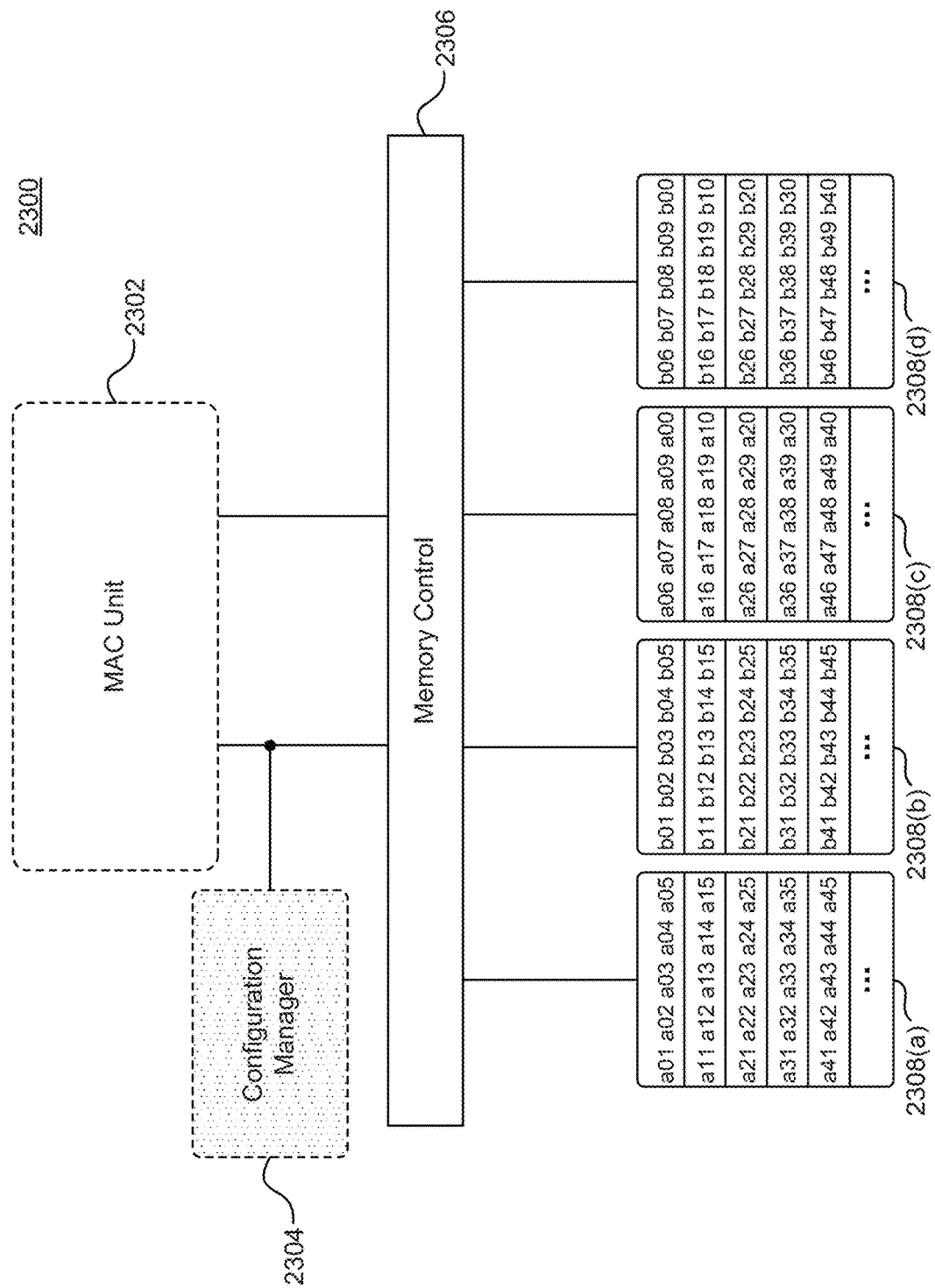
FIG. 23 is a block diagram of an exemplary processing device, consistent with disclosed embodiments.

FIG. 23 is a block diagram of an exemplary processing device 2300, consistent with disclosed embodiments. The block diagram shows a simplified processing device 2300 displaying a single accelerator in the form of MAC Unit 2302, configuration manager 2304 (equivalent or similar to configuration manager 2212), memory controller 2306 (equivalent or similar to memory controller 2210), and a plurality of memory blocks 2308(*a*)-(*d*).

In some embodiments, MAC unit 2302 may be a specific accelerator for processing a particular task. By way of example, the processing device 2300 may be tasked with 2D-convolutions. Then, configuration manager 2304 can signal an accelerator that has the appropriate hardware to perform calculations associated with the task. For instance, MAC unit 2302 may have four internal incrementing counters (logical adders and registers to manage the four loops needed by a convulsion calculation) and a multiply accumulate unit. Configuration manager 2304 may signal MAC unit 2302 to process incoming data and execute the task. Configuration manager 2304 may transmit an indication to MAC unit 2302 to execute the task. In these situations, MAC unit 2302 may iterate over calculated addresses, multiply the numbers, and accumulate them to an internal register.

In some embodiments, configuration manager 2304 may configure the accelerators while memory controller 2306 grants access to blocks 2308 and MAC unit 2302 using dedicated buses. In other embodiments, however, memory controller 2306 can directly configure the accelerators based on instructions received from configuration manger 2304 or an external interface. Alternatively, or additionally, configuration manager 2304 can pre-load a few configurations and allow the accelerator to iteratively run on different addresses with different sizes. In such embodiments, configuration manager 2304 may include a cache memory that stores a command before it is transmitted to at least one of the plurality of processing units, such as accelerators 2216. However, in other embodiments configuration manager 2304 may not include a cache.

In some embodiments, configuration manager 2304 or memory controller 2306 may receive addresses that need to be accessed for a task. Configuration manager 2304 or memory controller 2306 may check a register to determine whether the address is already in a loaded line to one of memory blocks 2308. If so, memory controller 2306 may read the word from memory block 2308 and pass it to the MAC unit 2302. If the address is not in a loaded line, configuration manager 2304 may request memory controller 2306 may load the line and signal MAC unit 2302 to delay until it is retrieved.

In some embodiments, as shown in FIG. 23, memory controller 2306 may include two inputs form two independent addresses. But if more than two addresses should be accessed simultaneously, and these addresses are in a single memory block (for example it is only in of memory blocks 2308(*a*)), memory controller 2306 or configuration manager 2304 may raise an exception. Alternatively, configuration manager 2304 may return invalid data signal when the two addresses can only be access through a single line. In other embodiments, the unit may delay the process execution until it is possible to retrieve all needed data. This may diminish the overall performance. Nonetheless, a compiler may be able to find a configuration and data placement that would prevent delays.

In some embodiments, a compiler may create a configuration or instruction set for processing device 2300 that may configure configuration manager 2304 and memory controller 2306 and accelerator 2302 to handle situations in which multiple addresses need to be accessed from a single memory block but the memory block has one port. For instance, a compiler may re-arrange data in memory blocks 2308 such that processing units may access multiple lines in memory blocks 2308.

In addition, memory controller 2306 may also work simultaneously on more than one input at the same time. For example, memory controller 2306 may allow accessing one of memory blocks 2308 through one port and supplying the data while receiving a request from a different memory block in another input. Therefore, this operation may result in and accelerator 2216 tasked with the exemplary 2D-convolutions receiving data from dedicated lines of communication with the pertinent memory blocks.

Additionally, or alternatively, memory controller 2306 or a logic block may hold refresh counters for every memory block 2308 and handle the refresh of all lines. Having such a counter allows memory controller 2306 to slip in the refresh cycles between dead access times from the devices.

Furthermore, memory controller 2306 may be configurable to perform the pipelined memory access, receiving addresses and opening lines in memory blocks before supplying the data. The pipelined memory access may provide data to processing units without interruption or delayed clock cycles. For example, while memory controller 2306 or one of the logic blocks access data with the right line in FIG. 23, it may be transmitting data in the left line. These methods will be explained in greater detail in connection to FIG. 26.

In response to the required data, processing device 2300 may use multiplexors and/or other switching devices to choose which device gets serviced to perform a given task. For example, configuration manager 2304 may configure multiplexers so at least two data lines reach the MAC unit 2302. In this way, a task requiring data from multiple addresses, such as 2D-convolutions, may be performed faster because the vectors or words requiring multiplication during convolution can reach the processing unit simultaneously, in a single clock. This data transferring method may allow the processing units, such as accelerators 2216, to quickly output a result.

In some embodiments, configuration manager 2304 may be configurable to execute processes based on priority of tasks. For example, configuration manager 2304 can be configured to let a running process finish without any interruptions. In that case, configuration manger 2304 may provide an instruction or configurations of a task to accelerators 2216, let them run uninterrupted, and switch multiplexers only when the task is finished. However, in other embodiments, configuration manager 2304 may interrupt a task and reconfigure data routing when it receives a priority task, such a request from an external interface. Nevertheless, with enough memory blocks 2308, memory controller 2306 may be configurable to route data, or grant access, to processing units with dedicated lines that do not have to be changed until a task is completed. Moreover, in some embodiments, all devices may be connected by buses to the entries of configuration manager 2304, and the devices may manage access between themselves and the buses (e.g., using the same logic as a multiplexer). Therefore, memory controller 2306 may be directly connected to a number of memory instances or memory blocks.

Alternatively, memory controller 2306 may be connected directly to memory sub-instances. In some embodiments, each memory instance or block can be built from sub-instances (for example, DRAM may be built from mats with independent data lines arranged in multiple sub-blocks). Further, the instances may include at least one of DRAM mats, DRAM, banks, flash mats, or SRAM mats or any other type of memory. Then, memory controller 2306 may include dedicated lines to address sub-instances directly to minimize latency during a pipelined memory access.

In some embodiments, memory controller 2306 may also hold the logic needed for a specific memory instance (such as row\col decoders, refresh logic, etc.) and memory blocks 2308 may handle its own logic. Therefore, memory blocks 2308 may get an address and generate commands for return\write data.

Figure 24:
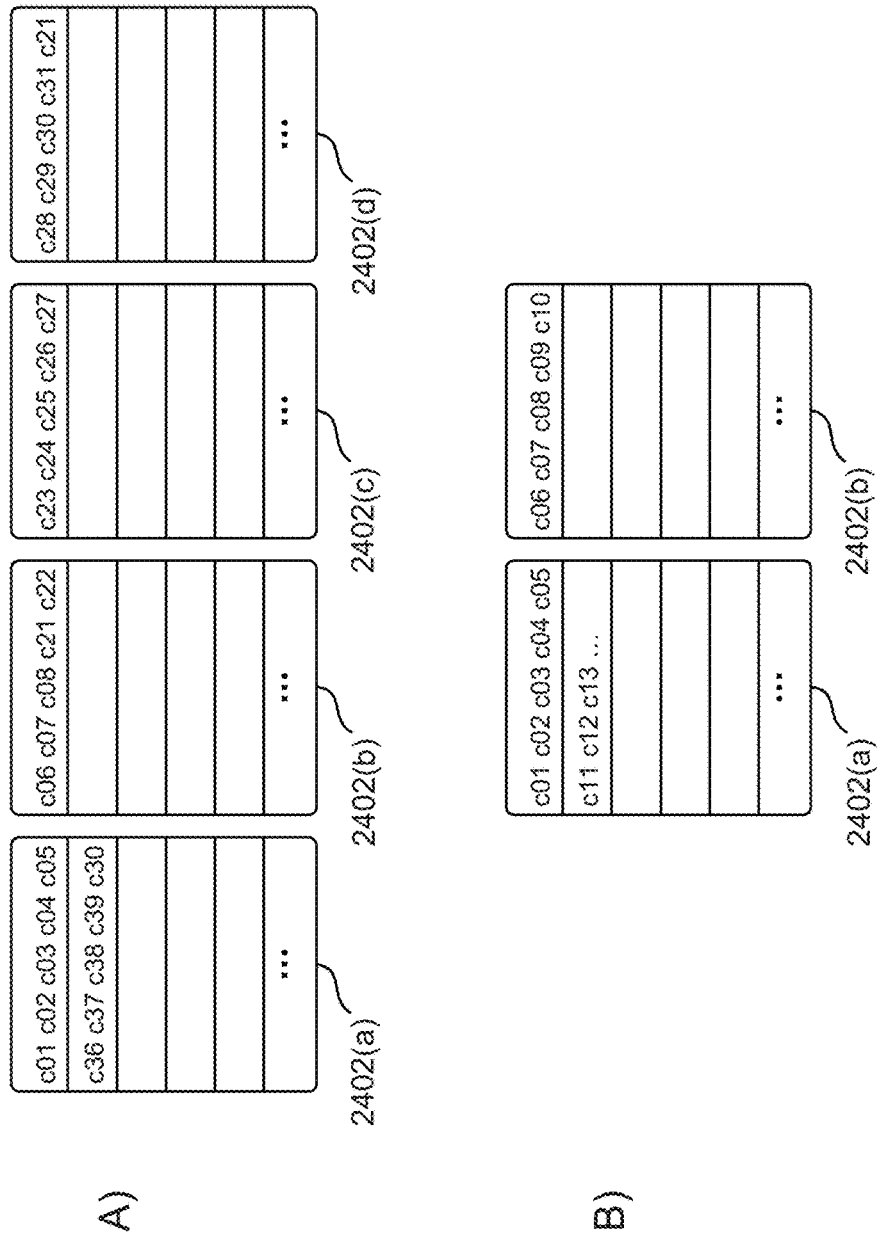
FIG. 24 includes exemplary memory configuration diagrams, consistent with disclosed embodiments.

FIG. 24 depicts exemplary memory configuration diagrams, consistent with disclosed embodiments. In some embodiments, a compiler generating code or configuration for processing device 2200 may perform a method to configure loading from memory blocks 2202 and 2204 by pre-arranging data in each block. For example, a compiler may prearrange data so each word required for a task is correlated to a line of memory instance or memory block(s). But for tasks that require more memory blocks than the one available in processing device 2200, a compiler may implement methods of fitting data in more than one memory location of each memory block. The compiler may also store data in sequence and evaluate the latency of each memory block to avoid line miss latency. In some embodiments, the host may be part of a processing unit, such as configuration manger 2212, but in other embodiments the compiler host may be connected to processing device 2200 via an external interface. In such embodiments, the host may run compiling functions, such as the ones described for the compiler.

In some embodiments, configuration manager 2212 may be a CPU or a micro controller (uC). In such embodiments, configuration manager 2212 may have to access the memory to fetch commands or instructions placed in the memory. A specific compiler may generate the code and place it in the memory in a manner that allows for consecutive commands to be stored in the same memory line and across a number of memory banks to allow for the pipelined memory access also on the fetched command. In these embodiments, configuration manager 2212 and memory controller 2210 may be capable of avoiding row latency in linear execution by facilitating the pipelined memory access.

The previous case of linear execution of a program described a method for a compiler to recognize and place the instructions to allow for pipelined memory execution. However other software structures may be more complex and would require the compiler to recognize them and act accordingly. For example, in case a task requires loops and branches, a compiler may place all the loop code inside a single line so that the single line can be looped without line opening latency. Then, memory controller 2210 may not need to change lines during an execution.

In some embodiments, configuration manager 2212 may include internal caching or small memory. The internal caching may store commands that are executed by configuration manager 2212 to handle branches and loops. For example, commands in internal caching memory may include instructions to configure accelerators for accessing memory blocks.

Figure 25:
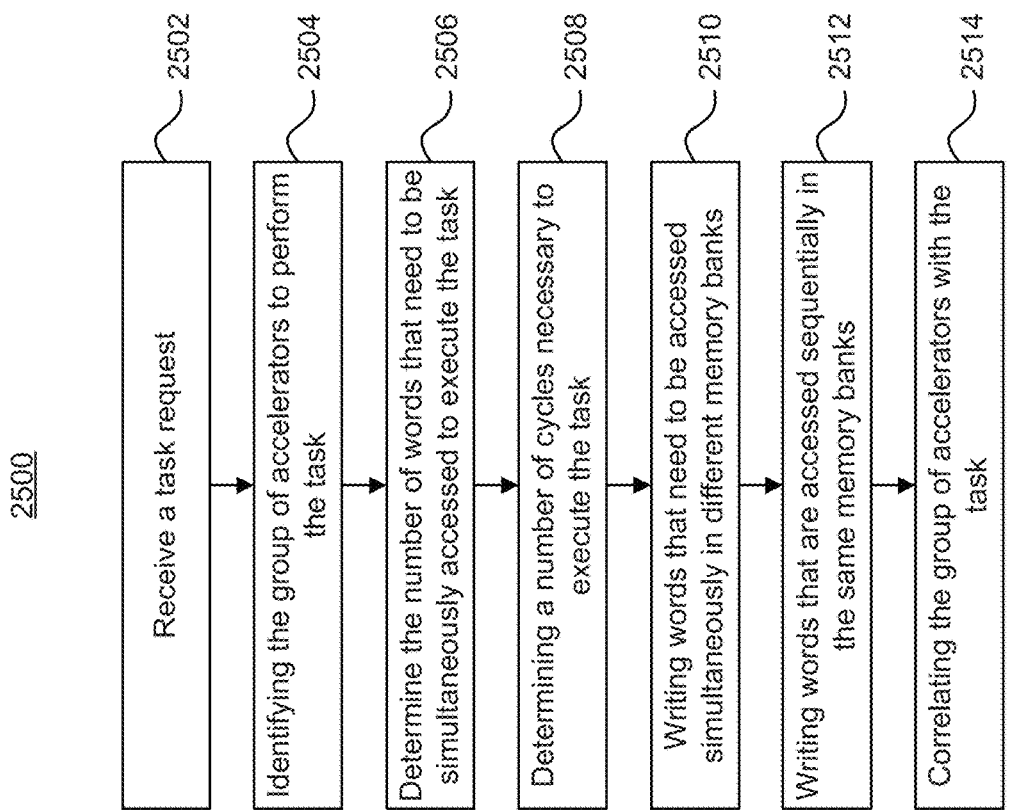
FIG. 25 is an exemplary flowchart illustrating a memory configuration process, consistent with disclosed embodiments.

FIG. 25 is an exemplary flowchart illustrating a possible memory configuration process 2500, consistent with disclosed embodiments. Where convenient in describing memory configuration process 2500, reference may be made to the identifiers of elements depicted in FIG. 22 and described above. In some embodiments, process 2500 may be executed by a compiler that provides instructions to a host connected through an external interface. In other embodiments, process 2500 may be executed by components of processing device 2200, such as configuration manager 2212.

In general, process 2500 may include determining a number of words required simultaneously to perform the task; determining a number of words that can be accessed simultaneously from each one of the plurality of memory banks; and dividing the number of words required simultaneously between multiple memory banks when the number of words required simultaneously is greater than the number of words that can be accessed simultaneously. Moreover, dividing the number of words required simultaneously may include executing a cyclic organization of words and sequentially assigning one word per memory bank.

More specifically, process 2500 may begin with step 2502, in which a compiler may receive a task specification. The specification include required computations and/or a priority level.

In step 2504, a compiler may identify an accelerator, or group of accelerators, that may perform the task. Alternatively, the compiler may generate instructions so the processing units, such as configuration manager 2212, may identify an accelerator to perform the task. For example, using the required computation configuration manger 2212 may identify accelerators in the group of accelerators 2216 that may process the task.

In step 2506, the compiler may determine a number of words that needs to be simultaneously accessed to execute the task. For example, the multiplication of two vectors requires access to at least two vectors, and the compiler may therefore determine that vector words must be simultaneously accessed to perform the operation.

In step 2508, the compiler may determine a number of cycles necessary to execute the task. For example, if the task requires a convolution operation of four by-products, the compiler may determine that at least 4 cycles will be necessary to perform the task.

In step 2510, the compiler may place words that are needed to be accessed simultaneously in different memory banks. In that way, memory controller 2210 may be configured to open lines to different memory instances and access the required memory blocks within a clock cycle, without any required cached data.

In step 2512, the compiler place words that are accessed sequentially in the same memory banks. For example, in the case that four cycles of operations are required, the compiler may generate instructions to write needed words in sequential cycles in a single memory block to avoid changing lines between different memory blocks during execution.

In step 2514, compiler generate instructions for programming processing units, such as configuration manager 2212. The instructions may specify conditions to operate a switching device (such as a multiplexor) or configure a data bus. With such instructions, configuration manager 2212 may configure memory controller 2210 to route data from, or grant access to, memory blocks to processing units using dedicated lines of communication according to a task.

Figure 26:
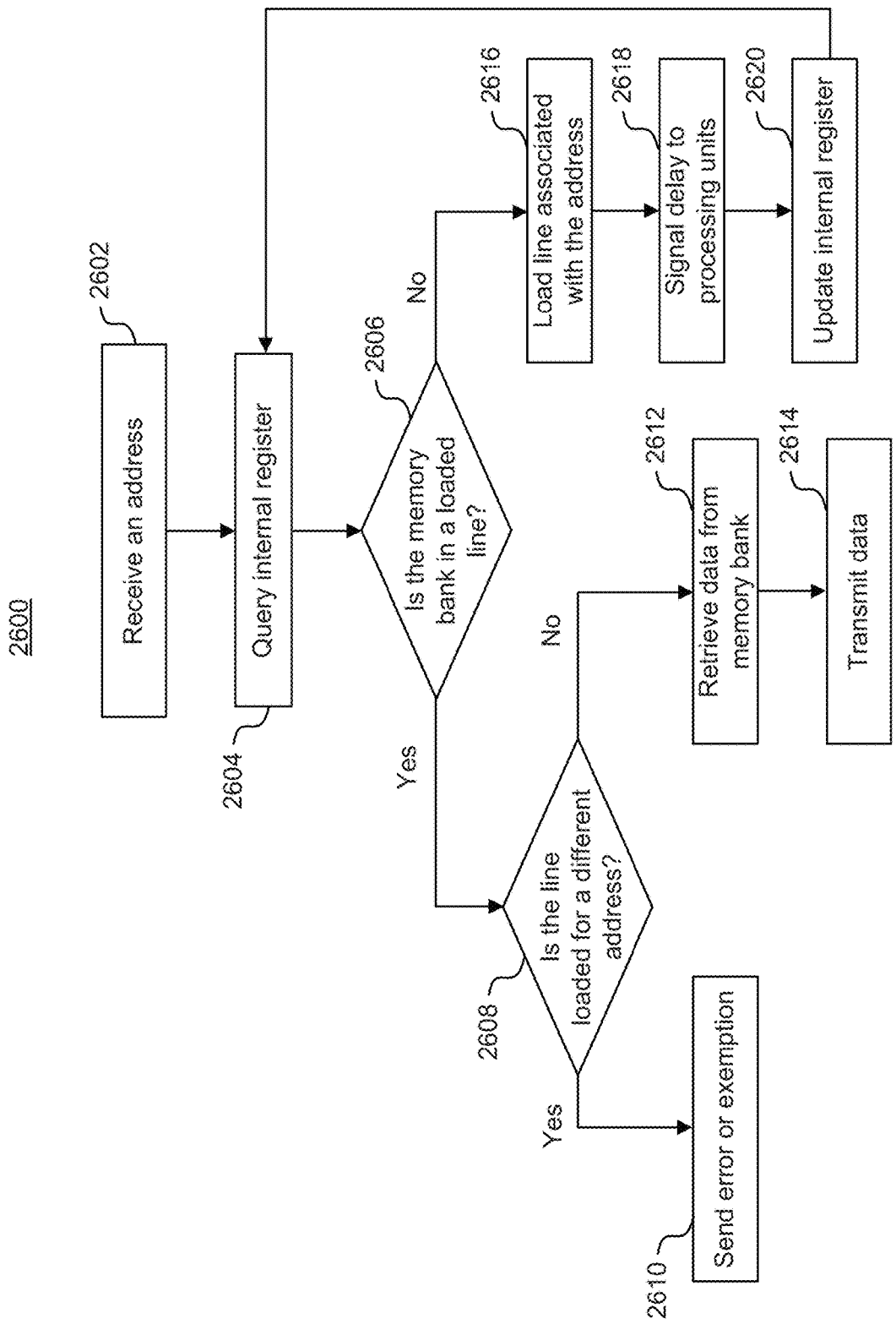
FIG. 26 is an exemplary flowchart illustrating a memory read process, consistent with disclosed embodiments.

FIG. 26 is an exemplary flowchart illustrating a memory read process 2600, consistent with disclosed embodiments. Where convenient in describing memory read process 2600, reference may be made to the identifiers of elements depicted in FIG. 22 and described above. In some embodiments, as described below, process 2600 may be implemented by memory controller 2210. In other embodiments, however, process 2600 may be implemented by other elements in the processing device 2200, such as configuration manager 2212.

In step 2602, memory controller 2210, configuration manager 2212, or other processing units may receive an indication to route data from, or grant access to, a memory bank. The request may specify an address and a memory block.

In some embodiments, the request may be received via a data bus specifying a read command in line 2218 and address in line 2220. In other embodiments, the request may be received via demultiplexers connected to memory controller 2210.

In step 2604, configuration manager 2212, a host, or other processing units, may query an internal register. The internal register may include information regarding opened lines to memory banks, opened addresses, opened memory blocks, and/or upcoming tasks. Based on the information in the internal register, it may be determined whether there are lines opened to the memory bank and/or whether the memory block received the request in step 2602. Alternatively, or additionally, memory controller 2210 may directly query the internal register.

If the internal register indicates that the memory bank is not loaded in an opened line (step 2606: no), process 2600 may continue to step 2616 and a line may be loaded to a memory bank associated with the received address. In addition, memory controller 2210 or a processing unit, such as configuration manager 2212, may signal a delay to the element requesting information from the memory address in step 2616. For example, if accelerator 2216 is requesting the memory information that is located an already occupied memory block, memory controller 2210 may send a delay signal to the accelerator in step 2618. In step 2620, configuration manager 2212 or memory controller 2210 may update the internal register to indicate a line has opened to a new memory bank or a new memory block.

If the internal register indicates that the memory bank is loaded in an opened line (step 2606: yes), process 2600 may continue to step 2608. In step 2608, it may be determined whether the line loaded the memory bank is being used for a different address. If the line is being used for a different address (step 2608: yes), it would indicate that there are two instances in a single block and, therefore, they cannot be accessed simultaneously. Thus, an error or exemption signal may be send to the element requesting information from the memory address in step 2616. But, if the line is not being used for a different address (step 2608: no), a line may be opened for the address and retrieve data from the target memory bank and continue to step 2614 to transmit data to the to the element requesting information from the memory address.

With process 2600, processing device 2200 has the ability to establish direct connections between processing units and the memory blocks or memory instances that contain the required information to perform a task. This organization of data would enable reading information from organized vectors in different memory instances, as well as allow the retrieval of information simultaneously from different memory blocks when a device requests a plurality of these addresses.

Figure 27:
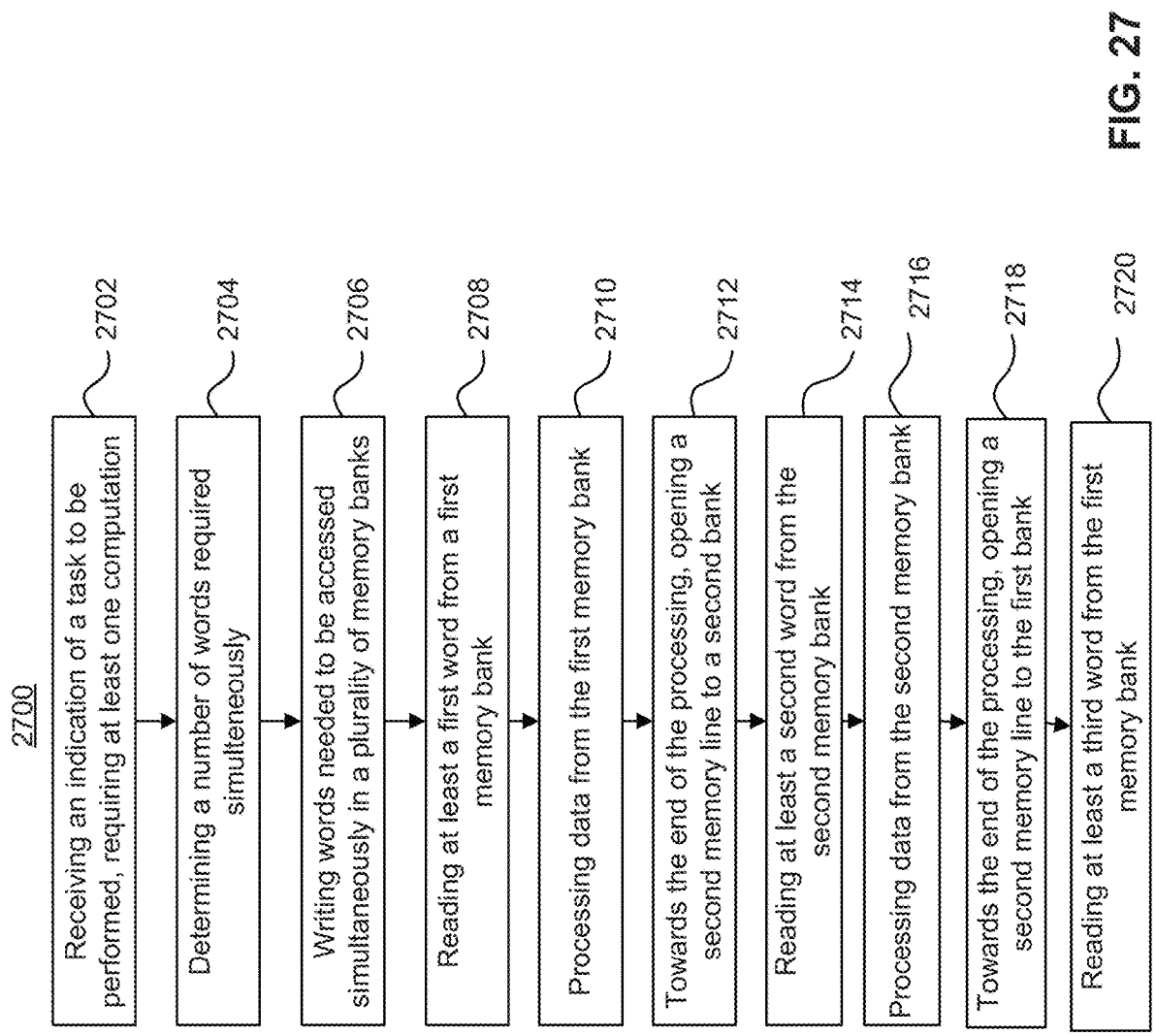
FIG. 27 is an exemplary flowchart illustrating a process execution, consistent with disclosed embodiments.

FIG. 27 is an exemplary flowchart illustrating an execution process 2700, consistent with disclosed embodiments. Where convenient in describing execution process 2700, reference may be made to the identifiers of elements depicted in FIG. 22 and described above.

In step 2702, a compiler or a local unit, such as configuration manager 2212, may receive an indication of a task that needs to be performed. The task may include a single operation (e.g., multiplication) or a more complex operation (e.g., convolution between matrixes). The task may also indicate a required computation.

In step 2704, the compiler or configuration manager 2212 may determine a number of words that is required simultaneously to perform the task. For example, configuration a compiler may determine two words are required simultaneously to perform a multiplication between vectors. In another example, a 2D convolution task, configuration manager 2212 may determine that "n" times "m" words are required for a convolution between matrices, where "n" and "m" are the matrices dimensions. Moreover, in step 2704, configuration manager 2212 may also determine a number of cycles necessary to perform the task.

In step 2706, depending on the determinations in step 2704, a compiler may write words that need to be accessed simultaneously in a plurality of memory banks disposed on the substrate. For instance, when a number a number of words that can be accessed simultaneously from one of the plurality of memory banks is lower than the number of words that are required simultaneously, a compiler may organize data in multiple memory banks to facilitate access to the different required words within a clock. Moreover, when configuration manager 2212 or the compiler determine a number of cycles is necessary to perform the task, the compiler may write words that are needed in sequential cycles in a single memory bank of the plurality of memory banks to prevent switching of lines between memory banks.

In step 2708, memory controller 2210 may be configured to read or grant access to at least one first word from a first memory bank from the plurality of memory banks or blocks using a first memory line.

In step 2170, a processing unit, for example one of accelerators 2216, may process the task using the at least one first word.

In step 2712, memory controller 2210 may be configured to open a second memory line in a second memory bank. For example, based on the tasks and using the pipelined memory access approach, memory controller 2210 may be configured to open a second memory line in a second memory block where information required for the tasks was written in step 2706. In some embodiments, the second memory line may be opened when the task in step 2170 is about to be completed. For example, if a task requires 100 clocks, the second memory line may be opened in the 90th clock.

In some embodiments, steps 2708-2712 may be executed within one line access cycle.

In step 2714, memory controller 2210 may be configured to grant access to data from at least one second word from the second memory bank using the second memory line opened in step 2710.

In step 2176, a processing unit, for example one of accelerators 2216, may process the task using the at least second word.

In step 2718, memory controller 2210 may be configured to open a second memory line in the first memory bank. For example, based on the tasks and using the pipelined memory access approach, memory controller 2210 may be configured to open a second memory line to the first memory block. In some embodiments, the second memory line to the first block may be opened when the task in step 2176 is about to be completed.

In some embodiments, steps 2714-2718 may be executed within one line access cycle.

In step 2720, memory controller 2210 may read or grant access to at least one third word from the first memory bank from the plurality of memory banks or blocks using a second memory line in the first bank or a first line in a third bank and continuing in different memory banks.

Some memory chips, such as dynamic random access memory (DRAM) chips, use refreshes to keep stored data (e.g., using capacitance) from being lost due to voltage decay in capacitors or other electric components of the chips. For example, in DRAM each cell has to be refreshed from time to time (based on the specific process and design) to restore the charge in the capacitors so that data is not lost or damaged. As the memory capacities of a DRAM chip increase, the amount of time required to refresh the memory becomes significant. During the time periods when a certain line of memory is being refreshed, the bank containing the line being refreshed cannot be accessed. This can result in reductions in performance. Additionally, the power associated with the refresh process may also be significant. Prior efforts have attempted to reduce the rate at which refreshes are performed to reduce adverse effects associated with refreshing memory, but most of these efforts have focused on the physical layers of the DRAM.

Refreshing is similar to reading and writing back a row of the memory. Using this principle and focusing on the access pattern to the memory, embodiments of the present disclosure include software and hardware techniques, as well as modifications to the memory chips, to use less power for refreshing and to reduce amounts of time during which memory is refreshed. For example, an as an overview, some embodiments may use hardware and/or software to track line access timing and skip recently accessed rows within a refresh cycle (e.g., based on a timing threshold). In another example, some embodiments may rely on software executed by the memory chip's refresh controller to assign reads and writes such that access to the memory is non-random. Accordingly, the software may control the refresh more precisely to avoid wasted refresh cycles and/or lines. These techniques may be used alone or combined with a compiler that encodes commands for the refresh controller along with machine code for a processor such that access to the memory is again non-random. Using any combination of these techniques and configurations, which are described in detail below, the disclosed embodiments may reduce memory refresh power requirements and/or increase system performance by reducing an amount of time during which a memory unit is refreshed.

Figure 28:
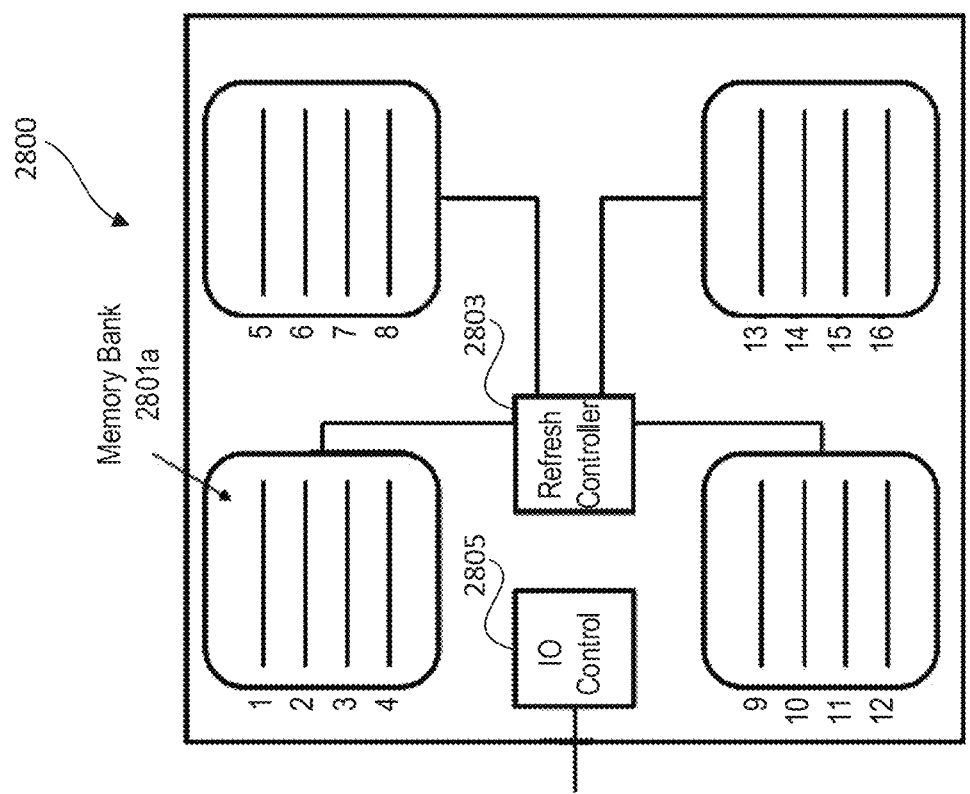
FIG. 28 shows an example memory chip with a refresh controller, consistent with the present disclosure.

FIG. 28 depicts an example memory chip 2800 with a refresh controller 2803, consistent with the present disclosure. For example, memory chip 2800 may include a plurality of memory banks (e.g., memory bank 2801*a* and the like) on a substrate. In the example of FIG. 28, the substrate includes four memory banks, each with four lines. A line may refer to a wordline within one or more memory banks of memory chip 2800 or any other collection of memory cells within memory chip 2800, such as a portion of or an entire row along a memory bank or a group of memory banks.

In other embodiments, the substrate may include any number of memory banks, and each memory bank may include any number of lines. Some memory banks may include a same number of lines (as shown in FIG. 28) while other memory banks may include different numbers of lines. As further depicted in FIG. 28, memory chip 2800 may include a controller 2805 to receive input to memory chip 2800 and transmit output from memory chip 2800 (e.g., as described above in "Division of Code").

In some embodiments, the plurality of memory banks may comprise dynamic random access memory (DRAM). However, the plurality of memory banks may comprise any volatile memory that stores data requiring periodic refreshes.

As will be discussed in more detail below, the presently disclosed embodiments may employ counters or resistor-capacitor circuits to time refresh cycles. For example a counter or timer may be used to count time from the last full refresh cycle and then when the counter reaches its target value another counter may be used to iterate over all rows. Embodiments of the present disclosure may additionally track accesses to segments of memory chip 2800 and reduce refresh power required. For example, although not depicted in FIG. 28, memory chip 2800 may further include a data storage configured to store access information indicative of access operations for one or more segments of the plurality of memory banks. For example, the one or more segments may comprise any portions of lines, columns, or any other groupings of memory cells within memory chip 2800. In one particular example, the one or more segments may include at least one row of memory structures within the plurality of memory banks. Refresh controller 2803 may be configured to perform a refresh operation of the one or more segments based, at least in part, on the stored access information.

For example, the data storage may comprise one or more registers, static random access memory (SRAM) cells, or the like associated with segments of memory chip 2800 (e.g., lines, columns, or any other groupings of memory cells within memory chip 2800). Further, the data storage may be configured to store bits indicative of whether the associated segment was accessed in one or more previous cycles. A "bit" may comprise any data structure storing at least one bit, such as a register, an SRAM cell, a nonvolatile memory, or the like. Moreover, a bit may be set by setting a corresponding switch (or switching element, such as a transistor) of the data structure to ON (which may be equivalent to "1" or "true"). Additionally or alternatively, a bit may be set by modifying any other property within the data structure (such as charging a floating gate of a flash memory, modifying a state of one or more flip-flops in an SRAM, or the like) in order to write a "1" to the data structure (or any other value indicating the setting of a bit). If a bit is determined to be set as part of the memory controller's refresh operation, refresh controller 2803 may skip a refresh cycle for the associated segment and clear the register(s) associated with that portion.

In another example, the data storage may comprise one or more nonvolatile memories (e.g., a flash memory or the like) associated with segments of memory chip 2800 (e.g., lines, columns, or any other groupings of memory cells within memory chip 2800). The nonvolatile memory may be configured to store bits indicative of whether the associated segment was accessed in one or more previous cycles.

Some embodiments may additionally or alternatively add a timestamp register on each row or group of rows (or other segment of memory chip 2800) holding the last tick within the current refresh cycle which the line was accessed. This means that with each row access, the refresh controller may update the row timestamp register. Thus, when a next time to refresh occurs (e.g., at the end of a refresh cycle), the refresh controller may compare the stored timestamp, and if the associated segment was previously accessed within a certain period of time (e.g., within a certain threshold as applied to the stored timestamp), the refresh controller may skip to the next segment. This saves the system from expending refresh power on segments that have been recently accessed. Moreover, the refresh controller may continue to track access to make sure each segment is accessed or refreshed at the next cycle.

Accordingly, in yet another example, the data storage may comprise one or more registers or nonvolatile memories associated with segments of memory chip 2800 (e.g., lines, columns, or any other groupings of memory cells within memory chip 2800). Rather than using bits to indicate whether an associated segment has been accessed, the registers or nonvolatile memories may be configured to store timestamps or other information indicative of a most recent access of the associated segments. In such an example, refresh controller 2803 may determine whether to refresh or access the associated segments based on whether an amount of time between timestamps stored in the associated registers or memories and a current time (e.g., from a timer, as explained below in FIGS. 29A and 29B) exceed a predetermined threshold (e.g., 8 ms, 16 ms, 32 ms, 64 ms, or the like).

Accordingly, the predetermined threshold may comprise an amount of time for a refresh cycle to ensure that the associated segments are refreshed (if not accessed) at least once per refresh cycle. Alternatively, the predetermined threshold may comprise an amount of time shorter than that required for a refresh cycle (e.g., to ensure that any required refresh or access signals may reach the associated segments before the refresh cycle is complete). For example, the predetermined time may comprise 7 ms for a memory chip with an 8 ms refresh period such that, if a segment has not been accessed in 7 ms, the refresh controller will send a refresh or access signal that reaches the segment by the end of the 8 ms refresh period. In some embodiments, the predetermined threshold may depend on the size of an associated segment. For example, the predetermined threshold may be smaller for smaller segments of memory chip 2800.

Although described above with respect to a memory chip, the refresh controllers of the present disclosure may also be used in distributed processor architectures, like those described in the sections above and throughout the present disclosure. One example of such an architecture is depicted in FIG. 7A. In such embodiments, the same substrate as memory chip 2800 may include, disposed thereon, a plurality of processing groups, e.g., as depicted in FIG. 7A. As explained above with respect to FIG. 3A, a "processing group" may refer to two or more processor subunits and their corresponding memory banks on the substrate. The group may represent a spatial distribution on the substrate and/or a logical grouping for the purposes of compiling code for execution on memory chip 2800. Accordingly, the substrate may include a memory array that includes a plurality of banks, such as banks 2801a and other banks shown in FIG. 28. Furthermore, the substrate may include a processing array that may include a plurality of processor subunits (such as subunits 730a, 730b, 730c, 730d, 730e, 730f, 730g, and 730h shown in FIG. 7A).

As further explained above with respect to FIG. 7A, each processing group may include a processor subunit and one or more corresponding memory banks dedicated to the processor subunit. Moreover, to allow each processor subunit to communicate with its corresponding, dedicated memory bank(s), the substrate may include a first plurality of buses connecting one of the processor subunits to its corresponding, dedicated memory bank(s).

In such embodiments, as shown in FIG. 7A, the substrate may include a second plurality of buses to connect each processor subunit to at least one other processor subunit (e.g., an adjacent subunit in in the same row, an adjacent processor subunit in the same column, or any other processor subunit on the substrate). The first and/or second plurality of buses may be free of timing hardware logic components such that data transfers between processor subunits and across corresponding ones of the plurality of buses are uncontrolled by timing hardware logic components, as explained above in the "Synchronization Using Software" section.

In embodiments where same substrate as memory chip 2800 may include, disposed thereon, a plurality of processing groups (e.g., as depicted in FIG. 7A), the processor subunits may further include an address generator (e.g., address generator 450 as depicted in FIG. 4). Moreover, each processing group may include a processor subunit and one or more corresponding memory banks dedicated to the processor subunit. Accordingly, each one of the address generators may be associated with a corresponding, dedicated one of the plurality of memory banks. In addition, the substrate may include a plurality of buses, each connecting one of the plurality of address generators to its corresponding, dedicated memory bank.

Figure 29A:
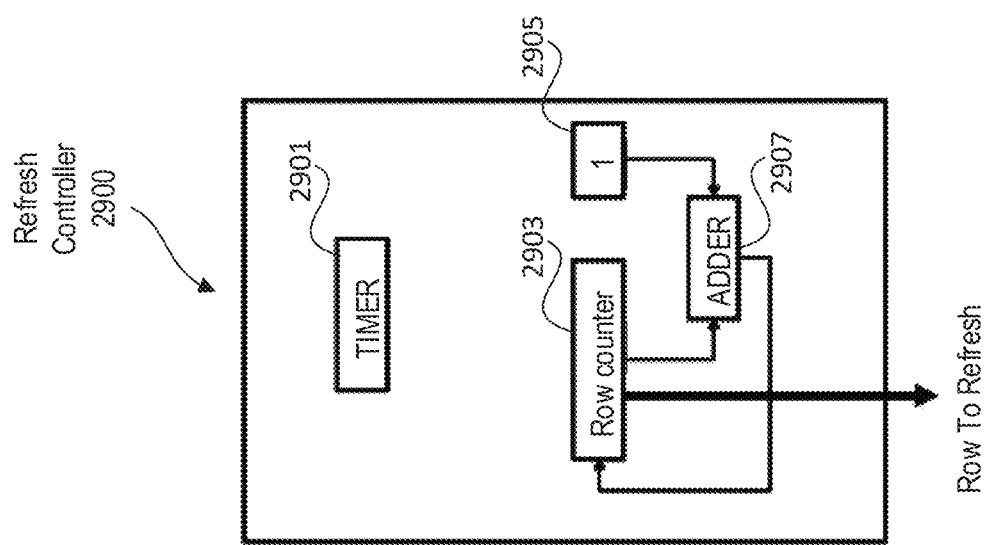
FIG. 29A shows an example refresh controller consistent with the present disclosure.

FIG. 29A depicts example refresh controller 2900 consistent with the present disclosure. Refresh controller 2900 may be incorporated in a memory chip of the present disclosure, such as memory chip 2800 of FIG. 28. As depicted in FIG. 29A, refresh controller 2900 may include a timer 2901, which may comprise a on-chip oscillator or any other timing circuit for refresh controller 2900. In the configuration depicted in FIG. 29A, timer 2901 may trigger a refresh cycle periodically (e.g., every 8 ms, 16 ms, 32 ms, 64 ms, or the like). The refresh cycle may use a row counter 2903 to cycle through all rows of a corresponding memory chip and generate a refresh signal for each row using adder 2901 combined with an active bit 2905. As shown in FIG. 29A, bit 2905 may be fixed at 1 ("true") to ensure that each row is refreshed during a cycle.

In embodiments of the present disclosure, refresh controller 2900 may be include a data storage. As described above, the data storage may comprise one or more registers or nonvolatile memories associated with segments of memory chip 2800 (e.g., lines, columns, or any other groupings of memory cells within memory chip 2800). The registers or nonvolatile memories may be configured to store timestamps or other information indicative of a most recent access of the associated segments.

Refresh controller 2900 may use the stored information to skip refreshes for segments of memory chip 2900. For example, refresh controller 2900 may skip a segment in a current refresh cycle if the information indicates it was refreshed during one or more previous refresh cycles. In another example, refresh controller 2900 may skip a segment in a current refresh cycle if a difference between the stored timestamp for the segment a current time is below a threshold. Refresh controller 2900 may further continue to track accesses and refreshes of the segments of memory chip 2800 through multiple refresh cycles. For example, refresh controller 2900 may update stored timestamps using timer 2901. In such embodiments, refresh controller 2900 may be configured to use an output of the timer in clearing the access information stored in the data storage after a threshold time interval. For example, in embodiments where the data storage stores timestamps of a most recent access or refresh for an associated segment, refresh controller 2900 may store a new timestamp in the data storage whenever an access command or refresh signal is sent to the segment. If the data storage stores bits rather than timestamps, timer 2901 may be configured to clear bits that are set for longer than a threshold period of time. For example, in embodiments where the data storage stores bits indicating that associated segments was accessed in one or more previous cycles, refresh controller 2900 may clear bits (e.g., setting them to 0) in the data storage whenever timer 2901 triggers a new refresh cycle that is a threshold number of cycles (e.g., one, two, or the like) later since the associated bits were set (e.g., set to 1).

Refresh controller 2900 may track access of the segments of memory chip 2800 in cooperation with other hardware of memory chip 2800. For example, memory chips use sense amplifiers to perform read operations (e.g., as shown above in FIGS. 9 and 10). The sense amplifiers may comprise a plurality of transistors configured to sense low-power signals from a segment of the memory chip 2800 storing a data in one or more memory cells and amplify the small voltage swing to higher voltage levels such that the data can be interpreted by logic, such as external CPUs or GPUs or integrated processor subunits as explained above. Although not depicted in FIG. 29A, refresh controller 2900 may further communicate with a sense amplifier configured to access the one or more segments and change the state of the at least one bit register. For example, when the sense amplifier accesses the one or more segments, it may set (e.g., set to 1) bits associated with the segments indicating that the associated segments were accessed in a previous cycle. In embodiments where the data storage stores timestamps of a most recent access or refresh for an associated segment, when the sense amplifier accesses the one or more segments, it may trigger a write of a timestamp from timer 2901 to the registers, memories, or other elements comprising the data storage.

In any of the embodiments described above, refresh controller 2900 may be integrated with a memory controller for the plurality of memory banks. For example, similar to the embodiments depicted in FIG. 3A, refresh controller 2900 may be incorporated into a logic and control subunit associated with a memory bank or other segment of memory chip 2800.

Figure 29B:
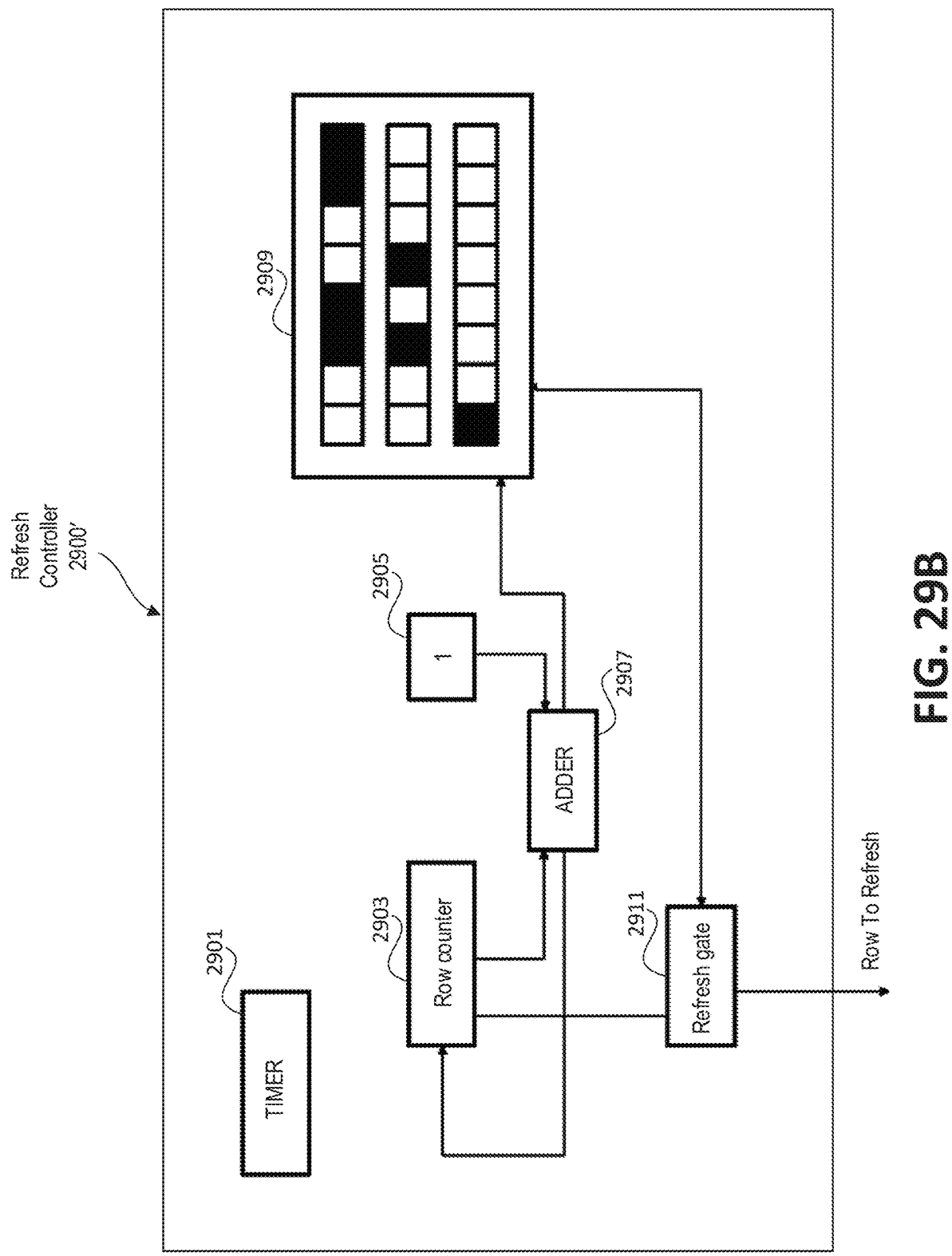
FIG. 29B shows another example refresh controller consistent with the present disclosure.

FIG. 29B depicts another example refresh controller 2900' consistent with the present disclosure. Refresh controller 2900' may be incorporated in a memory chip of the present disclosure, such as memory chip 2800 of FIG. 28. Similar to refresh controller 2900, refresh controller 2900' includes timer 2901, row counter 2903, active bit 2905, and adder 2907. Additionally, refresh controller 2900' may include data storage 2909. As shown in FIG. 29B, data storage 2909 may comprise one or more registers or nonvolatile memories associated with segments of memory chip 2800 (e.g., lines, columns, or any other groupings of memory cells within memory chip 2800), and states within the data storage may be configured to be changed (e.g., by a sense amplifier and/or other elements of refresh controller 2900', as described above) in response to the one or more segments being accessed. Accordingly, the refresh controller 2900' may be configured to skip a refresh of the one or more segments based on the states within the data storage. For example, if a state associated with a segment is activated (e.g., set to 1 by being switched on, having a property altered in order to store a "1," or the like), refresh controller 2900' may skip a refresh cycle for the associated segment and clear the state associated with that portion. The state may be stored with at least a one-bit register or any other memory structure configured to store at least one bit of data.

In order to ensure segments of the memory chip are refreshed or accessed during each refresh cycle, refresh controller 2900' may reset or otherwise clear the states in order to trigger a refresh signal during the next refresh cycle. In some embodiments, after a segment is skipped, refresh controller 2900' may clear the associated state in order to ensure that the segment is refreshed on the next refresh cycle. In other embodiments, refresh controller 2900' may be configured to reset the states within the data storage after a threshold time interval. For example, refresh controller 2900' may clear states (e.g., setting them to 0) in the data storage whenever timer 2901 exceeds a threshold time since the associated states were set (e.g., set to 1 by being switched on, having a property altered in order to store a "1," or the like). In some embodiments, refresh controller 2900' may use a threshold number of refresh cycles (e.g., one, two, or the like) or use a threshold number of clock cycles (e.g., two, four, or the like) rather than a threshold time.

In other embodiments, the state may comprise a timestamp of a most recent refresh or access of an associated segment such that, if an amount of time between the timestamp and a current time (e.g., from timer 2901 of FIGS. 29A and 29B) exceeds a predetermined threshold (e.g., 8 ms, 16 ms, 32 ms, 64 ms, or the like), refresh controller 2900' may send an access command or a refresh signal to the associated segment and update the timestamp associated with that portion (e.g., using timer 2901). Additionally or alternatively, refresh controller 2900' may be configured to skip a refresh operation relative to the one or more segments of the plurality of memory banks if the refresh time indicator indicates a last refresh time within a predetermined time threshold. In such embodiments, refresh controller 2900', after skipping a refresh operation relative to the one or more segments, may be configured to alter the stored refresh time indicator associated with the one or more segments such that during a next operation cycle, the one or more segments will be refreshed. For example, as described above, refresh controller 2900' may use timer 2901 to update the stored refresh time indicator.

Accordingly, the data storage may include a timestamp register configured to store a refresh time indicator indicative of a time at which the one or more segments of the plurality of memory banks were last refreshed. Moreover, refresh controller 2900' may use an output of the timer in clearing the access information stored in the data storage after a threshold time interval.

In any of the embodiments described above, access to the one or more segments may include a write operation associated with the one or more segments. Additionally or alternatively, access to the one or more segments may include a read operation associated with the one or more segments.

Moreover, as depicted in FIG. 29B, refresh controller 2900' may comprise a row counter 2903 and an adder 2907 configured to assist in updating the data storage 2909 based, at least in part, on the states within the data storage. Data storage 2909 may comprise a bit table associated with the plurality of memory banks. For example, the bit table may comprise an array of switches (or switching elements such as transistors) or registers (e.g., SRAM or the like) configured to hold bits for associated segments. Additionally or alternatively, data storage 2909 may store timestamps associated with the plurality of memory banks.

Moreover, refresh controller 2900' may include a refresh gate 2911 configured to control whether a refresh to the one or more segments occurs based a corresponding value stored in the bit table. For example, refresh gate 2911 may comprise a logic gate (such as an "and" gate) configured to nullify a refresh signal from row counter 2903 if a corresponding state of data storage 2909 indicates that the associated segment was refreshed or accessed during one or more previous clock cycles. In other embodiments, refresh gate 2911 may comprise a microprocessor or other circuit configured to nullify a refresh signal from row counter 2903 if a corresponding timestamp from data storage 2909 indicates that the associated segment was refreshed or accessed within a predetermined threshold time value.

Figure 30:
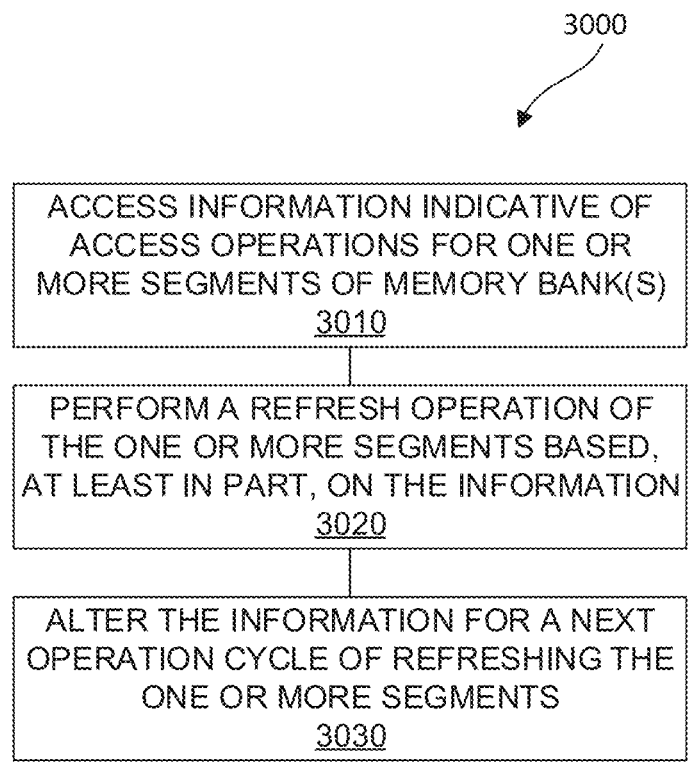
FIG. 30 is an example flowchart of a process executing by a refresh controller consistent with the present disclosure.

FIG. 30 is an example flowchart of a process 3000 for partial refreshes in a memory chip (e.g., memory chip 2800 of FIG. 28) Process 3000 may be executed by a refresh controller consistent with the present disclosure, such as refresh controller 2900 of FIG. 29A or refresh controller 2900' of FIG. 29B.

At step 3010, the refresh controller may access information indicative of access operations for one or more segments of a plurality of memory banks. For example, as explained above with respect to FIGS. 29A and 29B, the refresh controller may include a data storage associated with segments of memory chip 2800 (e.g., lines, columns, or any other groupings of memory cells within memory chip 2800) and configured to store timestamps or other information indicative of a most recent access of the associated segments.

At step 3020, the refresh controller may generate refresh and/or access commands based, at least in part, on the accessed information. For example, as explained above with respect to FIGS. 29A and 29B, the refresh controller may skip a refresh operation relative to the one or more segments of the plurality of memory banks if the accessed information indicates a last refresh or access time within a predetermined time threshold and/or if the accessed information indicates a last refresh or access occurred during one or more previous clock cycles. Additionally or alternatively, the refresh controller may generate comments to refresh or access the associated segments based on whether the accessed information indicates a last refresh or access time that exceeds a predetermined threshold and/or if the accessed information indicates a last refresh or access did not occur during one or more previous clock cycles.

At step 3030, the refresh controller may alter the stored refresh time indicator associated with the one or more segments such that during a next operation cycle, the one or more segments will be refreshed. For example, after skipping a refresh operation relative to the one or more segments, the refresh controller may alter the information indicative of access operations for the one or more segments such that, during a next clock cycle, the one or more segments will be refreshed. Accordingly, the refresh controller may clear (e.g., set to 0) states for the segments after skipping a refresh cycle. Additionally or alternatively, the refresh controller may set (e.g., set to 1) states for the segments that are refreshed and/or accessed during the current cycle. In embodiments where the information indicative of access operations for the one or more segments includes timestamps, the refresh controller may update any stored timestamps associated with segments that are refreshed and/or accessed during the current cycle.

Method 3000 may further include additional steps. For example, in addition to or as an alternative to step 3030, a sense amplifier may access the one or more segments and may change the information associated with the one or more segments. Additionally or alternatively, the sense amplifier may signal to the refresh controller when the access has occurred such that the refresh controller may update the information associated with the one or more segments. As explained above, a sense amplifier may comprise a plurality of transistors configured to sense low-power signals from a segment of the memory chip storing a data in one or more memory cells and amplify the small voltage swing to higher voltage levels such the data can be interpreted by logic, such as external CPUs or GPUs or integrated processor subunits as explained above. In such an example, whenever the sense amplifier accesses the one or more segments, it may set (e.g., set to 1) bits associated with the segments indicating that the associated segments were accessed in a previous cycle. In embodiments where the information indicative of access operations for the one or more segments includes timestamps, whenever the sense amplifier accesses the one or more segments, it may trigger a write of a timestamp from a timer of the refresh controller to the data storage to update any stored timestamps associated with the segments.

Figure 31:
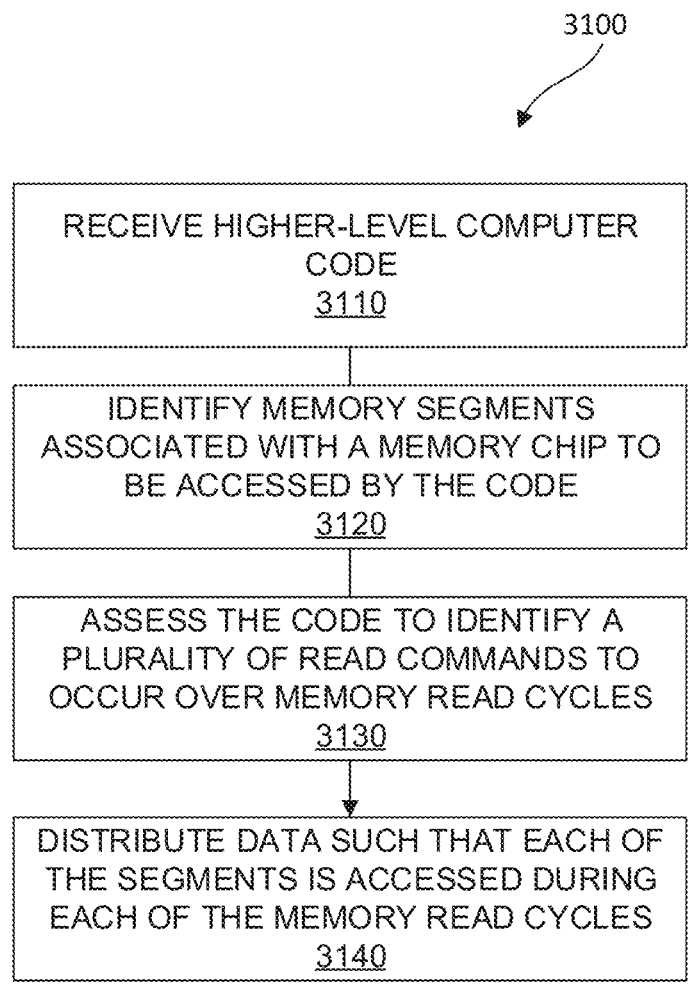
FIG. 31 is an example flowchart of a process implemented by a compiler consistent with the present disclosure.

FIG. 31 is an example flowchart of a process 3100 for determining refreshes for a memory chip (e.g., memory chip 2800 of FIG. 28). Process 3100 may be implemented within a compiler consistent with the present disclosure. As explained above, a "compiler" refers to any computer program that converts a higher-level language (e.g., a procedural language, such as C, FORTRAN, BASIC, or the like; an object-oriented language, such as Java, C++, Pascal, Python, or the like; etc.) to a lower-level language (e.g., assembly code, object code, machine code, or the like). The compiler may allow a human to program a series of instructions in a human-readable language, which is then converted to a machine-executable language. The compiler may comprise software instructions executed by one or more processors.

At step 3110, the one or more processors may receive higher-level computer code. For example, the higher-level computer code may be encoded in one or more files on a memory (e.g., a non-volatile memory such as a hard disk drive or the like, a volatile memory such as DRAM, or the like) or received over a network (e.g., the Internet or the like). Additionally or alternatively, the higher-level computer code may be received from a user (e.g., using an input device such as a keyboard).

At step 3120, the one or more processors may identify a plurality of memory segments distributed over a plurality of memory banks associated with a memory chip to be accessed by the higher-level computer code. For example, the one or more processors may access a data structure defining the plurality of memory banks and a corresponding structure of the memory chip. The one or more processor may access the data structure from a memory (e.g., a non-volatile memory such as a hard disk drive or the like, a volatile memory such as DRAM, or the like) or receive the data structure over a network (e.g., the Internet or the like). In such embodiments, the data structure may be included in one or more libraries accessible by the compiler to permit the compiler to generate instructions for the particular memory chip to be accessed.

At step 3130, the one or processors may assess the higher-level computer code to identify a plurality of memory read commands to occur over a plurality of memory access cycles. For example, the one or more processor may identify each operation within the higher-level computer code requiring one or more read commands from memory and/or one or more write commands to memory. Such instructions may include variable initialization, variable re-assignment, logic operations on variables, input-output operations, or the like.

At step 3140, the one or more processors may cause a distribution of data, associated with the plurality of memory access commands, across each of the plurality of memory segments such that each of the plurality of memory segments is accessed during each of the plurality of memory access cycles. For example, the one or more processors may identify the memory segments from the data structure defining the structure of the memory chip and then assign variables from the higher-level code to various ones of the memory segments such that each memory segment is accessed (e.g., via a write or a read) at least once during each refresh cycle (which may comprise a particular number of clock cycles). In such an example, the one or more processors may access information indicative of how many clock cycles each line of higher-level code requires in order to assign variables from the lines of higher-level code such that each memory segment is accessed (e.g., via a write or a read) at least once during the particular number of clock cycles.

In another example, the one or more processors may first generate machine code or other lower-level code from the higher-level code. The one or more processors may then assign variables from the lower-level code to various ones of the memory segments such that each memory segment is accessed (e.g., via a write or a read) at least once during each refresh cycle (which may comprise a particular number of clock cycles). In such an example, each line of lower-level code may require a single clock cycle.

In any of the examples given above, the one or more processor may further assign logic operations or other commands that use temporary output to various ones of the memory segments. Such temporary outputs may still result in read and/or write commands such that the assigned memory segment is still being accessed during that refresh cycle even though a named variable has not been assigned to that memory segment.

Method 3100 may further include additional steps. For example, the one or more processors may, in embodiments where the variables are assigned prior to compiling, generate machine code or other lower-level code from the higher-level code. Moreover, the one or more processors may transmit the compiled code for execution by the memory chip and corresponding logic circuits. The logic circuits may comprise conventional circuits such as GPUs or CPUs or may comprise processing groups on the same substrate as the memory chip, e.g., as depicted in FIG. 7A. Accordingly, as described above, the substrate may include a memory array that includes a plurality of banks, such as banks 2801a and other banks shown in FIG. 28. Furthermore, the substrate may include a processing array that may include a plurality of processor subunits (such as subunits 730a, 730b, 730c, 730d, 730e, 730f, 730g, and 730h shown in FIG. 7A).

Figure 32:
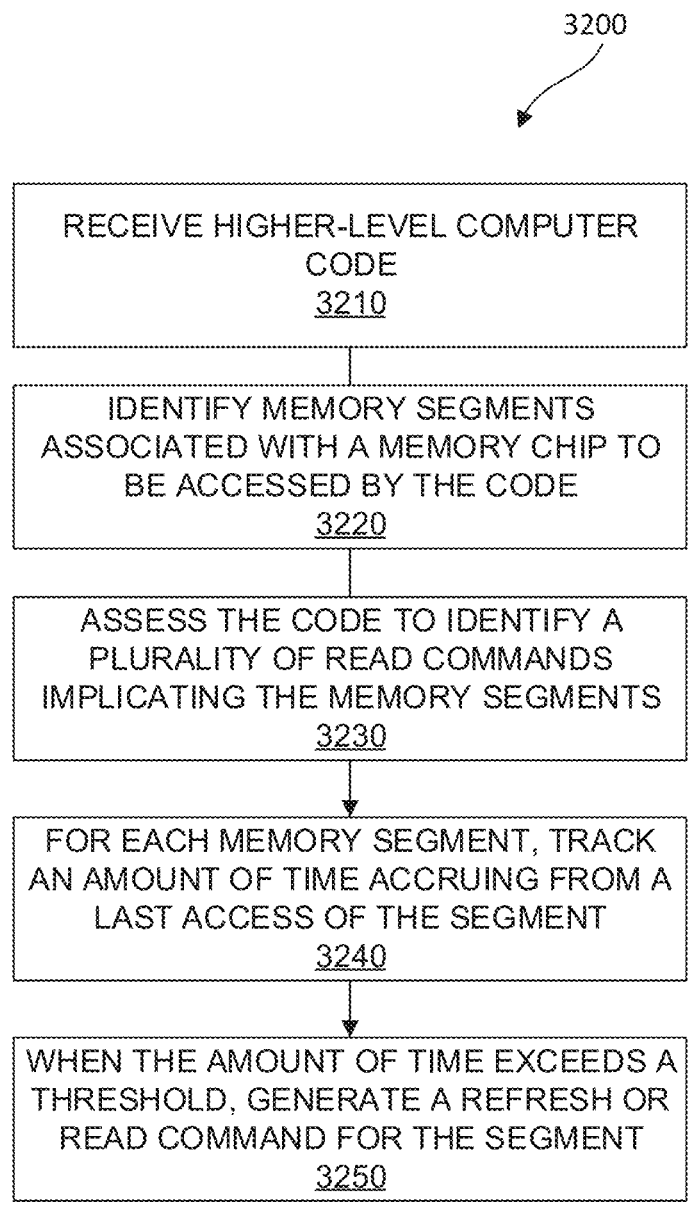
FIG. 32 is another example flowchart of a process implemented by a compiler consistent with the present disclosure.

FIG. 32 is another example flowchart of a process 3200 for determining refreshes for a memory chip (e.g., memory chip 2800 of FIG. 28). Process 3200 may be implemented within a compiler consistent with the present disclosure. Process 3200 may be executed by one or more processors executing software instructions comprising the compiler. Process 3200 may be implemented separately from or in combination with process 3100 of FIG. 31.

At step 3210, similar to step 3110, the one or more processors may receive higher-level computer code. At step 3220, similar to step 3210, the one or more processors may identify a plurality of memory segments distributed over a plurality of memory banks associated with a memory chip to be accessed by the higher-level computer code.

At step 3230, the one or more processors may assess the higher-level computer code to identify a plurality of memory read commands each implicating one or more of the plurality of memory segments. For example, the one or more processor may identify each operation within the higher-level computer code requiring one or more read commands from memory and/or one or more write commands to memory. Such instructions may include variable initialization, variable re-assignment, logic operations on variables, input-output operations, or the like.

In some embodiments, the one or more processors may simulate an execution of the higher-level code using logic circuits and the plurality of memory segments. For example, the simulation may comprise a line-by-line step-through of the higher-level code similar to that of a debugger or other instruction set simulator (ISS). The simulation may further maintain internal variables which represent the addresses of the plurality of memory segments, similar to how a debugger may maintain internal variables which represent registers of a processor.

At step 3240, the one or more processors may, based on analysis of the memory access commands and for each memory segment among the plurality of memory segments, track an amount of time that would accrue from a last access to the memory segment. For example, using the simulation described above, the one or processors may determine lengths of time between each access (e.g., a read or a write) to one or more addresses within each of the plurality of memory segments. The lengths of time may be measured in absolute time, clock cycles, or refresh cycles (e.g., determined by a known refresh rate of the memory chip).

At step 3250, in response to a determination that an amount of time since a last access for any particular memory segment would exceed a predetermined threshold, the one or more processors may introduce into the higher-level computer code at least one of a memory refresh command or a memory access command configured to cause an access to the particular memory segment. For example, the one or more processors may include a refresh command for execution by a refresh controller (e.g., refresh controller 2900 of FIG. 29A or refresh controller 2900' of FIG. 29B). In embodiments where the logic circuits are not embedded on the same substrate as the memory chip, the one or more processors may generate the refresh commands for sending to the memory chip separate from the lower-level code for sending to the logic circuits.

Additionally or alternatively, the one or more processors may include an access command for execution by a memory controller (which may be separate from the refresh controller or incorporated into the same). The access command may comprise a dummy command configured to trigger a read operation on the memory segment but without having the logic circuits perform any further operation on the read or written variable from the memory segment.

In some embodiments, the compiler may include a combination of steps from process 3100 and from process 3200. For example, the compiler may assign variables according to step 3140 and then run the simulation described above to add in any additional memory refresh commands or memory access commands according to step 3250. This combination may allow for the compiler to distribute the variables across as many memory segments as possible and to generate refresh or access commands for any memory segments that cannot be accessed within the predetermined threshold amount of time. In another combinatory example, the compiler may simulate the code according to step 3230 and assign variables according to step 3140 based on any memory segments that the simulation indicates will not be accessed within the predetermined threshold amount of time. In some embodiments, this combination may further include step 3250 to allow for the compiler to generate refresh or access commands for any memory segments that cannot be accessed within the predetermined threshold amount of time, even after assignments according to step 3140 are complete.

Refresh controllers of the present disclosure may allow software executed by logic circuits (whether conventional logic circuits such as CPUs and GPUs or processing groups on the same substrate as the memory chip, e.g., as depicted in FIG. 7A) to disable an automatic refresh executed by the refresh controller and control the refresh via the executed software instead. Accordingly, some embodiments of the present disclosure may provide software with a known access pattern to a memory chip (e.g., if the compiler has access to a data structure defining a plurality of memory banks and a corresponding structure of the memory chip). In such embodiments, a post-compiling optimizer may disable automatic refresh and manually set refresh controls only for segments of the memory chip not accessed within threshold amounts of time. Thus, similar to step 3250 described above but after compilation, the post-compiling optimizer may generate refresh commands to ensure each memory segment is accessed or refreshed with the predetermined threshold amount of time.

Another example of reducing refresh cycles may include using predefined patterns of access to the memory chip. For example, if software executed by the logic circuits can control its access pattern for the memory chip, some embodiments may create access patterns for refresh beyond conventional linear line refreshes. For example, if a controller determines that software executed by the logic circuits accesses regularly every second row of memory, then a refresh controller of the present disclosure may use an access pattern that does not refresh every second line in order to speed up the memory chip and reduce power usage.

Figure 33:
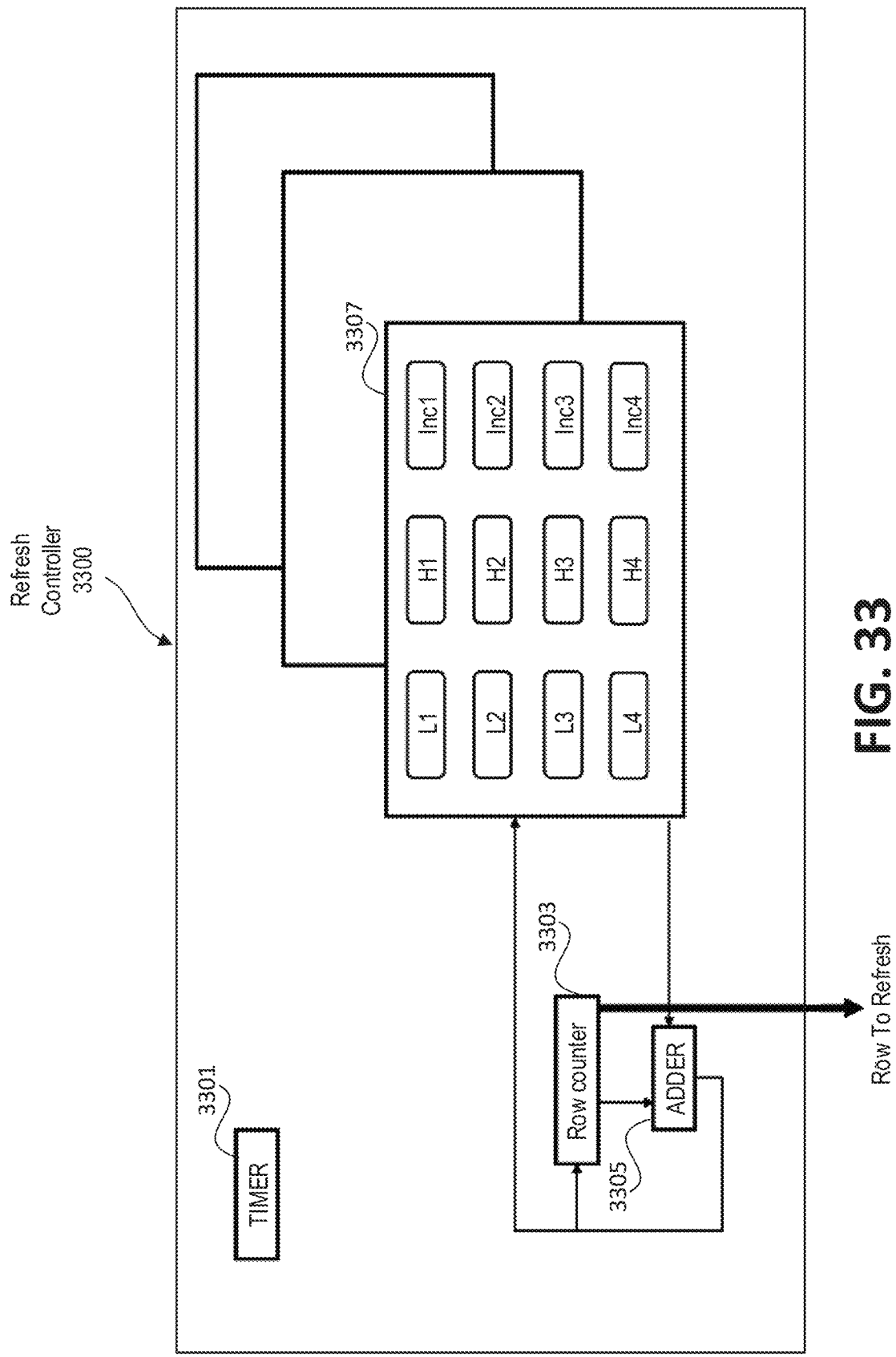
FIG. 33 shows an example refresh controller configured by stored patterns consistent with the present disclosure.

An example of such a refresh controller is shown in FIG. 33. FIG. 33 depicts an example refresh controller 3300 configured by stored patterns consistent with the present disclosure. Refresh controller 3300 may be incorporated in a memory chip of the present disclosure, e.g., having a plurality of memory banks and a plurality of memory segments included in each of the plurality of memory banks, such as memory chip 2800 of FIG. 28.

Refresh controller 3300 includes a timer 3301 (similar to timer 2901 of FIGS. 29A and 29B), a row counter 3303 (similar to row counter 2903 of FIGS. 29A and 29B), and an adder 3305 (similar to adder 2907 of FIGS. 29A and 29B). Moreover, refresh controller 3300 includes a data storage 3307. Unlike data store 2909 of FIG. 29B, data storage 3307 may store at least one memory refresh pattern to be implemented in refreshing the plurality of memory segments included in each of the plurality of memory banks. For example, as depicted in FIG. 33, data storage 3307 may include Li (e.g., L1, L2, L3, and L4 in the example of FIG. 33) and Hi (e.g., H1, H2, H3, and H4 in the example of FIG. 33) that define segments in the memory banks by row and/or column. Moreover, each segment may be associated with an Inci variable (e.g., Inc1, Inc2, Inc3, and Inc4 in the example of FIG. 33) which defines how the rows associated with the segment are incremented (e.g., whether each row is accessed or refresh, whether every other row is accessed or refreshed, or the like). Thus, as shown in FIG. 33, the refresh pattern may comprise a table including a plurality of memory segment identifiers assigned by the software to identify ranges of the plurality of memory segments in a particular memory bank that are to be refreshed during a refresh cycle and ranges of the plurality of memory segments in the particular memory bank that are not to be refreshed during the refresh cycle.

Thus, data storage 3308 may define a refresh pattern which the software executed by logic circuits (whether conventional logic circuits such as CPUs and GPUs or processing groups on the same substrate as the memory chip, e.g., as depicted in FIG. 7A) may select for use. The memory refresh pattern may be configurable using software to identify which of the plurality of memory segments in a particular memory bank are to be refreshed during a refresh cycle and which of the plurality of memory segments in the particular memory bank are not to be refreshed during the refresh cycle. Thus, refresh controller 3300 may refresh some or all rows within the defined segments that are not accessed during a current cycle according to Inci. Refresh controller 3300 may skip other rows of the defined segments that are set for access during the current cycle.

In embodiments where data storage 3308 of refresh controller 3300 includes a plurality of memory refresh patterns, each may represent a different refresh pattern for refreshing the plurality of memory segments included in each of the plurality of memory banks. The memory refresh patterns may be selectable for use on the plurality of memory segments. Accordingly, refresh controller 3300 may be configured to allow selection of which of the plurality of memory refresh patterns to implement during a particular refresh cycle. For example, the software executed by logic circuits (whether conventional logic circuits such as CPUs and GPUs or processing groups on the same substrate as the memory chip, e.g., as depicted in FIG. 7A) may select different memory refresh patterns for use during one or more different refresh cycles. Alternatively, the software executed by logic circuits may select one memory refresh pattern for use throughout some or all of the different refresh cycles.

The memory refresh patterns may be encoded using one or more variables stored in data storage 3308. For example, in embodiments where the plurality of memory segments are arranged in rows, each memory segment identifier may be configured to identify a particular location within a row of memory where a memory refresh should either begin or end. For example, in addition to Li and Hi, one or more additional variables may define which portions of the rows defined by Li and Hi are within the segment.

Figure 34:
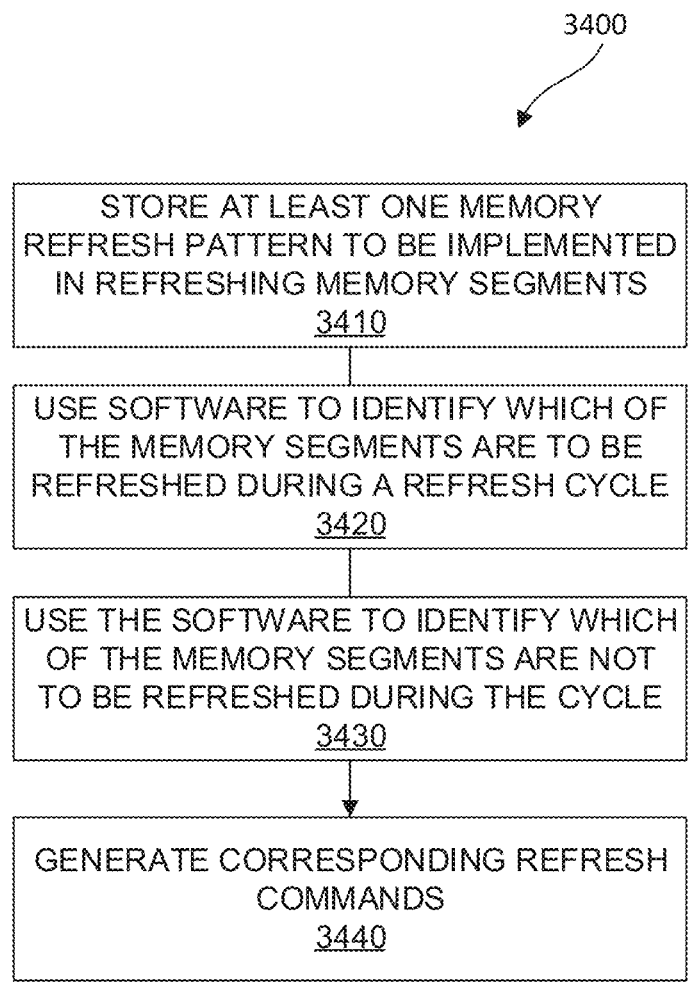
FIG. 34 is an example flowchart of a process implemented by software within a refresh controller consistent with the present disclosure.

FIG. 34 is an example flowchart of a process 3400 for determining refreshes for a memory chip (e.g., memory chip 2800 of FIG. 28). Process 3100 may be implemented by software within a refresh controller (e.g., refresh controller 3300 of FIG. 33) consistent with the present disclosure.

At step 3410, the refresh controller may store at least one memory refresh pattern to be implemented in refreshing a plurality of memory segments included in each of a plurality of memory banks. For example, as explained above with respect to FIG. 33, the refresh pattern may comprise a table including a plurality of memory segment identifiers assigned by the software to identify ranges of the plurality of memory segments in a particular memory bank that are to be refreshed during a refresh cycle and ranges of the plurality of memory segments in the particular memory bank that are not to be refreshed during the refresh cycle.

In some embodiments, the at least one refresh pattern may be encoded onto refresh controller (e.g., onto a read-only memory associated with or at least accessible by the refresh controller) during manufacture. Accordingly, the refresh controller may access the at least one memory refresh pattern but not store the same.

At steps 3420 and 3430, the refresh controller may use software to identify which of the plurality of memory segments in a particular memory bank are to be refreshed during a refresh cycle and which of the plurality of memory segments in the particular memory bank are not to be refreshed during the refresh cycle. For example, as explained above with respect to FIG. 33, software executed by logic circuits (whether conventional logic circuits such as CPUs and GPUs or processing groups on the same substrate as the memory chip, e.g., as depicted in FIG. 7A) may select the at least one memory refresh pattern. Moreover, the refresh controller may access the selected at least one memory refresh pattern to generate corresponding refresh signals during each refresh cycle. The refresh controller may refresh some or all portions within the defined segments that are not accessed during a current cycle according to the at least one memory refresh pattern and may skip other portions of the defined segments that are set for access during the current cycle.

At step 3440, the refresh controller may generate corresponding refresh commands. For example, as depicted in FIG. 33, an adder 3305 may comprise a logic circuit configured to nullify refresh signals for particular segments that are not to be refreshed according to the at least one memory refresh pattern in data storage 3307. Additionally or alternatively, a microprocessor (not shown in FIG. 33) may generate particular refresh signals based on which segments are to be refreshed according to the at least one memory refresh pattern in data storage 3307.

Method 3400 may further include additional steps. For example, in embodiments where the at least one memory refresh pattern is configured to change (e.g., moving from L1, H1, and Inc1 to L2, H2, and Inc2 as shown in FIG. 33) every one, two, or other number of refresh cycles, the refresh controller may access a different portion of the data storage for a next determination of refresh signals according to steps 3430 and 3440. Similarly, if the software executed by logic circuits (whether conventional logic circuits such as CPUs and GPUs or processing groups on the same substrate as the memory chip, e.g., as depicted in FIG. 7A) selects a new memory refresh pattern from the data storage for use in one or more future refresh cycles, the refresh controller may access a different portion of the data storage for a next determination of refresh signals according to steps 3430 and 3440.

When designing a memory chip and aiming for a certain capacity of memory, changes in memory capacity to a larger size or a smaller size may require redesign of the product and a redesign of a full mask set. Often, the product design is done in parallel with market research and, in some cases, the product design is completed before the market research is available. Thus, there is the potential for disconnects between product designs and actual demands of the market. The present disclosure proposes a way to flexibly provide a memory chips with memory capacities commensurate with market demands. The design method may include designing dies on a wafer along with appropriate interconnect circuitry such that memory chips that may contain one or more dies can selectively be cut from the wafer in order to provide an opportunity to produce memory chips of variable sized memory capacities from a single wafer.

Figure 35A:
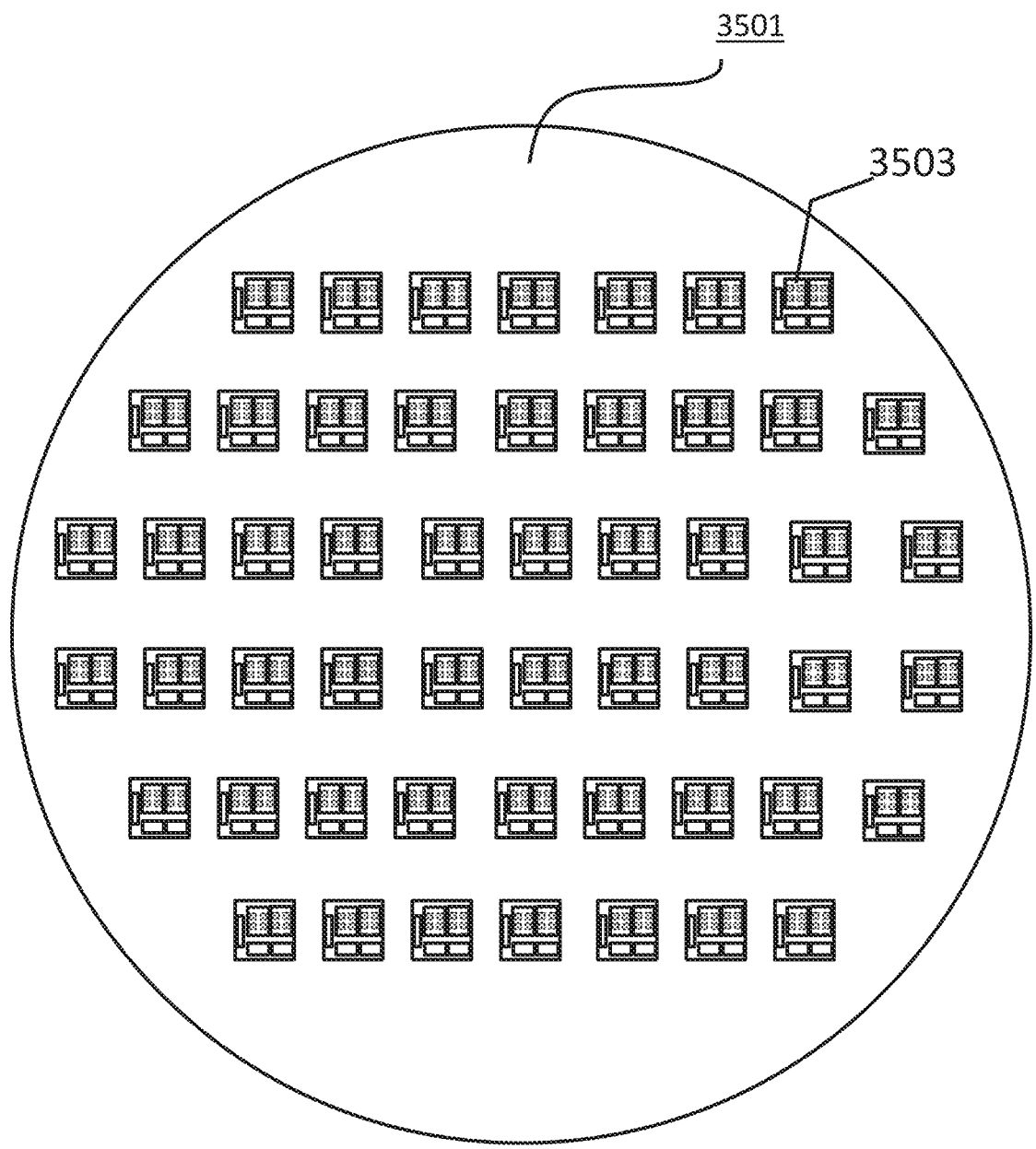
FIG. 35A shows an example wafer, including dies consistent with the present disclosure.

The present disclosure relates to systems and methods for fabricating memory chips by cutting them from a wafer. The method may be used for producing selectable sized memory chips from the wafer. An example embodiment of a wafer 3501 containing dies 3503 is shown in FIG. 35A. Wafer 3501 may be formed from a semiconductor material (e.g., silicon (Si), silicon-germanium (SiGe), silicon on insulator (SOI), gallium nitride (GaN), aluminum nitride (AlN), aluminum gallium nitride (AlGaN), boron nitride (BN), gallium arsenide (GaAs), gallium aluminum arsenide (AlGaAs), indium nitride (InN) combination of thereof, and the like). Dies 3503 may include any suitable circuit elements (e.g., transistors, capacitors, resistors, and/or the like) which may include any suitable semiconductor, dielectric or metallic components. Dies 3503 may be formed from a semiconductor material which may be the same or different as the material of wafer 3501. In addition to dies 3503, wafer 3501 may include other structures and/or circuitry. In some embodiments, one or more coupling circuits may be provided and may couple together one or more of the dies. In an example embodiment, such a coupling circuit may include a bus shared by two or more dies 3503. Additionally, the coupling circuit may include one or more logic circuits designed to control circuitry associated with dies 3503 and/or to direct information to/from dies 3503. In some cases, the coupling circuit may include a memory access management logic. Such logic may translate logical memory addresses into physical addresses associated with dies 3503. It should be noted that the term fabrication, as used herein, may refer collectively to any of the steps for building the disclosed wafers, dies, and/or chips. For example, fabrication may refer to the simultaneous laying out and forming of the various dies (and any other circuitry) included on the wafer. Fabrication may also refer to the cutting of selectable sized memory chips from the wafer to include one die, in some cases, or multiple dies in other cases. Of course, the term fabrication is not intended to be limited to these examples but may include other aspects associated with generation of the disclosed memory chips and any or all of the intermediate structures.

Figure 35B:
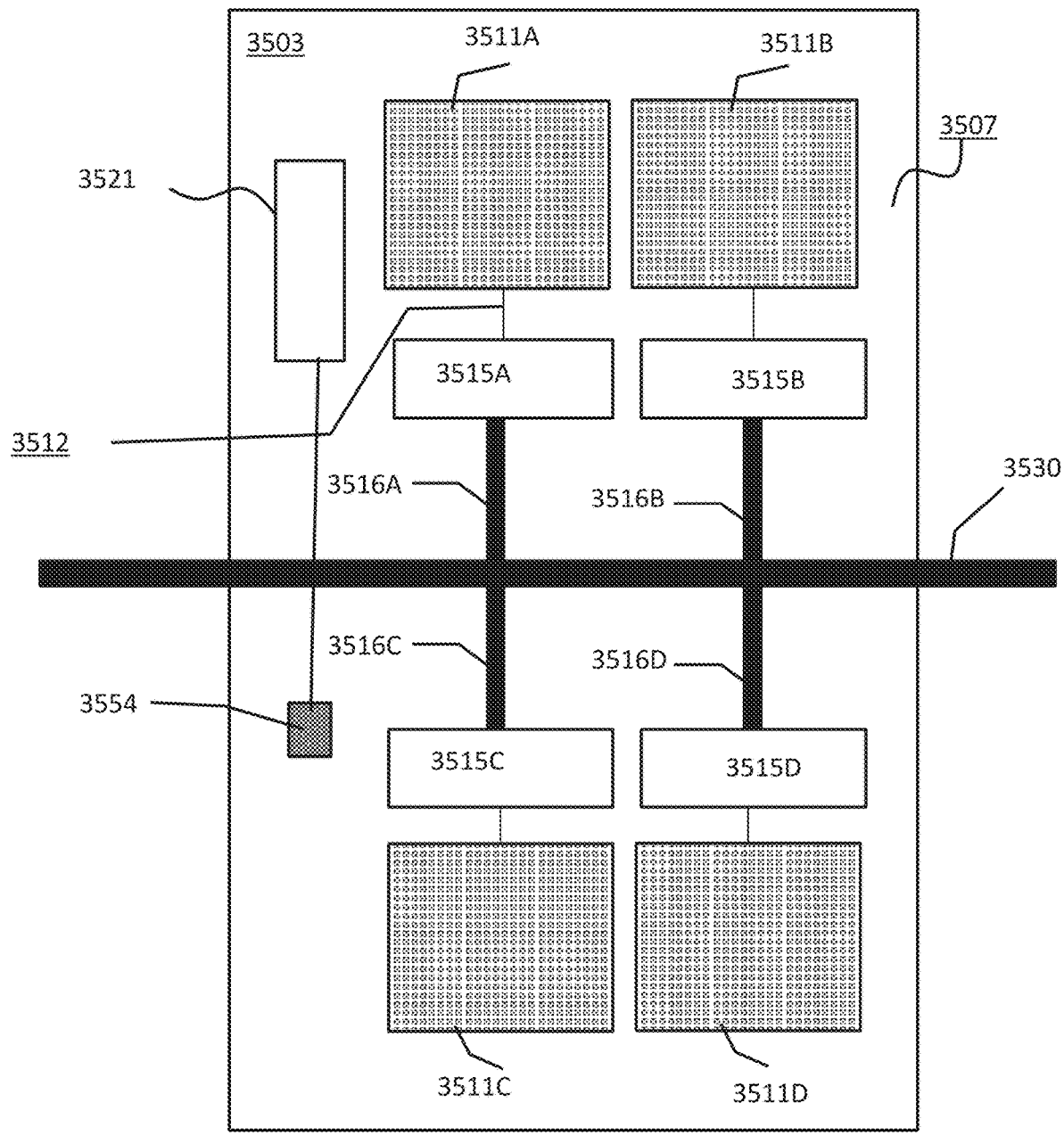
FIG. 35B shows an example memory chip connected to an input/output bus consistent with the present disclosure.

Die 3503 or a group of dies may be used for fabrication of a memory chip. The memory chip may include a distributed processor, as described in other sections of the present disclosure. As shown in FIG. 35B, die 3503 may include a substrate 3507 and a memory array disposed on the substrate. The memory array may include one or more memory units, such as, for example, memory banks 3511A-3511D designed to store data. In various embodiments, memory banks may include semiconductor-based circuit elements such as transistors, capacitors, and the like. In an example embodiment, a memory bank may include multiple rows and columns of storage units. In some cases, such a memory bank may have a capacity greater than one megabyte. The memory banks may include dynamic or static access memory.

Die 3503 may further include a processing array disposed on the substrate, the processing array including a plurality of processor subunits 3515A-3515D, as shown in FIG. 35B. As described above, each memory bank may include a dedicated processor subunit connected by a dedicated bus. For example, processor subunit 3515A is associated with memory bank 3511A via bus or connection 3512. It should be understood that various connections between memory banks 3511A-3511D and processor subunits 3515A-3515D are possible, and only some illustrative connections are shown in FIG. 35B. In an example embodiment, processor subunit may perform read/write operations for an associated memory bank and may further perform refreshing operations or any other suitable operations relative to memory stored in the various memory banks.

As noted, die 3503 may include a first group of buses configured to connect processor subunits with their corresponding memory banks. An example bus may include a set of wires or conductors that connect electrical components and allow transfers of data and addresses to and from each memory bank and its associated processor subunit. In an example embodiment, connection 3512 may serve as a dedicated bus for connecting processor subunit 3515A to memory bank 3511A. Die 3503 may include a group of such buses, each connecting a processor subunit to a corresponding, dedicated memory bank. Additionally, die 3503 may include another group of buses, each connecting processor subunits (e.g., subunits 3515A-3515D) to each other. For example, such buses may include connections 3516A-3516D. In various embodiments data for memory banks 3511A-3511D may be delivered via input-output bus 3530. In an example embodiment, input-output bus 3530 may carry data-related information, and command related information for controlling the operation of memory units of die 3503. Data information may include data for storing in memory banks, data read from memory banks, processing results from one or more of the processor subunits based on operations performed relative to data stored in corresponding memory banks, command related information, various codes, etc.

In various cases, data and commands transmitted by input-output bus 3530 may be controlled by input-output (IO) controller 3521. In an example embodiment, IO controller 3521 may control the flow of data from bus 3530 to and from processor subunits 3515A-3515D. IO controller 3521 may determine from which one of processor subunits 3515A-3515D information is retrieved. In various embodiments, IO controller 3521 may include a fuse 3554 configured to deactivate IO controller 3521. Fuse 3554 may be used if multiple dies are combined together to form a larger memory chip (also referred to as a multi-die memory chip, as an alternative to a single die memory chip that contains only one die). The multi-die memory chip may then use one of the IO controllers of one of the die units forming the multi-die memory chip while disabling other IO controllers related to the other die units by using fuses corresponding to the other IO controllers.

As noted, each memory chip or predecessor die or group of dies may include distributed processors associated with corresponding memory banks. These distributed processors, in some embodiments, may be arranged in a processing array disposed on the same substrate as a plurality of memory banks. Additionally, the processing array may include one or more logic portions each including an address generator (also referred to as address generator unit (AGU)). In some cases, the address generator may be part of at least one processor subunit. The address generator may generate memory addresses required for fetching data from the one or more memory banks associated with the memory chip. Address-generation calculations may involve integer arithmetic operations, such as addition, subtraction, modulo operations, or bit shifts. The address generator may be configured to operate on multiple operands at a time. Furthermore, multiple address generators may perform more than one address-calculation operation simultaneously. In various embodiments, an address generator may be associated with a corresponding memory bank. The address generators may be connected with their corresponding memory banks by means of corresponding bus lines.

In various embodiments, a selectable sized memory chip may be formed from wafer 3501 by selectively cutting different regions of the wafer. As noted, the wafer may include a group of dies 3503, the group including any group of two or more dies (e.g., 2, 3, 4, 5, 10, or more dies) included on the wafer. As will be discussed further below, in some cases, a single memory chip may be formed by cutting a portion of the wafer that includes just one of the dies of the group of dies. In such cases, the resulting memory chip would include memory units associated with one die. In other cases, however, selectable sized memory chips may be formed to include more than one die. Such memory chips may be formed by cutting regions of the wafer that include two or more dies of a group of dies included on the wafer. In such cases, the dies together with a coupling circuit that couples together the dies provide a multi-die memory chip. Some additional circuit elements may also be wired on board between chips, such as, for example, clock elements, data buses or any suitable logic circuits.

In some cases, at least one controller associated with the group of dies may be configured to control the operation of the group of dies as a single memory chip (e.g., a multiple memory unit memory chip). The controller may include one or more circuits that manage the flow of data going to and from the memory chip. A memory controller can be a part of the memory chip, or it can be a part of a separate chip not directly related to the memory chip. In an example embodiment, the controller may be configured to facilitate read and write requests or other commands associated with the distributed processors of the memory chip, and may be configured to control any other suitable aspects of the memory chip (e.g., refreshing the memory chip, interacting with the distributed processors, etc.). In some cases, the controller may be part of die 3503, and in other cases the controller may be laid out adjacent to die 3503. In various embodiments, the controller may also include at least one memory controller of at least one of the memory units included on the memory chip. In some cases, a protocol used for accessing information on a memory chip may be agnostic to duplicate logic and memory units (e.g., memory banks) that may be present on the memory chip. The protocol may be configured to have different IDs or address ranges for adequate access of data on the memory chip. An example of a chip with such protocol may include a chip with a Joint Electron Device Engineering Council (JEDEC) double data rate (DDR) controller where different memory banks may have different address ranges, a serial peripheral interface (SPI) connection, where different memory units (e.g., memory banks) have different identifications (IDs), and the like.

Figure 35C:
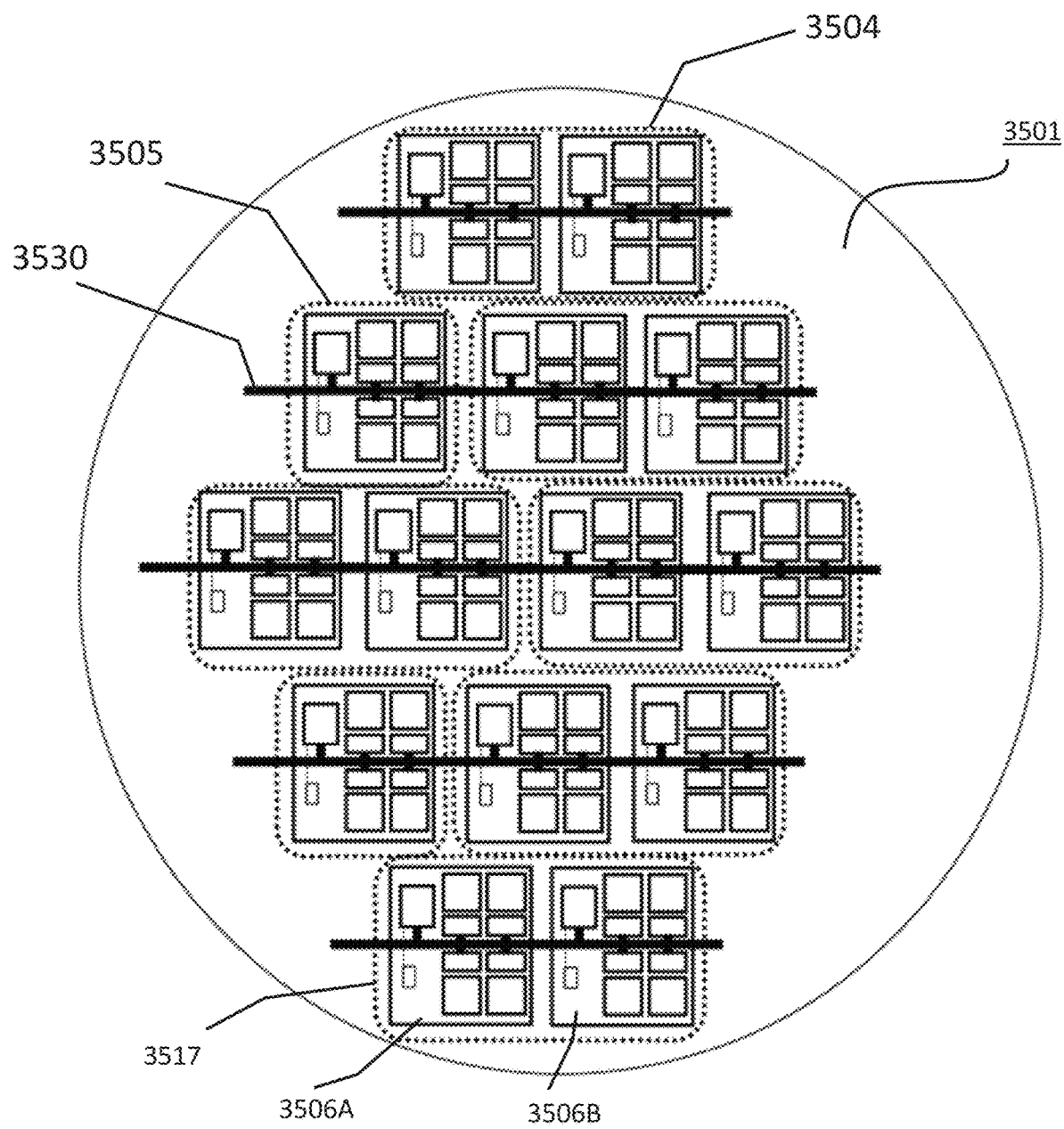
FIG. 35C shows an example wafer including memory chips arranged in rows, and connected to input-output buses consistent with the present disclosure.

In various embodiments, multiple regions may be cut from the wafer, with various regions including one or more dies. In some cases, each separate region may be used to build a multi-die memory chip. In other cases, each region to be cut from the wafer may include a single die to provide a single die memory chip. In some cases, two or more of the regions may have the same shape and have the same number of dies coupled to the coupling circuit in the same way. Alternatively, in some example embodiments, a first group of regions may be used to form a first type of the memory chip, and a second group of regions may be used to form a second type of memory chip. For example, wafer 3501, as shown in FIG. 35C may include a region 3505 that may include a single die, and a second region 3504 may include a group of two dies. When region 3505 is cut from the wafer 3501, a single die memory chip will be provided. When region 3504 is cut from the wafer 3501, a multi-die memory chip will be provided. Groups shown in FIG. 35C are only illustrative, and various other regions and groups of dies may be cut out from wafer 3501.

In various embodiments, dies may be formed on wafer 3501, such that they are arranged along one or more rows of the wafer, as shown, for example, in FIG. 35C. The dies may share input-output bus 3530 corresponding to one or more rows. In an example embodiment, group of dies may be cut out from wafer 3501 using various cutting shapes where, when cutting out a group of dies that may be used to form a memory chip, at least a portion of the shared input-output bus 3530 may be excluded (e.g., only a portion of input-output bus 3530 may be included as a part of the memory chip formed including a group of dies).

Figure 35D:
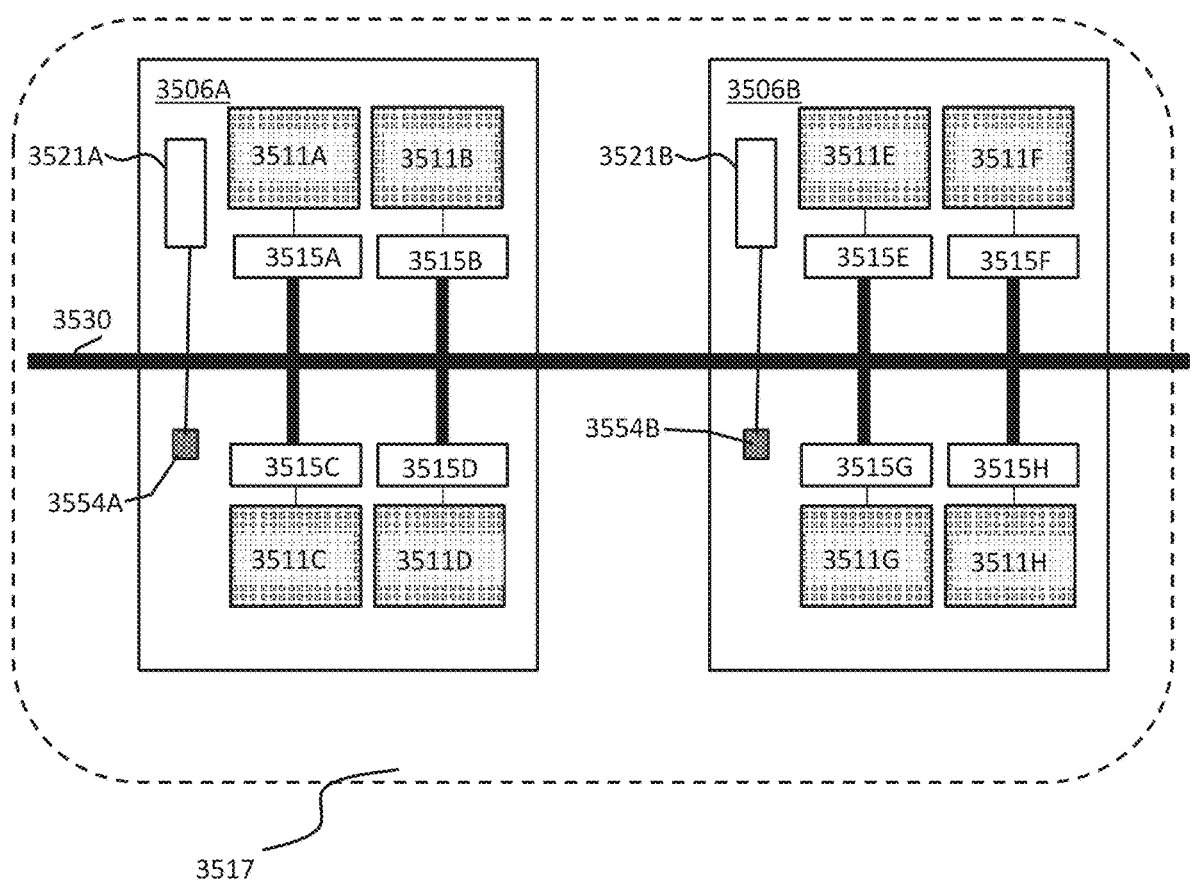
FIG. 35D shows two memory chips forming a group, and connected to input-output buses consistent with the present disclosure.

As previously discussed, when multiple dies (e.g., dies 3506A, and 3506B, as shown in FIG. 35C) are used to form a memory chip 3517, one IO controller corresponding to one of the dies may be enabled and configured to control data flow to all the processor subunits of dies 3506A and 3506B. For example, FIG. 35D shows memory dies 3506A and 3506B combined to form memory chip 3517 that includes memory banks 3511A-3511H, processor subunits 3515A-3515H, IO controllers 3521A, and 3521B and fuses 3554A and 3554B. It should be noted that memory chip 3517 corresponds to a region 3517 of wafer 3501 prior to removal of the memory chip from the wafer. In other words, as used here and elsewhere in the disclosure, regions 3504, 3505, 3517 etc. of wafer 3501 once cut from wafer 3501 will result in memory chips 3504, 3505, 3517, etc. Additionally, fuses herein are also referred to as disabling elements. In an example embodiment, fuse 3554B may be used to deactivate IO controller 3521B, and IO controller 3521A may be used to control data flow to all memory banks 3511A-3511H by communicating data to processor subunits 3515A-3515H. In an example embodiment, IO controller 3521A may be connected to various processor subunits using any suitable connection. In some embodiments, as further described below, processor subunits 3515A-3515H may be interconnected, and IO controller 3521A may be configured to control data flow to processor subunits 3515A-3515H that form processing logic of memory chip 3517.

In an example embodiment, IO controllers, such as controller 3521A and 3521B and corresponding fuses 3554A and 3554B may be formed on wafer 3501 together with the formation of memory banks 3511A-3511H and processor subunits 3515A-3515H. In various embodiments, when forming memory chip 3517, one of the fuses (e.g., fuse 3554B) may be activated such that dies 3506A and 3506B are configured to form memory chip 3517 that functions as a single chip and is controlled by a single input-output controller (e.g., controller 3521A). In an example embodiment, activating a fuse may include applying a current to trigger the fuse. In various embodiment, when more than one die is used for forming a memory chip, all but one IO controller may be deactivated via corresponding fuses.

Figure 35E:
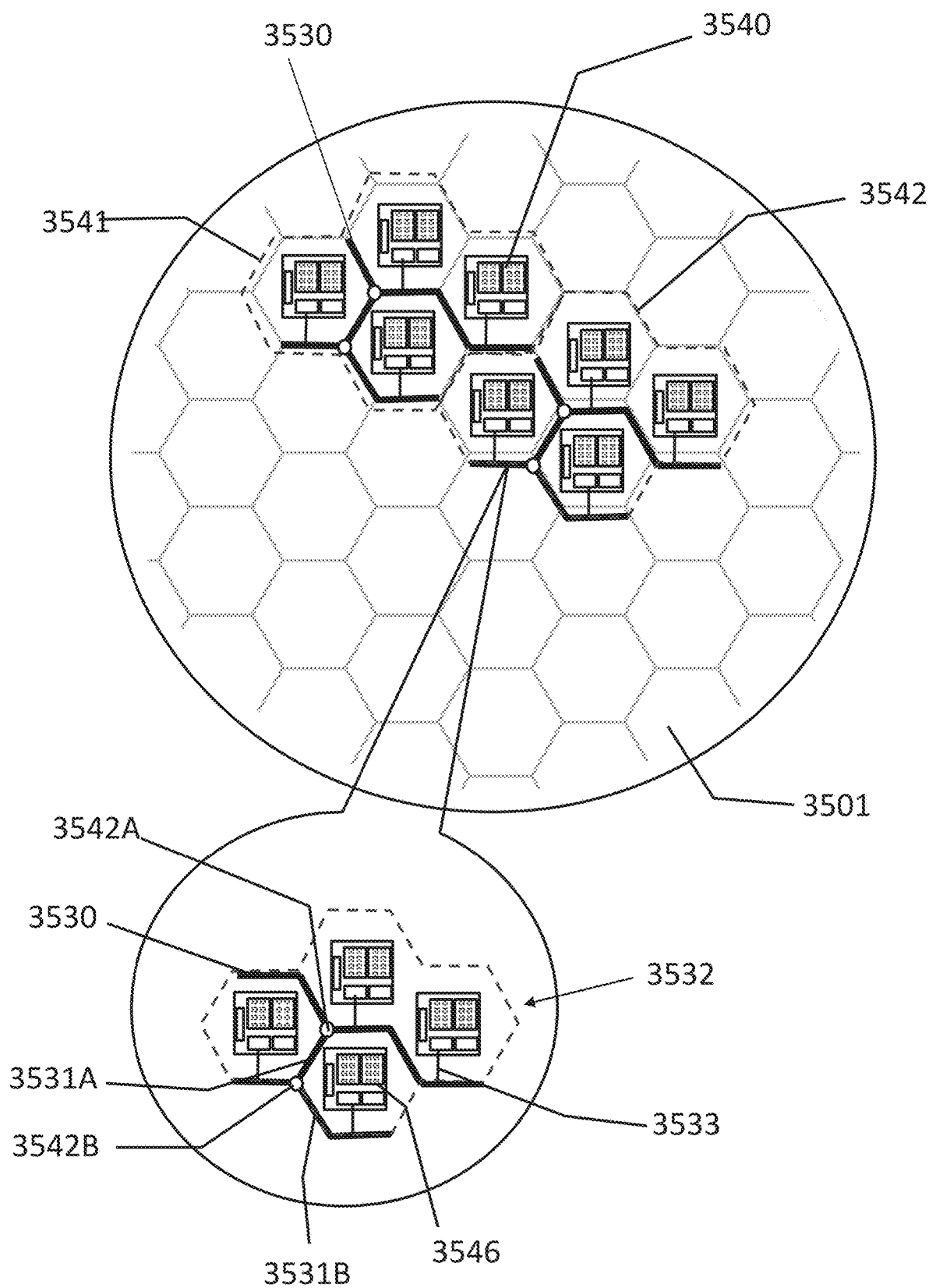
FIG. 35E shows an example wafer, including dies placed in a hexagonal lattice and connected to input-output buses consistent with the present disclosure.

In various embodiments, as shown in FIG. 35C, multiple dies are formed on wafer 3501 together with a set of input-output buses, and/or control buses. An example input-output bus 3530 is shown in FIG. 35C. In an example embodiment, one of the input-output buses (e.g., input-output bus 3530) may be connected to multiple dies. FIG. 35C shows an example embodiment of input-output bus 3530 passing next to dies 3506A and 3506B. Configuration of dies 3506A and 3506B and input-output bus 3530, as shown in FIG. 35C is only illustrative, and various other configurations may be used. For example, FIG. 35E illustrates dies 3540 formed on wafer 3501 and arranged in a hexagonal formation. A memory chip 3532 that includes four dies 3540 may be cut out form wafer 3501. In an example embodiment, memory chip 3532 may include a portion of input-output bus 3530 connected to the four dies by suitable bus lines (e.g., line 3533, as shown in FIG. 35E). In order to route information to appropriate memory unit of memory chip 3532, memory chip 3532 may include input/output controllers 3542A and 3542B placed at branch points for input-output bus 3530. Controllers 3542A and 3542B may receive command data via input-output bus 3530 and select a branch of bus 3530 for transmitting information to an appropriate memory unit. For example, if command data includes read/write information from/to memory units associated with die 3546, controller 3542A may receive command request and transmit data to a branch 3531A, of bus 3530, as shown in FIG. 35D, while controller 3542B may receive command request and transmit data to a branch 3531B. FIG. 35E indicates various cuts of different regions that may be made, where cut lines are represented by dashed lines.

Figure 36A:
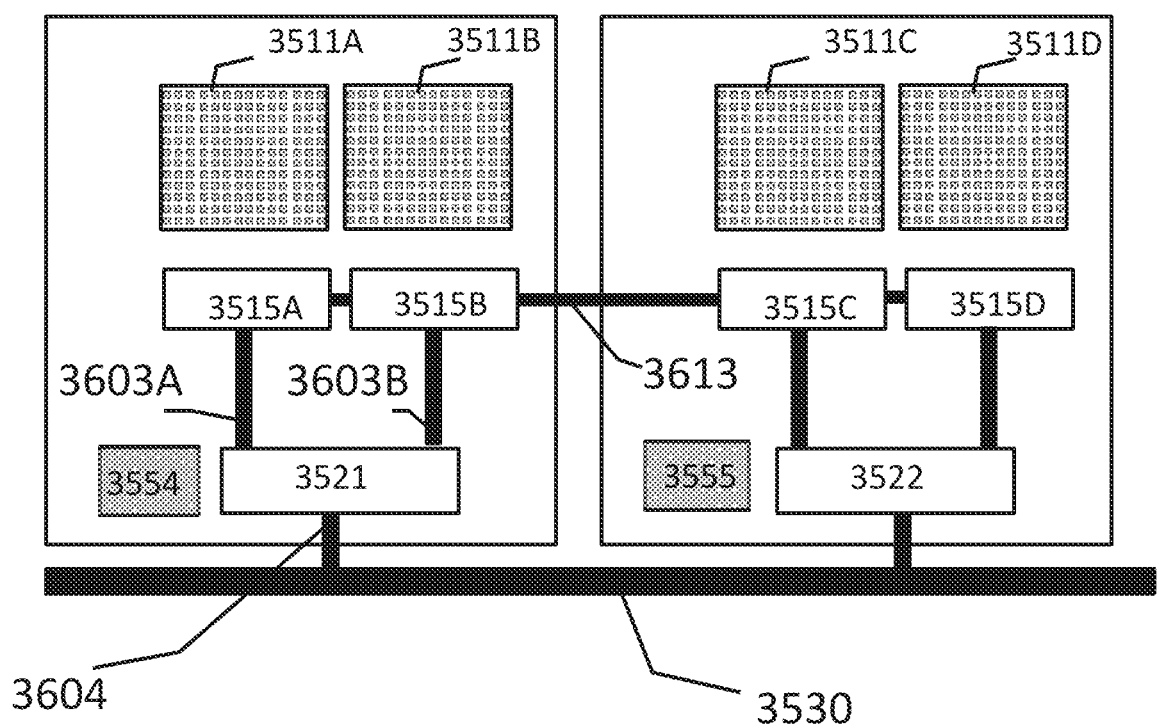
FIGS. 36A-36D show various possible configurations of memory chips connected to an input/output bus consistent with the present disclosure.

In an example embodiment, a group of dies and interconnecting circuitry may be designed for inclusion in a memory chip 3506 as shown in FIG. 36A. Such an embodiment may include processor subunits (for in-memory processing) that may be configured to communicate between one another. For example, each die to be included in memory chip 3506 may include various memory units such as memory banks 3511A-3511D, processor subunits 3515A-3515D, and IO controllers 3521 and 3522. IO controllers 3521 and 3522 may be connected in parallel to input-output bus 3530. IO controller 3521 may have a fuse 3554, and IO controller 3522 may have a fuse 3555. In an example embodiment, processor subunits 3515A-3515D may be connected by means of, for example, bus 3613. In some cases, one of IO controller may be disabled using a corresponding fuse. For instance, IO controller 3522 may be disabled using fuse 3555, and IO controller 3521 may control data flow into memory banks 3511A-3511D via processor subunits 3515A-3515D connected to each other via bus 3613.

Figure 36B:
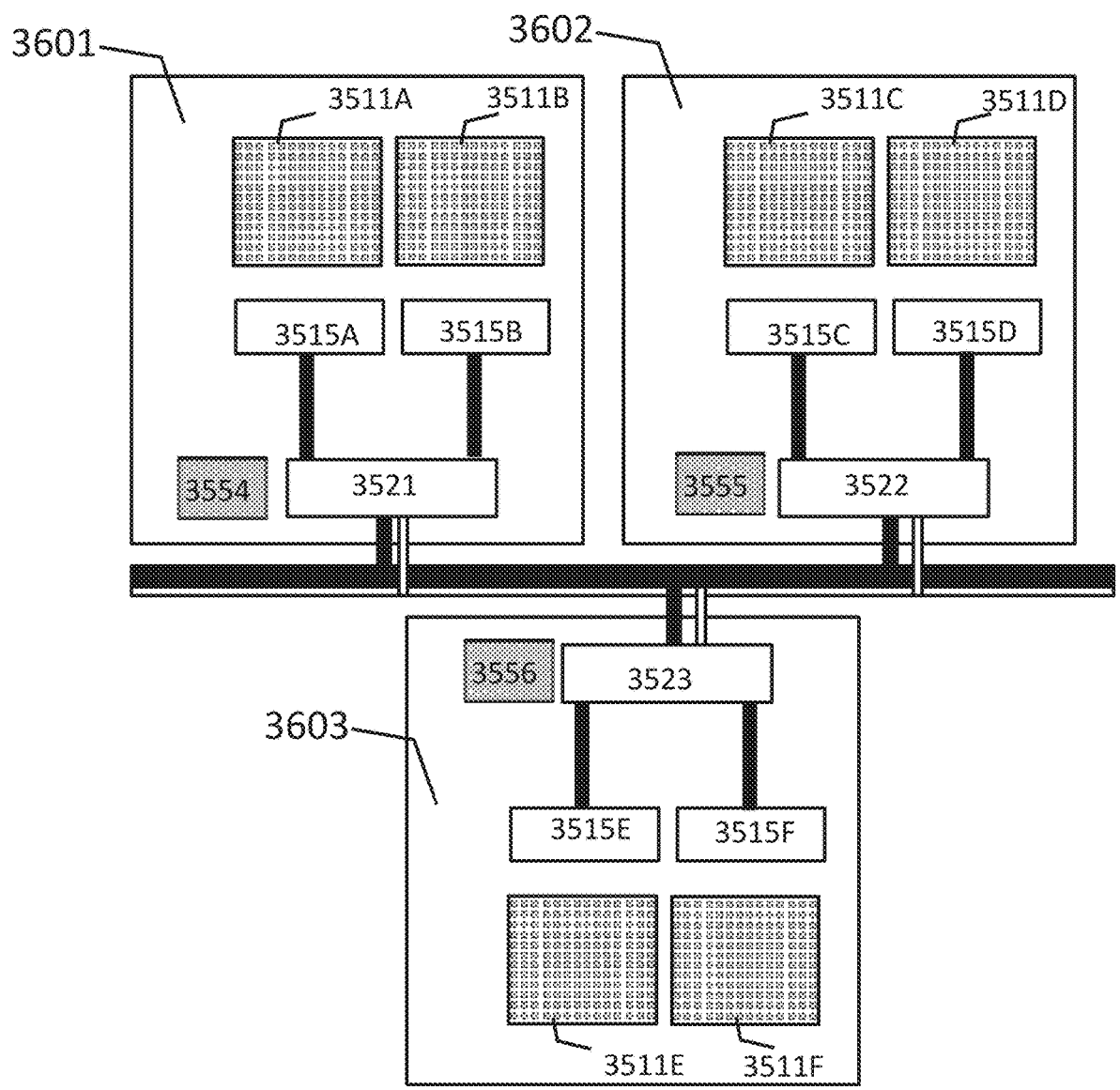
Figure 36C:
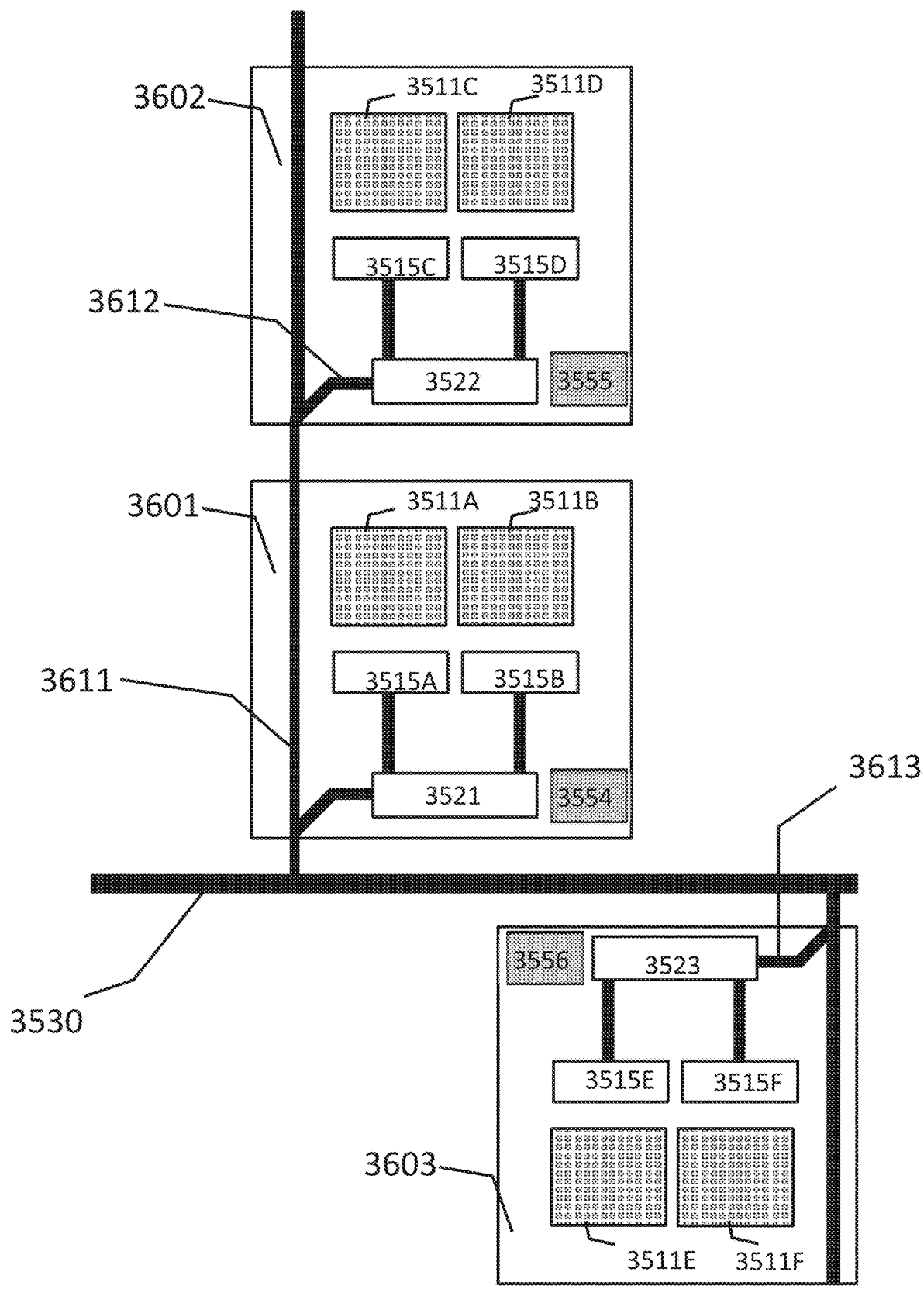
Figure 36D:
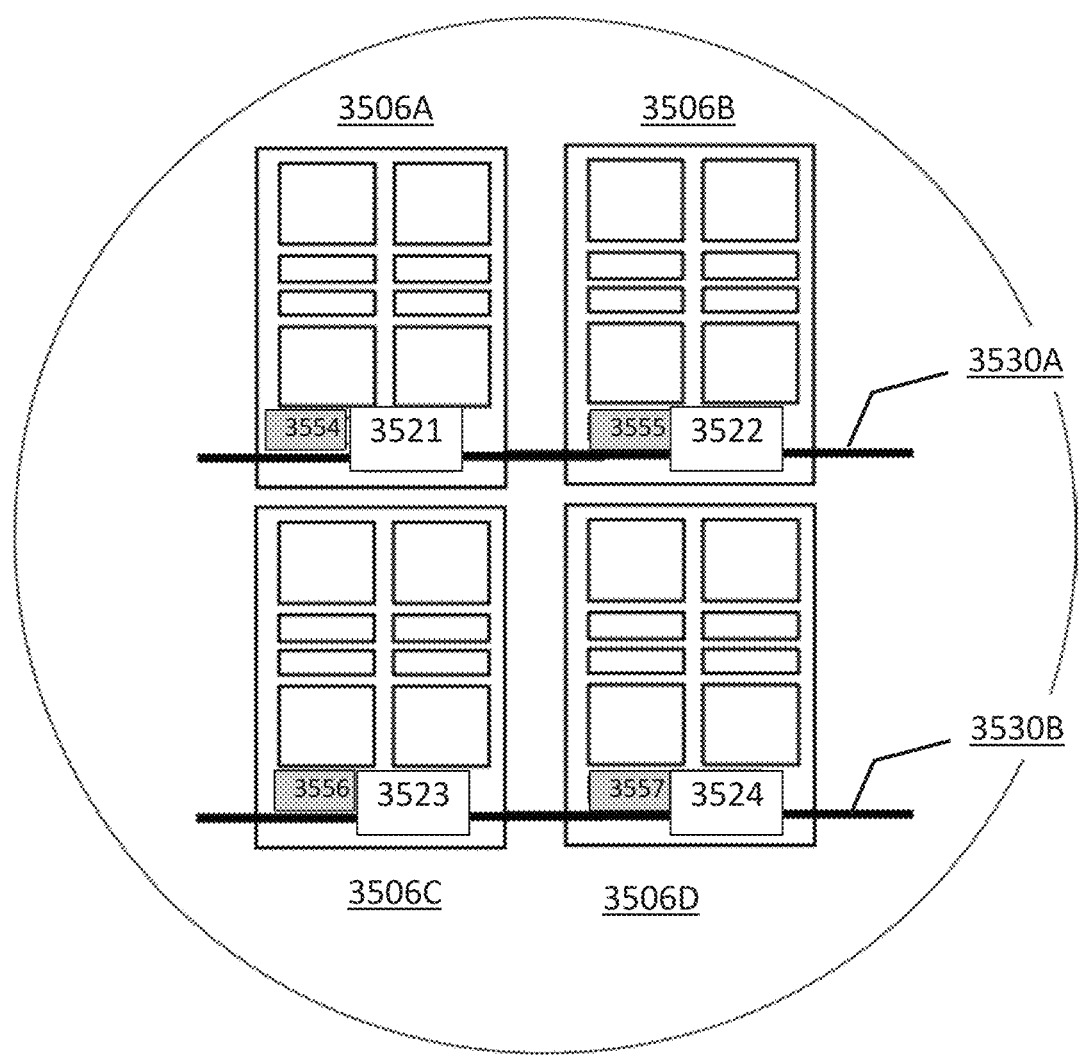

Configuration of memory units, as shown in FIG. 36A is only illustrative, and various other configurations may be formed by cutting different regions of wafer 3501. For example, FIG. 36B shows a configuration with three domains 3601-3603 containing memory units and connected to input-output bus 3530. In an example embodiment, domains 3601-3603 are connected to input-output bus 3530 using IO control modules 3521-3523 that may be disabled by corresponding fuses 3554-3556. Another example of embodiment of arranging domains containing memory units is shown in FIG. 36C where three domains 3601, 3602 and 3603 are connected to input-output bus 3530 using bus lines 3611, 3612 and 3613. FIG. 36D shows, another example embodiment of memory chips 3506A-3506D connected to input-output buses 3530A and 3530B via IO controllers 3521-3524. In an example embodiment, IO controllers may be deactivated using corresponding fuse elements 3554-3557, as shown in FIG. 36D.

Figure 37:
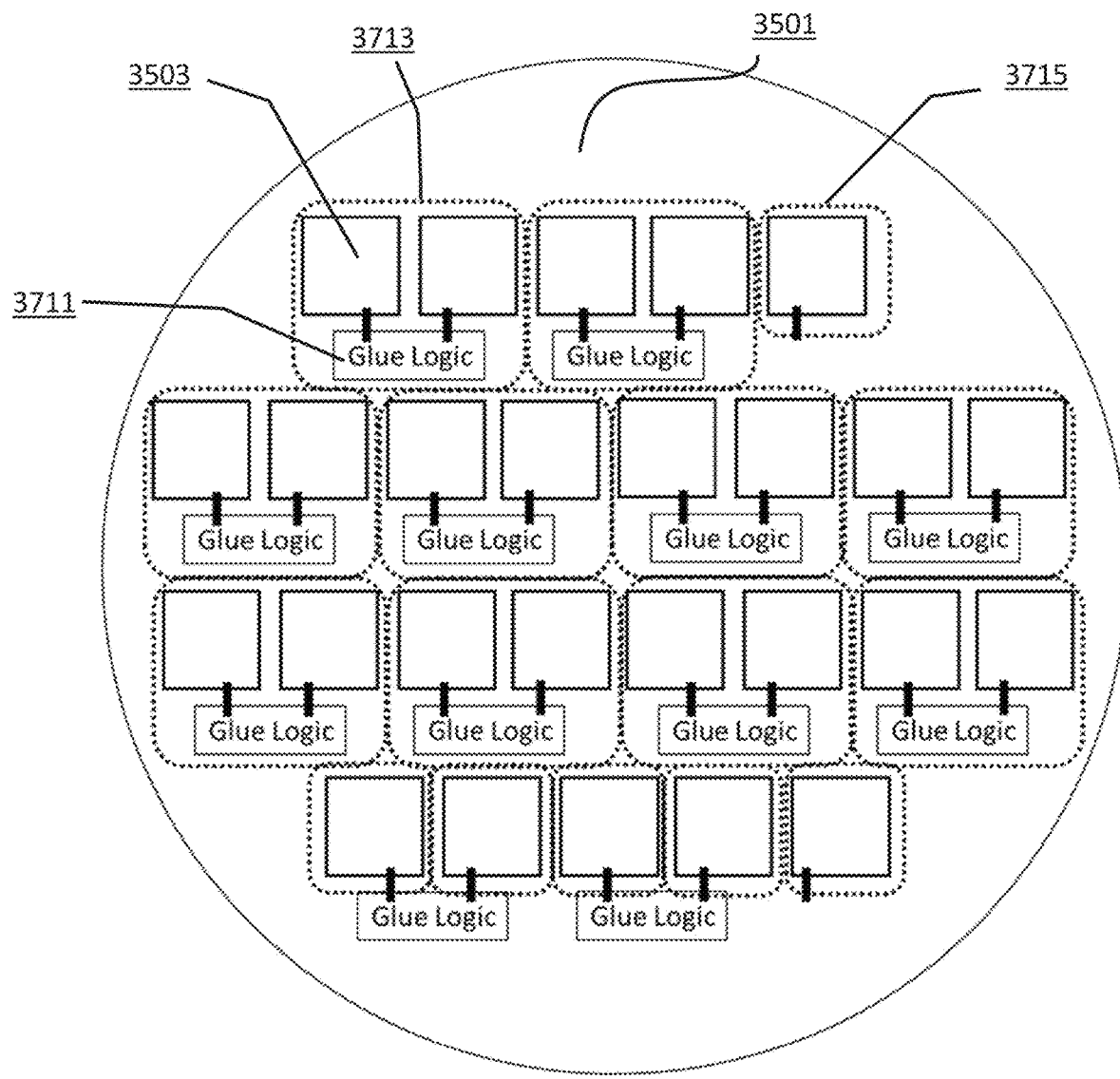
FIG. 37 shows an example grouping of dies sharing a glue logic consistent with the present disclosure.

FIG. 37 shows various groups of dies 3503, such as group 3713 and group 3715 that may include one or more dies 3503. In an example embodiment, in addition to forming dies 3503 on wafer 3501, wafer 3501 may also contain logical circuits 3711 referred to as glue logic 3711. Glue logic 3711 may take some space on wafer 3501 resulting in the fabrication of a fewer number of dies per wafer 3501 as compared to a number of the dies that could have been fabricated without the presence of glue logic 3711. However, the presence of glue logic 3711 may allow multiple dies to be configured to function together as a single memory chip. The glue logic, for example, may connect multiple dies, without having to make configuration changes and without having to designate area inside any of the dies themselves for circuitry that is only used for connecting dies together. In various embodiments, glue logic 3711 provides an interface with other memory controllers, such that multi-die memory chip functions as a single memory chip. Glue logic 3711 may be cut together with a group of dies as shown, for example, by group 3713. Alternatively, if only one die is required for the memory chip, as, for example, for group 3715, glue logic may not be cut. For example, the glue logic may be selectively eliminated where not needed to enable cooperation between different dies. In FIG. 37, various cuts of different regions may be made as shown, for example, by the dashed line regions. In various embodiments, as shown in FIG. 37, one glue logic element 3711 may be laid out on the wafer for every two dies 3506. In some cases, one glue logic element 3711 may be used for any suitable number of dies 3506 forming a group of dies. Glue logic 3711 may be configured to be connected to all the dies from the group of dies. In various embodiments, dies connected to glue logic 3711 may be configured to form a multi-die memory chip and may be configured to form separate single die memory chips when they are not connected to glue logic 3711. In various embodiments, dies connected to glue logic 3711 and designed to function together may be cut out from wafer 3501 as a group and may include glue logic 3711 as indicated, for example, by group 3713. The dies not connected to glue logic 3711 may be cut out from wafer 3501 without including glue logic 3711 as indicated, for example, by group 3715 to form a single die memory chip.

In some embodiments, during manufacturing of multi-die memory chips from wafer 3501, one or more cutting shapes (e.g., shapes forming groups 3713, 3715) may be determined for creating the desired set of the multi-die memory chips. In some cases, as shown by group 3715, the cutting shapes may exclude glue logic 3711.

In various embodiments, glue logic 3711 may be a controller for controlling multiple memory units of a multi-die memory chip. In some cases, glue logic 3711 may include parameters that may be modified by various other controllers. For example, a coupling circuit for multi-die memory chips may include a circuit for configuring parameters of glue logic 3711 or parameters of memory controllers (e.g., processor subunits 3515A-3515D, as shown, for example, in FIG. 35B). Glue logic 3711 may be configured to do a variety of tasks. For example, logic 3711 may be configured to determine which die may need to be addressed. In some cases, logic 3711 may be used to synchronize multiple memory units. In various embodiments, logic 3711 may be configured to control various memory units such that the memory units operate as a single chip. In some cases, amplifiers between input-output bus (e.g., bus 3530, as shown in FIG. 35C) and processor subunits 3515A-3515D may be added to amplify a data signal from bus 3530.

Figure 38A:
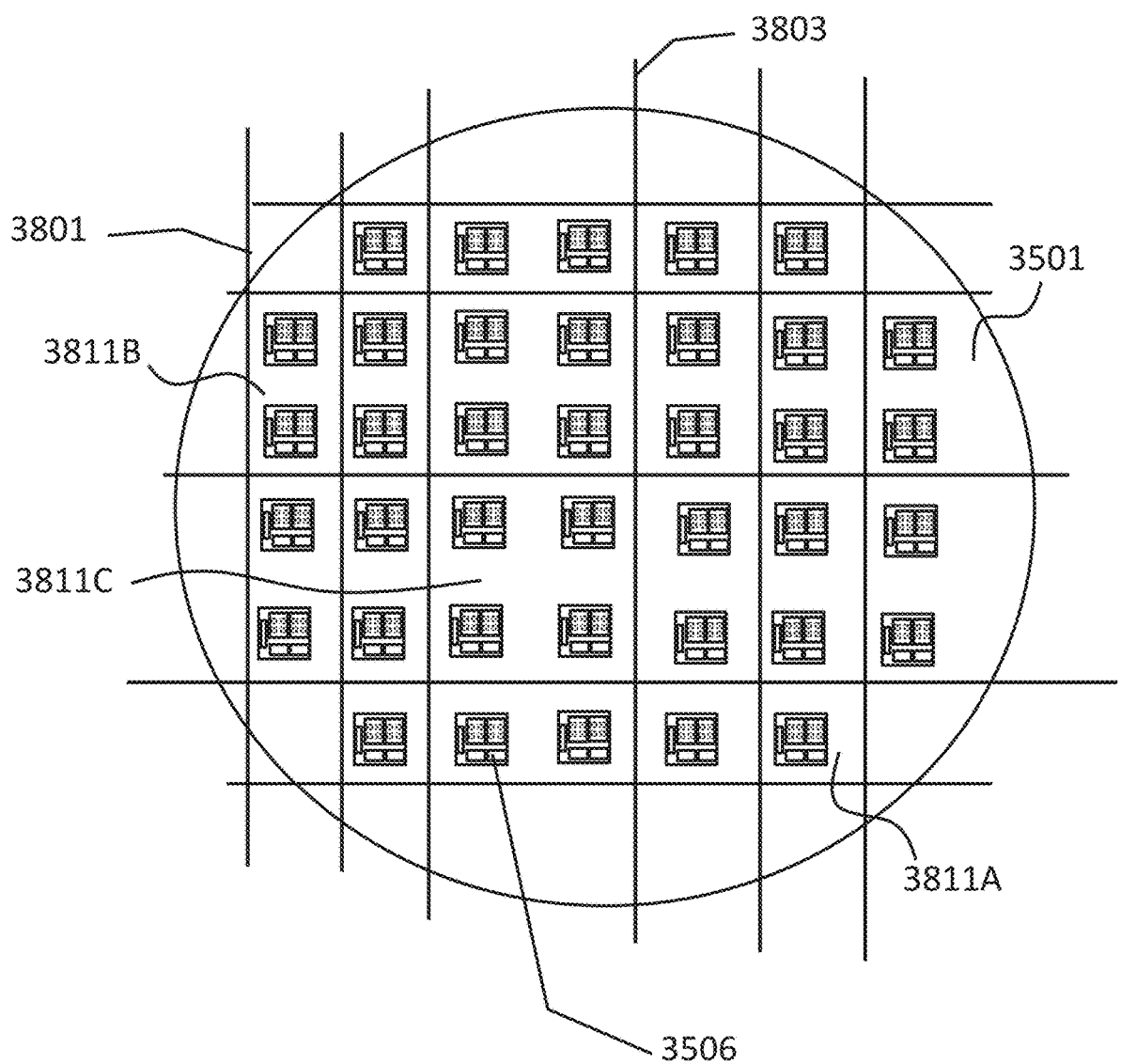
FIGS. 38A-38B show example cuts through a wafer consistent with the present disclosure.
Figure 38B:
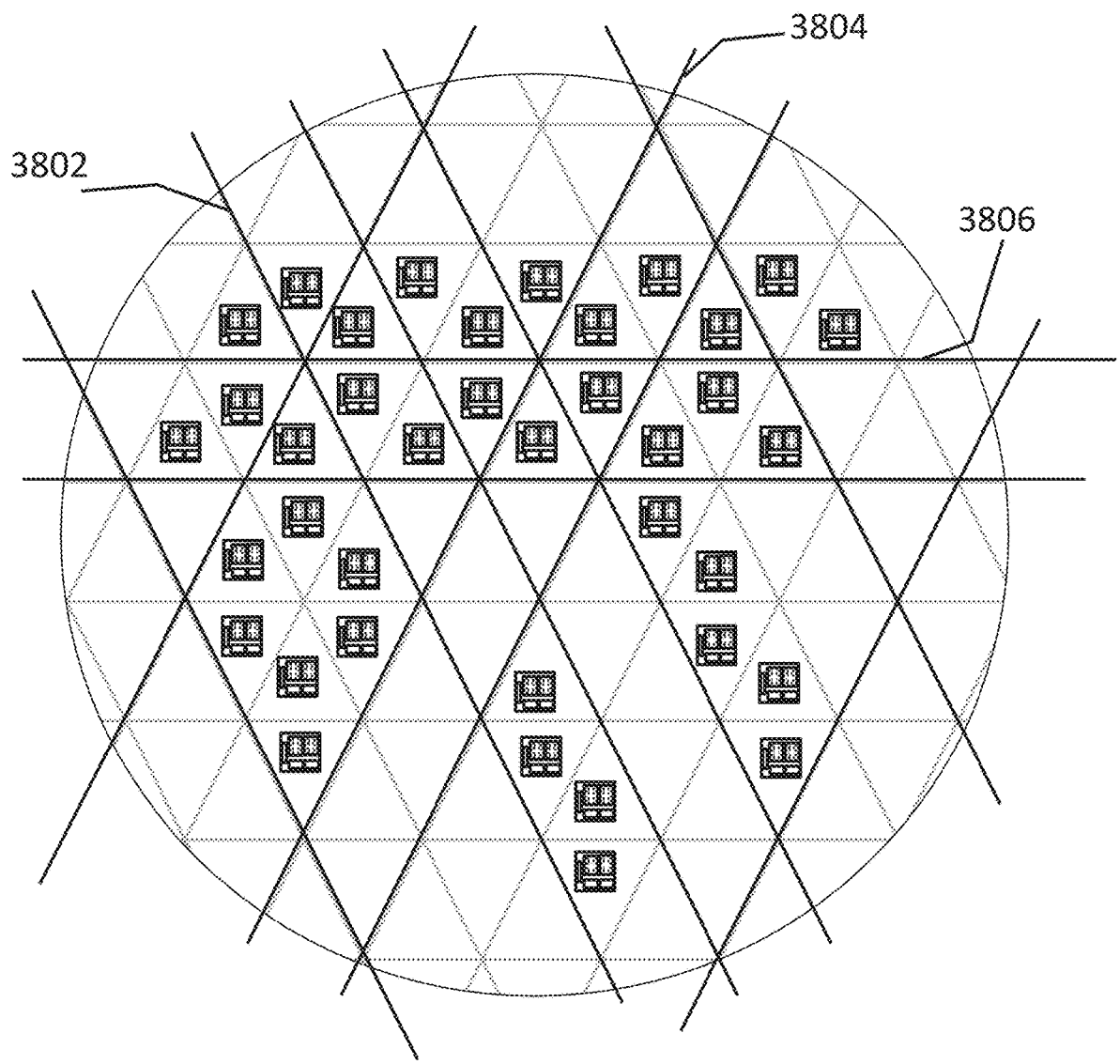

In various embodiments, cutting complex shapes from wafer 3501 may be technologically difficult/expensive, and a simpler cutting approach may be adopted, provided that dies are aligned on wafer 3501. For example, FIG. 38A shows dies 3506 aligned to form a rectangular grid. In an example embodiment, vertical cuts 3803 and horizontal cuts 3801 across entire wafer 3501 may be made to separate cut out groups of dies. In an example embodiment, vertical and horizontal cuts 3803 and 3801 can lead to a group containing a selected number of dies. For instance, cuts 3803 and 3801 can result in regions containing a single die (e.g., region 3811A), regions containing two dies (e.g., region 3811B) and regions containing four dies (e.g., region 3811C). The regions formed by cuts 3801 and 3803 are only illustrative, and any other suitable regions may be formed. In various embodiments, depending on the alignment of dies, various cuts may be made. For instance, if dies are arranged in a triangular grid, as shown in FIG. 38B, cut lines such as lines 3802, 3804, and 3806 may be used to make multi-die memory chips. For example, some regions may include six dies, five dies, four dies, three dies, two dies, one die, or any other suitable number of dies.

Figure 38C:
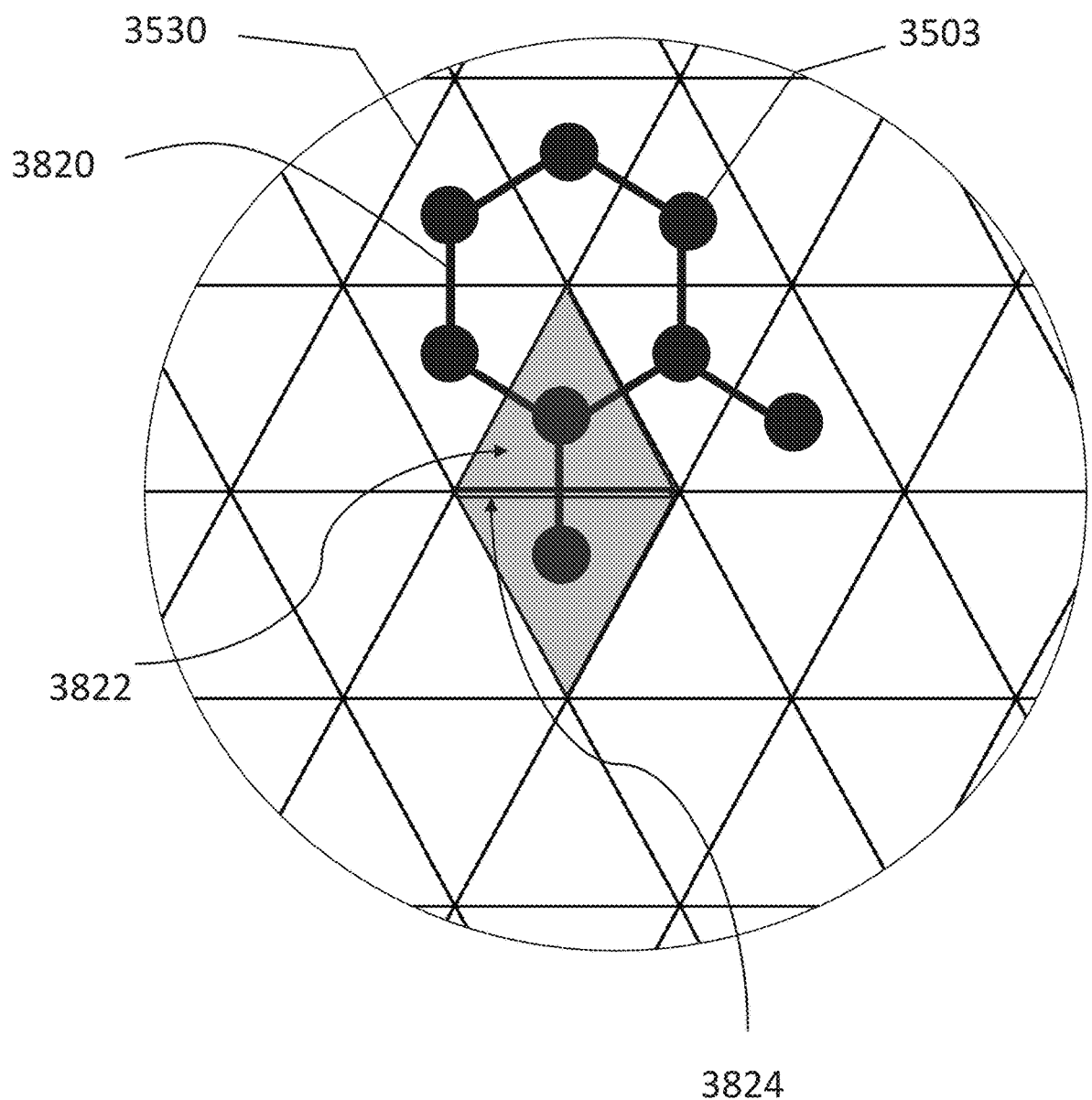
FIG. 38C shows an example arrangement of dies on a wafer and arrangement of input-output buses consistent with the present disclosure.

FIG. 38C shows bus lines 3530 arranged in a triangular grid, with dies 3503 aligned in the centers of triangles formed by intersecting bus lines 3530. Dies 3503 may be connected via bus lines 3820 to all the neighboring bus lines. By cutting a region containing two or more adjacent dies (e.g., region 3822, as shown in FIG. 38C) at least one bus line (e.g., line 3824) remains within region 3822, and bus line 3824 may be used to supply data and commands to a multi-die memory chip formed using region 3822.

Figure 39:
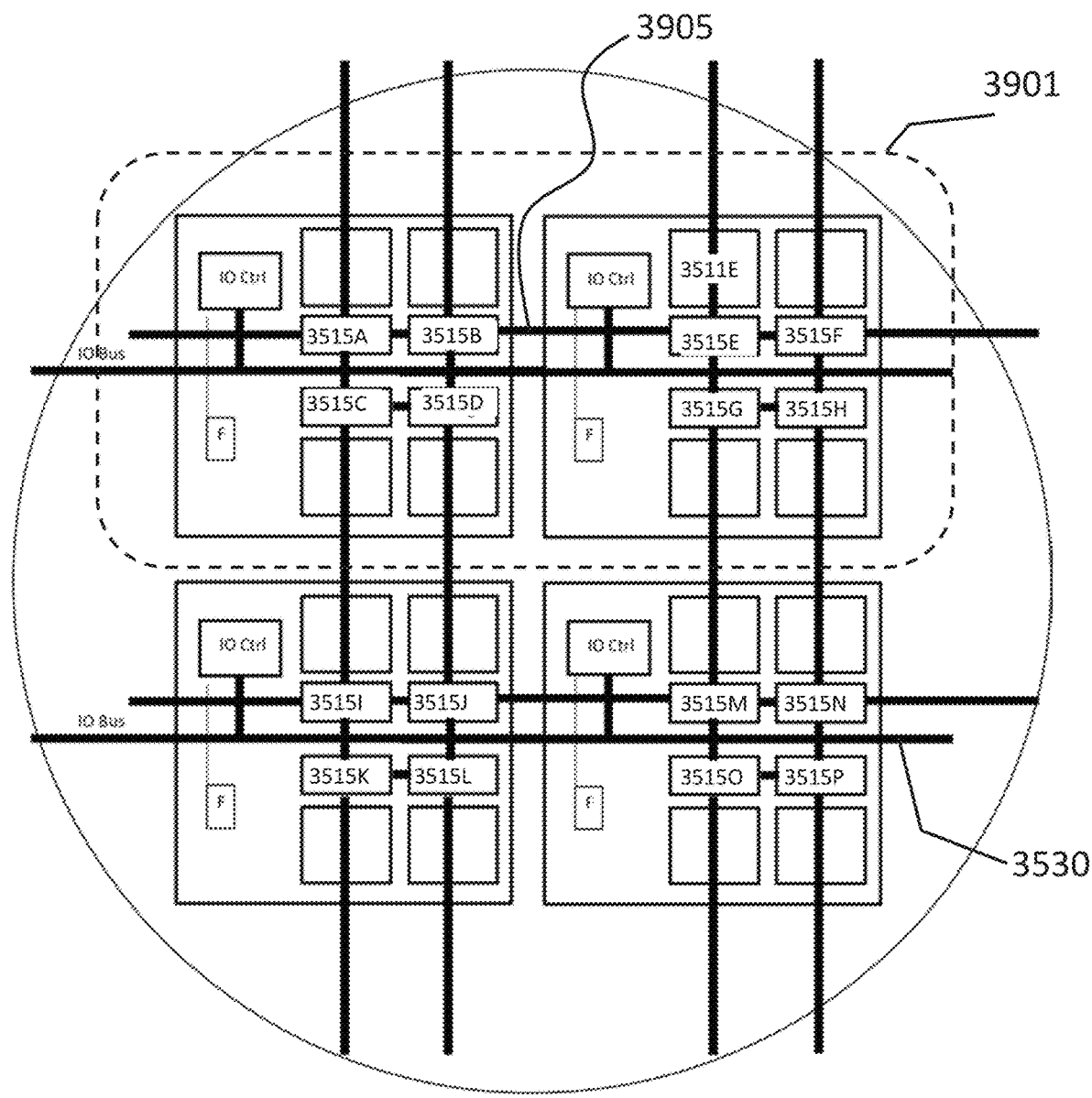
FIG. 39 shows example memory chips on a wafer with interconnected processor subunits consistent with the present disclosure.

FIG. 39 shows that various connections may be formed between processor subunits 3515A-3515P to allow a group of memory units to act as a single memory chip. For instance, a group 3901 of various memory units may include a connection 3905 between processor subunit 3515B and subunit 3515E. Connection 3905 may be used as a bus line for transmitting data and commands to from subunit 3515B to subunit 3515E that can be used to control a respective memory bank 3511E. In various embodiments, connections between processor subunits may be implemented during the formation of dies on wafer 3501. In some cases, additional connections may be fabricated during a packaging stage of a memory chip formed from several dies.

As shown in FIG. 39, processor subunits 3515A-3515P may be connected to each other using various buses (e.g., connection 3905). Connection 3905 may be free of timing hardware logic components such that data transfers between processor subunits and across connection 3905 may not be controlled by timing hardware logic components. In various embodiments, buses connecting processor subunits 3515A-3515P may be laid out on wafer 3501 prior to fabricating various circuits on wafer 3501.

In various embodiments, processor subunits (e.g., subunits 3515A-3515P) may be interconnected. For instance, subunits 3515A-3515P may be connected by suitable buses (e.g., connections 3905). Connections 3905 may be connect any one of subunits 3515A-3515P with any other of the subunits 3515A-3515P. In an example embodiment, connected subunits may be on a same die (e.g., subunits 3515A and 3515B) and in other cases, the connected subunits may be on different dies (e.g., subunits 3515B and 3515E). Connections 3905 may include dedicated buses for connecting subunits and may be configured to efficiently transmit data between subunits 3515A-3515P.

Various aspects of the present disclosure relate to methods for producing selectable sized memory chips from a wafer. In an example embodiment, selectable sized memory chips may be formed from one or more dies. The dies, as noted before, may be arranged along one or more rows, as shown, for example, in FIG. 35C. In some cases, at least one shared input-output bus corresponding to one or more rows may be laid out on wafer 3501. For example, bus 3530 may be laid out, as shown in FIG. 35C. In various embodiments, bus 3530 may be electrically connected to memory units of at least two of the dies, and the connected dies may be used to form a multi-die memory chip. In an example embodiment, one or more controllers (e.g., input-output controllers 3521 and 3522, as shown in FIG. 35B) may be configured to control the at memory units of least two dies that are used to form a multi-die memory chip. In various embodiments, the dies with memory units connected to bus 3530 may be cut off the wafer with at least one corresponding portion of the shared input-output bus (e.g., bus 3530, as shown in FIG. 35B) transmitting information to at least one controller (e.g., controllers 3521, 3522) to configure the controller to control the memory units of the connected dies to function together as a single chip.

In some cases, the memory units located on wafer 3501 may be tested prior to manufacturing memory chips by cutting regions of wafer 3501. The testing may be done using at least one shared input-output bus (e.g., bus 3530, as shown in FIG. 35C). The memory chip may be formed from a group of dies containing memory units when the memory units pass the testing. The memory units that do not pass the testing may be discarded, and not used for manufacturing of a memory chip.

Figure 40:
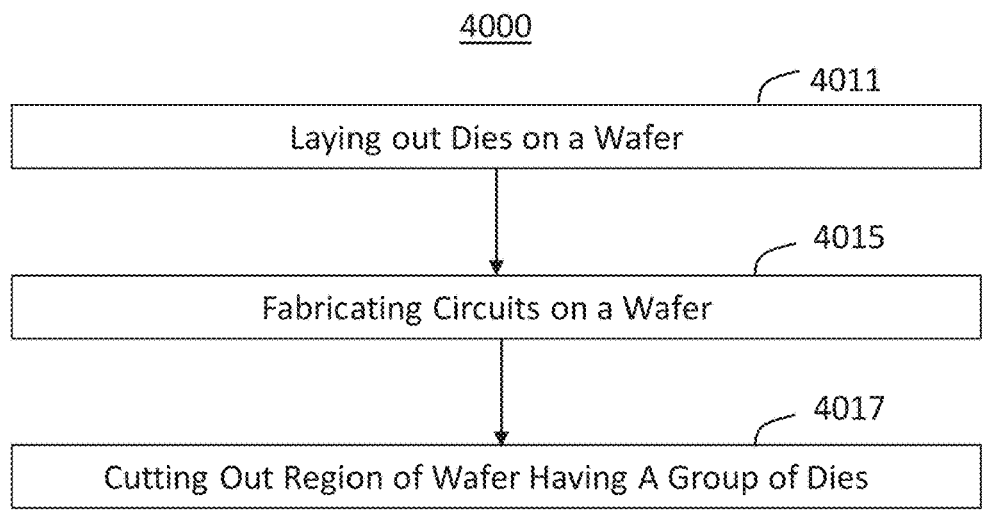
FIG. 40 is an example flowchart of a process of laying out a group of memory chips from a wafer consistent with the present disclosure.

FIG. 40 shows an example process 4000 of building memory chips from a group of dies. At step 4011 of process 4000, the dies may be laid out on semiconductor wafer 3501. At step 4015 the dies may be fabricated on wafer 3501 using any suitable approach. For example, dies may be fabricated by etching wafer 3501, depositing various dielectric, metallic or semiconductor layers, and further etching of the deposited layers, etc. For example, multiple layers may be deposited and etched. In various embodiments, layers may be n-type doped or p-type doped using any suitable doping elements. For instance, semiconductor layers may be n-type doped with phosphorus and may be p-type doped with boron. Dies 3503, as shown in FIG. 35A may be separated from each other by a space that may be used to cut dies 3503 out of wafer 3501. For example, dies 3503 may be spaced apart from each other by spacing regions, where the width of the spacing regions may be selected to allow wafer cuts in the spacing regions.

At step 4017, dies 3503 may be cut out from wafer 3501 using any suitable approach. In an example embodiment dies 3503 may be cut out using a laser. In an example embodiment, wafer 3501 may be scribed first following by mechanical dicing. Alternatively, mechanical dicing saw may be used. In some cases, a stealth dicing process may be used. During dicing, wafer 3501 may be mounted on a dicing tape for holding dies once they are cut out. In various embodiments large cuts may be done, as shown for example in FIG. 38A, by cuts 3801 and 3803 or in FIG. 38B as shown by cuts 3802, 3804, or 3806. Once dies 3503 are cut out individually or in groups, as shown for example by group 3504 in FIG. 35C, dies 3503 may be packaged. Packaging of dies may include forming contacts to dies 3503, depositing protective layers over contacts, attaching heat managing devices (e.g., heatsinks) and encapsulating dies 3503. In various embodiments, depending on how many dies are selected to form a memory chip, appropriate configuration of contacts and buses may be used. In an example embodiment, some of the contacts between different dies forming the memory chip may be made during memory chip packaging.

Figure 41A:
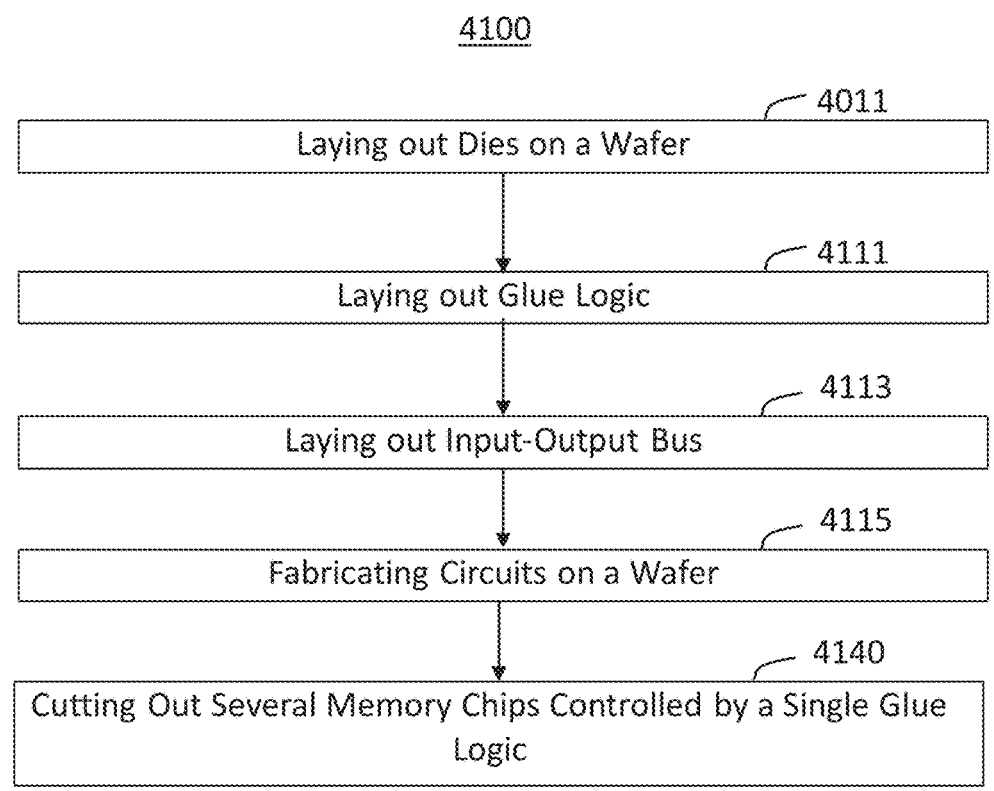
FIG. 41A is another example flowchart of a process of laying out a group of memory chips from a wafer consistent with the present disclosure.

FIG. 41A shows an example process 4100 for manufacturing memory chips containing multiple dies. Step 4011 of process 4100 may be the same as step 4011 of process 4000. At step 4111, glue logic 3711, as shown in FIG. 37 may laid out on wafer 3501. Glue logic 3711 may be any suitable logic for controlling operations of dies 3506, as shown in FIG. 37. As described before, the presence of glue logic 3711 may allow multiple dies to function as a single memory chip. Glue logic 3711 may provide an interface with other memory controllers, such that memory chip formed from multiple dies functions as a single memory chip.

At step 4113 of process 4100, buses (e.g., input-output buses and control buses) may be laid out on wafer 3501. The buses may be laid out such that they are connected with various dies and logic circuits, such as glue logic 3711. In some cases, buses may connect memory units. For example, buses may be configured to connect processor subunits of different dies. At step 4115, dies, glue logic and buses may be fabricated using any suitable approach. For example, logic elements may be fabricated by etching wafer 3501, depositing various dielectric, metallic or semiconductor layers, and further etching of the deposited layers, etc. Buses may be fabricated using, for example, metal evaporation.

At step 4140, cutting shapes may be used to cut groups of dies connected to a single glue logic 3711, as shown, for example, in FIG. 37. Cutting shapes may be determined using memory requirements for a memory chip containing multiple dies 3503. For instance, FIG. 41B shows a process 4101, which may be a variant of process 4100, where step 4140 of process 4100 may be preceded by steps 4117 and 4119. At step 4117 a system for cutting wafer 3501 may receive instructions describing requirements for a memory chip. For example, requirements may include forming a memory chip including four dies 3503. In some cases, a program software may determine a periodic pattern for group of dies and glue logic 3711 at step 4119. For instance, a periodic pattern may include two glue logic 3711 elements and four dies 3503 with every two dies connected to one glue logic 3711. Alternatively, at step 4119 the pattern may be provided by a designer of memory chips.

In some cases, the pattern may be selected to maximize a yield of memory chips from wafer 3501. In an example embodiment, memory units of dies 3503 may be tested to identify dies with faulty memory units (such dies are referred to as faulty of failed dies), and based on the location of faulty dies, groups of dies 3503 that contain memory units that pass the test can be identified and an appropriate cutting pattern can be determined. For example, if a large number of dies 3503 fail at edges of wafer 3501, a cutting pattern may be determined to avoid dies at the edges of wafer 3501. Other steps of process 4101, such as steps 4011, 4111, 4113, 4115, and 4140 may be the same as the same numbered steps of process 4100.

FIG. 41C shows an example process 4102 that may be a variation of process 4101. Steps 4011, 4111, 4113, 4115, and 4140 of process 4102 may be the same as the same numbered steps of process 4101, step 4131 of process 4102 may substitute step 4117 of process 4101, and step 4133 of process 4102 may substitute step 4119 of process 4101. At step 4131, a system for cutting wafer 3501 may receive instructions describing requirements for a first set of memory chips and a second set of memory chips. For example, requirements may include forming the first set of memory chip with memory chips consisting of four dies 3503, and forming a second set of memory chip with memory chips consisting of two dies 3503. In some cases, more than two sets of memory chips may need to be formed from wafer 3501. For instance, a third set of memory chips may include memory chips consisting of only one die 3503. In some cases, at step 4133, a program software may determine a periodic pattern for a group of dies and glue logic 3711 for forming memory chips for each set of memory chips. For instance, a first set of memory chips may include memory chips containing two glue logic 3711 and four dies 3503 with every two dies connected to one glue logic 3711. In various embodiments, glue logic units 3711 for the same memory chip may be linked together to act as a single glue logic. For example, during fabrication of glue logic 3711 appropriate bus lines may be formed linking glue logic units 3711 with one another.

The second set of memory chips may include memory chips containing one glue logic 3711 and two dies 3503 with dies 3503 connected to glue logic 3711. In some cases, when a third set of memory chips is selected, and when it includes a memory chip consisting of a single die 3503, no glue logic 3711 may be needed for these memory chips.

When designing memory chips or memory instances within a chip, one important characteristic is the number of words that can be accessed simultaneously during a single clock cycle. The more addresses (e.g., addresses along rows, also called words or word lines, and columns, also called bits or bitlines) that can be accessed at the same time for reading and/or writing, the faster the memory chip. While there has been some activity in developing memories that include multi-way ports that allow access to multiple addresses at the same time, e.g., for building register files, cashes, or shared memories, most instances use a memory mat that is larger in size and that supports the multiple address accesses. However, DRAM chips usually include a single bit line and a single row line connected to each capacitor of each memory cell. Accordingly, embodiments of the present disclosure seek to provide multi-port access on existing DRAM chips without modifying this conventional single-port memory structure of DRAM arrays.

Embodiments of the present disclosure may clock memory instances or chips at twice the speed of logic circuits using the memory. Any logic circuits using the memory may therefore "correspond" to the memory and any components thereof. Accordingly, embodiments of the present disclosure may retrieve or write to two addresses in two memory array clock cycles, which are equivalent to a single processing clock cycle for the logic circuits. The logic circuits may comprise circuits such as controllers, accelerators, GPUs, or CPUs or may comprise processing groups on the same substrate as the memory chip, e.g., as depicted in FIG. 7A. As explained above with respect to FIG. 3A, a "processing group" may refer to two or more processor subunits and their corresponding memory banks on a substrate. The group may represent a spatial distribution on the substrate and/or a logical grouping for the purposes of compiling code for execution on memory chip 2800. Accordingly, as described above with respect to FIG. 7A, a substrate with the memory chip may include a memory array with a plurality of banks, such as banks 2801a and other banks shown in FIG. 28. Furthermore, the substrate may also include a processing array that may include a plurality of processor subunits (such as subunits 730a, 730b, 730c, 730d, 730e, 730f, 730g, and 730h shown in FIG. 7A).

Accordingly, embodiments of the present disclosure may retrieve data from the array at each one of two consecutive memory cycles in order handle two addresses for each logic cycle and provide the logic with two results as though the single-port memory array were a two-port memory chip. Additional clocking may allow for memory chips of the present disclosure to function as though the single-port arrays are a two-port memory instance, a three-port memory instance, a four-port memory instance, or any other multi-port memory instance.

Figure 42:
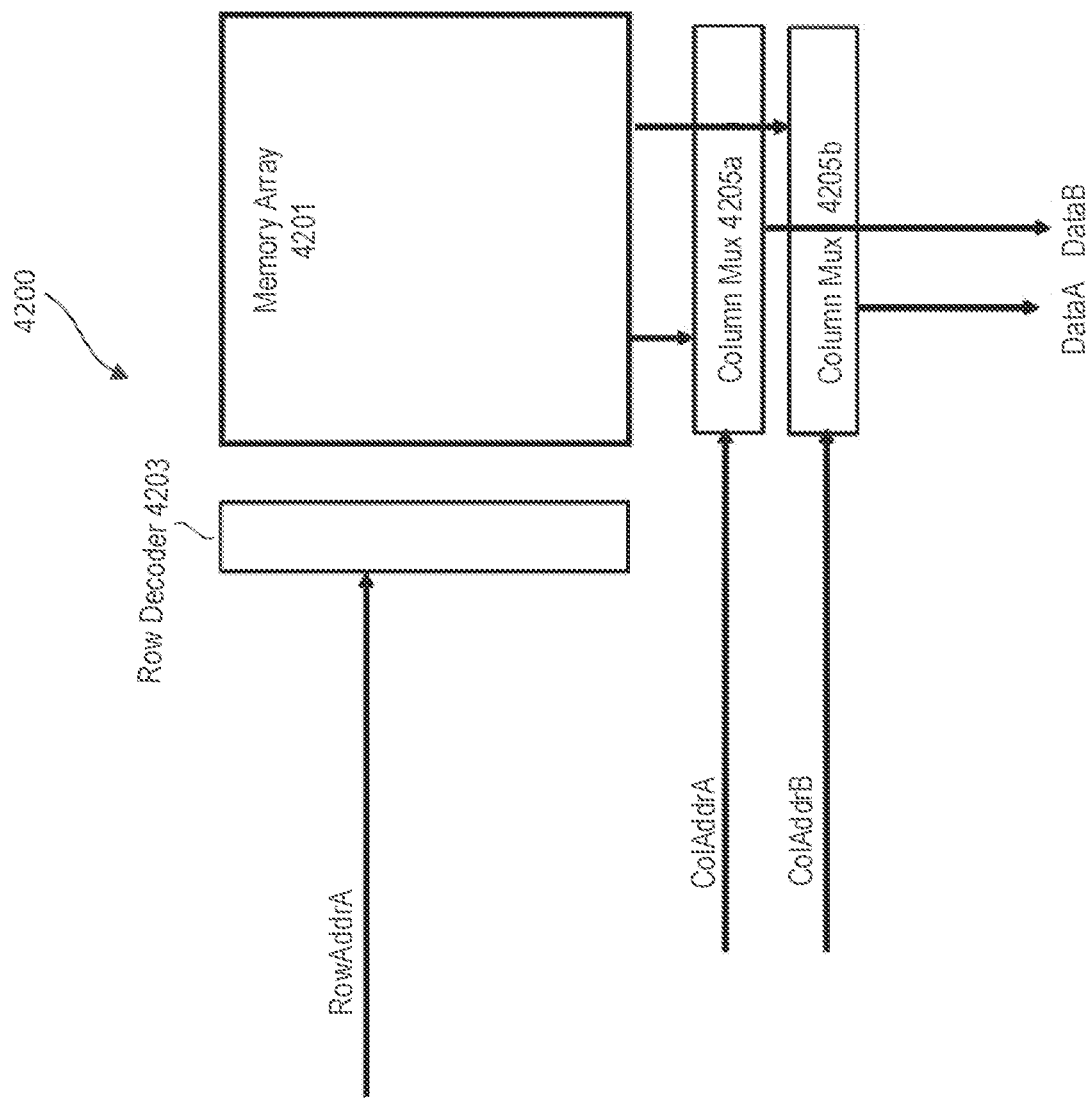
FIG. 42 shows an example of circuitry within a memory chip providing dual-port access along columns, consistent with the present disclosure.

FIG. 42 depicts example circuitry 4200 providing dual-port access along columns of a memory chip in which circuitry 4200 is used, consistent with the present disclosure. The embodiment depicted in FIG. 42 may use one memory array 4201 with two column multiplexers ("muxes") 4205a and 4205b to access two words on the same row during a same clock cycle for a logic circuit. For example, during a memory clock cycle, RowAddrA is used in row decoder 4203, and ColAddrA is used in multiplexer 4205a to buffer data from a memory cell with address (RowAddrA, ColAddrA). During the same memory clock cycle, ColAddrB is used in multiplexer 4205b to buffer data from a memory cell with address (RowAddrA, ColAddrB). Thus, circuitry 4200 may allow for dual-port access to data (e.g., DataA and DataB) stored on memory cells at two different addresses along the same row or word line. Thus, the two addresses may share a row such that the row decoder 4203 activates the same word line for both retrievals. Moreover, embodiments like the example depicted in FIG. 42 may use column muxes such that two addresses may be accessed during a same memory clock cycle.

Figure 43:
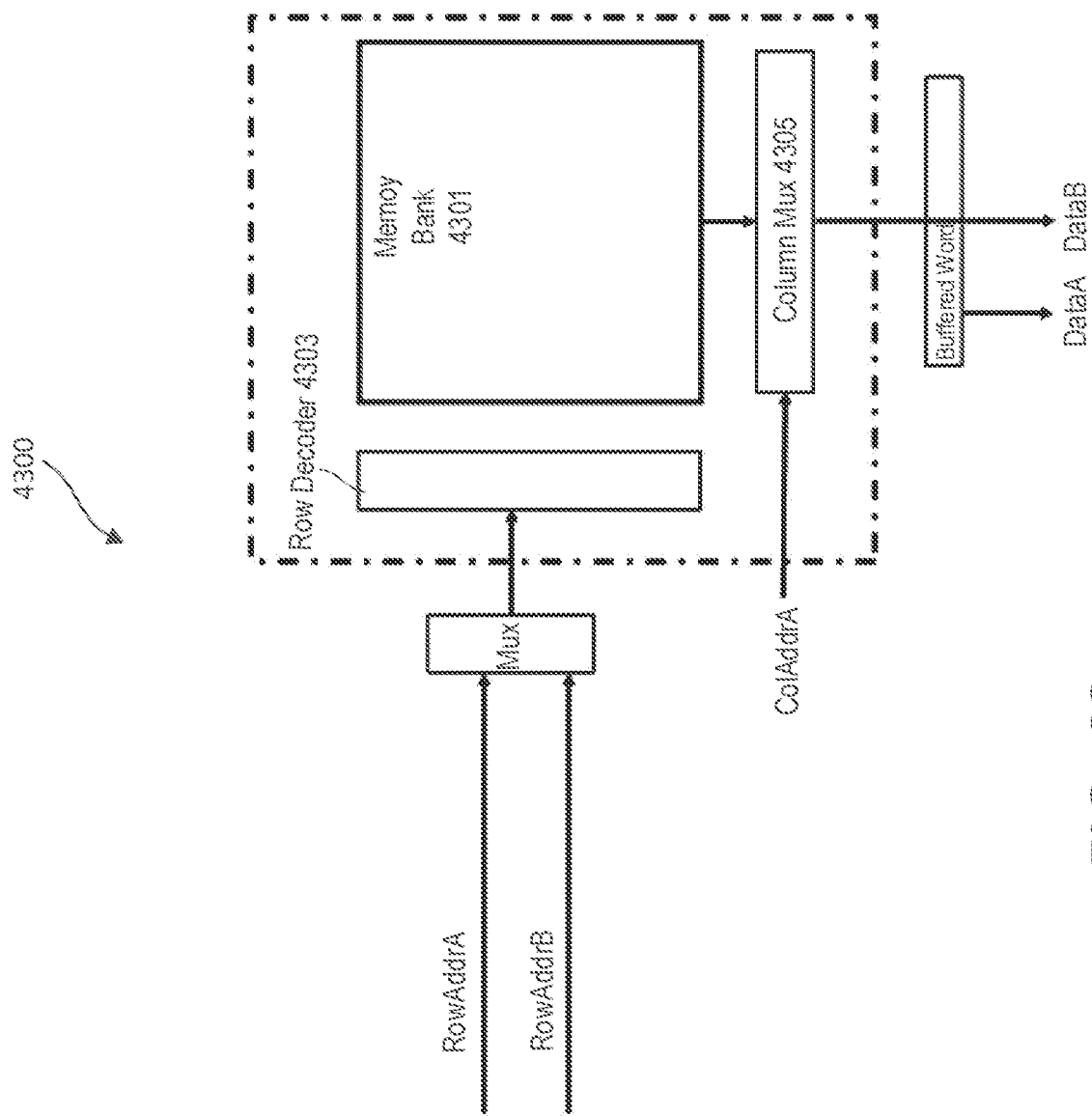
FIG. 43 shows an example of circuitry within a memory chip providing dual-port access along rows, consistent with the present disclosure.

Similarly, FIG. 43 depicts example circuitry 4300 providing dual-port access along rows of a memory chip in which circuitry 4300 is used, consistent with the present disclosure. The embodiment depicted in FIG. 43 may use one memory array 4301 with a row decoder 4303 coupled with a multiplexer ("mux") to access two words on the same column during a same clock cycle for a logic circuit. For example, on the first of two memory clock cycles, RowAddrA is used in row decoder 4303, and ColAddrA is used in column multiplexer 4305 to buffer data (e.g., to the "Buffered Word" buffer of FIG. 43) from a memory cell with address (RowAddrA, ColAddrA). On the second of two memory clock cycles, RowAddrB is used in row decoder 4303, and ColAddrA is used in column multiplexer 4305 to buffer data from a memory cell with address (RowAddrB, ColAddrA). Thus, circuitry 4300 may allow for dual-port access to data (e.g., DataA and DataB) stored on memory cells at two different addresses along the same column or bitline. Thus, the two addresses may share a row such that the column decoder (which may be separate from or combined with one or more column multiplexers, as depicted in FIG. 43) activates the same bitline for both retrievals. Embodiments like the example depicted in FIG. 43 may use two memory clock cycles because row decoder 4303 may need one memory clock cycle to activate each word line. Accordingly, a memory chip using circuitry 4300 may function as a dual-port memory if clocked at least twice as fast as a corresponding logic circuit.

Accordingly, as explained above, FIG. 43 may retrieve DataA and DataB during two memory clock cycles, which is faster than a clock cycle for a corresponding logic circuit. For example, the row decoder (e.g., row decoder 4303 of FIG. 43) and the column decoder (which may be separate from or combined with one or more column multiplexers, as depicted in FIG. 43) may be configured to be clocked at a rate at least twice a rate of a corresponding logic circuit generating the two addresses. For example, a clock circuit for circuitry 4300 (not shown in FIG. 43) may clock circuitry 4300 according to a rate at least twice a rate of a corresponding logic circuit generating the two addresses.

The embodiment of FIGS. 42 and 43 may be used separately or combined. Accordingly, circuitry (e.g., circuitry 4200 or 4300) providing dual-port functionality on a single-port memory array or mat may comprise a plurality of memory banks arranged along at least one row and at least one column. The plurality of memory banks are depicted as memory array 4201 in FIG. 42 and as memory array 4301 in FIG. 43. The embodiments may further use at least one row multiplexer (as depicted in FIG. 43) or at least one column multiplexer (as depicted in FIG. 42) configured to receive, during a single clock cycle, two addresses for reading or writing. Moreover, the embodiments may use a row decoder (e.g., row decoder 4203 of FIG. 42 and row decoder 4303 of FIG. 43) and a column decoder (which may be separate from or combined with one or more column multiplexers, as depicted in FIGS. 42 and 43) to read from or write to the two addresses. For example, the row decoder and column decoder may, during a first cycle, retrieve a first of the two addresses from the at least one row multiplexer or the at least one column multiplexer and decode a word line and a bitline corresponding to the first address. Moreover, the row decoder and column decoder may, during a second cycle, retrieve a second of the two addresses from the at least one row multiplexer or the at least one column multiplexer and decode a word line and a bitline corresponding to the second address. The retrievals may each comprise activating a word line corresponding to an address using the row decoder and activating a bit line on the activated word line corresponding to the address using the column decoder.

Although described above for retrievals, the embodiments of FIGS. 42 and 43, whether implemented separately or in combination, may include write commands. For example, during the first cycle, the row decoder and column decoder may write first data retrieved from the at least one row multiplexer or the at least one column multiplexer to the first of the two addresses. Moreover, during the second cycle, the row decoder and column decoder may write second data retrieved from the at least one row multiplexer or the at least one column multiplexer to the second of the two addresses.

The example of FIG. 42 shows this process when the first and second addresses share a word line address while the example of FIG. 43 shows this process when the first and second addresses share a column address. As described further with respect to FIG. 47 below, the same process may be implemented when the first and second address do not share either a word line address or a column address.

Figure 44:
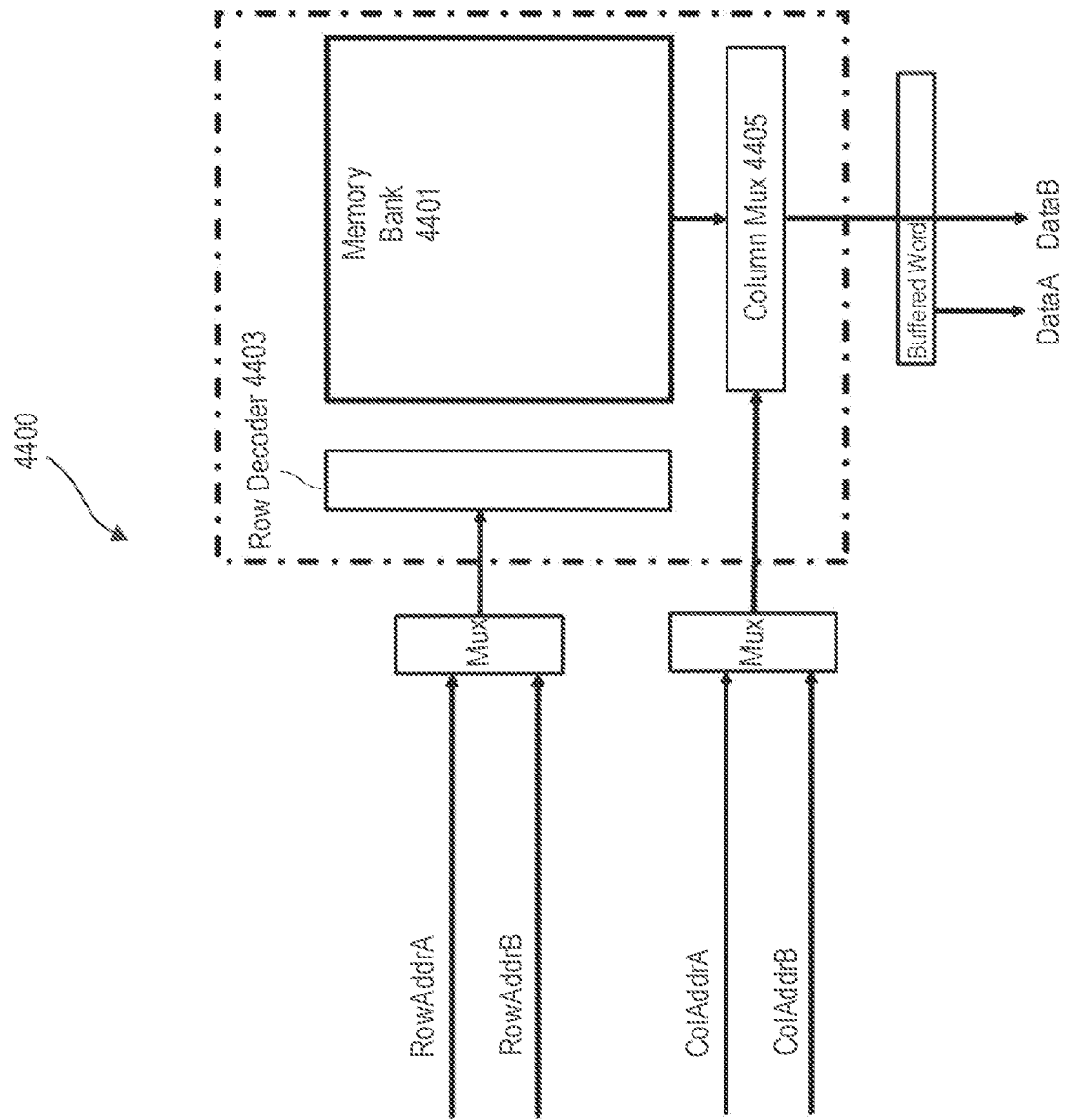
FIG. 44 shows an example of circuitry within a memory chip providing dual-port access along both rows and columns, consistent with the present disclosure.

Accordingly, although the examples above provide dual-port access along at least one of rows or columns, additional embodiments may provide dual-port access along both rows and columns. FIG. 44 depicts example circuitry 4400 providing dual-port access along both rows and columns of a memory chip in which circuitry 4400 is used, consistent with the present disclosure. Accordingly, circuitry 4700 may represent a combination of circuitry 4200 of FIG. 42 with circuitry 4300 of FIG. 43.

The embodiment depicted in FIG. 44 may use one memory array 4401 with a row decoder 4403 coupled with a multiplexer ("mux") to access two rows during a same clock cycle for a logic circuit. Moreover, the embodiment depicted in FIG. 44 may use memory array 4401 with a column decoder (or multiplexer) 4405 coupled with a multiplexer ("mux") to access two columns during the same clock cycle. For example, on the first of two memory clock cycles, RowAddrA is used in row decoder 4403, and ColAddrA is used in column multiplexer 4405 to buffer data (e.g., to the "Buffered Word" buffer of FIG. 44) from a memory cell with address (RowAddrA, ColAddrA). On the second of two memory clock cycles, RowAddrB is used in row decoder 4403, and ColAddrB is used in column multiplexer 4405 to buffer data from a memory cell with address (RowAddrB, ColAddrB). Thus, circuitry 4400 may allow for dual-port access to data (e.g., DataA and DataB) stored on memory cells at two different addresses. Embodiments like the example depicted in FIG. 44 may use the additional buffer because row decoder 4403 may need one memory clock cycle to activate each word line. Accordingly, a memory chip using circuitry 4400 may function as a dual-port memory if clocked at least twice as fast as a corresponding logic circuit.

Although not depicted in FIG. 44, circuitry 4400 may further include the additional circuitry of FIG. 46 (described further below) along the rows or word lines and/or similar additional circuitry along the columns or bitlines. Accordingly, circuitry 4400 may activate corresponding circuitry (e.g., by opening one or more switching elements, such as one or more of switching elements 4613*a*, 4613*b*, and the like of FIG. 46) to activate disconnected portions including the addresses (e.g., by connecting voltages or allowing current to flow to the disconnected portions). Accordingly, the circuitry may "correspond" when elements of the circuitry (such as lines or the like) include locations identified the addresses and/or when elements of the circuitry (such as the switching elements) control a supply or voltage and/or a flow of current to memory cells identified by the addresses. Circuitry 4400 may then use row decoder 4403 and column multiplexer 4405 to decode corresponding word lines and bitlines to retrieve data from or write data to the addresses, which are located in the activated disconnected portions.

As further depicted in FIG. 44, circuitry 4400 may further use at least one row multiplexer (depicted separate from row decoder 4403 but may be incorporate therein) and/or at least one column multiplexer (e.g., depicted separate from column multiplexer 4405 but may be incorporate therein)

configured to receive, during a single clock cycle, two addresses for reading or writing. Accordingly, the embodiments may use a row decoder (e.g., row decoder 4403) and a column decoder (which may be separate from or combined with column multiplexer 4405) to read from or write to the two addresses. For example, the row decoder and column decoder may, during a memory clock cycle, retrieve a first of the two addresses from the at least one row multiplexer or the at least one column multiplexer and decode a word line and a bitline corresponding to the first address. Moreover, the row decoder and column decoder may, during the same memory cycle, retrieve a second of the two addresses from the at least one row multiplexer or the at least one column multiplexer and decode a word line and a bitline corresponding to the second address.

Figure 45A:
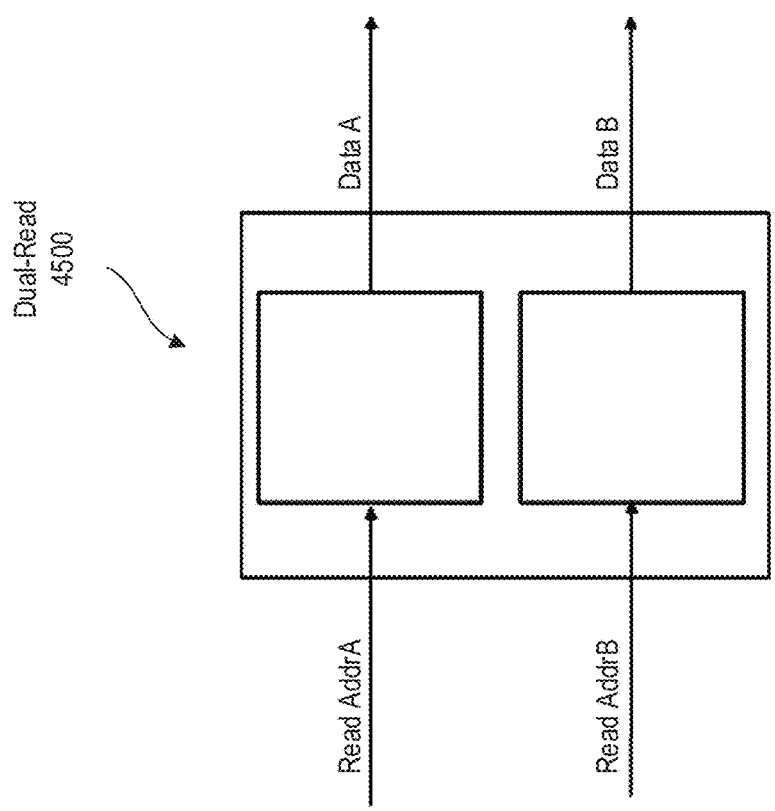
FIG. 45A shows a dual-read using duplicated memory arrays or mats.
Figure 45B:
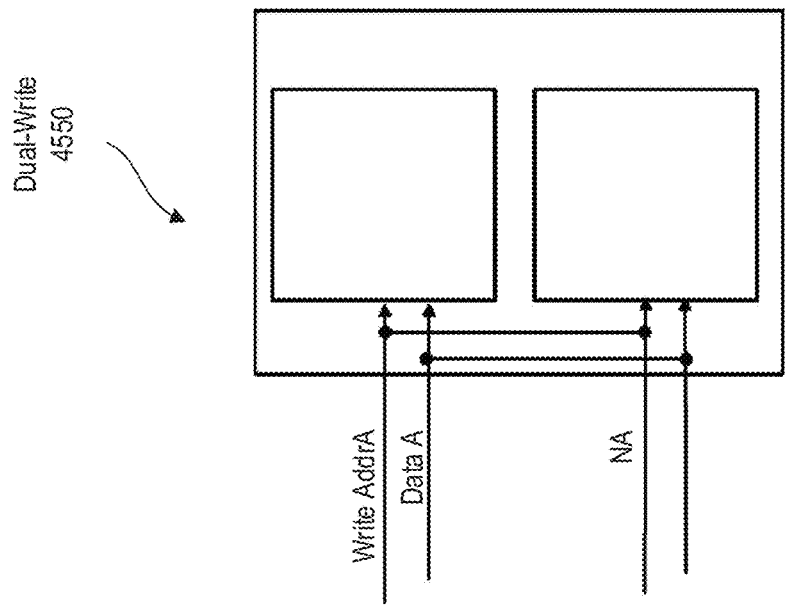
FIG. 45B shows a dual-write using duplicated memory arrays or mats.

FIGS. 45A and 45B depict existing duplication techniques for providing dual-port functionality on a single-port memory array or mat. As shown in FIG. 45A, dual-port reading may be provided by keeping duplicate copies of data in sync across memory arrays or mats. Accordingly, reading may be performed from both copies of the memory instance, as depicted in FIG. 45A. Moreover, as shown in FIG. 45B, dual-port writing may be provided by duplicating all writes across the memory arrays or mats. For example, the memory chip may require that logic circuits using the memory chip send write commands in duplicate, one for each duplicate copy of the data. Alternatively, in some embodiments, as shown in FIG. 45A, additional circuitry may allow for the logic circuits using the memory instance to send single write commands that are automatically duplicated by the additional circuitry to generate duplicate copies of the written data across the memory arrays or mats in order to keep the copies in sync. The embodiments of FIGS. 42, 43, and 44 may reduce the redundancy from these existing duplication techniques either by using multiplexers to access two bitlines in a single memory clock cycle (e.g., as depicted in FIG. 42) and/or by clocking the memory faster than a corresponding logic circuit (e.g., as depicted in FIGS. 43 and 44) and providing additional multiplexers to handle additional addresses rather than duplicating all data in the memory.

In addition to the faster clocking and/or additional multiplexers described above, embodiments of the present disclosure may use circuitry that disconnects the bitlines and/or word lines at some points within the memory array. Such embodiments may allow for multiple simultaneous access to the array as long as the row and column decoders access different locations that are not coupled to the same portions of the disconnect circuitry. For example, locations with different word lines and bitlines may be accessed simultaneously because the disconnecting circuitry may allow the row and column decodes to access the different addresses without electrical interference. The granularity of the disconnected regions within the memory array may be weighed against the additional area required by the disconnect circuitry during design of the memory chip.

Figure 46:
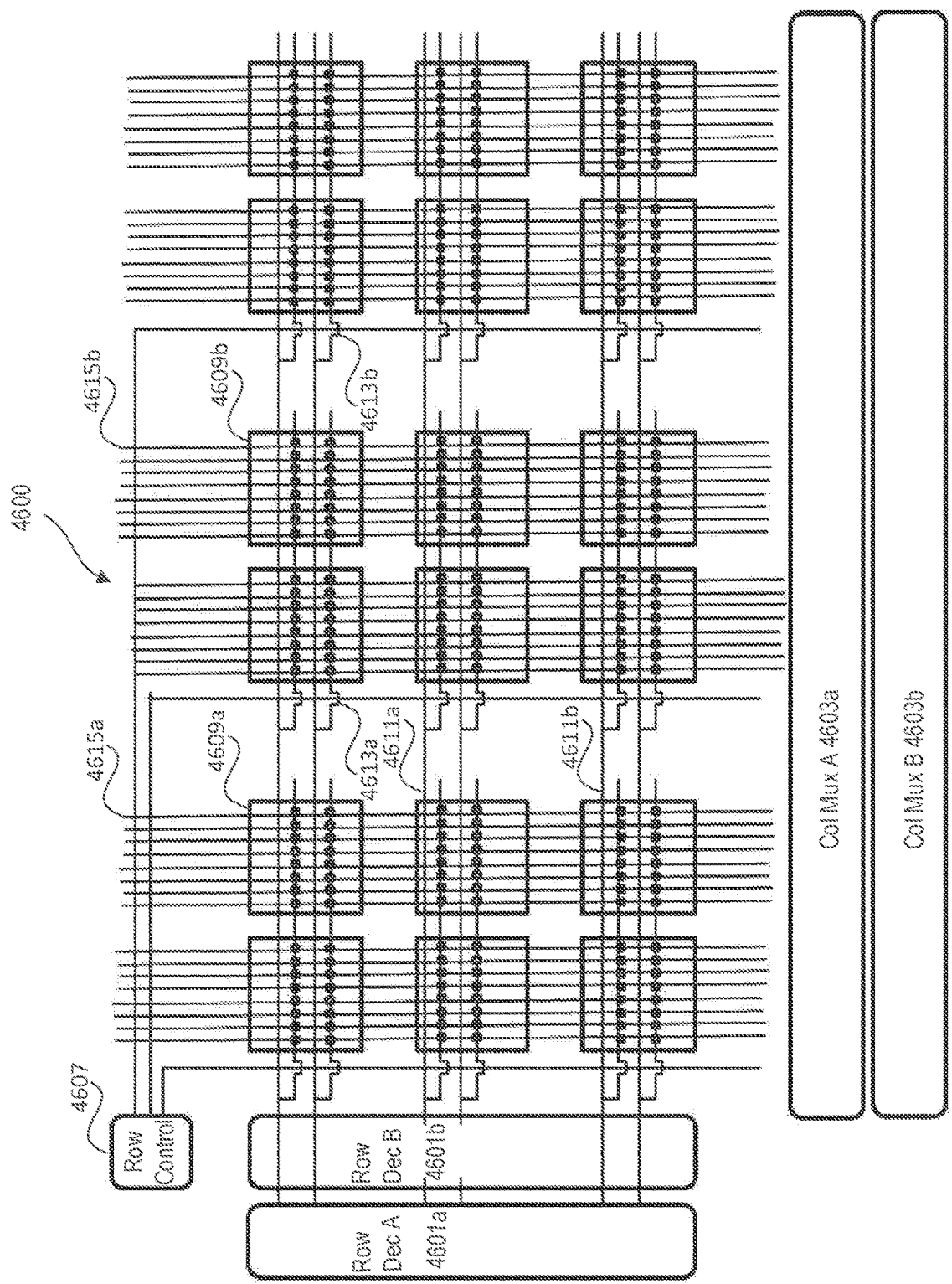
FIG. 46 shows an example of circuitry within a memory chip with switching elements for dual-port access along rows, consistent with the present disclosure.

An architecture for implementing such simultaneous access is depicted in FIG. 46. In particular, FIG. 46 depicts example circuitry 4600 providing dual-port functionality on a single-port memory array or mat. As depicted in FIG. 46, circuitry 4600 may include a plurality of memory mats (e.g., memory mat 4609*a*, mat 4609*b*, and the like) arranged along at least one row and at least one column. The layout of circuitry 4600 further includes a plurality of word lines, such as word lines 4611*a* and 4611*b* corresponding to rows and bitlines 4615*a* and 4615*b* corresponding to columns.

The example of FIG. 46 includes twelve memory mats, each with two lines and eight columns. In other embodiments, the substrate may include any number of memory mats, and each memory mat may include any number of lines and any number of columns. Some memory mats may include a same number of lines and columns (as shown in FIG. 46) while other memory mats may include different numbers of lines and/or columns.

Although not depicted in FIG. 46, circuitry 4600 may further use at least one row multiplexer (either separate from or incorporated with row decoder 4601*a* and/or 4601*b*) or at least one column multiplexer (e.g., column multiplexer 4603*a* and/or 4603*b*) configured to receive, during a single clock cycle, two (or three or any plurality of) addresses for reading or writing. Moreover, the embodiments may use a row decoder (e.g., row decoder 4601*a* and/or 4601*b*) and a column decoder (which may be separate from or combined with column multiplexer 4603*a* and/or 4603*b*) to read from or write to the two (or more) addresses. For example, the row decoder and column decoder may, during a memory clock cycle, retrieve a first of the two addresses from the at least one row multiplexer or the at least one column multiplexer and decode a word line and a bitline corresponding to the first address. Moreover, the row decoder and column decoder may, during the same memory cycle, retrieve a second of the two addresses from the at least one row multiplexer or the at least one column multiplexer and decode a word line and a bitline corresponding to the second address. As explained above, as long as the two addresses are in different locations that are not coupled to the same portions of the disconnect circuitry (e.g., switching elements such as 4613*a*, 4613*b*, and the like), the access may occur during the same memory clock cycle. Additionally, circuitry 4600 may access a first two addresses simultaneously during a first memory clock cycle and then a second two addresses simultaneously during a second memory clock cycle. In such embodiments, a memory chip using circuitry 4600 may function as a four-port memory if clocked at least twice as fast as a corresponding logic circuit.

FIG. 46 further includes at least one row circuit and at least one column circuit configured to function as switches. For example, corresponding switching elements such as 4613*a*, 4613*b*, and the like may comprise transistors or any other electrical element configured to allow or stop current to flow and/or connect or disconnect voltages from the word line or bitline connected to switching elements such as 4613*a*, 4613*b*, and the like. Thus, the corresponding switching elements may divide circuitry 4600 into disconnected portions. Although depicted as comprising single rows and sixteen columns of each row, the disconnected regions within the circuitry 4600 may include differing levels of granularity depending on design of the circuitry 4600.

Circuitry 4600 may use a controller (e.g., row control 4607) to activate corresponding ones of the at least one row circuit and the at least one column circuit in order to activate corresponding disconnected regions during the address operations described above. For example, circuitry 4600 may transmit one or more control signals to close corresponding ones of the switching elements (e.g., switching elements 4613*a*, 4613*b*, and the like). In embodiments where switching elements 4613*a*, 4613*b*, and the like comprises transistors, the control signals may comprise voltages to open the transistors.

Depending on the disconnected regions including the addresses, more than one of the switching elements may be activated by circuitry 4600. For example, to reach an address within memory mat 4609*b* of FIG. 46, the switching element allowing access to memory mat 4609a must be opened as well as the switching element allowing access to memory mat 4609b. Row control 4607 may determine the switching elements to activate in order to retrieve a particular address within circuitry 4600 according to the particular address.

FIG. 46 represents an example of circuitry 4600 used to divide word lines of a memory array (e.g., comprising memory mat 4609a, mat 4609b, and the like). However, other embodiments may use similar circuitry (e.g., switching elements dividing memory chip 4600 into disconnected regions) to divide bitlines of the memory array. Accordingly, the architecture of circuitry 4600 may be used in dual-column access like that depicted in FIG. 42 or FIG. 44 as well as dual-row access like that depicted in FIG. 43 or FIG. 44.

Figure 47A:
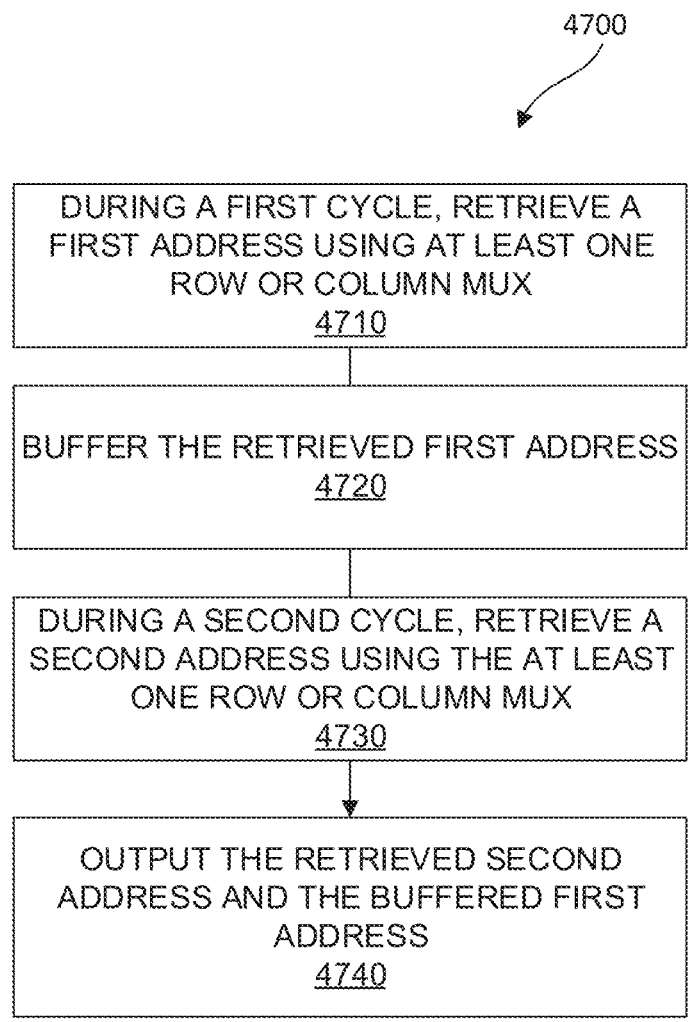
FIG. 47A is an example flowchart of a process for providing dual-port access on a single-port memory array or mat, consistent with the present disclosure.

A process for multi-cycle access to memory arrays or mats is depicted in FIG. 47A. In particular, FIG. 47A is an example flowchart of a process 4700 for providing dual-port access on a single-port memory array or mat (e.g., using circuitry 4300 of FIG. 43 or circuitry 4400 of FIG. 44) Process 4700 may be executed using row and column decoders consistent with the present disclosure, such as row decoder 4303 or 4403 of FIG. 43 or 44, respectively, and a column decoder (which may be separate from or combined with one or more column multiplexers, such as column multiplexer 4305 or 4405 depicted in FIG. 43 or 44, respectively).

At step 4710, during a first memory clock cycle, the circuitry may use at least one row multiplexer and at least one column multiplexer to decode a word line and a bitline corresponding to a first of two addresses. For example, the at least one row decoder may activate a word line, and the at least one column multiplexer may amplify a voltage from a memory cell along the activated word line and corresponding to the first address. The amplified voltage may be provided to a logic circuit using a memory chip including the circuitry or buffered according to step 4720 described below. The logic circuits may comprise circuits such as GPUs or CPUs or may comprise processing groups on the same substrate as the memory chip, e.g., as depicted in FIG. 7A.

Although described above as a read operation, method 4700 may similarly process a write operation. For example, the at least one row decoder may activate a word line, and the at least one column multiplexer may apply a voltage to a memory cell along the activated word line and corresponding to the first address to write new data to the memory cell. In some embodiments, the circuitry may provide confirmation of the write to the logic circuit using the memory chip including the circuitry or buffer the confirmation according to step 4720 below.

At step 4720, the circuitry may buffer the retrieved data of the first address. For example, as depicted in FIGS. 43 and 44, the buffer may allow the circuitry to retrieve a second of the two addresses (as described in step 4730 below) and return the results of both retrievals together. The buffer may comprise a register, an SRAM, a nonvolatile memory, or any other data storage device.

At step 4730, during a second memory clock cycle, the circuitry may use the at least one row multiplexer and the at least one column multiplexer to decode a word line and a bitline corresponding to a second address of the two addresses. For example, the at least one row decoder may activate a word line, and the at least one column multiplexer may amplify a voltage from a memory cell along the activated word line and corresponding to the second address. The amplified voltage may be provided to a logic circuit using a memory chip including the circuitry, whether indi-vidually or together with a buffered voltage, e.g., from step 4720. The logic circuits may comprise circuits such as GPUs or CPUs or may comprise processing groups on the same substrate as the memory chip, e.g., as depicted in FIG. 7A.

Although described above as a read operation, method 4700 may similarly process a write operation. For example, the at least one row decoder may activate a word line, and the at least one column multiplexer may apply a voltage to a memory cell along the activated word line and corresponding to the second address to write new data to the memory cell. In some embodiments, the circuitry may provide confirmation of the write to the logic circuit using the memory chip including the circuitry, whether individually or together with a buffered voltage, e.g., from step 4720.

At step 4740, the circuitry may output the retrieved data of the second address with the buffered first address. For example, as depicted in FIGS. 43 and 44, the circuitry may return the results of both retrievals (e.g., from steps 4710 and 4730) together. The circuitry may return the results to a logic circuit using a memory chip including the circuitry, The logic circuits may comprise circuits such as GPUs or CPUs or may comprise processing groups on the same substrate as the memory chip, e.g., as depicted in FIG. 7A.

Although described with reference to multiple cycles, if the two addresses share a word lines, as depicted in FIG. 42, method 4700 may allow for single-cycle access to the two addresses. For example, steps 4710 and 4730 may occur during a same memory clock cycle since multiple column multiplexers may decode different bitlines on a same word line during the same memory clock cycle. In such embodiments, the buffering step 4720 may be skipped.

Figure 47B:
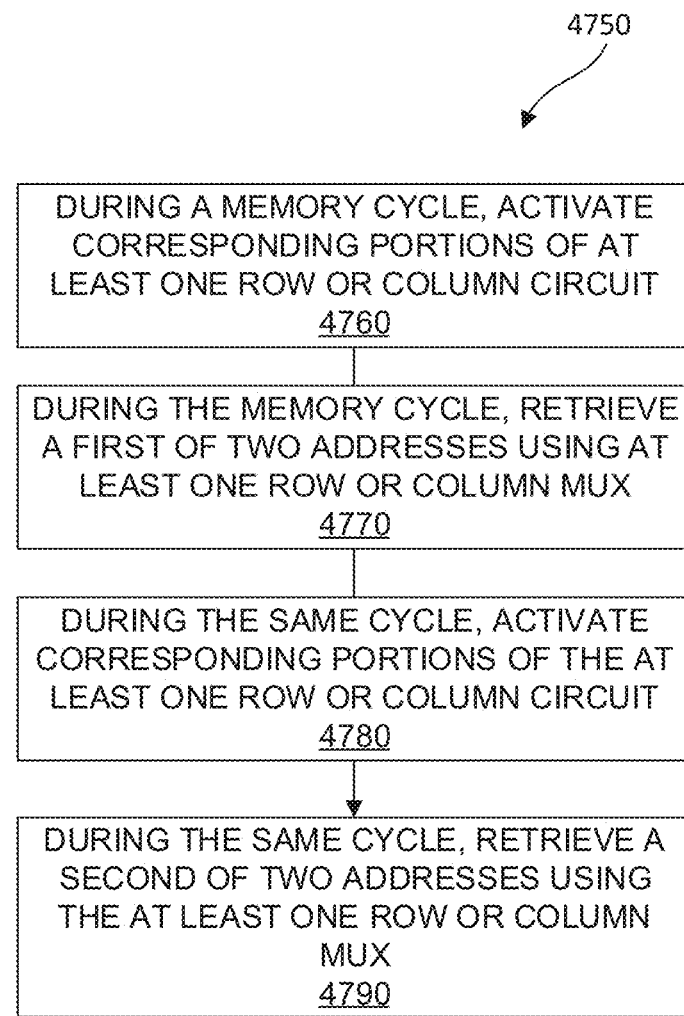
FIG. 47B is an example flowchart of another process for providing dual-port access on a single-port memory array or mat, consistent with the present disclosure.

A process for simultaneous access (e.g., using circuitry 4600 described above) is depicted in FIG. 47B. Accordingly, although shown in sequence, the steps of FIG. 47B may all occur during a same memory clock cycle, and at least some steps (e.g., steps 4760 and 4780 or steps 4770 and 4790) may be executed simultaneously. In particular, FIG. 47B is an example flowchart of a process 4750 for providing dual-port access on a single-port memory array or mat (e.g., using circuitry 4200 of FIG. 42 or circuitry 4600 of FIG. 46) Process 4750 may be executed using row and column decoders consistent with the present disclosure, such as row decoder 4203 or rows decoders 4601a and 4601b of FIG. 42 or 46, respectively, and a column decoder (which may be separate from or combined with one or more column multiplexers, such as column multiplexers 4205a and 4205b or column multiplexers 4603a and 4306b depicted in FIG. 42 or 46, respectively).

At step 4760, during a memory clock cycle, the circuitry may activate corresponding ones of at least one row circuit and at least one column circuit based on a first of two addresses. For example, the circuitry may transmit one or more control signals to close corresponding ones of switching elements comprising the at least one row circuit and the at least one column circuit. Accordingly, the circuitry may access a corresponding disconnected region including the first of the two addresses.

At step 4770, during the memory clock cycle, the circuitry may use at least one row multiplexer and at least one column multiplexer to decode a word line and a bitline corresponding to the first address. For example, the at least one row decoder may activate a word line, and the at least one column multiplexer may amplify a voltage from a memory cell along the activated word line and corresponding to the first address. The amplified voltage may be provided to a logic circuit using a memory chip including the circuitry. For example, as described above, the logic circuits may comprise circuits such as GPUs or CPUs or may comprise processing groups on the same substrate as the memory chip, e.g., as depicted in FIG. 7A.

Although described above as a read operation, method 4500 may similarly process a write operation. For example, the at least one row decoder may activate a word line, and the at least one column multiplexer may apply a voltage to a memory cell along the activated word line and corresponding to the first address to write new data to the memory cell. In some embodiments, the circuitry may provide confirmation of the write to the logic circuit using the memory chip including the circuitry.

At step 4780, during the same cycle, the circuitry may activate corresponding ones of the at least one row circuit and the at least one column circuit based on a second of the two addresses. For example, the circuitry may transmit one or more control signals to close corresponding ones of switching elements comprising the at least one row circuit and the at least one column circuit. Accordingly, the circuitry may access a corresponding disconnected region including the second of the two addresses.

At step 4790, during the same cycle, the circuitry may use the at least one row multiplexer and the at least one column multiplexer to decode a word line and a bitline corresponding to the second address. For example, the at least one row decoder may activate a word line, and the at least one column multiplexer may amplify a voltage from a memory cell along the activated word line and corresponding to the second address. The amplified voltage may be provided to a logic circuit using the memory chip including the circuitry. For example, as described above, the logic circuits may comprise conventional circuits such as GPUs or CPUs or may comprise processing groups on the same substrate as the memory chip, e.g., as depicted in FIG. 7A.

Although described above as a read operation, method 4500 may similarly process a write operation. For example, the at least one row decoder may activate a word line, and the at least one column multiplexer may apply a voltage to a memory cell along the activated word line and corresponding to the second address to write new data to the memory cell. In some embodiments, the circuitry may provide confirmation of the write to the logic circuit using the memory chip including the circuitry.

Although described with reference to a single cycle, if the two addresses are in disconnected regions sharing word lines or bitlines (or otherwise sharing switching elements in the at least one row circuit and the at least one column circuit), method 4500 may allow for multi-cycle access to the two addresses. For example, steps 4760 and 4770 may occur during a first memory clock cycle in which a first row decoder and a first column multiplexer may decode the word line and bitline corresponding to the first address while steps 4780 and 4790 may occur during a second memory clock cycle in which a second row decoder and a second column multiplexer may decode the word line and bitline corresponding to the second address.

Figure 48:
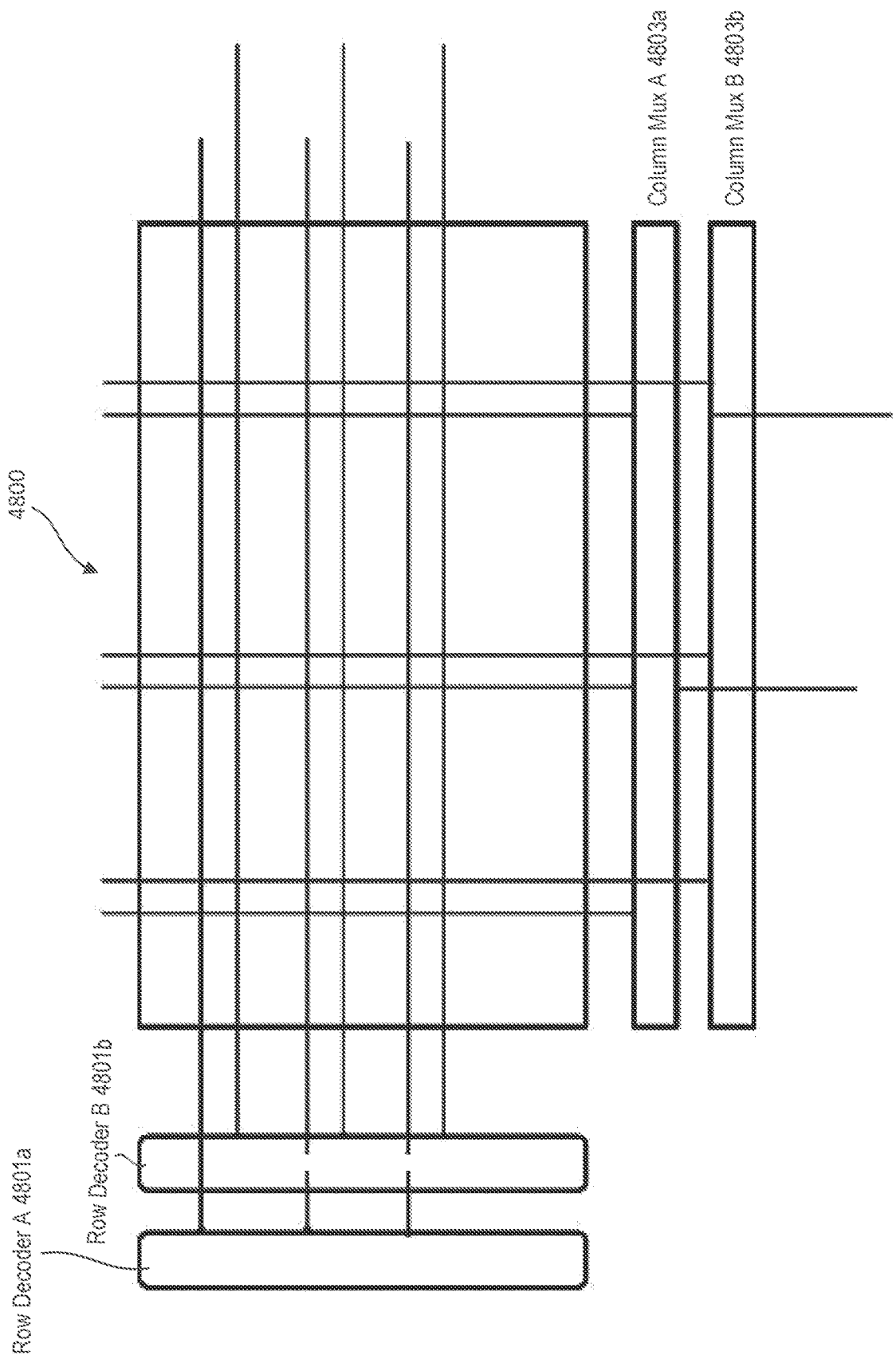
FIG. 48 shows another example of circuitry within a memory chip memory chip providing dual-port access along both rows and columns, consistent with the present disclosure.

A further example of architecture for dual-port access along both rows and columns is depicted in FIG. 48. In particular, FIG. 48 depicts example circuitry 4800 providing dual-port access along both rows and columns using multiple row decoders in combination with multiple column multiplexers. In FIG. 48, row decoder 4801a may access a first word line, and column multiplexer 4803a may decode data from one or more memory cells along the first word line while row decoder 4801b may access a second word line, and column multiplexer 4803b may decode data from one or more memory cells along the second word line.

As described with respect to FIG. 47B, this access may be simultaneous during one memory clock cycles. Accordingly, similar to the architecture of FIG. 46, the architecture of FIG. 48 (including the memory mats described in FIG. 49 below) may allow for multiple addresses to be accessed in a same clock cycle. For example, the architecture of FIG. 48 may include any number of row decoders and any number of column multiplexers such that a number of addresses corresponding to the number of row decoder and column multiplexers may be accessed all within a single memory clock cycle.

In other embodiments, this access may be sequential along two memory clock cycles. By clocking memory chip 4800 faster than a corresponding logic circuit, two memory clock cycles may be equivalent to one clock cycle for the logic circuit using the memory. For example, as described above, the logic circuits may comprise conventional circuits such as GPUs or CPUs or may comprise processing groups on the same substrate as the memory chip, e.g., as depicted in FIG. 7A.

Other embodiments may allow for simultaneous access. For example, as described with respect to FIG. 42, multiple column decoders (which may comprise column multiplexers such as 4803a and 4803b as shown in FIG. 48) may read multiple bitlines along a same word line during a single memory clock cycle. Additionally or alternatively, as described with respect to FIG. 46, circuitry 4800 may incorporate additional circuitry such that this access may be simultaneous. For example, row decoder 4801a may access a first word line, and column multiplexer 4803a may decode data from a memory cell along the first word line during a same memory clock cycle in which row decoder 4801b accesses a second word line, and column multiplexer 4803b decodes data from a memory cell along the second word line.

Figure 49:
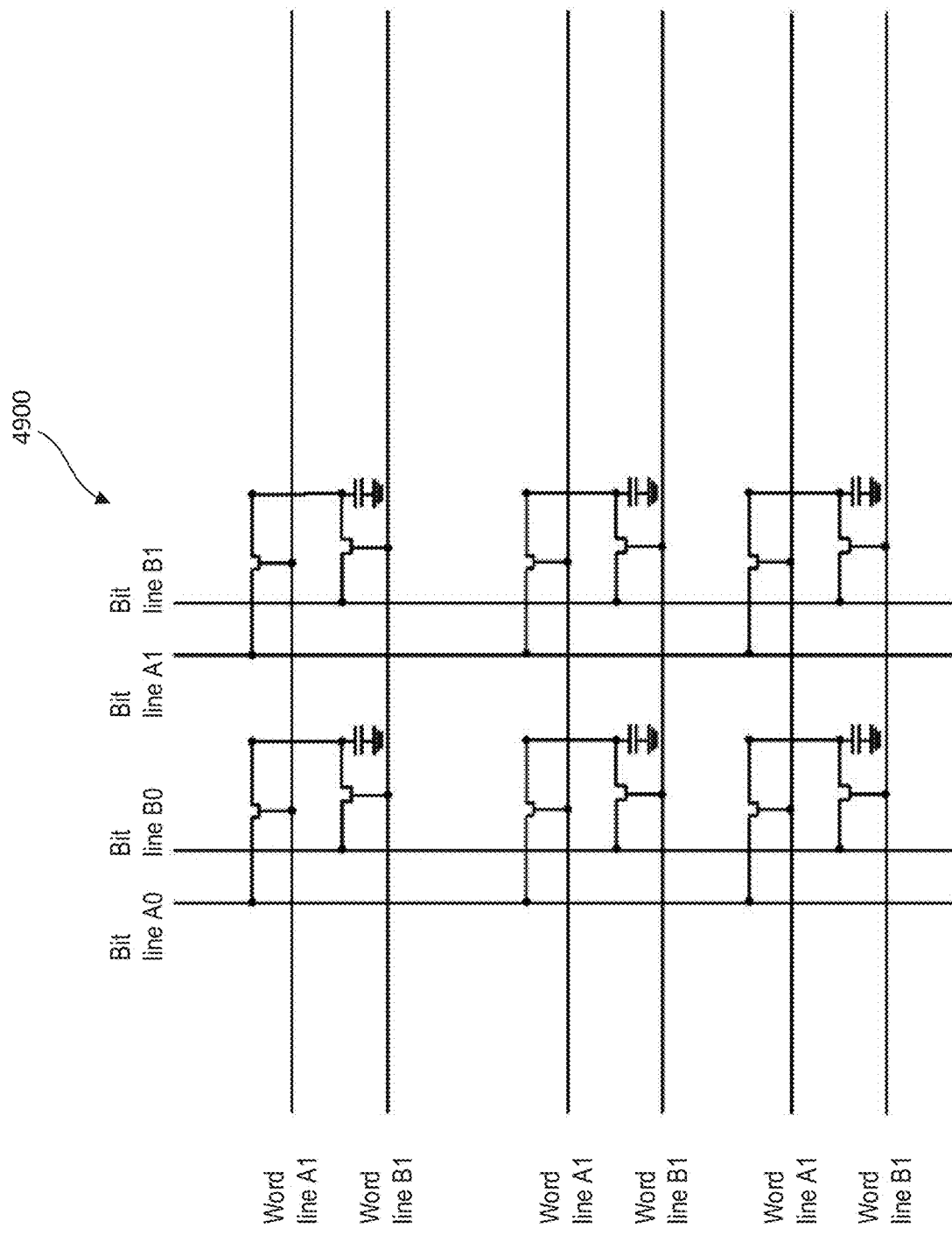
FIG. 49 shows an example of switching elements for dual-port access within a memory mat, consistent with the present disclosure.

The architecture of FIG. 48 may be used with modified memory mats forming the memory banks as shown in FIG. 49. In FIG. 49, each memory cell (depicted as a capacitor similar to DRAM but may also comprise a number of transistors arranged in a manner similar to SRAM or any other memory cell) is accessed by two word lines and by two bit lines. Accordingly, memory mat 4900 of FIG. 49 allows for access of two different bits simultaneously or even access to a same bit by two different logic circuits. However, the embodiment of FIG. 49 uses a modification to the memory mats rather than implementing a dual-port solution on standard DRAM memory mats, which are wired for single-port access, as the embodiments above do.

Although described with two ports, any of the embodiments described above may be extended to more than two ports. For example, the embodiments of FIGS. 42, 46, 48, and 49 may include additional column or row multiplexers, respectively, to provide access to additional columns or rows, respectively, during a single clock cycle. As another example, the embodiments of FIGS. 43 and 44 may include additional row decoders and/or column multiplexers to provide access to additional rows or columns, respectively, during a single clock cycle.

Variable Word Length Access in Memory

As used above and further below, the term "coupled" may include directly connected, indirectly connected, in electrically communication with, and the like.

Moreover, terms like "first," "second," and the like are used to distinguish between elements or method steps having a same or similar name or title and do not necessarily indicate a spatial or temporal order.

Typically, a memory chip may include memory banks. The memory banks may be coupled to a row decoder and a column decoder configured to choose a specific word (or other fixed size data unit) to be read or written. Each memory bank may include memory cells to store the data units, sense amplifiers to amplify voltages from the memory cells selected by the row and column decoders, and any other appropriate circuits.

Each memory bank usually has a specific I/O width. For example, the I/O width may comprise a word.

While some processes executed by logic circuits using the memory chip may benefit from using very long words, some other processes may require only a part of the word.

Indeed, in-memory computing units (such as processor subunits disposed on the same substrate as the memory chip, e.g., as depicted and described in FIG. 7A) frequently perform memory access operations that require only a part of the word.

To reduce latency associated with accessing an entire word when only a portion is used, embodiments of the present disclosure may provide a method and a system for fetching only one or more parts of a word, thereby reducing data losses associated with transferring unneeded parts of the word and allowing power saving in a memory device.

Furthermore, embodiments of the present disclosure may also reduce power consumption in the interaction between the memory chip and other entities (such as logic circuits, whether separate like CPUs and GPUs or included on the same substrate as the memory chip, such as the processor subunits depicted and described in FIG. 7A) that access the memory chip, which may receive or write only a part of the word.

A memory access command (e.g., from a logic circuit using the memory) may include an address in the memory. For example, the address may include a row address and a column address or may be translated to a row address and a column address, e.g., by a memory controller of the memory.

In many volatile memories, such as DRAMs, the row address is sent (e.g., directly by the logic circuit or using the memory controller) to the row decoder, which activates the entire row (also called the word line) and loads all of the bitlines included in the row.

The column address identifies the bitline(s) on the activated row that are transferred outside a memory bank including the bitline(s) and to next level circuitry. For example, the next level circuitry may comprise an I/O bus of the memory chip. In embodiments using in-memory processing, the next level circuitry may comprise a processor subunit of the memory chip (e.g., as depicted in FIG. 7A).

Accordingly, the memory chip described below may be included in or otherwise comprise the memory chip as illustrated in any one of FIG. 3A, 3B, 4-6, 7A-7D, 11-13, 16-19, 22, or 23.

The memory chip may be manufactured by a first manufacturing process optimized for memory cells rather than logic cells. For example, the memory cells manufactured by the first manufacturing process may exhibit a critical dimension that is smaller (for example, by a factor that exceeds 2, 3, 4, 5, 6, 7, 8, 9, 10, and the like), than the critical dimension of a logic circuit manufactured by the first manufacturing process. For example, the first manufacturing process may comprise an analog manufacturing process, a DRAM manufacturing process, and the like.

Such a memory chip may comprise an integrated circuit that may include a memory unit. The memory unit may include memory cells, an output port, and read circuitry. In some embodiments, the memory unit may further include a processing unit, such as a processor subunit as described above.

For example, the read circuitry may include a reduction unit and a first group of memory read paths for outputting up to a first number of bits through the output port. The output port may connect to an off-chip logic circuit (such as an accelerator, CPU, GPU, or the like) or to an on-chip processor subunit, as described above.

In some embodiments, the processing unit may include the reduction unit, may be a part of the reduction unit, may differ from the reduction unit, or may otherwise comprise the reduction unit.

An in-memory read path may be included in the integrated circuit (for example, may in the memory unit) and may include any circuit and/or link configured for reading from and/or writing to a memory cell. For example, the in-memory read path may include a sense amplifier, a conductor coupled to the memory cell, a multiplexer, and the like.

The processing unit may be configured to send to the memory unit a read request for reading a second number of bits from the memory unit. Additionally or alternatively, the read request may originate from an off-chip logic circuit (such as an accelerator, CPU, GPU, or the like).

The reduction unit may be configured to assist in reducing power consumption related to an access request, e.g., by using any of the partial word accesses described herein.

The reduction unit may be configured to control the memory read paths, during a read operation triggered by the read request, based on the first number of bits and the second number of bits. For example, the control signal from the reduction unit may affect the memory consumption of the read paths to reduce energy consumption of memory read paths not relevant to the requested second number of bits. For example, the reduction unit may be configured to control irrelevant memory read paths when the second number is smaller than the first number.

As explained above, the integrated circuit may be included in, may include, or otherwise comprise a memory chip as illustrated in any one of FIG. 3A, 3B, 4-6, 7A-7D, 11-13, 16-19, 22, or 23.

The irrelevant in-memory read paths may be associated with irrelevant bits of the first number of bits, such as bits of the first number of bits not included in the second number of bits.

Figure 50:
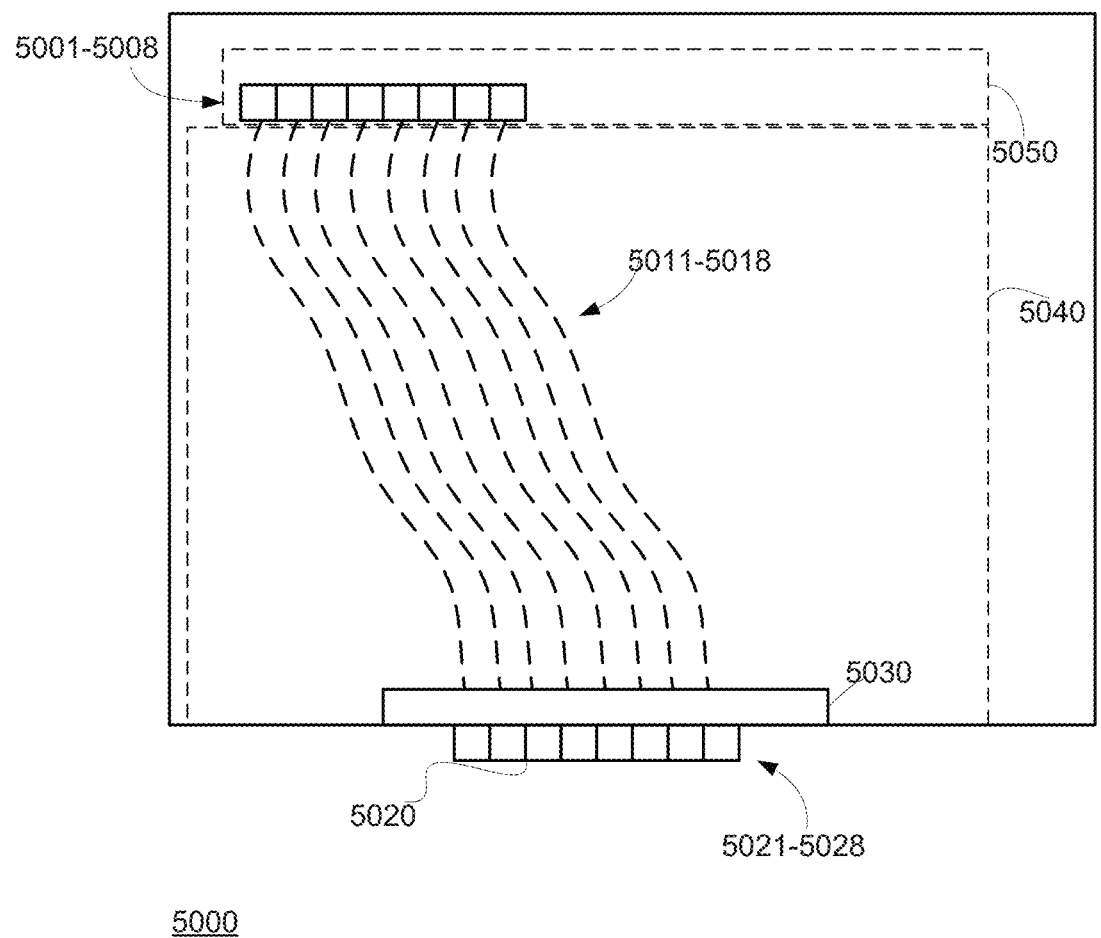
FIG. 50 illustrates an example integrated circuit with a reduction unit configured to access partial words, consistent with the present disclosure.

FIG. 50 illustrates an example integrated circuit 5000 including memory cells 5001-5008 of an array 5050 of memory cells, an output port 5020 that includes bits 5021-5028, read circuitry 5040 that includes memory read paths 5011-5018, and reduction unit 5030.

When a second number of bits are read using corresponding memory read paths, the irrelevant bits of the first number of bits may correspond to bits that should not be read (e.g., bits that are not included in the second number of bits).

During the read operation, the reduction unit 5030 may be configured to activate memory read paths corresponding to the second number of bits such that the activated memory read paths may be configured to convey the second number of bits. In such embodiments, only the memory read paths corresponding to the second number of bits may be activated.

During the read operation, the reduction unit 5030 may be configured to shut down at least a portion of each irrelevant memory read paths. For example, the irrelevant memory read paths may corresponding to the irrelevant bits of the first number of bits.

It should be noted that instead of shutting down at least one portion of an irrelevant memory path, the reduction unit 5030 may instead insure that the irrelevant memory path is not activated.

Additionally or alternatively, during the read operation, the reduction unit 5030 may be configured to maintain the irrelevant memory read paths in a low power mode. For example, a low power mode may comprise a mode in which the irrelevant memory paths are supplied with voltage or current lower than a normal operating voltage or current, respectively.

The reduction unit 5030 may be further configured to control bitlines of the irrelevant memory read paths.

Accordingly, the reduction unit 5030 may be configured to load bitlines of relevant memory read paths and maintain bitlines of the irrelevant memory read paths in the low power mode. For example, only the bitlines of the relevant memory read paths may be loaded.

Additionally or alternatively, the reduction unit 5030 may be configured to load bitlines of the relevant memory read paths while maintaining bitlines of the irrelevant memory read paths deactivated.

In some embodiments, the reduction unit 5030 may be configured to utilize portions of the relevant memory read paths during the read operation and to maintain in the low power mode a portion of each irrelevant memory read path, wherein the portion differs from a bitline.

As explained above, memory chips may use sense amplifiers to amplify voltages from memory cells included therein. Accordingly, the reduction unit 5030 may be configured to utilize portions of the relevant memory read paths during the read operation and to maintain in the low power mode a sense amplifier associated with at least some of the irrelevant memory read paths.

In such embodiments, the reduction unit 5030 may be configured to utilize portions of the relevant memory read paths during the read operation and to maintain in the low power mode one or more sense amplifiers associated with all of the irrelevant memory read paths.

Additionally or alternatively, the reduction unit 5030 may be configured to utilize portions of the relevant memory read paths during the read operation and to maintain in the low power mode portions of the irrelevant memory read paths that follow (e.g., spatially and/or temporally) one or more sense amplifiers associated with the irrelevant memory read paths.

In any of the embodiments described above, the memory unit may include a column multiplexer (not shown).

In such embodiments, the reduction unit 5030 may be coupled between the column multiplexer and the output port.

Additionally or alternatively, the reduction unit 5030 may be embedded in the column multiplexer.

Additionally or alternatively, the reduction unit 5030 may be coupled between the memory cells and the column multiplexer.

The reduction unit 5030 may comprise reduction subunits that may be independently controllable. For example, different reduction subunits may be associated with different memory unit columns.

Although described above with respect to read operations and read circuitry, and of the embodiments above may similarly be applied for write operations and write circuitry.

For example, an integrated circuit according to the present disclosure may include a memory unit comprising memory cells, an output port, and write circuitry. In some embodiments, the memory unit may further include a processing unit, such as a processor subunit as described above. The write circuitry may include a reduction unit and a first group of memory write paths for outputting up to a first number of bits through the output port. The processing unit may be configured to send to the memory unit a write request for writing a second number of bits from the memory unit. Additionally or alternatively, the write request may originate from an off-chip logic circuit (such as an accelerator, CPU, GPU, or the like). The reduction unit 5030 may be configured to control the memory write paths, during a write operation triggered by the write request, based on the first number of bits and the second number of bits.

Figure 51:
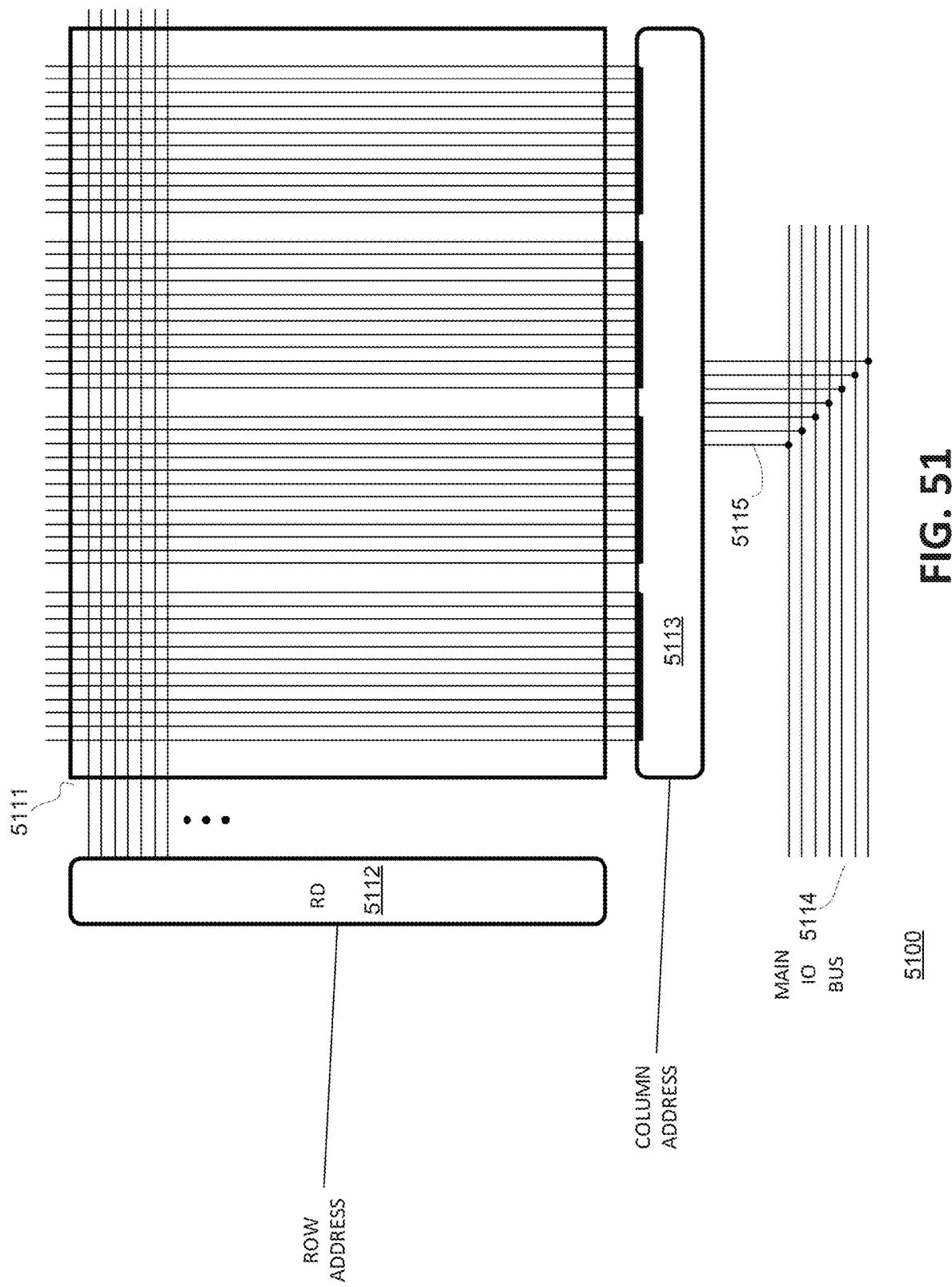
FIG. 51 illustrates a memory bank for using a reduction unit as described for FIG. 50.

FIG. 51 illustrates a memory bank 5100 that include an array 5111 of memory cells that are addressed using row and column addresses (e.g., from an on-chip processor subunit or an off-chip logic circuit, such as an accelerator, CPU, GPU, or the like). As shown in FIG. 51, the memory cells are fed to bitlines (vertical) and word lines (horizontal—many omitted for simplicity). Moreover, row decoder 5112 may be fed with a row address (e.g., from the on-chip processor subunit, the off-chip logic circuit, or a memory controller not shown in FIG. 51), column multiplexer 5113 may be fed with a column address (e.g., from the on-chip processor subunit, the off-chip logic circuit, or a memory controller not shown in FIG. 51), and column multiplexer 5113 may receive outputs from up to an entire line and output up to a word over output bus 5115. In FIG. 51, the output bus 5115 of the column multiplexer 5113 is coupled to a main I/O bus 5114. In other embodiments, the output bus 5115 may be coupled to a processor subunit of the memory chip (e.g., as depicted in FIG. 7A) sending the row and column addresses. The division of the memory bank into memory mats is not shown for simplicity.

Figure 52:
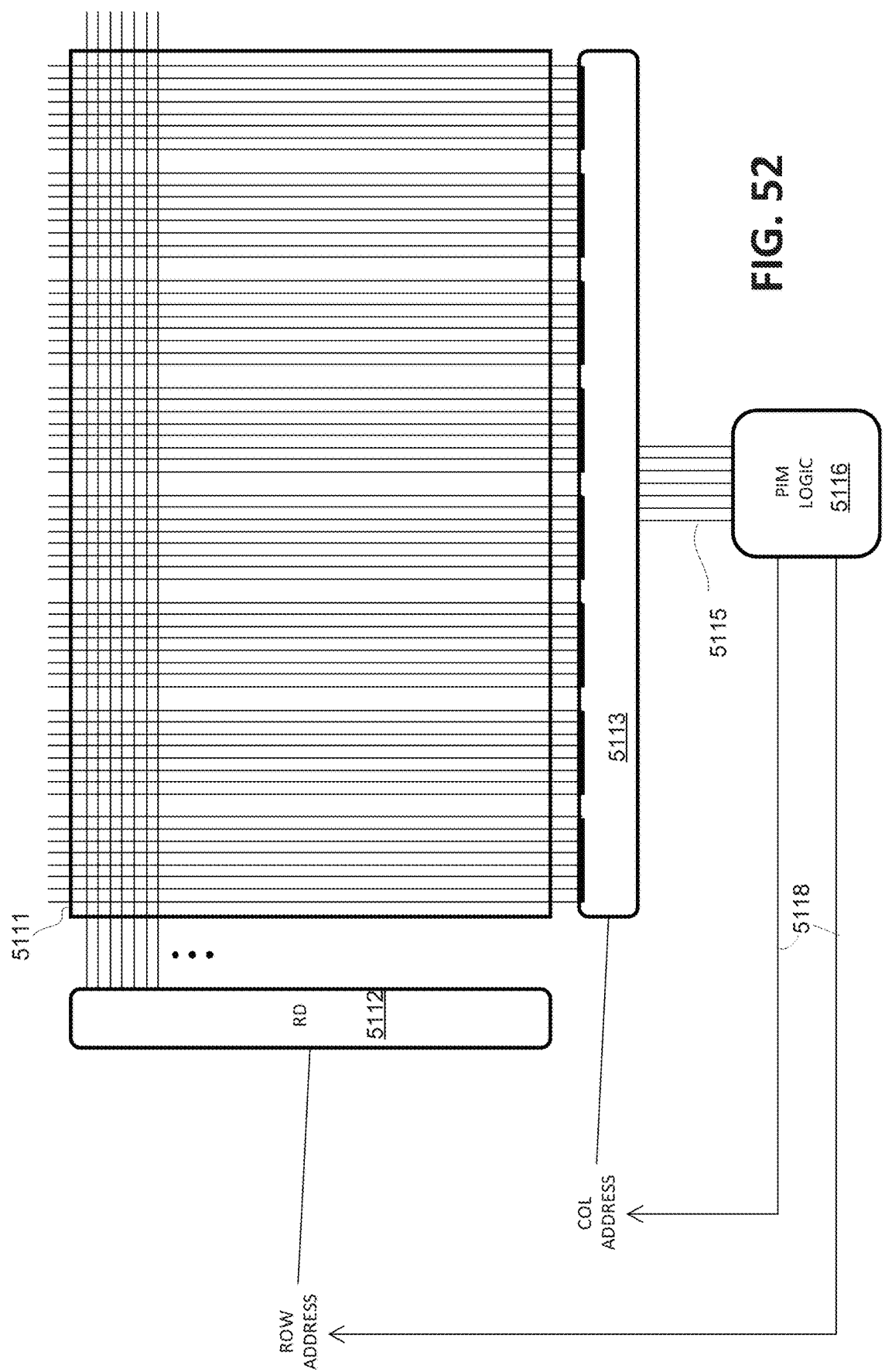
FIG. 52 illustrates a memory bank using a reduction unit integrated into PIM logic, consistent with the present disclosure.

FIG. 52 illustrates a memory bank 5101. In FIG. 52, the memory bank is also illustrated as including a PIM (processing in memory) logic 5116 that has inputs coupled to output bus 5115. PIM logic 5116 may generate addresses (e.g., comprising row addresses and column addresses) and output the addresses via PIM address buses 5118 to access the memory bank. PIM logic 5116 is an example of a reduction unit (e.g., unit 5030) that also comprises a processing unit. The PIM logic 5016 may control other circuits not shown in FIG. 52 that assist in the reduction of power. PIM logic 5116 may further control the memory paths of a memory unit including memory bank 5101.

As explained above, the word length (e.g., the number of bitlines chosen to be transferred at a time) may be large in some cases.

In those cases, each word for reading and/or writing may be associated with a memory path that may consume power at various stages of the reading and/or writing operation, for example:

a. loading the bitline—to avoid loading the bitline to the needed value (either from a capacitor on the bitline in a read cycle or to the new value to be written to the capacitor in a write cycle), there is a need to disable a sense amplifier located at the end of the memory array and make sure the capacitor holding the data is not discharged or charged (otherwise the data stored thereon would be destructed); and b. moving the data from the sense amplifier through a column multiplexer that chooses the bitlines and to the rest of the chip (either to the I/O bus that transfers data in and out of the chip or to the embedded logic, such as a processor subunit on the same substrate as the memory, that would use the data).

To achieve power saving, integrated circuits of the present disclosure may determine, at row activation time, that some parts of a word are irrelevant and then send a disable signal to one or more sense amplifier for the irrelevant parts of the word.

Figure 53:
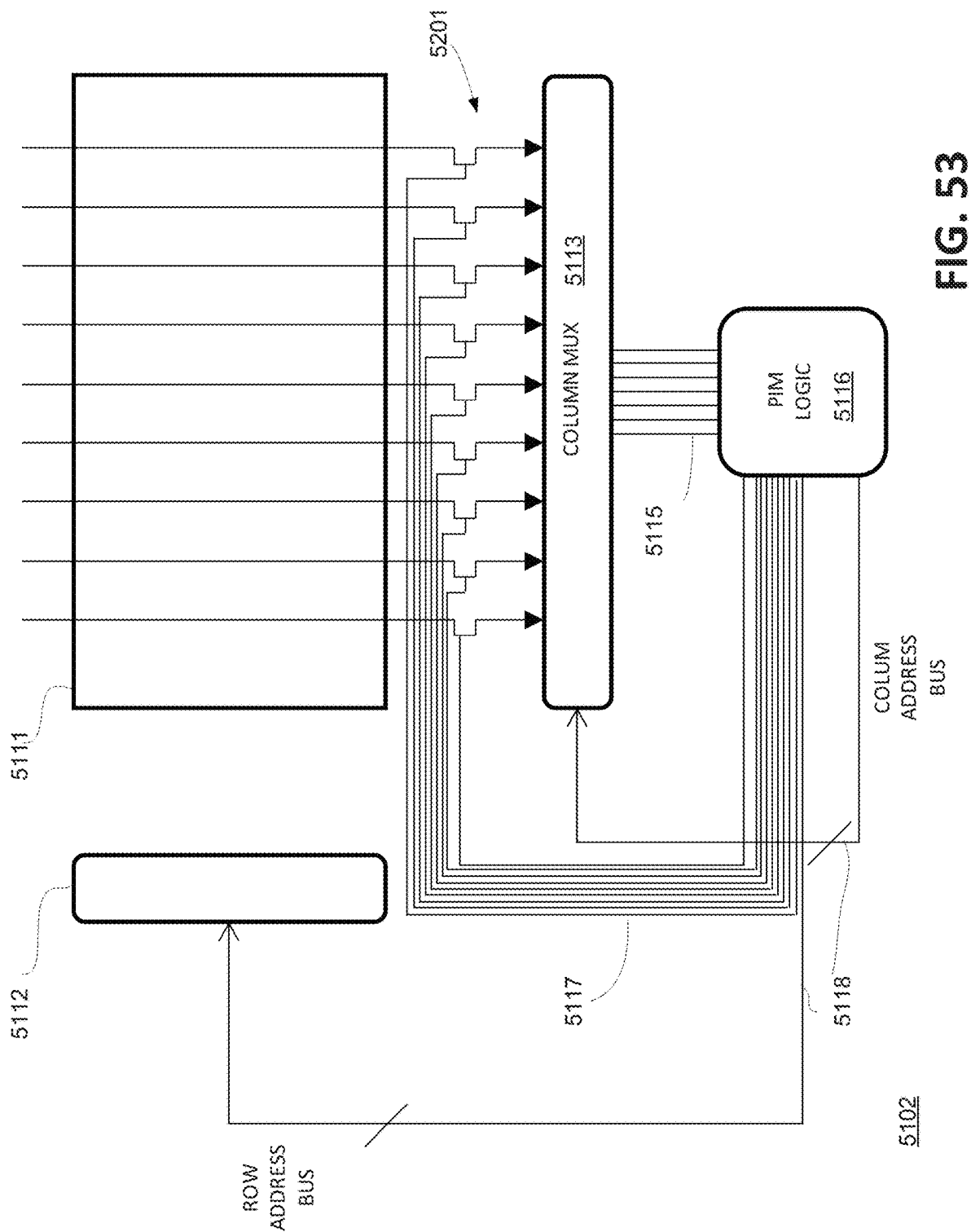
FIG. 53 illustrates a memory bank using a PIM logic to activate switches for accessing partial words, consistent with the present disclosure.

FIG. 53 illustrates a memory unit 5102 that includes an array 5111 of memory cells, a row decoder 5112, a column multiplexer 5113 that is coupled to output bus 5115, and PIM logic 5116.

Memory unit 5102 also includes switches 5201 that enable or disable the passage of bits to the column multiplexer 5113. Switches 5201 may comprise analog switches, transistors configured to function as switches, or any other circuitry configured to control a supply or voltage and/or a flow of current to part of memory unit 5102. The sense amplifiers (not shown) may be located at the end of the memory cell array, e.g., before (spatially and/or temporally) switches 5201.

The switches 5201 may be controlled by enable signals sent over bus 5117 from PIM logic 5116. The switches are configured, when disconnected, to disconnect the sense amplifiers (not shown) of the memory unit 5102 and therefore not discharge or charge bitlines disconnected from the sense amplifiers.

Switches 5201 and PIM logic 5116 may form a reduction unit (e.g., reduction unit 5030).

In yet another example, PIM logic 5116 may send enable signals to the sense amplifiers (e.g., when the sense amplifiers have an enable input) instead of being sent to switches 5201.

The bitlines may additionally or alternatively be disconnected at other points, e.g., not at the end of the bitlines and after the sense amplifiers. For example—a bitline may be disconnected before entering the array 5111.

In these embodiments, power may also be saved on data transfer from the sense amplifiers and forwarding hardware (such as output bus 5115).

Other embodiments (that may save less power but may be easier to implement) focus on saving the power of the column multiplexer 5113 and transfer losses from the column multiplexer 5113 to a next level circuitry. For example, as explained above, the next level circuitry may comprise an I/O bus of the memory chip (such as bus 5115). In embodiments using in-memory processing, the next level circuitry may additionally or alternatively comprise a processor sub-unit of the memory chip (such as PIM logic 5116).

Figure 54A:
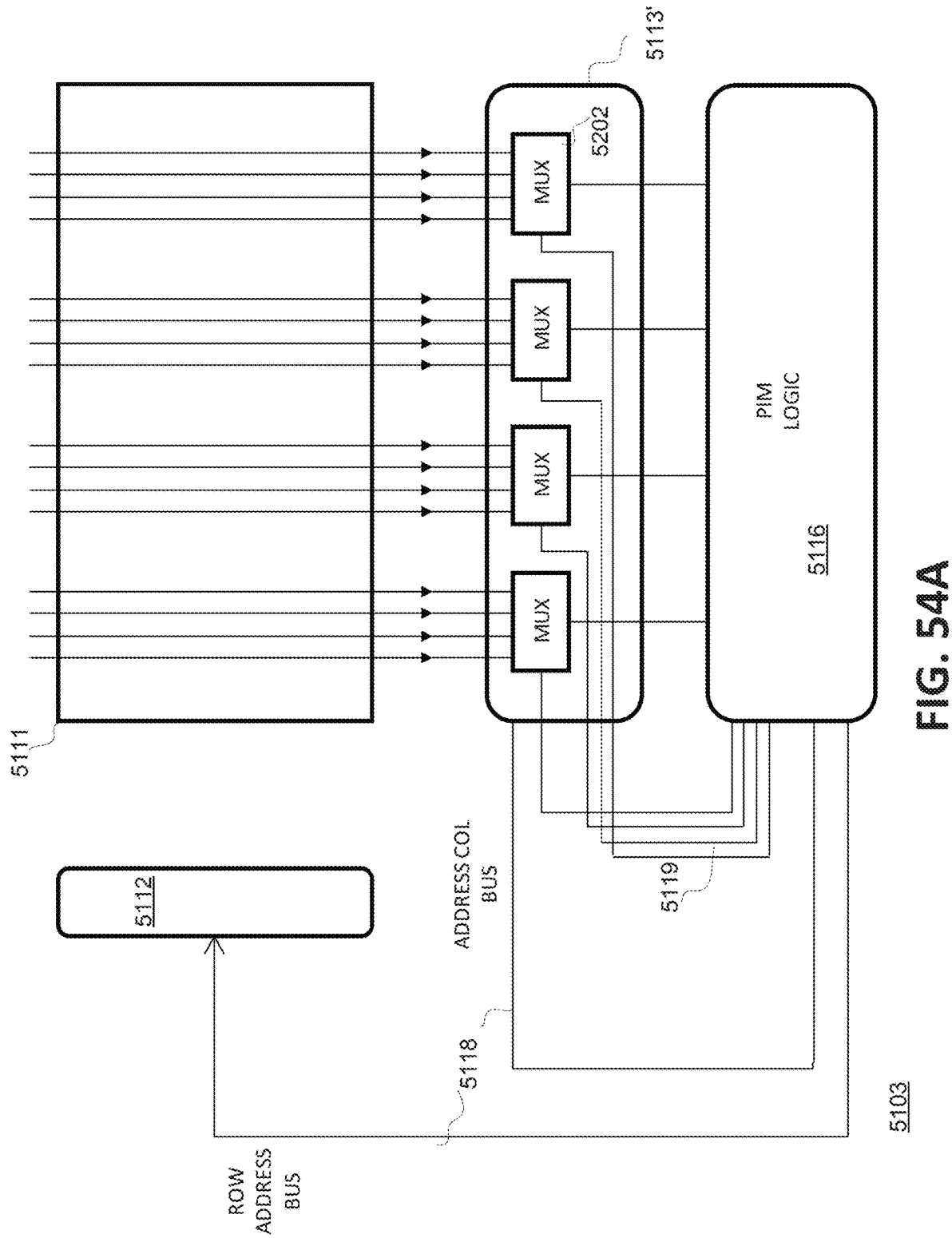
FIG. 54A illustrates a memory bank with segmented column multiplexes for deactivating to access partial words, consistent with the present disclosure.

FIG. 54A illustrates a column multiplexer 5113 segmented to segments 5202. Each segment 5202 of the column multiplexer 5113 may be individually enabled or disabled by enable and/or disable signals sent over bus 5119 from PIM logic 5116. Column multiplexer 5113 may also be fed by address columns bus 5118.

The embodiment of FIG. 54A may provide better control over different portions of the output from column multiplexer 5113.

It should be noted that the control of different memory paths may be of different resolutions, e.g., ranging from a bit resolution and to a resolution of multiple bits. The former may be more effective in sense of power savings. The latter may be simpler to implement and require fewer control signals.

Figure 54B:
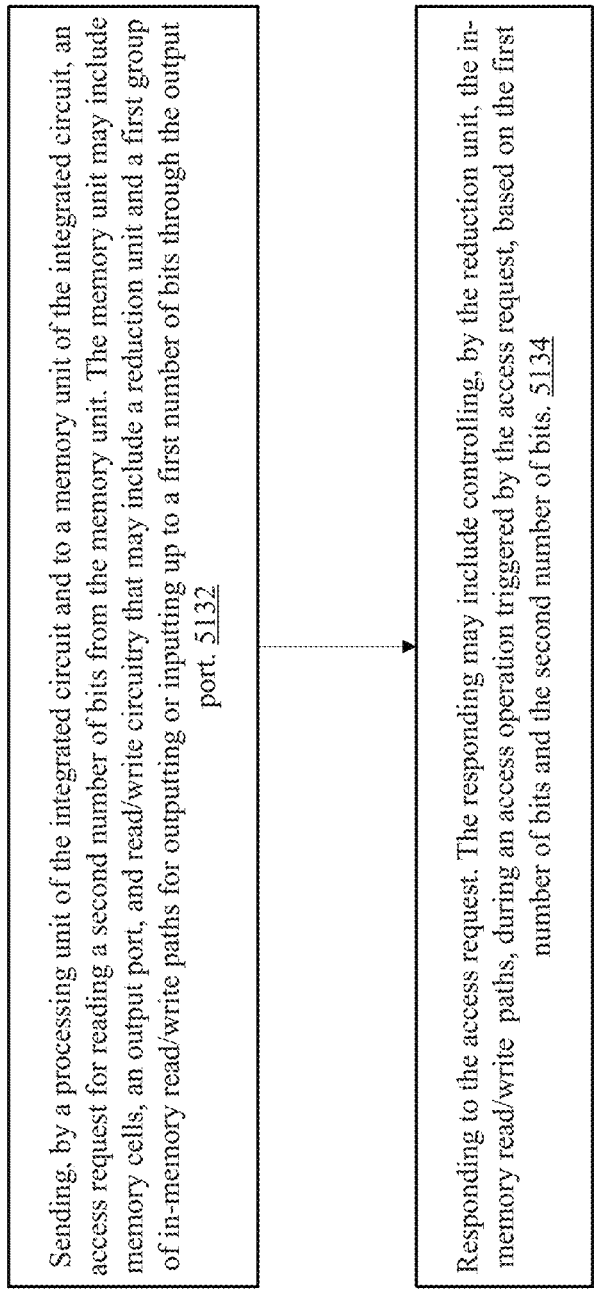
FIG. 54B is an example flowchart of a process for partial word access in a memory, consistent with the present disclosure.

FIG. 54B illustrates an example method 5130. For example, method 5130 may be implemented using any of the memory units described above with respect to FIG. 50, 51, 52, 53, or 54A.

Method 5130 may include steps 5132 and 5134.

Step 5132 may include sending, by a processing unit (e.g., PIM logic 5116) of the integrated circuit and to a memory unit of the integrated circuit, an access request for reading a second number of bits from the memory unit. The memory unit may include memory cells (e.g., memory cells of array 5111), an output port (e.g., output bus 5115), and read/write circuitry that may include a reduction unit (e.g., reduction unit 5030) and a first group of memory read/write paths for outputting and/or inputting up to a first number of bits through the output port.

An access request may comprise a read request and/or a write request.

A memory input/output path may comprise a memory read path, a memory write path, and/or a path used for both reading and writing.

Step 5134 may include responding to the access request.

For example, step 5134 may include controlling, by the reduction unit (e.g., unit 5030), the memory read/write paths, during an access operation triggered by the access request, based on the first number of bits and the second number of bits.

Step 5134 may further include any one of the following and/or any combination of any one of the following. Any of the listed below operations may be executed during the responding to the access request but may also be executed before and/or after responding to the access request.

Thus, step 5134 may include at least one of:

a. controlling irrelevant memory read paths when the second number is smaller than the first number, wherein the irrelevant memory read paths are associated with bits of the first number of bits not included in the second number of bits;
b. activating, during a read operation, relevant memory read paths, wherein the relevant memory read paths are configured to convey the second number of bits;
c. shutting down, during the read operation, at least a portion of each one of the irrelevant memory read paths;
d. maintaining, during the read operation, the irrelevant memory read paths in a low power mode;
e. controlling bitlines of the irrelevant memory read paths;
f. loading bitlines of the relevant memory read paths and maintaining bitlines of the irrelevant memory read paths in a low power mode;
g. loading bitlines of the relevant memory read paths, while maintaining bitlines of the irrelevant memory read paths deactivated;
h. utilizing portions of the relevant memory read paths during the read operation and maintaining in a low power mode a portion of each irrelevant memory read path, wherein the portion differs from a bitline;
i. utilizing portions of the relevant memory read paths during a read operation and maintaining in a low power mode a sense amplifier for at least some of the irrelevant memory read paths;
j. utilizing portions of the relevant memory read paths during a read operation and maintaining in a low power mode a sense amplifier of at least some of the irrelevant memory read paths; and
k. utilizing portions of the relevant memory read paths during a read operation and maintaining in a low power mode portions of the irrelevant memory read paths that follow sense amplifiers of the irrelevant memory read paths.

A low power mode or an idle mode may comprise a mode in which power consumption of a memory access path is lower than power consumption of the same when the memory access path is used for an access operation. In some embodiments, a low power mode may even involve shutting down the memory access path. A low power mode may additionally or alternatively include not activating the memory-access path.

It should be noted that power reductions that occur during the bitline phase may require that the relevancy or irrelevancy of the memory access paths should be known prior to opening the word line. Power reductions that occur elsewhere (for example, in the column multiplexer) may instead allow for deciding the relevancy or irrelevancy of the memory access paths on every access.

Fast and Low Power Activation and Fast Access Memory

DRAM and other memory types (such as SRAM, Flash, or the like) are often built from memory banks, which are usually built to allow for row and column access schemes.

Figure 55:
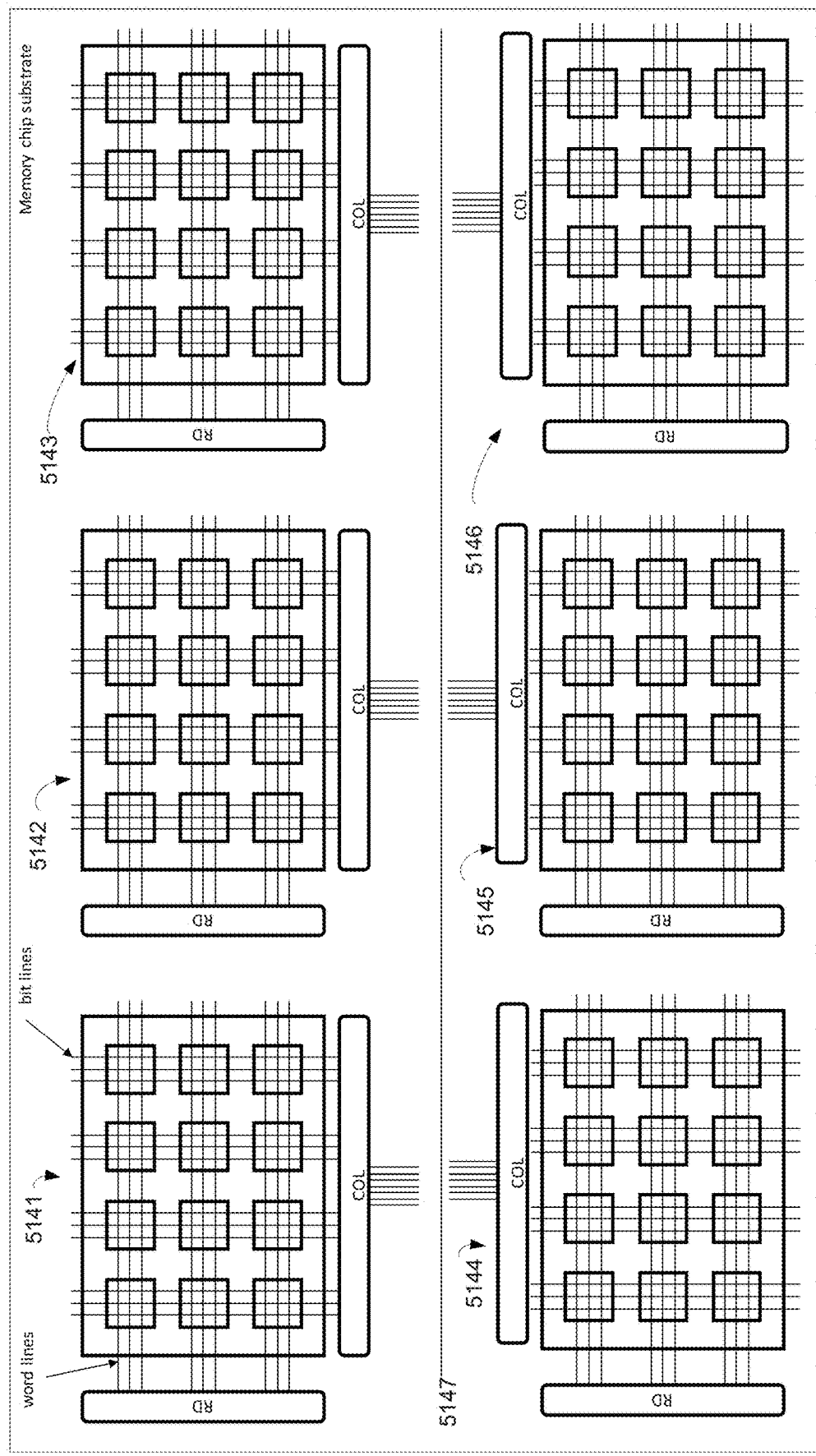
FIG. 55 illustrates an existing memory chip that includes multiple memory mats.

FIG. 55 illustrates an example of a memory chip 5140 that includes multiple memory mats and associated logic (such as row and column decoders—depicted as RD and COL in FIG. 55, respectively). In the example of FIG. 55, the mats are grouped into banks and have word lines and bitlines through them. The memory mats and associated logic are denoted 5141, 5142, 5143, 5144, 5145 and 5146 in FIG. 55 and share at least one bus 5147.

Memory chip 5140 may be included in, may include, or otherwise comprise a memory chip as illustrated in any one of FIG. 3A, 3B, 4-6, 7A-7D, 11-13, 16-19, 22, or 23.

In DRAM, for example, there is a lot overhead associated with activation of a new row (e.g., preparing a new line for access). Once a line is activated (also referred to as being opened), the data within that row may be available for much faster access. In DRAM, this access may occur in a random manner.

Two problems associated with activating a new line are power and time:

c. The power rises due to a rush of current caused by accessing all capacitors on the line together and having to load the line (e.g., the power can reach several Amperes when opening a line with just a few memory banks); and d. the time delay problem is mostly associated with the time it takes to load the row (word) line and then the bit (column) lines.

Some embodiments of the present disclosure may include a system and method to reduce peak power consumption during activation of a line and reduce activation time of the line. Some embodiments may sacrifice full random access within a line, at least to some extent, to reduce these power and time costs.

For example, in one embodiment, a memory unit may include a first memory mat, a second memory mat, and an activation unit configured to activate a first group of memory cells included in the first memory mat without activating a second group of memory cells included in the second memory mat. The first group of memory cells and the second group of memory cells may both belong to a single row of the memory unit.

Alternatively, the activation unit may be configured to activate the second group of memory cells included in the second memory mat without activating the first group of memory cells.

In some embodiments, the activation unit may be configured to activate the second group of memory cells after activation of the first group of memory cells.

For example, the activation unit may be configured to activate the second group of memory cells following expiration of a delay period initiated after activation of the first group of memory cells has been completed.

Additionally or alternatively, the activation unit may be configured to activate the second group of memory cells based on a value of a signal developed on a first word line segment coupled to the first group of memory cells.

In any of the embodiments described above, the activation unit may include an intermediate circuit disposed between a first word line segment and a second word line segment. In such embodiments, The first word line segment may be coupled to the first memory cells and the second word line segment may be coupled to the second memory cells. Non-limiting examples of intermediate circuits include switches, flip-flops, buffers, inverters, and the like—some of which are illustrated throughout FIGS. 56-61.

Figure 61:
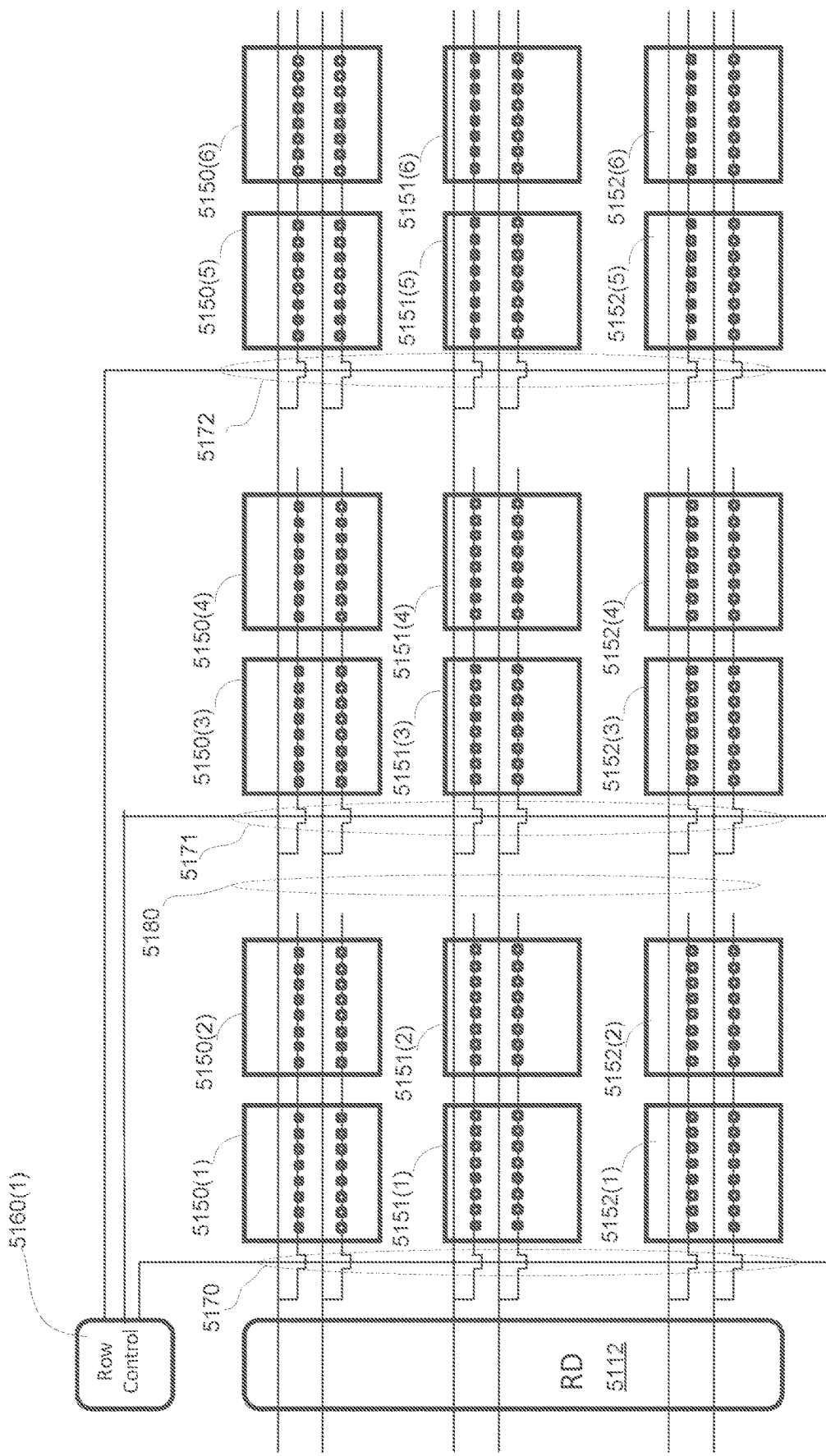
FIG. 61 illustrates another example memory chip with a global word line and local word lines for reducing power consumption during opening of a line, consistent with the present disclosure.

In some embodiments, the second memory cells may be coupled to a second word line segment. In such embodiments, the second word line segment may be coupled to a bypass word line path that passes through at least the first memory mat. An example of such bypass paths is illustrated in FIG. 61.

The activation unit may comprises a control unit configured to control a supply of voltage (and/or a flow of current) to the first group of memory cells and to the second group of memory cells based on an activation signal from a word line associated with the single row.

In another example embodiment, a memory unit may include a first memory mat, a second memory mat, and an activation unit configured to supply an activation signal to a first group of memory cells of the first memory mat and delay a supply of the activation signal to a second group of memory cells of the second memory mat at least until activation of the first group of memory cells has been completed. The first group of memory cells and the second group of memory cells may belong to a single row of the memory unit.

For example, the activation unit may include a delay unit that may be configured to delay the supply of the activation signal.

Additionally or alternatively, the activation unit may include a comparator that may be configured to receive the activation signal at an input of the comparator and to control the delay unit based on at least one characteristic of the activation signal.

In another example embodiment, a memory unit may include a first memory mat, a second memory mat, and an isolation unit configured to: isolate first memory cells of the first memory mat from second memory cells of the second memory mat during an initial activation period in which the first memory cells are activated; and couple the first memory cells to the second memory cells following the initial activation period. The first and second memory cells may belong to a single row of the memory unit.

In the following examples, no modifications to the memory mats themselves may be required. In certain examples, embodiments may rely on minor modifications to the memory bank.

The diagrams below depict a mechanism to shorten the word signal added to memory banks, thereby splitting a word line into a number of shorter portions.

In the following figures, various memory bank components were omitted for clarity.

FIGS. 56-61 illustrate portions (denoted 5140(1), 5140(2), 5140(3), 5140(4), 5140(5), and 5149(6), respectively) of memory banks that include row decoder 5112 and multiple memory mats (such as 5150(1), 5150(2), 5150(3), 5150(4), 5150(5), 5150(6), 5151(1), 5151(2), 5151(3), 5151(4), 5151

(5), 5151(6), 5152(1), 5152(2), 5152(3), 5152(4), 5152(5), and 5152(6)) that are grouped within different groups.

Memory mats that are arranged in a row may include different groups.

FIGS. 56-59 and 61 illustrates nine groups of memory mats, where each group includes a pair of memory mats. Any number of groups, each with any number of memory mats, may be used.

Memory mats 5150(1), 5150(2), 5150(3), 5150(4), 5150(5), and 5150(6) are arranged in a row, share multiple memory lines and are divided into three groups—a first upper group includes memory mats 5150(1) and 5150(2), a second upper group includes memory mats 5150(3) and 5150(4), and a third upper group includes memory mats 5150(5) and 5150(6).

Similarly, memory mats 5151(1), 5151(2), 5151(3), 5151(4), 5151(5), and 5151(6) are arranged in a row, share multiple memory lines and are divided into three groups—a first intermediate group includes memory mats 5151(1) and 5151(2), a second intermediate group includes memory mats 5151(3) and 5151(4), and a third intermediate group includes memory mats 5151(5) and 5151(6).

Moreover, memory mats 5152(1), 5152(2), 5152(3), 5152(4), 5152(5) and 5152(6) are arranged in a row, share multiple memory lines and are grouped to three groups—a first lower group includes memory mats 5152(1) and 5152(2), a second lower group includes memory mats 5152(3) and 5152(4), and a third lower group includes memory mats 5152(5) and 5152(6). Any number of memory mats may be arranged in a row and share memory lines and may be divided into any number of groups.

For example, the number of memory mats per group may be one, two, or may exceed two.

As explained above, an activation circuit may be configured to activate one group of memory mats without activating another group of memory mats that share the same memory lines—or at least are coupled to different memory line segments that have a same line address.

FIGS. 56-61 illustrates different examples of activation circuits. In some embodiments, at least a portion of the activation circuit (such as intermediate circuits) may be located between groups of memory mats to allow memory mats of one group to be activated while another group of memory mats of the same row is not activated.

Figure 56:
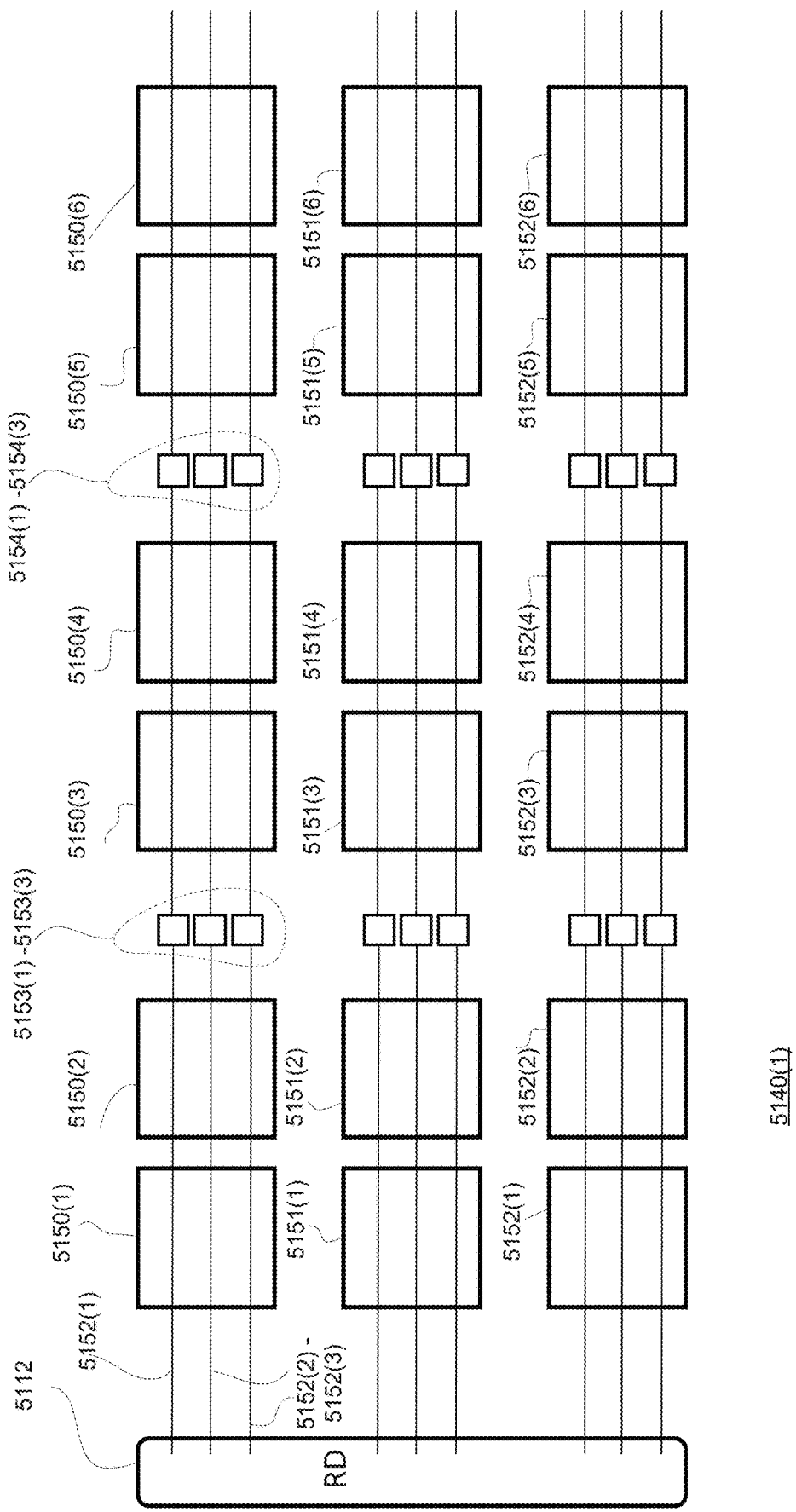
FIG. 56 illustrates an example memory chip with activation circuits for reducing power consumption during opening of a line, consistent with the present disclosure.

FIG. 56 illustrates intermediate circuits, such as delay or isolation circuits 5153(1)-5153(3), as positioned between different lines of the first upper group of memory and of the second upper group of memory mats.

FIG. 56 also illustrates intermediate circuits, such as delay or isolation circuits 5154(1)-5154(3), as positioned between different lines of second upper group of memory and of third upper group of memory mats. Additionally, some delay or isolation circuits are positioned between groups formed from memory mats of the intermediate groups. Moreover, some delay or isolation circuits are positioned between groups formed from memory mats of the lower groups.

The delay or isolation circuits may delay or stop a word line signal from the row decoder 5112 from propagating along a row to another group.

Figure 57:
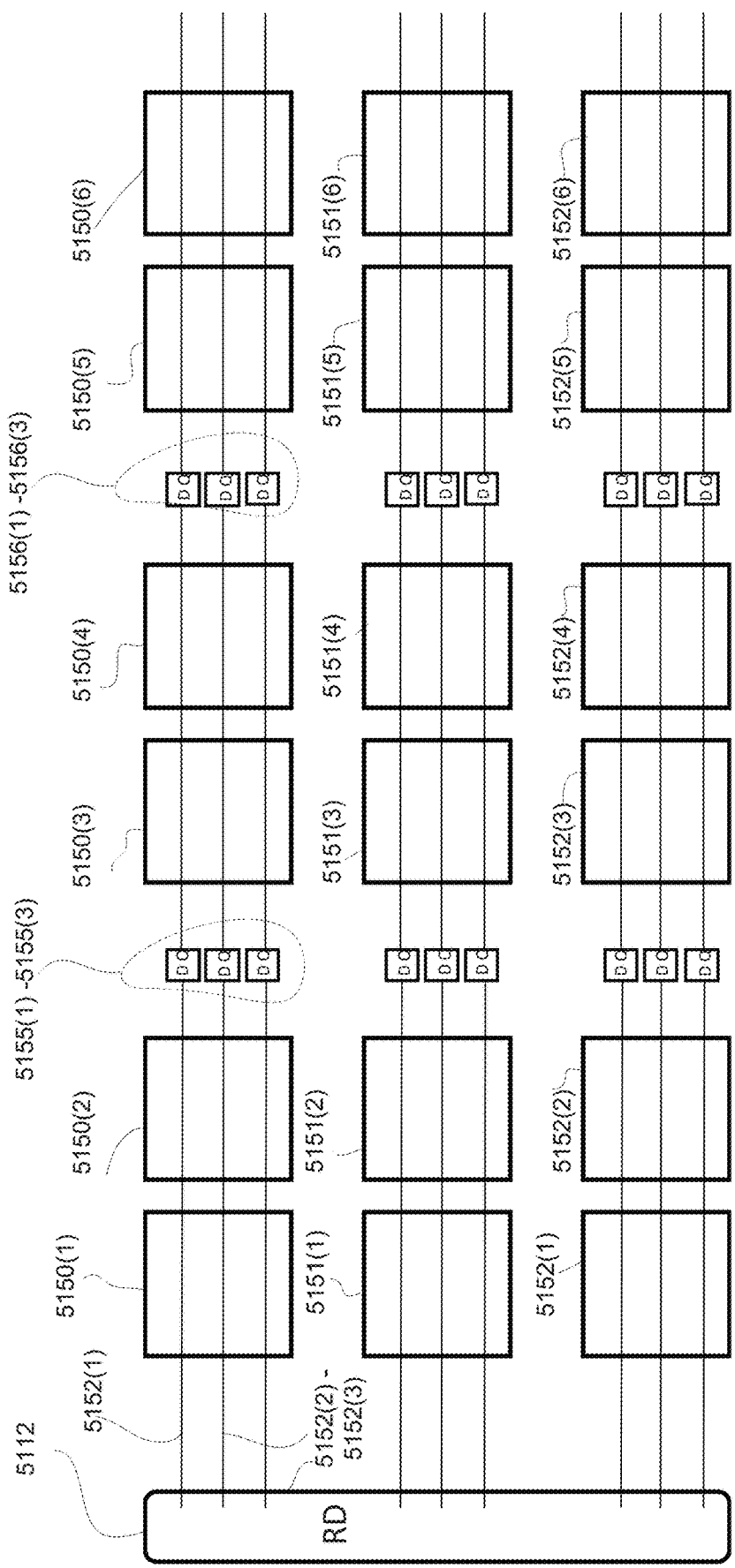
FIG. 57 illustrates another example memory chip with activation circuits for reducing power consumption during opening of a line, consistent with the present disclosure.

FIG. 57 illustrates intermediate circuits, such as delay or isolation circuits, that comprise flip-flops (such as 5155(1)-5155(3) and 5156(1)-5156(3)).

When an activation signal is injected to a word line, one of the first groups of mats (depending on the word line) is activated while the other groups along the word line remain deactivated. The other groups may be activated at the next clock cycle. For example, second groups of the other groups may be activated at the next clock cycle, and third groups of the other groups may be activated after yet another clock cycle.

The flipflops may comprise D-type flip-flops or any other type of flip-flop. The clock fed to the D-type flip-flop is omitted from the drawing for simplicity.

Thus, access to the first groups may use power to charge only the part of the word line associated with the first group, which is faster than charging the entire word line and requires less current.

More than one flip-flop may be used between groups of memory mats, thereby increasing the delay between opening parts. Additionally or alternatively, embodiments may use a slower clock to increase the delay.

Moreover, the groups that are activated may still contain groups from the previous line value that was used. For example, the method may allow activating a new line segment while still accessing data of the previous line, thereby reducing the penalty associated with activating a new line.

Accordingly, some embodiments may have a first group that is activated and allow other groups of the previously activated line to remain active with the signals of the bitlines not interfering with each other.

Additionally, some embodiments may include switches and a control signals. The control signals may be controlled by the bank controller or by adding flip-flops between control signals (e.g., generating the same timing effect that the mechanism described above had).

Figure 58:
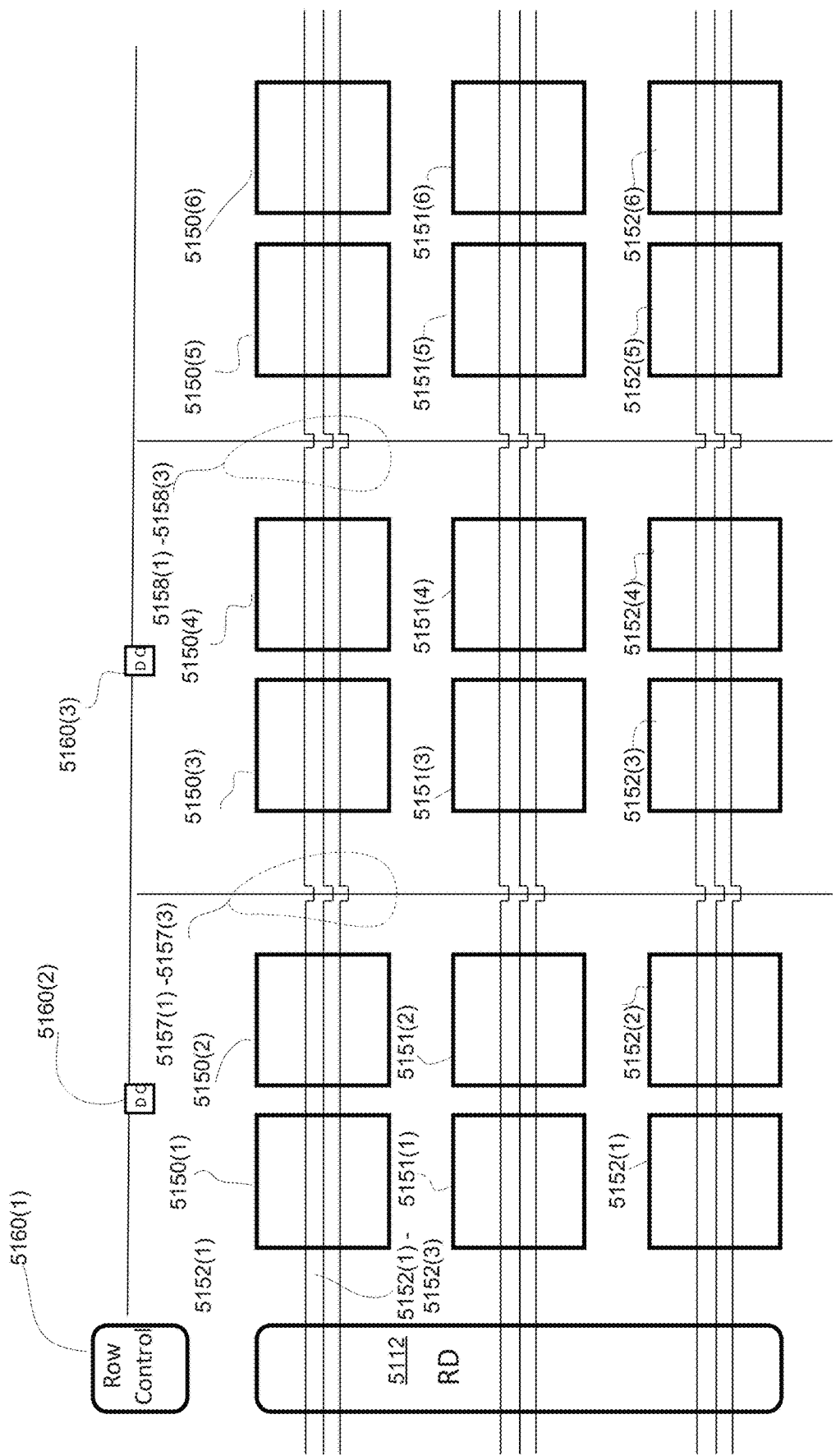
FIG. 58 illustrates yet another example memory chip with activation circuits for reducing power consumption during opening of a line, consistent with the present disclosure.

FIG. 58 illustrates intermediate circuits, such as delay or isolation circuits, that are switches (such as 5157(1)-5157(3) and 5158(1)-5158(3)) and positioned between one group of another. A set of switches positioned between groups may be controlled by a dedicated control signal. In FIG. 58 the control signal may be sent by a row control unit 5160(1) and delayed by a sequence of one or more delay units (e.g., units 5160(2) and 5160(3)) between different sets of switches.

Figure 59:
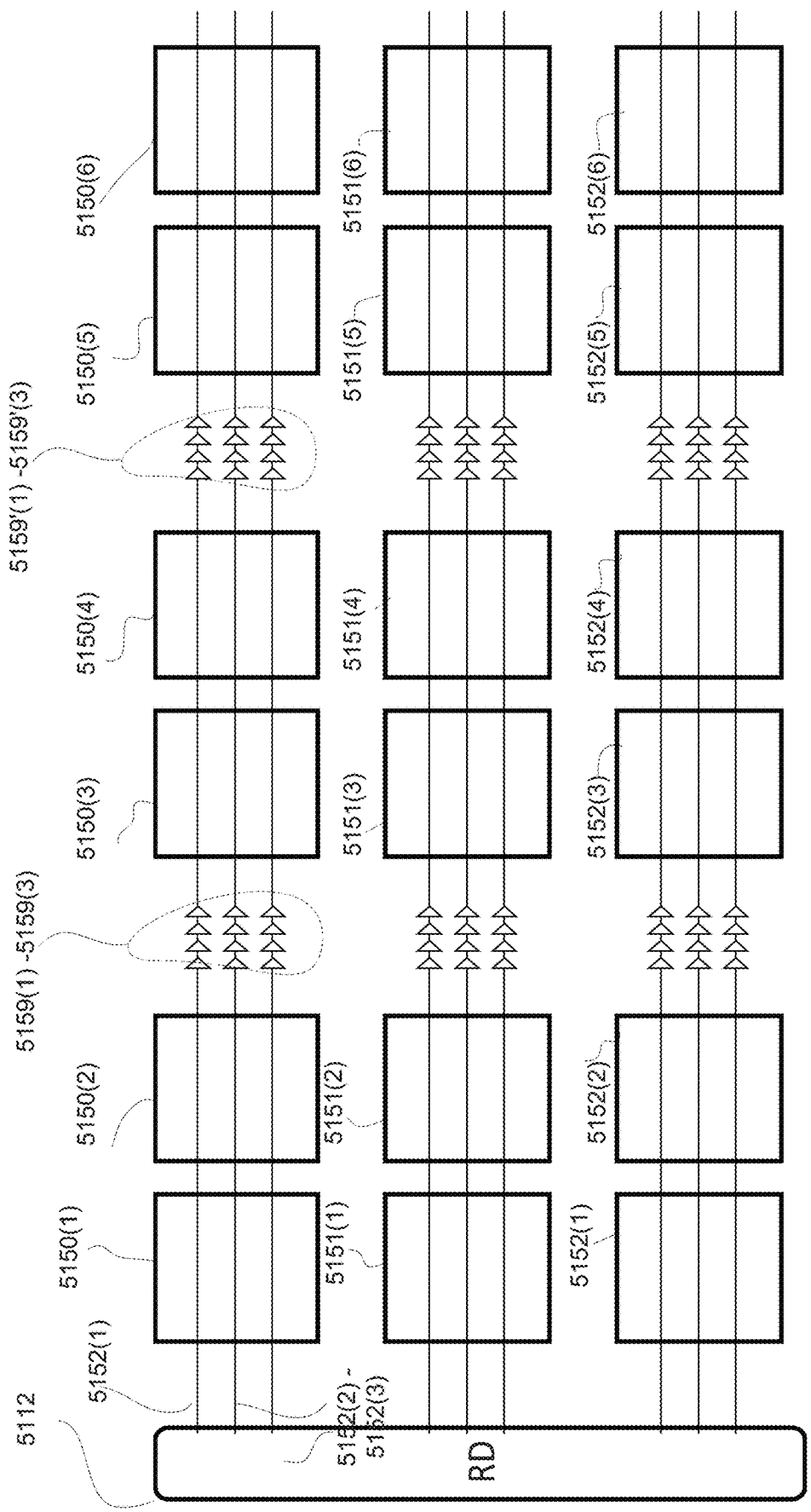
FIG. 59 illustrates an additional example memory chip with activation circuits for reducing power consumption during opening of a line, consistent with the present disclosure.

FIG. 59 illustrates intermediate circuits, such as delay or isolation circuits, that are sequences of inverter gates or buffers (such as 5159(1)-5159(3) and 5159'1(0-5159'(3)) and positioned between groups of memory mats.

Instead of switches, buffers may be used between groups of memory mats. Buffers may allow not dropping voltage along the word line from switch to switch, which is an effect that sometimes occurs when using the single transistor structure.

Other embodiments may allow for more random access and still provide very low activation power and time by using added area to the memory bank.

Figure 60:
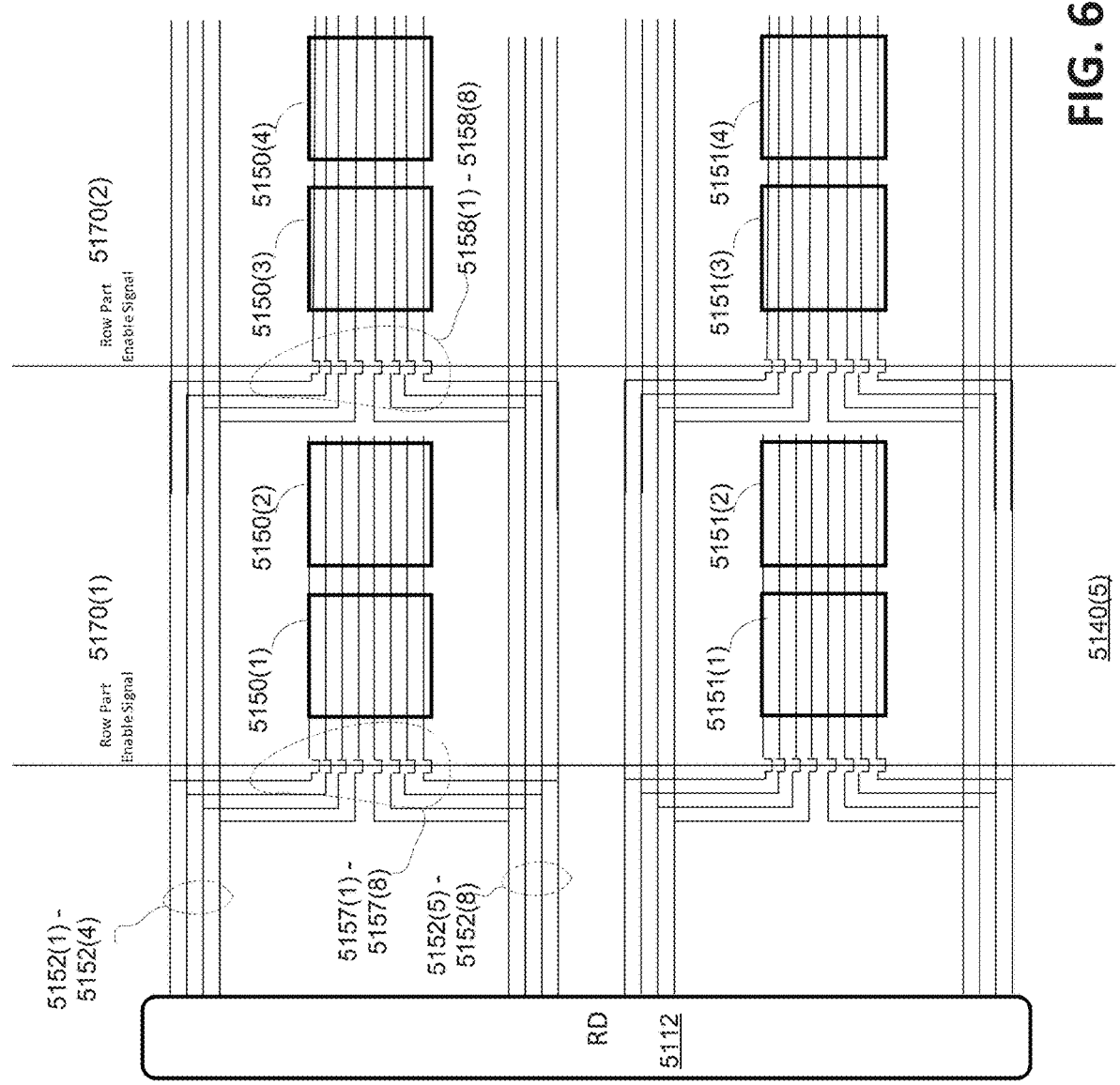
FIG. 60 illustrates an example memory chip with a global word line and local word lines for reducing power consumption during opening of a line, consistent with the present disclosure.

An example is shown in FIG. 60, which illustrates using global word lines (such as 5152(1)-5152(8)) positioned in proximity to the memory mats. These word lines may or may not pass through the memory mats and are coupled via intermediate circuits, such as switches (such as 5157(1)-5157(8)), to word lines within the memory mats. The switches may control which memory mat will be activated and allow a memory controller to activate, at each point of time, only the relevant line part. Unlike embodiments using a sequential activation of line portions described above, the example of FIG. 60 may provide greater control.

Enable signals, such as row part enable signals 5170(1) and 7150(2), may originate from logic, such as a memory controller, that is not shown.

FIG. 61 illustrates that the global word lines 5180 pass through the memory mats and form bypass paths for the word line signals, which may not need to be routed outside the mat. Accordingly, the embodiments shown in FIG. 61 may reduce the area of the memory bank at a cost of some memory density.

In FIG. 61, the global world line may pass uninterrupted through a memory mat and may not be connected to memory cells. A local word line segment may be controlled by one of the switches and connected to memory cells in the mat.

When the groups of memory mats provide a substantial partition of the word lines, the memory bank may virtually support full random access.

Another embodiment for slowing the spreading of the activation signal along a word line, that also may save some wiring and logic, uses switches and/or other buffering or isolating circuits between memory mats without using dedicated enable signals and dedicated lines for conveying the enable signals.

For example, a comparator may be used to control switches or other buffering or isolating circuits. The comparator may activate the switch or other buffering or isolating circuit when the level of signal on the word line segment monitored by the comparator reaches a certain level. For example, the certain level may indicate that the previous word line segment was fully loaded.

Figure 62:
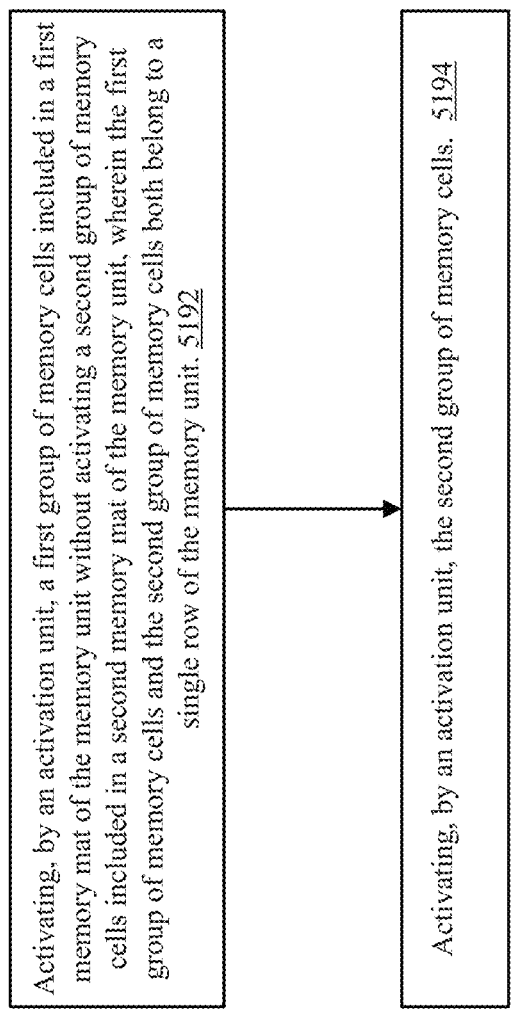
FIG. 62 is an example flowchart of a process for sequential opening of lines in a memory, consistent with the present disclosure.

FIG. 62 illustrates a method 5190 for operating a memory unit. For example, method 5130 may be implemented using any of the memory banks described above with respect to FIGS. 56-61.

Method 5190 may include steps 5192 and 5194.

Step 5192 may include activating, by an activation unit, a first group of memory cells included in a first memory mat of the memory unit without activating a second group of memory cells included in a second memory mat of the memory unit. The first group of memory cells and the second group of memory cells may both belong to a single row of the memory unit.

Step 5194 may include activating, by an activation unit, the second group of memory cells, e.g., after step 5192.

Step 5194 may be executed while the first group of memory cells are activated, after a full activation of the first group of memory cells, following expiration of a delay period initiated after activation of the first group of memory cells has been completed after the first group of memory cells are deactivated, and the like.

The delay period may be fixed or may be adjusted. For example, the duration of the delay period may be based on an expected access pattern of the memory unit or may be set regardless of the expected access pattern. The delay period may range between less than one millisecond and more than one second.

In some embodiments, step 5194 may be initiated based on a value of a signal developed on a first word line segment coupled to the first group of memory cells. For example, when a value of the signal exceeds a first threshold, it may indicate that the first group of memory cells are fully activated.

Either one of steps 5192 and 5194 may involve using an intermediate circuit (e.g., of the activation unit) disposed between a first word line segment and a second word line segment. The first word line segment may be coupled to the first memory cells and the second word line segment may be coupled to the second memory cells.

Examples of an intermediate circuit are illustrated throughout FIGS. 56-61.

Steps 5192 and 5194 may further include controlling, by a control unit, a supply to the first group of memory cells and to the second group of memory cells of an activation signal from a word line associated with the single row.

Using Memory Parallelism to Speedup Testing Times and Testing Logic in Memory Using Vectors Some embodiments of the present disclosure may speed up testing using in chip testing units.

Generally, memory chips testing requires significant testing time. Reducing testing time can reduce cost of production and also allow for more testing, leading to a more reliable product.

Figure 63:
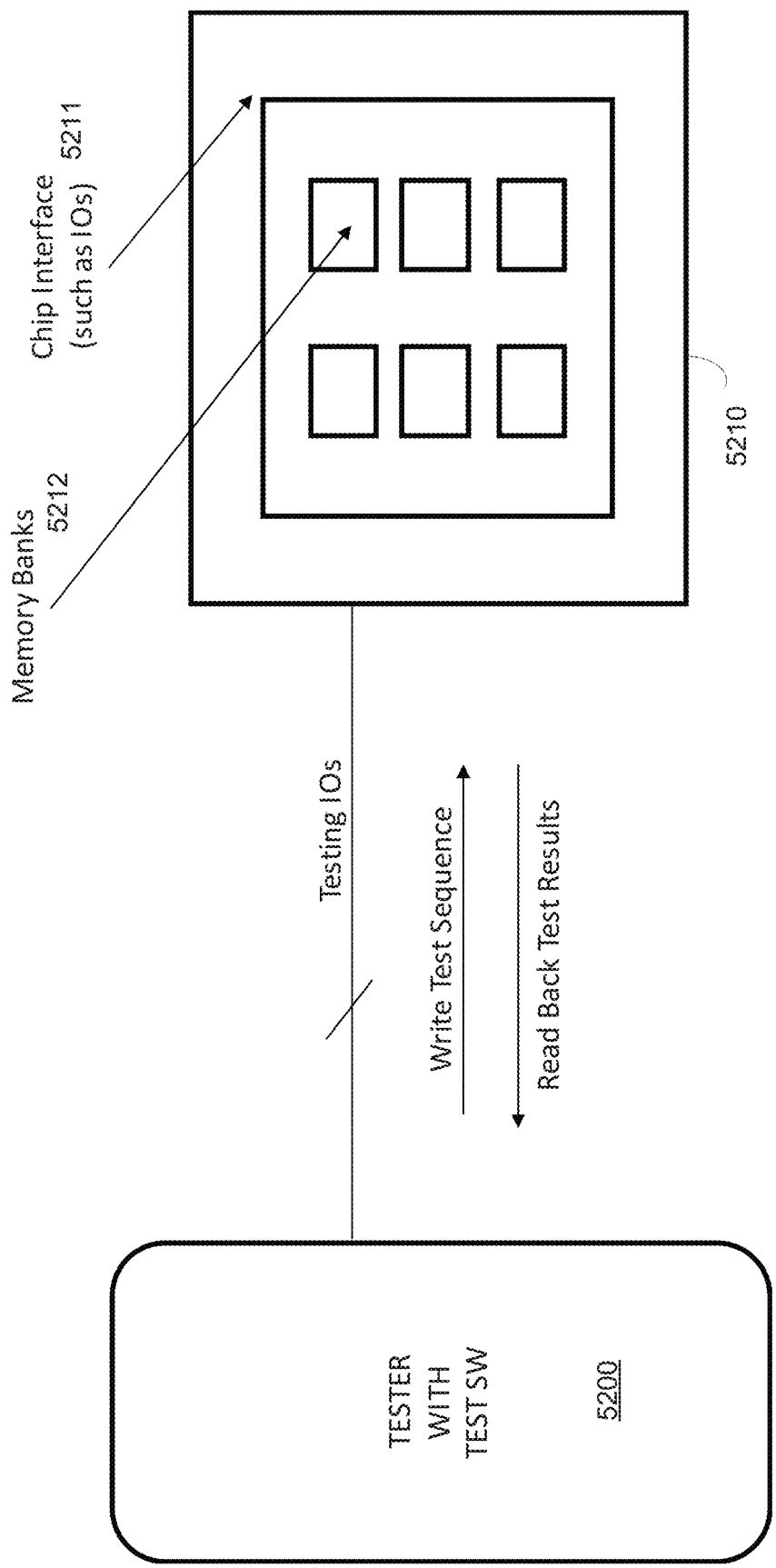
FIG. 63 illustrates an existing tester for memory chips.
Figure 64:
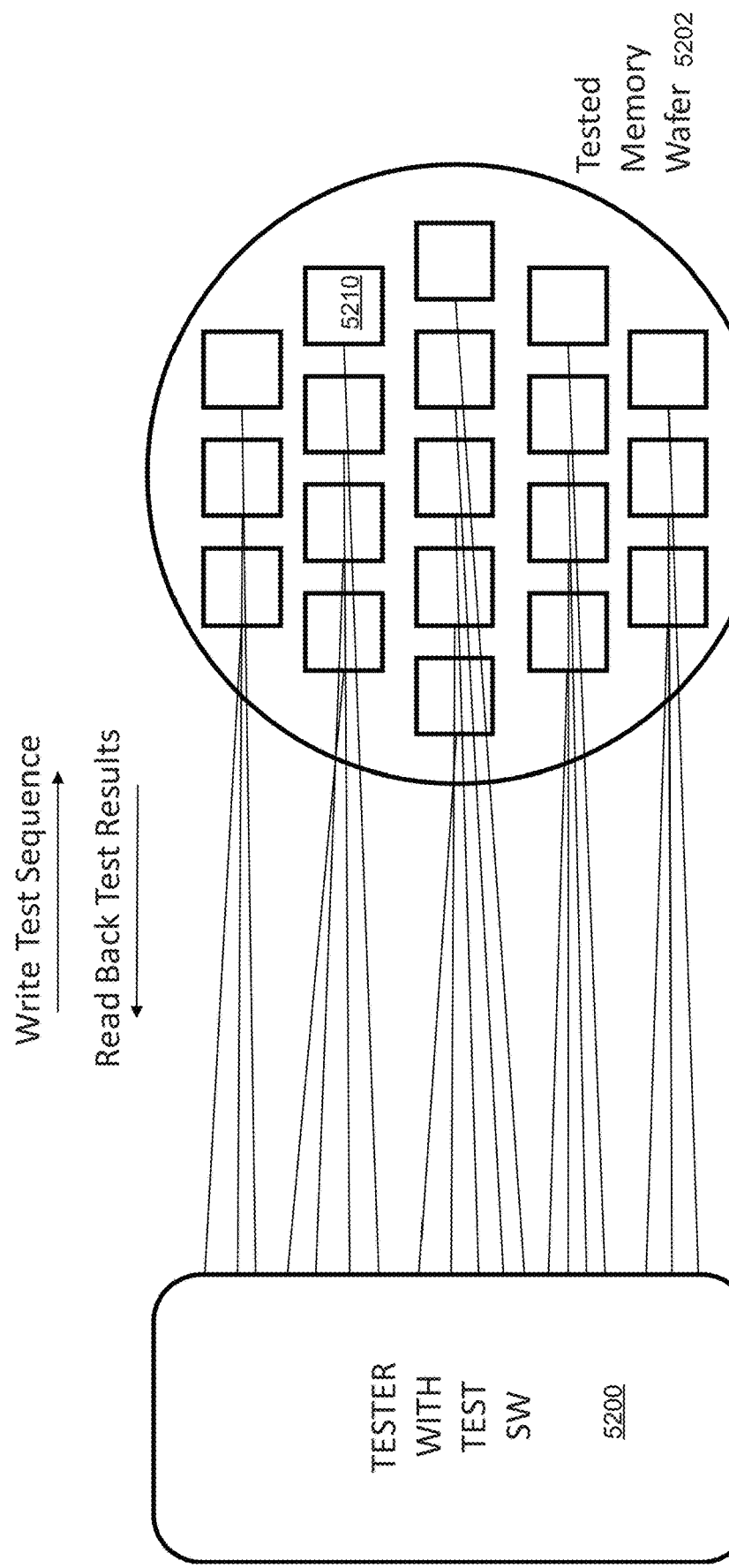
FIG. 64 illustrates another existing tester for memory chips.

FIGS. 63 and 64 illustrate a tester 5200 and a chip (or a wafer of chips) 5210. The tester 5200 may include software that manages the testing. The tester 5200 may run different sequences of data to all of memory 5210 and then read the sequences back to identify where failed bits of memory 5210 are located. Once recognized, the tester 5200 may issue a command to fix the bits, and if it was able to fix the problem, tester 5200 may declare memory 5210 as passed. In other cases, some chips may be declared as failed.

The tester 5200 may write test sequences and then read back the data to compare it to expected results.

FIG. 64 shows a test system with a tester 5200 and a full wafer 5202 of chips (such as 5210) being tested in parallel. For example, the tester 5200 may connect to each of the chips with a bus of wires.

As shown in FIG. 64, the tester 5200 has to read and write all of the memory chips a few times, and that data must be passed through the external chip interface.

Moreover, it may be beneficial to test both logic and memory banks of an integrated circuit, e.g., using programmable configuration information that may be provide using regular I/O operations.

The testing may also benefit from the presence of testing units within the integrated circuit.

The testing units may belong to the integrated circuit and may analyze a results of the test and find, for example, failures in logic (e.g., processor subunits as depicted in FIG. 7A and described) and/or memory (e.g., across a plurality of memory banks).

Memory testers are usually very simple and exchange test vectors with integrated circuits according to a simple format. For example, there may be write vectors that include pairs of addresses of memory entries to be written and the values to be written to the memory entries. There may also be a read vector that includes addresses of memory entries to be read. At least some of the addresses of the write vectors may be the same as at least some addresses of the read vectors. At least some other addresses of the write vectors may differ from at least some other addresses of the read vectors. When programmed, the memory testers may also receive an expected result vector that may include the addresses of memory entries to be read and the expected values to be read. The memory tester may compare the expected values to the values it reads.

According to an embodiment, the logic (e.g., processor subunits) of an integrated circuit (with or without the memory of the integrated circuit) may be tested by a memory tester using the same protocol/format. For example, some of the values in the write vector may be commands to be executed by the logic (and may, for example, involve calculations and/or memory access) of the integrated circuit. The memory tester may be programmed with the read vector and the expected result vector that may include memory entry addresses—at least some of which store expected values of the calculations. Thus, the memory tester may be used for testing the logic as well as the memory. Memory testers are usually much simpler and cheaper than logic testers, and the proposed methods allow for performing complex logic tests using a simple memory tester.

In some embodiments, a logic within the memory may enable testing of logic within the memory by using only vectors (or other data structures) and not more complex mechanisms common in logic testing (such as communicating with the controller, for example, through an interface, telling the logic which circuit to test).

Instead of using testing units, the memory controllers may be configured to receive instructions to access memory entries included in configuration information and execute the access instructions and output results.

Any of the integrated circuits illustrated in FIGS. 65-69 may execute the tests—even in the absence of testing units—or in the presence of testing units not capable to perform tests.

Embodiments of the present disclosure may include a method and system that use the parallelism of the memory and the internal chip bandwidth to speed up and improve test times.

The method and system may be based on a memory chip testing itself (as opposed to a tester running the test, reading results of the test, and analyzing the results), saving the results, and eventually allowing the tester to read them (and, if needed, to program the memory chip back, e.g., to activate redundancy mechanisms). The testing may include testing the memory or testing the memory banks and the logic (in case of a computational memory that has functional logic portions to test, such as that described above in FIG. 7A).

In one embodiments, the method may include reading and writing data within the chip such that external bandwidth does not limit the test.

In embodiments where the memory chip includes processor subunits, each processor subunit may be programmed with a test code or configuration.

In embodiments where the memory chip has processor subunits that cannot execute a test code or is without processor subunits but has memory controllers, then the memory controllers may be configured to read and write patterns (e.g., programmed to the controllers externally) and mark locations of faults (for example, writing a value to a memory entry, reading the entry, and receiving a value that differs from the written value) for further analysis.

It should be noted that the testing of a memory may require testing a vast number of bits, for example, testing each bit of the memory and verifying that the tested bits are functional. Moreover, sometimes the memory testing may be repeated under different voltage and temperature conditions.

For some defects, one or more redundancy mechanisms may be activated (e.g., by programming flash or OTP or burning fuses). In addition, the logic and analog circuits of the memory chips (e.g., controllers, regulators, I/Os) may also have to be tested.

In one embodiment, an integrated circuit that may include a substrate, a memory array disposed on the substrate, a processing array disposed on the substrate, and an interface disposed on the substrate.

The integrated circuits described herein may be included in, may include, or otherwise comprise a memory chip as illustrated in any one of FIG. 3A, 3B, 4-6, 7A-7D, 11-13, 16-19, 22, or 23.

FIGS. 65-69 illustrates various integrated circuits 5210 and tester 5200.

Figure 66:
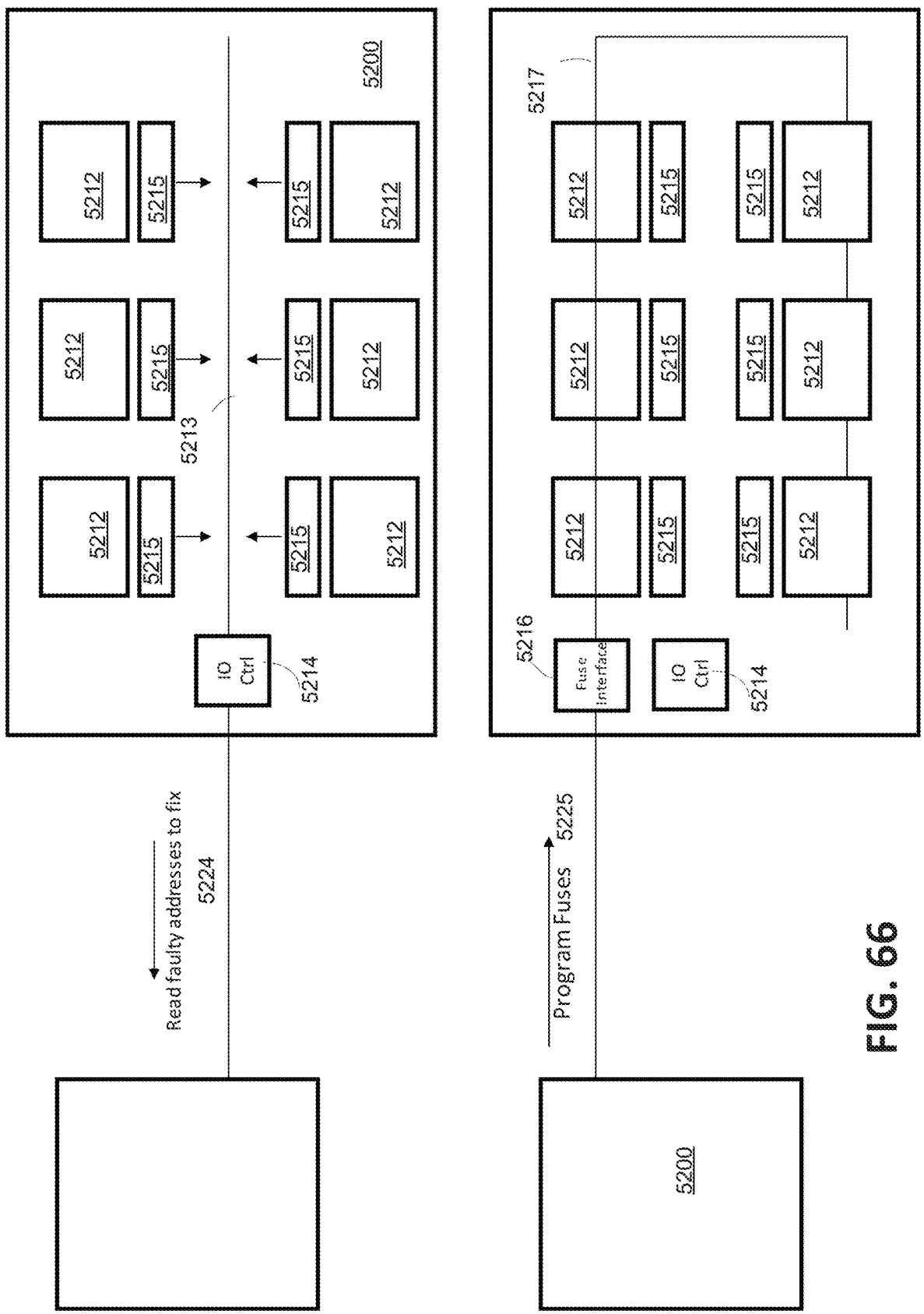
FIG. 66 illustrates another example of testing memory chips using logic units on the same substrate as the memory, consistent with the present disclosure.
Figure 67:
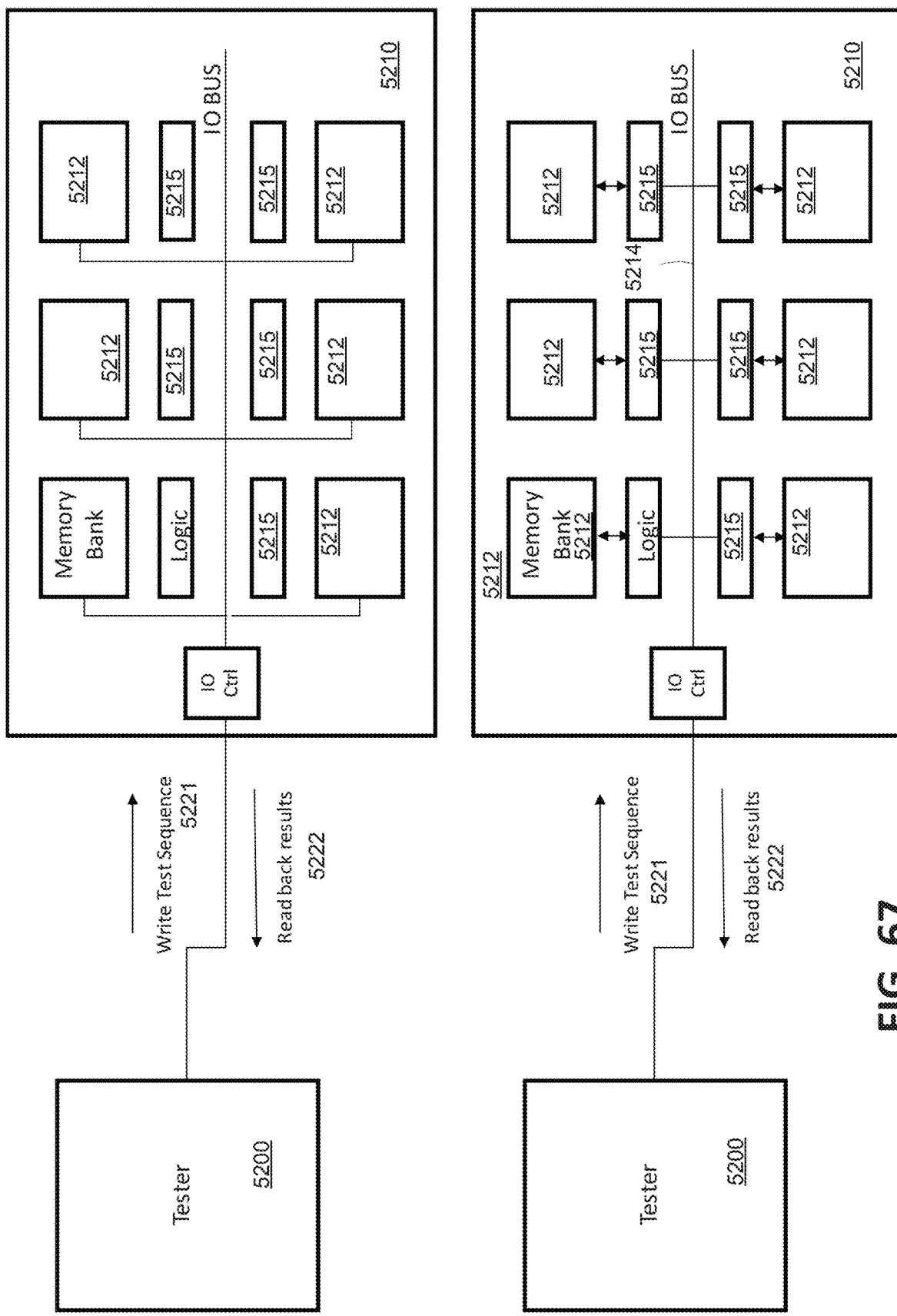
FIG. 67 illustrates yet another example of testing memory chips using logic units on the same substrate as the memory, consistent with the present disclosure.

The integrated circuit is illustrated as including memory banks 5212, a chip interface 5211 (such as I/O controller 5214 and bus 5213 shared by the memory banks), and logic unit (hereinafter "logic") 5215. FIG. 66 illustrates a fuse interface 5216 and a bus 5217 coupled to the fuse interface and the different memory banks.

FIGS. 65-70 also illustrate various steps in a testing process—such as:

a. write test sequence 5221 (FIGS. 65, 67, 68 and 69);
b. read back test results 5222 (FIGS. 67, 68 and 69);
c. write expected results sequence 5223 (FIG. 65);
d. read faulty addresses to fix 5224 (FIG. 66); and
e. program fuses 5225 (FIG. 66).

Each memory bank may be coupled to and/or controlled by its own logic unit 5215. However, as described above, any allocation of memory banks to logic unit 5215 may be provided. Thus, the number of logic units 5215 may differ from the number of memory banks, a logic unit may control more than a single memory bank or a fraction of a memory bank, and the like.

Figure 65:
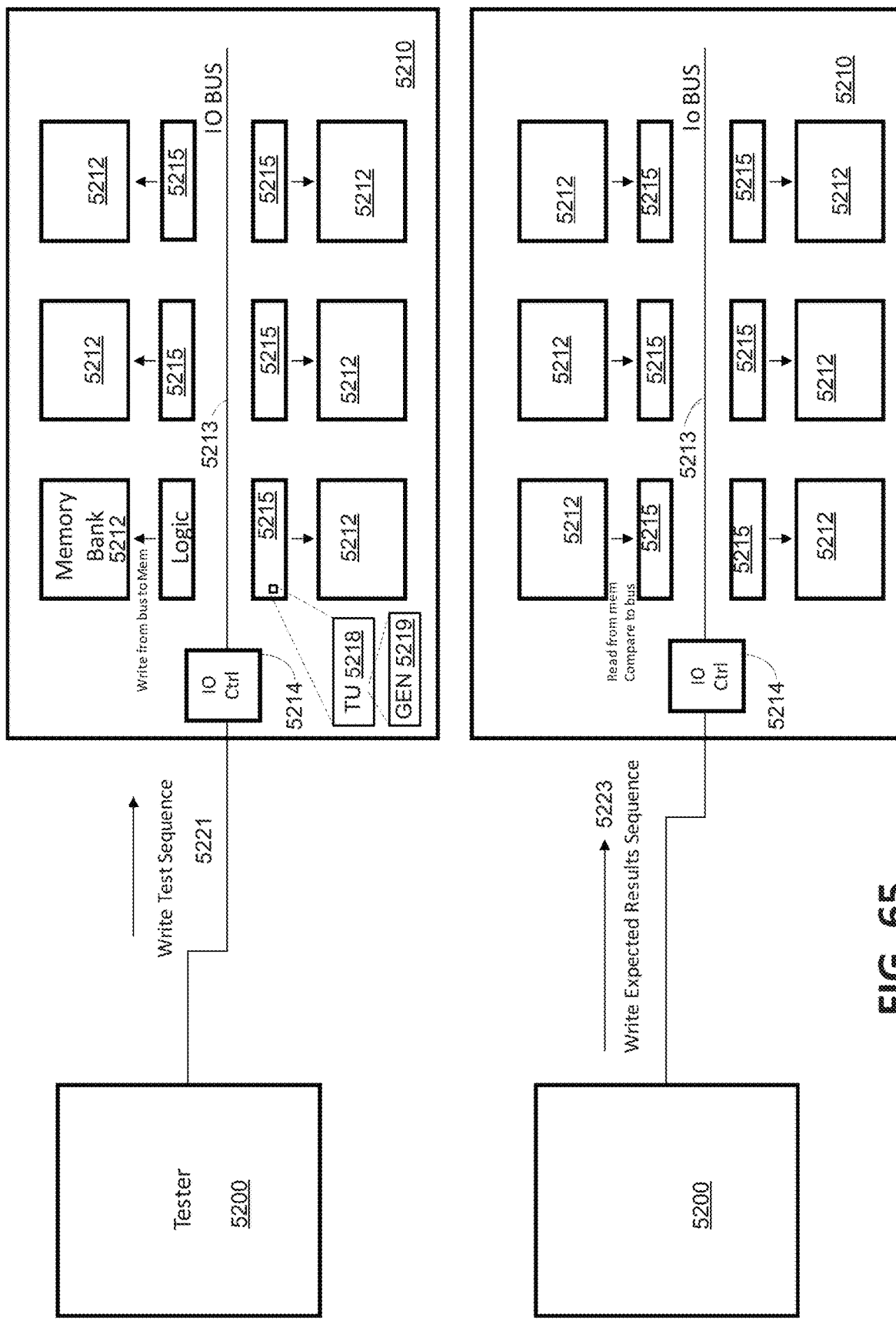
FIG. 65 illustrates an example of testing memory chips using logic units on the same substrate as the memory, consistent with the present disclosure.

The logic unit 5215 may include one or more testing units. FIG. 65 illustrates a testing unit (TU) 5218 within logic 5215. A TU may be included in all or some of the logic units 5212. It should be noted that the testing unit may be separate from the logic unit or integrated with the logic unit.

FIG. 65 also illustrates a test patter generator (denoted GEN) 5219 within TU 5218.

A test pattern generator may be included in all or some of the testing units. For simplicity, test patter generators and testing units are not illustrated in FIGS. 66-70 but may be included in such embodiments.

The memory array may include multiple memory banks. Moreover, the processing array may include a plurality of testing units. The plurality of testing units may be configured to test the multiple memory banks to provide test results. The interface may be configured to output, to a device external to the integrated circuit, information indicative of the test results.

The plurality of testing units may include at least one test pattern generator configured to generate at least one test pattern for use in testing one or more of the multiple memory banks. In some embodiments, as explained above, each of the plurality of testing units may include a test pattern generator configured to generate a test pattern for use by a particular one of the plurality of testing units to test at least one of the multiple memory banks. As indicated above, FIG. 65 illustrates a test pattern generator (GEN) 5219 within a testing unit. One or more or even all logic units may include the test pattern generator.

The at least one test pattern generator may be configured to receive instructions from the interface for generating the at least one test pattern. A test pattern may include memory entries that should be accessed (e.g., read and/or written) during a test and/or values to be written to the entries, and the like.

The interface may be configured to receive, from an external unit that may be external to the integrated circuit, configuration information including the instructions for generating the at least one test pattern.

The at least one test pattern generator may be configured to read configuration information including instructions for generating the at least one test pattern from the memory array.

In some embodiments, the configuration information may include a vector.

The interface may be configured to receive, from a device that may be external to the integrated circuit, configuration information that may include instructions that may be the at least one test pattern.

For example, at least one test pattern may include memory array entries to be accessed during the testing of the memory array.

The at least one test pattern further may include input data to be written to the memory arrays entries accessed during the testing of the memory array.

Additionally or alternatively, at least one test pattern further may include input data to be written to the memory array entries accessed during the testing of the memory array and expected values of output data to be read from the memory array entries accessed during the testing of the memory array.

In some embodiments, the plurality of testing units may be configured to retrieve, from the memory array, test instructions that once executed by the plurality of testing units cause the plurality of testing units to test the memory array.

For example, the test instructions may be included in configuration information.

The configuration information may include expected results of the testing of the memory array.

Additionally or alternatively, the configuration information may include values of output data to be read from memory array entries accessed during the testing of the memory array.

Additionally or alternatively, the configuration information may include a vector.

In some embodiments, the plurality of testing units may be configured to retrieve, from the memory array, test instructions that once executed by the plurality of testing units cause the plurality of testing units to test the memory array and to test the processing array.

For example, the test instructions may be included in configuration information.

The configuration information may include a vector.

Additionally or alternatively, the configuration information may include expected results of the testing of the memory array and of the processing array.

In some embodiments, as described above, the plurality of testing units may lack a test pattern generator for generating a test pattern used during the testing of the multiple memory banks.

In such embodiments, at least two of the plurality of testing units may be configured to test in parallel at least two of the multiple memory banks.

Alternatively, at least two of the plurality of testing units may be configured to test in series at least two of the multiple memory banks.

In some embodiments, the information indicative of the test results may include identifiers of faulty memory array entries.

In some embodiments, the interface may be configured to retrieve multiple times, during the testing of the memory array, partial test results obtained by the plurality of testing circuits.

In some embodiments, the integrated circuit may include an error correction unit configured to correct at least one error detected during the testing of the memory array. For example, the error correction unit may be configured to fix memory errors using any appropriate technique, for example, by disabling some memory words and replacing them with redundant words.

In any of the embodiments described above, the integrated circuit may be a memory chip.

For example, integrated circuit may include a distributed processor, wherein the processing array may include a plurality of subunits of the distributed processor, as depicted in FIG. 7A.

In such embodiments, each one of the processor subunits may be associated with a corresponding, dedicated one of multiple memory banks.

In any of the embodiments described above, the information indicative of the test results may indicate a status of at least one memory bank. The status of a memory bank may be provided in one or more granularities—per memory word, per a group of entries, or per the entire memory bank.

FIGS. 65-66 illustrates four steps in a tester testing phase.

In the first step, the tester writes (5221) the test sequence and the logic units of the banks write the data to their memories. The logic may also be complex enough to receive a command from the tester and generate the sequence on its own (as explained below).

In the second step, the tester writes (5223) to the tested memory the expected results and the logic units compare the expected results to data read from their memory banks, saving a list of errors. Writing the expected results may be simplified if the logic is complex enough to generate on its own the sequence of expected results (as explained below).

In the third step, the tester reads (5224) from the logic units the faulty addresses.

In the fourth step, the tester acts (5225) upon the results and can fix the errors. For example, it may connect to a specific interface to program fuses in the memory but can also use any other mechanism that allows for programming an error correction mechanism within the memory.

In such embodiments, the memory testers may use vectors to test the memory.

For example, each vector may be built from an input series and an output series.

The input series may include pairs of address and data to write to the memory (in many embodiments, this series could be modeled as a formula that allows a program, such as one executed by the logic units, to generate it when needed).

In some embodiments, a test pattern generator may generate such vectors.

It should be noted that a vector is an example data structure but some embodiments may use other data structures. The data structures may be compliant with other test data structures generated by testers located outside the integrated circuit.

The output series may include address and data pairs comprising expected data to be read back from the memory (in some embodiments, the series could additionally or alternatively be generated by a program at runtime, e.g., by the logic units).

Memory testing usually includes executing a list of vectors, each vector writing data to the memory according to the input series and then reading data back according to the output series and comparing it to its expected data.

In case of a mismatch, the memory may be either classifies as faulty or, if the memory includes mechanisms for redundancy, may have the redundancy mechanisms activated such that the vectors are tested again on the activated redundancy mechanisms.

In embodiments where memories include processor subunits (as described above with respect to FIG. 7A) or contain many memory controllers, the entire test may be handled by the logic units of the banks. Thus, a memory controller or processor subunit may perform the tests.

The memory controller may be programmed from the tester, and the results of the test may be saved in the controller itself to later be read by the tester.

To configure and test the operation of the logic unit, the tester may configure the logic unit for memory access and confirm that the results can be read by the memory access.

For example, an input vector may contain programming sequences for the logic unit, and the output vector may contain expected results of such testing. For example, if a logic unit such as a processor subunit comprises a multiplier or adder configured to perform computations on two addresses in the memory, an input vector may include a set of commands that writes data to the memory and a set of commands to the adder/multiplier logic. As long as the adder/multiplier results can be read back to an output vector, the results may be sent to the tested.

The testing may further include loading the logic configuration from the memory and having the logic output sent to the memory.

In embodiments where the logic unit loads its configuration from the memory (e.g., if the logic is a memory controller), the logic unit may run its code from the memory itself.

Accordingly, the input vector may include a program for the logic unit, and the program itself may test various circuits in the logic unit.

Thus, the testing may not be limited to receiving vectors in formats used by external testers.

If the commands that are loaded to the logic unit instruct the logic unit to write back results into the memory bank, then the tester may read those results and compare them to an expected output series.

For example, the vector written to the memory may be or may include a test program for the logic unit (e.g., the testing may assume the memory is valid, but even if not, the test program written would not work, and the test would fail, which is an acceptable result since the chip is invalid anyway) and/or how the logic unit ran the code and wrote back the results to the memory. Since all testing of the logic unit may be done through the memory (e.g., writing logic test inputs to the memory and writing test results back to the memory), the tester may run a simple vector test with an input sequence and expected output sequence.

Logic configuration and results may be accessed as read and/or write commands.

Figure 68:
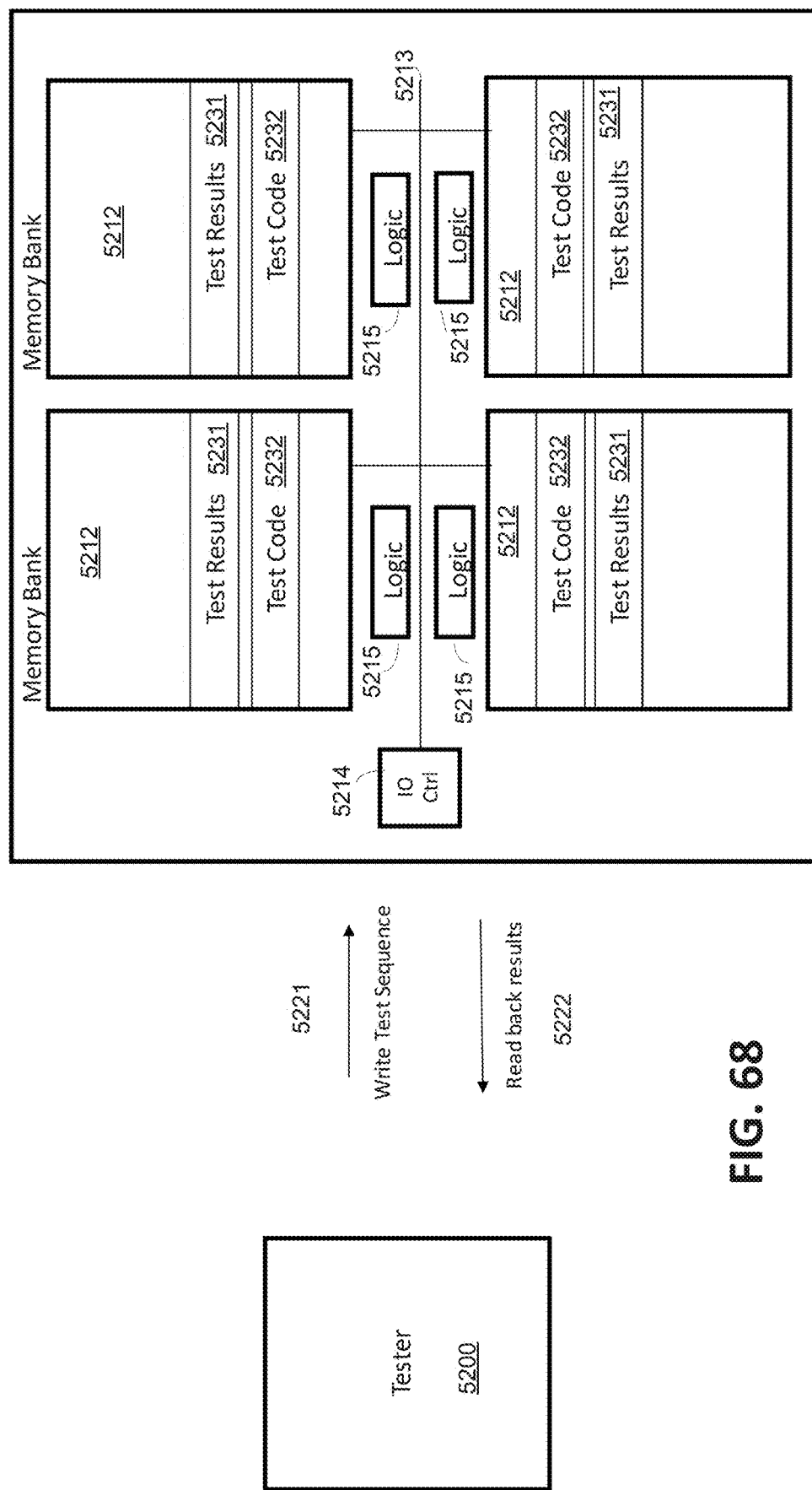
FIG. 68 illustrates an additional example of testing memory chips using logic units on the same substrate as the memory, consistent with the present disclosure.
Figure 69:
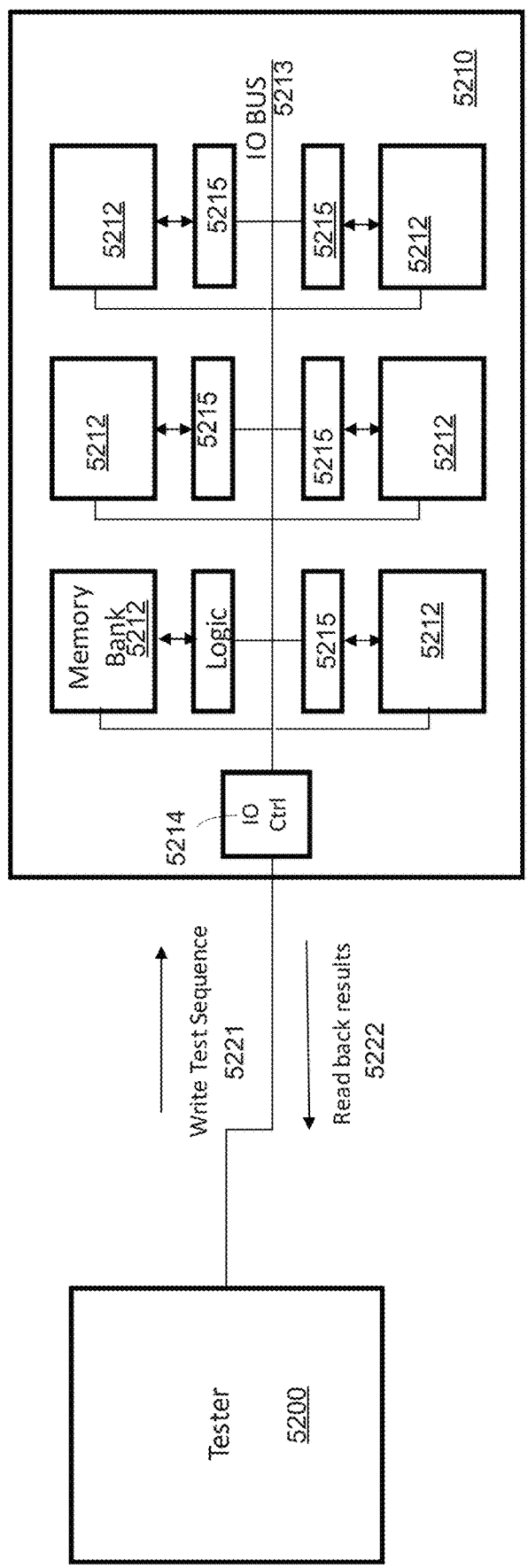
FIG. 69 illustrates a further example of testing memory chips using logic units on the same substrate as the memory, consistent with the present disclosure.

FIG. 68 illustrates a tester 5200 that sends a write test sequence 5221 that is a vector.

Parts of the vector include test code 5232 that is split between memory banks 5212 that are coupled to logic 5215 of a processing array.

Each logic 5215 may execute the code 5232 stored in its associated memory bank, and the execution may include accessing one or more memory banks, performing calculations, and storing the results (e.g., test results 5231) in the memory banks 5212.

The test results may be sent back (e.g., read back results 5222) by tester 5200.

This may allow logic 5215 to be controlled by commands received by the I/O controller 5214.

In FIG. 68, the I/O controller 5214 is connected to the memory banks and to the logic. In other embodiments, logic may be connected between the I/O controller 5214 and the memory banks.

Figure 70:
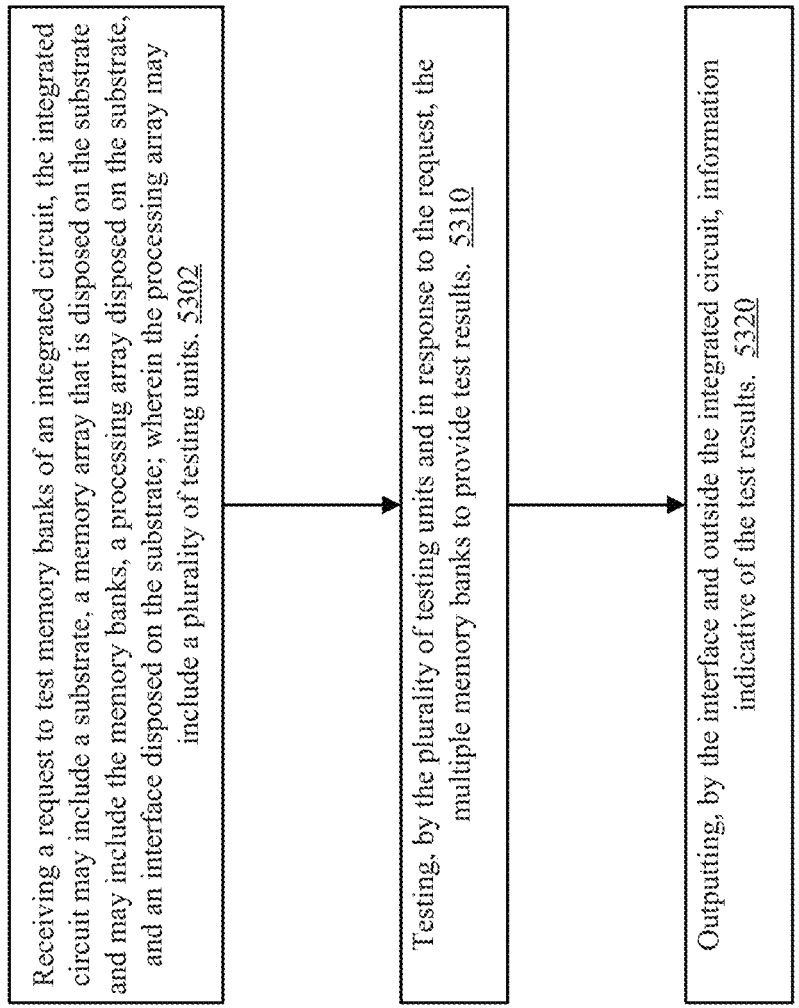
FIG. 70 is an example flowchart of a process for testing memory chips, consistent with the present disclosure.

FIG. 70 illustrates a method 5300 for testing memory banks. For example, method 5300 may be implemented using any of the memory banks described above with respect to FIGS. 65-69.

Method 5300 may include steps 5302, 5310, and 5320. Step 5302 may include receiving a request to test memory banks of an integrated circuit. The integrated circuit may include a substrate, a memory array that is disposed on the substrate and comprises the memory banks, a processing array disposed on the substrate, and an interface disposed on the substrate. The processing array may include a plurality of testing units, as described above.

In some embodiments, the request may include configuration information, one or more vectors, commands, and the like.

In such embodiments, the configuration information may include expected results of the testing of the memory array, instructions, data, values of output data to be read from memory array entries accessed during the testing of the memory array, a test pattern, and the like.

The test pattern may include at least one out of (i) memory array entries to be accessed during the testing of the memory array, (ii) input data to be written to the memory arrays entries accessed during the testing of the memory array, or (iii) expected values of output data to be read from the memory array entries accessed during the testing of the memory array.

Step 5302 may include at least one of the following and/or may followed by at least one of the following:
 a. receiving by the at least one test pattern generator instructions from the interface for generating the at least one test pattern;
 b. receiving by the interface and from an external unit that is external to the integrated circuit, configuration information including the instructions for generating the at least one test pattern;
 c. reading, by the at least one test pattern generator, configuration information including instructions for generating the at least one test pattern from the memory array;
 d. receiving, by the interface and from an external unit that is external to the integrated circuit, configuration information that comprises instructions that are the at least one test pattern;
 e. retrieving, by a plurality of testing units and from the memory array, test instructions that, once executed by the plurality of testing units, cause the plurality of testing units to test the memory array; and
 f. receiving by the plurality of testing units and from the memory array, test instructions that, once executed by the plurality of testing units, cause the plurality of testing units to test the memory array and to test the processing array.

Step 5302 may be followed by step 5310. Step 5310 may include testing, by the plurality of testing units and in response to the request, the multiple memory banks to provide test results.

Method 5300 may further include receiving, by the interface, a plurality of times, during the testing of the memory array, partial test results obtained by the plurality of testing circuits.

Step 5310 may include at least one of the following and/or may followed by at least one of the following:
 a. generating, by one or more test pattern generators (e.g., included in one, some, or all of the plurality of testing units) test patterns for use by one or more testing units to test at least one of the multiple memory banks;
 b. testing in parallel, by at least two of the plurality of testing units, at least two of the multiple memory banks;

c. testing in series, by at least two of the plurality of testing units, at least two of the multiple memory banks;
d. writing values to memory entries, reading the memory entries, and comparing the results; and
e. correcting, by an error correction unit, at least one error detected during the testing of the memory array.

Step 5310 may be followed by step 5320. Step 5320 may include outputting, by the interface and outside the integrated circuit, information indicative of the test results.

The information indicative of the test results may include identifiers of faulty memory array entries. This may save time by not sending read data regarding each memory entry.

Additionally or alternatively, the information indicative of the test results may indicate a status of at least one memory bank.

Accordingly, in some embodiments, the information indicative of the test results may be much smaller than the aggregate size of data units written to the memory banks of read from the memory banks during the testing and may be much smaller than the input data that may be sent from a tester that tests the memory without an assistance of the testing unit.

The tested integrated circuit may comprise memory chip and/or a distributed processor as illustrated in any of the previous figures. For example, the integrated circuits described herein may be included in, may include, or otherwise comprise a memory chip as illustrated in any one of FIG. 3A, 3B, 4-6, 7A-7D, 11-13, 16-19, 22, or 23.

Figure 71:
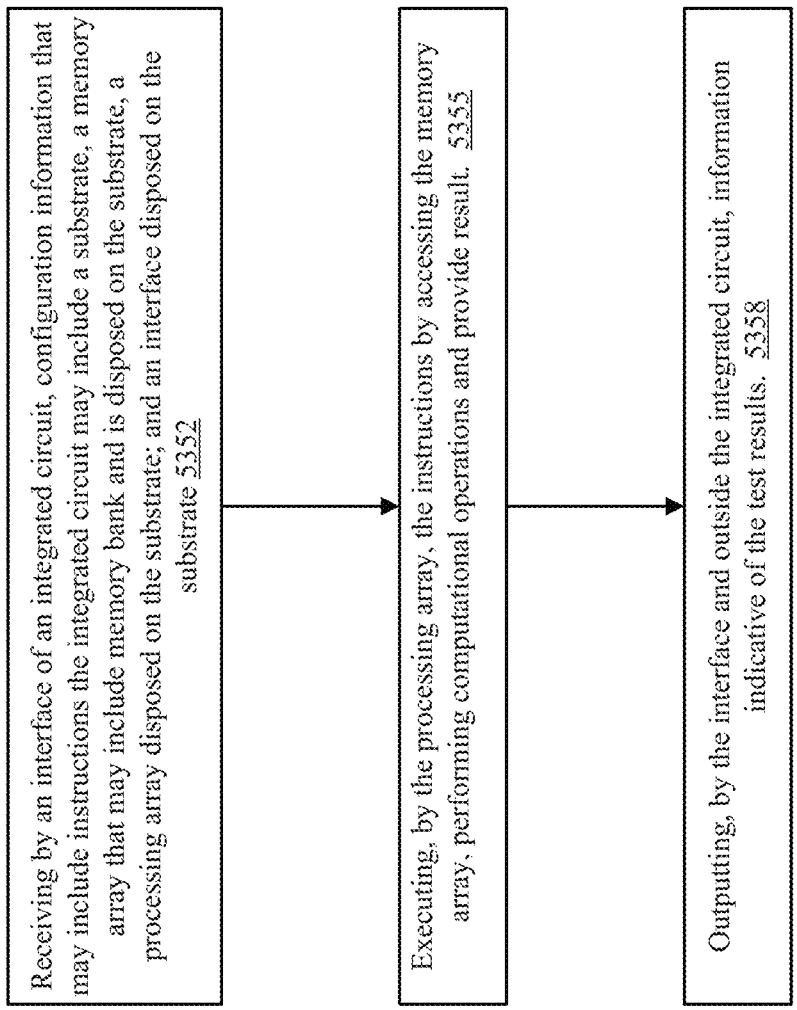
FIG. 71 is an example flowchart of another process for testing memory chips, consistent with the present disclosure.

FIG. 71 illustrates an example of method 5350 for testing memory banks of an integrated circuit. For example, method 5350 may be implemented using any of the memory banks described above with respect to FIGS. 65-69.

Method 5350 may include steps 5352, 5355, and 5358. Step 5352 may include receiving by an interface of an integrated circuit, configuration information that comprises instructions. The integrated circuit that includes the interface may also include a substrate, a memory array that comprises memory bank and is disposed on the substrate, a processing array disposed on the substrate; and an interface disposed on the substrate.

The configuration information may include expected results of the testing of the memory array, instructions, data, values of output data to be read from memory array entries accessed during the testing of the memory array, a test pattern, and the like.

Additionally or alternatively, the configuration information may include the instructions, addresses of memory entries to write the instructions, input data, and may also include addresses of memory entries to receive output values calculated during the execution of the instructions.

The test pattern may include at least one out of (i) memory array entries to be accessed during the testing of the memory array, (ii) input data to be written to the memory arrays entries accessed during the testing of the memory array, or (iii) expected values of output data to be read from the memory array entries accessed during the testing of the memory array.

Step 5352 may be followed by step 5355. Step 5355 may include executing, by the processing array, the instructions by accessing the memory array, performing computational operations, and providing results.

Step 5355 may be followed by step 5358. Step 5358 may include outputting, by the interface and outside the integrated circuit, information indicative of the results.

The foregoing description has been presented for purposes of illustration. It is not exhaustive and is not limited to the precise forms or embodiments disclosed. Modifications and adaptations will be apparent to those skilled in the art from consideration of the specification and practice of the disclosed embodiments. Additionally, although aspects of the disclosed embodiments are described as being stored in memory, one skilled in the art will appreciate that these aspects can also be stored on other types of computer readable media, such as secondary storage devices, for example, hard disks or CD ROM, or other forms of RAM or ROM, USB media, DVD, Blu-ray, 4K Ultra HD Blu-ray, or other optical drive media.

Computer programs based on the written description and disclosed methods are within the skill of an experienced developer. The various programs or program modules can be created using any of the techniques known to one skilled in the art or can be designed in connection with existing software. For example, program sections or program modules can be designed in or by means of .Net Framework, .Net Compact Framework (and related languages, such as Visual Basic, C, etc.), Java, C++, Objective-C, HTML, HTML/AJAX combinations, XML, or HTML with included Java applets.

Moreover, while illustrative embodiments have been described herein, the scope of any and all embodiments having equivalent elements, modifications, omissions, combinations (e.g., of aspects across various embodiments), adaptations and/or alterations as would be appreciated by those skilled in the art based on the present disclosure. The limitations in the claims are to be interpreted broadly based on the language employed in the claims and not limited to examples described in the present specification or during the prosecution of the application. The examples are to be construed as non-exclusive. Furthermore, the steps of the disclosed methods may be modified in any manner, including by reordering steps and/or inserting or deleting steps. It is intended, therefore, that the specification and examples be considered as illustrative only, with a true scope and spirit being indicated by the following claims and their full scope of equivalents.

What is claimed is:

1. An integrated circuit, comprising:
   a substrate;
   an interface disposed on the substrate, the interface including an input/output controller;
   a memory array disposed on the substrate, the memory array being communicatively coupled to a side of the input/output controller;
   a processing array disposed on the substrate, the processing array including at least one logic unit, and the processing array being communicatively coupled to the side of the input/output controller; and
   wherein the memory array comprises a plurality of memory banks;
   wherein the interface is configured to receive configuration information that comprises an instruction and an address of a memory entry in a memory bank of the memory array and the interface is further configured to write the instruction to the address of the memory entry in the memory bank;
   wherein the at least one logic unit of the processing array is configured to receive the instruction from the memory entry in the memory bank and test at least two of the memory banks in parallel, the at least one logic unit of the processing array being further configured to execute the instruction to access the memory array, perform a computational operation, and provide a result; and wherein the interface is configured to output, outside the integrated circuit, information indicative of the result.

2. The integrated circuit according to claim 1, wherein the configuration information further comprises input data.

3. The integrated circuit according to claim 1, comprising an error correction unit configured to correct at least one error detected during testing of the memory array.

4. The integrated circuit according to claim 1, wherein the integrated circuit is a memory chip.

5. The integrated circuit according to claim 1, wherein the integrated circuit includes a distributed processor, and wherein the processing array comprises a plurality of sub-units of the distributed processor.

6. The integrated circuit according to claim 5, wherein each one of the plurality of subunits is associated with a corresponding, dedicated one of the memory banks.

7. A method for testing an integrated circuit, the method comprising:
receiving a request to test the integrated circuit, the integrated circuit comprising a substrate, a memory array that is disposed on the substrate, a processing array disposed on the substrate, and an interface disposed on the substrate,
wherein the memory array comprises a plurality of memory banks and the processing array comprises at least one testing unit and is configured to test at least two of the memory banks in parallel;
receiving configuration information that comprises an instruction and an address of a memory entry in a memory bank of the memory array;
writing instruction to the address of the memory entry in the memory bank;
receiving, by the processing array, the instruction from the memory entry in the memory bank;
executing, by the at least one testing unit, the instruction to cause the at least one testing unit to test at least a portion of the processing array by accessing the memory array and performing a computational operation;
providing, by the processing array, a result of the computational operation; and
outputting, by the interface and outside the integrated circuit, information indicative of the result.

8. The method according to claim 7, wherein the at least one testing unit comprises at least one test pattern generator, wherein the method further comprises generating by the at least one test pattern generator, at least one test pattern for use in testing the integrated circuit.

9. The method according to claim 8, further comprising receiving, by the at least one test pattern generator, instructions from the interface for generating the at least one test pattern.

10. The method according to claim 9, wherein receiving the configuration information comprises receiving, by the interface and from an external unit that is external to the integrated circuit, the configuration information.

11. The method according to claim 8, further comprising reading, by the at least one test pattern generator, instructions for generating the at least one test pattern from the memory array.

12. The method according to claim 7, wherein the configuration information includes a vector.

13. The method according to claim 9, further comprising receiving, by the interface and from an external unit that is external to the integrated circuit, the instructions for generating the at least one test pattern.

14. The method according to claim 7, wherein the configuration information further comprises addresses of memory array entries to be accessed during testing of the memory array.

15. The method according to claim 7, wherein the configuration information further comprises input data to be written to memory array entries accessed during testing of the memory array.

16. The method according to claim 7, wherein the configuration information comprises an expected result of testing the portion of the processing array.

17. The method according to claim 7, wherein the at least one testing unit lacks a test pattern generator for generating a test pattern.

18. The method according to claim 7, further comprising testing in parallel, by at least two testing units, at least two memory banks included in the memory array.

19. The method according to claim 7, further comprising testing in series, by at least two testing units, at least two memory banks included in the memory array.

20. The integrated circuit according to claim 1, wherein the processing array is configured to read the instruction from the address of the memory entry in the memory bank.

21. The integrated circuit according to claim 1, wherein the processing array is configured to write the result to the memory array.

22. The integrated circuit according to claim 1, wherein the result includes information indicative of a status of at least one of the plurality of memory banks.

23. The method according to claim 7, wherein the result includes information indicative of a status of the portion of the processing array.

24. A method for testing an integrated circuit, the method comprising:
receiving a request to test the integrated circuit, the integrated circuit comprising a substrate, a memory array that is disposed on the substrate, and a processing array disposed on the substrate, wherein the processing array comprises at least one testing unit;
wherein the memory array comprises a plurality of memory banks and the processing array is configured to test at least two of the memory banks in parallel;
receiving configuration information that comprises an instruction and an address of a memory entry in a memory bank of the memory array;
writing the instruction to the address of the memory entry in the memory bank;
receiving, by the processing array, the instruction from the memory entry in the memory bank; and
executing, by the at least one testing unit, the instruction to cause the at least one testing unit to test at least a portion of the processing array.

* * * * *